US011936399B2

United States Patent
Hui et al.

(10) Patent No.: US 11,936,399 B2
(45) Date of Patent: Mar. 19, 2024

(54) CRC INTERLEAVING PATTERN FOR POLAR CODES

(71) Applicant: Telefonaktiebolaget LM Ericsson (publ), Stockholm (SE)

(72) Inventors: Dennis Hui, Sunnyvale, CA (US); Yufei Blankenship, Kildeer, IL (US); Michael Breschel, Lund (SE); Anders Wesslén, Staffanstorp (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 52 days.

(21) Appl. No.: 17/514,249

(22) Filed: Oct. 29, 2021

(65) Prior Publication Data
US 2022/0052709 A1 Feb. 17, 2022

Related U.S. Application Data

(63) Continuation of application No. 16/645,720, filed as application No. PCT/IB2018/056983 on Sep. 12, 2018, now Pat. No. 11,165,442.
(Continued)

(51) Int. Cl.
*H03M 13/00* (2006.01)
*H03M 13/13* (2006.01)
*H03M 13/27* (2006.01)

(52) U.S. Cl.
CPC ....... *H03M 13/2792* (2013.01); *H03M 13/13* (2013.01)

(58) Field of Classification Search
CPC .. H03M 13/2792; H03M 13/27; H03M 13/13; H03M 13/09; H03M 13/091;
(Continued)

(56) References Cited

U.S. PATENT DOCUMENTS 8,055,977 B2 * 11/2011 Ito ........................ H03M 13/11
714/758
8,205,143 B2 * 6/2012 Buckley ................ H03M 13/09
714/755
(Continued)

FOREIGN PATENT DOCUMENTS

| KR | 20150108362 | 9/2015 |
| WO | 2018231924 A1 | 12/2018 |
| WO | 2019053618 A1 | 3/2019 |

OTHER PUBLICATIONS

3GPP TSG RAN WG1 meeting #90; Prague, Czech Republic; Source: Huawei, HiSilicon; Title: Distributed CRC for Polar code construction (R1-1712167)—Aug. 21-25, 2017.
(Continued)

*Primary Examiner* — Esaw T Abraham
(74) *Attorney, Agent, or Firm* — BAKER BOTTS L.L.P.

(57) ABSTRACT

According to some embodiments, a method of operation of a wireless transmitter in a wireless communication network comprises: encoding a set of information carrying data bits u of length K with a linear outer code to generate a set of outer parity bits p along with the data bits u; interleaving the set of outer parity bits p and the data bits u using a predetermined interleaving mapping function that depends on the number of data bits K and is operable to distribute some bits of the set of parity bits p in front of some data bits u; and encoding the interleaved bits using a Polar encoder to generate a set of encoded bits x. Various interleaving mapping functions are disclosed.

26 Claims, 10 Drawing Sheets

Related U.S. Application Data

(60) Provisional application No. 62/559,991, filed on Sep. 18, 2017, provisional application No. 62/558,208, filed on Sep. 13, 2017, provisional application No. 62/557,715, filed on Sep. 12, 2017.

(58) Field of Classification Search
CPC .......... H03M 13/1137; H03M 13/118; H03M 13/2732; H03M 13/2757; H03M 13/2789; H03M 13/2742; H03M 13/2778
See application file for complete search history.

(56) References Cited

U.S. PATENT DOCUMENTS

| | | | |
|---|---|---|---|
| 9,966,975 B2 | 5/2018 | Zhang | |
| 10,313,057 B2* | 6/2019 | Lin | H03M 13/2906 |
| 10,361,718 B2* | 7/2019 | Jang | H03M 13/13 |
| 2016/0352463 A1 | 12/2016 | Vojcic | |
| 2018/0227076 A1* | 8/2018 | Koike-Akino | H03M 13/353 |

OTHER PUBLICATIONS

3GPP TSG RAN WG1 meeting NR#3; Nagoya, Japan; Source: Ericsson; Title: Polar Code Constructions for DL (R1-1715737)—Sep. 18-21, 2017.
3GPP TSG RAN WG1 NR Ad-Hoc #3; Nagoya, Japan; Source: Samsung; Title: Downlink Polar Code Construction (R1-1716669)—Sep. 18-21, 2017.
3GPP TSG RAN WG1 Meeting NR#3; Nagoya, Japan; Source: Ericsson: Title: Polar Code Design for NR-PBCH (R1-1716757)—Sep. 18-21, 2017.
3GPP TSG RAN WG1 Meeting NR#3; Nagoya, Japan; Source: Huawei, HiSilicon; Title: Distributed CRC for Polar Code construction (R1-1716771)—Sep. 18-21, 2017.
3GPP TSG RAN WG1 Meeting #90bis; Prague, CZ; Source: Ericsson; Title: Polar Code Design for NR-PBCH (R1-1717998)—Oct. 9-13, 2017.
3GPP TSG RAN WG1 Meeting 91; Reno, USA; Source: Ericsson; Title: Remaining Issues of Polar Code Construction for DCI (R1-1719609)—Nov. 17-Dec. 1, 2017.
PCT International Search Report for International application No. PCT/IB2018/056983—dated Dec. 17, 2018.
PCT Written Opinion of the International Searching Authority for International application No. PCT/IB2018/056983—dated Dec. 17, 2018.
Korea Patent Office Notice of Allowance in KR Application No. 10-2020-7010286 dated Oct. 5, 2021 with attached translated allowed claims.
Preview A novel design of CRC-concatenated polar codesChaki, Prakash; Kamiya, Norifumi. ICC 2019—2019 IEEE International Conference on Communications (ICC). Proceedings: 6 . IEEE. (2019) (Year: 2019).
Channel Polarization: A Method for Constructing Capacity-Achieving Codes for Symmetric Binary-Input Memoryless Channels, IEEE Transactions on Information Theory, vol. 55, No. 7 by Erdal Arikan—Jul. 2009.
List Decoding of Polar Codes by Ida Tai and Alexander Vardy—May 2012.
3GPP TSG RAN WG1 #90, Prague, Czech Republic, Aug. 21-25, 2017; Source: Nokia, Nokia Shanghai Bell; Title: Distributed CRC Polar Code Construction (R1-1714377)—Aug. 21-25, 2017.
3GPP TSG RAN WG1 Meeting #88bis, Spokane, USA, Source: NTT Docomo; Title: Distributed Simple Parity Check Polar Codes (R1-1705757)—Apr. 3-7, 2017.
3GPP TSG RAN WG1 Meeting NR#3, Nagoya, Japan, Aug. 21-25, 2017; Source: Huawei, HiSilicon Title: Distributed CRC Polar Code Construction (R1-1715494)—Sep. 18-21, 2017.
China Patent Agent translation of China Patent Office Official Action in Application No. 201880073313.6, dated Apr. 23, 2023.
Mexico Patent Office, Official Action in MX1/2020/002461 dated May 26, 2023 (not translated).
Japan Patent Office Official Action in JP Application No. 2022-113768 dated Jun. 27, 2023 (translated).
"Design details of distributed CRC," R1-1708833, Nokia, Alcatel-Lucent Shanghai Bell, 3GPP TSG RAN WG1 Meeting #89, Hangzhou, P.R. China May 15-19, 2017.
"Investigation of Distributed CRC and Interleaver for Polar Codes," R1-1714791, Ericsson, 3GPP TSG RAN WG1 NR Meeting #90, Prague, Czech Republic, Aug. 21-25, 2017.
Mexico Patent Office, Notice of Allowance in Application No. MX/a/2020/002461, dated Sep. 4, 2023 (not translated).

\* cited by examiner

CRC INTERLEAVING PATTERN FOR POLAR CODES

PRIORITY

This application is a continuation, under 35 U.S.C. § 120, of U.S. patent application Ser. No. 16/645,720 filed on Mar. 9, 2020, now U.S. Pat. No. 11,165,442 issued Nov. 2, 2021 which is a U.S. National Stage Filing under 35 U.S.C. § 371 of International Patent Application Serial No. PCT/IB2018/056983 filed Sep. 12, 2018, entitled "CRC INTERLEAVING PATTERN FOR POLAR CODES", which claims priority to: U.S. Provisional Patent Application No. 62/557,715 filed Sep. 12, 2017B; U.S. Provisional Patent Application No. 62/558,208 filed Sep. 13, 2017B; and U.S. Provisional Patent Application No. 62/559,991 filed Sep. 18, 2017B, all of which are hereby incorporated by reference in their entirety.

TECHNICAL FIELD

Particular embodiments are directed to wireless communications and, more particularly, to cyclic redundancy check (CRC) interleaving patterns for polar codes.

INTRODUCTION

Polar codes, proposed by E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009, are a class of constructive coding schemes that achieve the symmetric capacity of the binary-input discrete memoryless channels under a low-complexity Successive Cancellation (SC) decoder. The finite-length performance of polar codes under SC, however, is not competitive compared to other modern channel coding schemes such as low-density parity-check (LDPC) codes and Turbo codes. An SC list (SCL) decoder is proposed in I. Tal and A. Vardy, "List Decoding of Polar Codes," Proceedings of IEEE Symp. Inf. Theory, pp. 1-5, 2011, that approaches the performance of optimal maximum-likelihood (ML) decoder. By concatenating a simple cyclic redundancy check (CRC) coding, the performance of a concatenated polar code is competitive with that of well-optimized LDPC and Turbo codes. As a result, polar codes are being considered as a candidate for future fifth generation (5G) wireless communication systems.

Polar coding transforms a pair of identical binary-input channels into two distinct channels of different qualities, one better and one worse than the original binary-input channel. Repeating such a pair-wise polarizing operation on a set of $N=2^n$ independent uses of a binary-input channel results in a set of $2^n$ "bit-channels" of varying qualities. Some of the bit channels are nearly perfect (i.e., error free) while the rest of them are nearly useless (i.e., totally noisy). Polar coding uses the nearly perfect channel to transmit data to the receiver and sets the input to the useless channels to have fixed or frozen values (e.g., 0) known to the receiver. For this reason, the input bits to the nearly useless and the nearly perfect channel are commonly referred to as frozen bits and non frozen (or information) bits, respectively. Only the non-frozen bits are used to carry data in a polar code. Loading the data into the proper information bit locations has direct impact on the performance of a polar code. The set of information bit locations is commonly referred to as an information set. An illustration of the structure of a length-8 polar code is illustrated in FIG. 1.

Although the original polar code, as proposed by Arikan, was proven to be capacity achieving with a low-complexity successive cancellation (SC) decoder, the finite-length performance of polar codes under SC is not competitive compared to other modern channel coding schemes such LDPC and Turbo codes. A more complex decoder, the SC list (SCL) decoder, is proposed in I. Tal and A. Vardy, "List Decoding of polar codes," in Proceedings of IEEE Symp. Inf. Theory, pp. 1-5, 2011, where a list of more than one surviving decision paths is maintained in the decoding process, but the resulting performance is still unsatisfactory. Tal et al. further proposed that by concatenating a linear outer code, a cyclic redundancy check (CRC) code, with the original polar code as inner code, the outer code can be used to check if any of the candidate paths in the list is correctly decoded. Such a two-step decoding process significantly improves the performance and makes polar codes competitive with that of well-optimized LDPC and Turbo codes. However, the two-step decoding process is in general suboptimal because each step does not account for the structure of the other (inner or outer) code.

The two-step decoding process also increases the decoding latency as the outer decoder typically needs to wait for the inner decoder to finish decoding before it operates. To compensate for the delay incurred by extra processing, methods of improving the average decoding latency are needed. One method is to try to terminate the decoding when one of decoded CRC bits is found to be inconsistent with the previously decoded information bits that the CRC bit depends upon. However, this method is not effective when all CRC bits are attached at the end of the code block.

SUMMARY

The embodiments described herein include applying a bit-interleaver with a specific interleaving pattern between a linear outer code (e.g., a cyclic redundancy check (CRC) code) and a polar inner code. The interleaving pattern enables the decoder to achieve early termination of the decoding when some of the CRC bits that are encountered early in the successive decoding process are used for early error detection, while maintaining a low false-alarm rate (FAR). In addition, the interleaver also enables some of the parity bits generated by the outer code to be used earlier to positively influence the decisions made in a modified successive cancellation list (SCL) decoder for the polar inner code. This facilitates a single-step decoding for the overall concatenated code that accounts for the structure of the outer code and thus outperforms its two-step counterpart.

According to some embodiments, a method of operation of a wireless transmitter in a wireless communication network comprises: encoding a set of information carrying data bits u of length K with a linear outer code to generate a set of outer parity bits p along with the data bits u; interleaving the set of outer parity bits p and the data bits u using a predetermined interleaving mapping function that depends on the number of data bits K and is operable to distribute some bits of the set of parity bits p in front of some data bits u; and encoding the interleaved bits using a polar encoder to generate a set of encoded bits x. The method may further comprise transmitting the set of encoded bits x to a wireless receiver.

In particular embodiments the predetermined interleaving mapping function comprises a template interleaver for a largest value of K, referred to a $K_{max}$, and the template interleaver comprises a high-index bit mapper wherein the K data bits are loaded at the high-index positions of the input of the template interleaver, where $u=[u_0, u_1, \ldots, u_{K-1}]$ and the input of the template interleaver, denoted by $v=[v_0, v_1, \ldots, v_{K_{max}-1}]$, is given by the following bit mapping:

$$v_i = \begin{cases} u_{i-K_{max}+K} & K_{max} - K \leq i < K_{max} \\ p_{i-K_{max}} & i \geq K_{max} \\ \text{NULL} & \text{otherwise} \end{cases}.$$

In some embodiments the template interleaver comprises a low-index bit mapper wherein: the K data bits are loaded at the low-index positions of the input of the template interleaver in reverse, where the input of the template interleaver is given by the following bit mapping:

$$v_i = \begin{cases} u_{K-1-i} & 0 \leq i < K \\ p_{i-K_{max}} & i \geq K_{max} \\ \text{NULL} & \text{otherwise} \end{cases}.$$

According to some embodiments, a wireless transmitter comprises processing circuitry. The processing circuitry is operable to: encode a set of information carrying data bits u of length K with a linear outer code to generate a set of outer parity bits p along with the data bits u; interleave the set of outer parity bits p and the data bits u using a predetermined interleaving mapping function that depends on the number of data bits K and is operable to distribute some bits of the set of parity bits p in front of some data bits u; and encode the interleaved bits using a polar encoder to generate a set of encoded bits x. The processing circuitry may be further operable to transmit the set of encoded bits x to a wireless receiver.

In particular embodiments, the wireless transmitter comprises as wireless device (e.g., user equipment) or a base station (e.g., gNB).

According to some embodiments, a method of operation of a wireless receiver in a wireless communication network comprises: determining a decoder reaches a distributed CRC bit $p_i$ when decoding a received set of polar encoded bits; calculating L estimated values, $p_i(\ell)$, of the distributed CRC bit $p_i$, one for each list $\ell$, $\ell = 0, 1, \ldots, L-1$; for each $p_i(\ell)$, determining whether the info bits associated with $p_i(\ell)$ leads to a successful parity check; and upon determining there is no successful parity check for each $p_i(\ell)$, terminating the decoding; and upon determining there exists a successful parity check, continuing the decoding.

According to some embodiments, a method of operation of a wireless receiver in a wireless communication network comprises: determining a decoder reaches a distributed CRC bit $p_i$ when decoding a received set of polar encoded bits, wherein the distributed CRC bit $p_i$ is masked by a bit $q_i$, and becomes: $w_i=(p_i+q_i)$ mod 2; calculating L estimated values, $w_i(\ell)$, of the distributed CRC bit $p_i$, one for each list $\ell$, $\ell = 0, 1, \ldots, L-1$; for each $w_i(\ell)$, removing the mask, $p_i=(w_i+q_i)$ mod 2; for each $p_i(\ell)$, determining whether the info bits associated with $p_i(\ell)$ leads to a successful parity check; upon determining there is no successful parity check for each $p_i(\ell)$, terminating the decoding; and upon determining there exists a successful parity check, continuing the decoding.

In particular embodiments, the decoding comprises a template deinterleaver and a bit demapper which performs the inverse of the bit mapping of any of the interleaving functions described herein.

According to some embodiments, a wireless receiver comprises processing circuitry. The processing circuitry is operable to: determine a decoder reaches a distributed CRC bit $p_i$ when decoding a received set of polar encoded bits; calculate L estimated values, $p_i(\ell)$, of the distributed CRC bit $p_i$, one for each list $\ell$, $\ell = 0, 1, \ldots, L-1$; for each $p_i(\ell)$, determine whether the info bits associated with $p_i(\ell)$ leads to a successful parity check; and upon determining there is no successful parity check for each $p_i(\ell)$, terminate the decoding; and upon determining there exists a successful parity check, continue the decoding.

According to some embodiments, a wireless receiver comprises processing circuitry. The processing circuitry is operable to: determine a decoder reaches a distributed CRC bit $p_i$ when decoding a received set of polar encoded bits, wherein the distributed CRC bit p is masked by a bit $q_i$, and becomes: $w_i=(p_i+q_i)$ mod 2; calculate L estimated values, $w_i(\ell)$, of the distributed CRC bit $p_i$, one for each list $\ell$, $\ell = 0, 1, \ldots, L-1$; for each $w_i(\ell)$, remove the mask, $p_i=(w_i+q_i)$ mod 2; for each $p_i(\ell)$, determine whether the info bits associated with $p_i(\ell)$ leads to a successful parity check; upon determining there is no successful parity check for each $p_i(e)$, terminate the decoding; and upon determining there exists a successful parity check, continue the decoding.

According to some embodiments, a wireless transmitter comprises an encoding module (1350, 1450). The encoding module is operable to: encode a set of information carrying data bits u of length K with a linear outer code to generate a set of outer parity bits p along with the data bits u; interleave the set of outer parity bits p and the data bits u using a predetermined interleaving mapping function that depends on the number of data bits K and is operable to distribute some bits of the set of parity bits p in front of some data bits u; and encode the interleaved bits using a polar encoder to generate a set of encoded bits x.

According to some embodiments, a wireless receiver comprises a decoding module (1350, 1450). The decoding module is operable to: determine a decoder reaches a distributed CRC bit $p_i$ when decoding a received set of polar encoded bits; calculate L estimated values, $p_i(\ell)$, of the distributed CRC bit $p_i$, one for each list $\ell$, $\ell = 0, 1, \ldots, L-1$; for each $p_i(e)$, determine whether the info bits associated with $p_i(\ell)$ leads to a successful parity check; and upon determining there is no successful parity check for each $p_i(\ell)$, terminate the decoding; and upon determining there exists a successful parity check, continue the decoding.

According to some embodiments, a wireless receiver comprises a decoding module (1350, 1450). The decoding module is operable to: determine a decoder reaches a distributed CRC bit $p_i$ when decoding a received set of polar encoded bits, wherein the distributed CRC bit $p_i$ is masked by a bit $q_i$, and becomes: $w_i=(p_i+q_i)$ mod 2; calculate L estimated values, $w_i(\ell)$, of the distributed CRC bit $p_i$, one for each list $\ell$, $\ell = 0, 1, \ldots, L-1$; for each $w_i(\ell)$, remove the mask, $p_i=(w_i+q_i)$ mod 2; for each $p_i(\ell)$, determine whether the info bits associated with $p_i(\ell)$ leads to a successful parity check; upon determining there is no successful parity check for each $p_i(e)$, terminate the decoding; and upon determining there exists a successful parity check, continue the decoding.

In particular embodiments, the wireless receiver comprises as wireless device (e.g., user equipment) or a base station (e.g., gNB).

Also disclosed is a computer program product. The computer program product comprises instructions stored on non-transient computer-readable media which, when executed by a processor, perform the steps of encoding a set of information carrying data bits u of length K with a linear outer code to generate a set of outer parity bits p along with the data bits u; interleaving the set of outer parity bits p and the data bits u using a predetermined interleaving mapping function that depends on the number of data bits K and is operable to distribute some bits of the set of parity bits p in front of some data bits u; and encoding the interleaved bits using a Polar encoder to generate a set of encoded bits x. The instructions may further perform the step of transmitting the set of encoded bits x to a wireless receiver.

Another computer program product comprises instructions stored on non-transient computer-readable media which, when executed by a processor, perform the steps of determining a decoder reaches a distributed CRC bit $p_i$ when decoding a received set of polar encoded bits; calculating L estimated values, $p_i(\ell)$, of the distributed CRC bit $p_i$, one for each list $\ell$, $\ell=0, 1, \ldots, L-1$; for each $p_i(\ell)$, determining whether the info bits associated with $p_i(\ell)$ leads to a successful parity check; and upon determining there is no successful parity check for each $p_i(\ell)$, terminating the decoding; and upon determining there exists a successful parity check, continuing the decoding.

Another computer program product comprises instructions stored on non-transient computer-readable media which, when executed by a processor, perform the steps o determining a decoder reaches a distributed CRC bit $p_i$ when decoding a received set of polar encoded bits, wherein the distributed CRC bit $p_i$ is masked by a bit $q_i$, and becomes: $w_i=(p_i+q_i)$ mod 2; calculating L estimated values, $w_i(\ell)$, of the distributed CRC bit $p_i$, one for each list $\ell$, $\ell=0, 1, \ldots, L-1$; for each $w_i(\ell)$, removing the mask, $p_i=(w_i+q_i)$ mod 2; for each $p_i(\ell)$, determining whether the info bits associated with $p_i(\ell)$ leads to a successful parity check; upon determining there is no successful parity check for each $p_i(\ell)$, terminating the decoding; and upon determining there exists a successful parity check, continuing the decoding.

Particular embodiments may include some, all, or none of the following advantages. For example, particular interleaving patterns enable the decoder to take early termination of decoding if the decoded info bits in each candidate of the decoding list are not consistent with the decoded value of a CRC bit. This reduces the overall decoding latency. With existing methods, the entire length-$K_{CRC}$ vector of CRC bits are typically used in CRC checking after all information bits are decoded. With particular embodiments described herein, CRC checking can be done bit-by-bit for each individual CRC bit during the successive cancellation list decoding. The interleaving patterns strike a balance between early termination gain in decoding and the false-alarm probability (i.e., the probability of falsely accepting an incorrectly decoded code block).

Particular embodiments also facilitate a single-step decoding process for the concatenation of any linear outer code and a polar inner code through a judicious design of the interleaver, as opposed to a two-step decoding process where the inner polar code is first decoded followed by the decoding of the outer code. Such a single step decoding jointly accounts the structure of the polar inner code and the linear outer (e.g., CRC) code and thus improves the performance, compared to the two-step solution.

BRIEF DESCRIPTION OF THE DRAWINGS

For a more complete understanding of the embodiments and their features and advantages, reference is now made to the following description, taken in conjunction with the accompanying drawings, in which.

DETAILED DESCRIPTION

Figure 1:
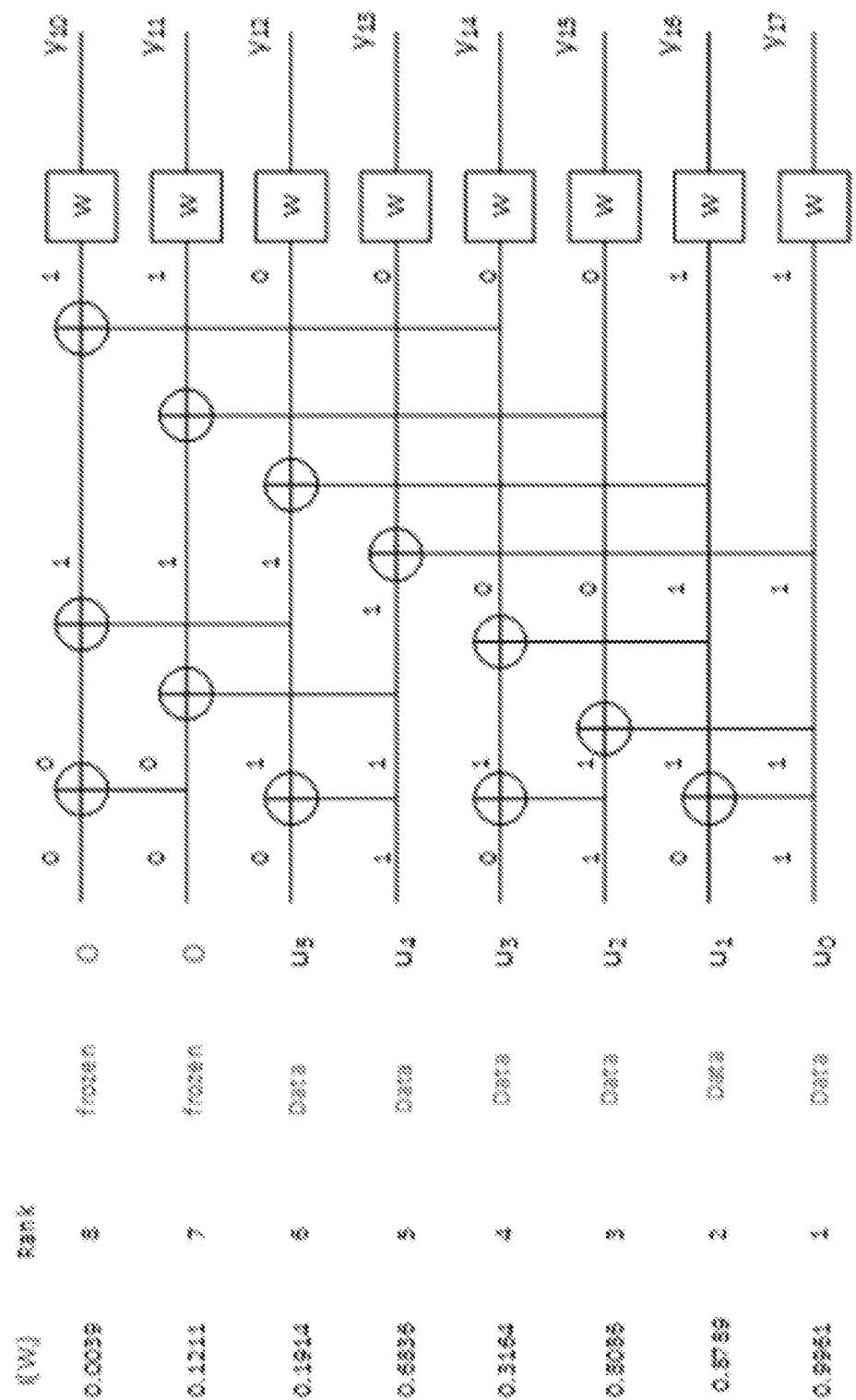
FIG. 1 illustrates an example of a polar code structure with N=8.

Polar codes achieve the symmetric capacity of the binary-input discrete memoryless channels under a low-complexity successive cancellation (SC) decoder. However, the finite-length performance of polar codes under SC is not competitive compared to other modern channel coding schemes such as low-density parity-check (LDPC) codes and Turbo codes. An SC list (SCL) decoder approaches the performance of optimal maximum-likelihood (ML) decoder. By concatenating a simple cyclic redundancy check (CRC) coding, the performance of a concatenated polar code is competitive with that of well-optimized LDPC and Turbo codes. As a result, polar codes may be used for fifth generation (5G) wireless communication systems.

By concatenating a linear outer code, such as a CRC code, with the original polar code as inner code, the outer code can be used to check if any of the candidate paths in the list is correctly decoded. The two-step decoding process significantly improves the performance, however, it is in general sub-optimal because each step does not account for the structure of the other (inner or outer) code.

The two-step decoding process also increases the decoding latency as the outer decoder typically needs to wait for the inner decoder to finish decoding before it operates. To compensate for the delay incurred by extra processing, particular embodiments improve the average decoding latency.

Particular embodiments described herein obviate the problems described above and include applying a bit-interleaver with a specific interleaving pattern between a linear outer code (e.g., a CRC code) and a polar inner code. The interleaving pattern enables the decoder to achieve early termination of the decoding when some of the CRC bits that are encountered early in the successive decoding process are used for early error detection, while maintaining a low false-alarm rate (FAR). In addition, the interleaver also enables some of the parity bits generated by the outer code to be used earlier to positively influence the decisions made in a modified SCL decoder for the polar inner code. This facilitates a single-step decoding for the overall concatenated code that accounts for the structure of the outer code and thus outperforms its two-step counterpart.

The interleaving patterns strike a balance between early termination gain in decoding and the false-alarm probability (i.e., the probability of falsely accepting an incorrectly decoded code block). Particular embodiments also facilitate a single-step decoding process for the concatenation of any linear outer code and a polar inner code through a judicious design of the interleaver, as opposed to a two-step decoding process where the inner polar code is first decoded followed by the decoding of the outer code. Such a single step decoding jointly accounts for the structure of the polar inner code and the linear outer (CRC) code and thus improves the performance, compared to the two-step solution.

The following description sets forth numerous specific details. It is understood, however, that embodiments may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments, whether or not explicitly described.

Particular embodiments are described with reference to FIGS. 2-10B of the drawings, like numerals being used for like and corresponding parts of the various drawings. Long term evolution (LTE) and NR are used throughout this disclosure as an example cellular system, but the ideas presented herein may apply to other wireless communication systems as well.

Figure 2:
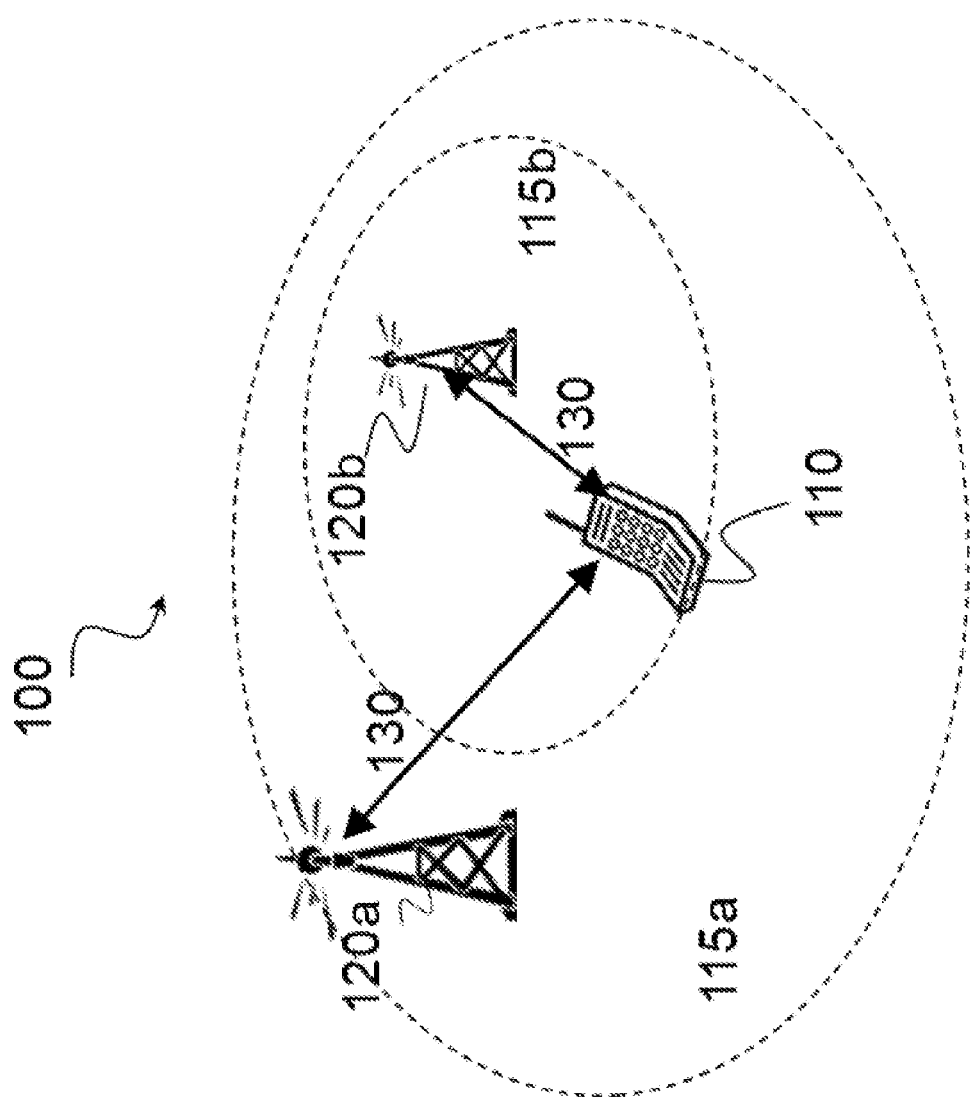
FIG. 2 is a block diagram illustrating an example wireless network, according to a particular embodiment.

FIG. 2 is a block diagram illustrating an example wireless network, according to a particular embodiment. Wireless network 100 includes one or more wireless devices 110 (such as mobile phones, smart phones, laptop computers, tablet computers, MTC devices, or any other devices that can provide wireless communication) and a plurality of network nodes 120 (such as base stations, eNodeBs, gNBs, etc.). Wireless device 110 may also be referred to as a UE. Network node 120 serves coverage area 115 (also referred to as cell 115).

In general, wireless devices 110 that are within coverage of network node 120 (e.g., within cell 115 served by network node 120) communicate with network node 120 by transmitting and receiving wireless signals 130. For example, wireless devices 110 and network node 120 may communicate wireless signals 130 containing voice traffic, data traffic, and/or control signals. A network node 120 communicating voice traffic, data traffic, and/or control signals to wireless device 110 may be referred to as a serving network node 120 for the wireless device 110. Communication between wireless device 110 and network node 120 may be referred to as cellular communication. Wireless signals 130 may include both downlink transmissions (from network node 120 to wireless devices 110) and uplink transmissions (from wireless devices 110 to network node 120).

Each network node 120 may have a single transmitter or multiple transmitters for transmitting signals 130 to wireless devices 110. In some embodiments, network node 120 may comprise a multi-input multi-output (MIMO) system. Wireless signal 130 may comprise one or more beams. Particular beams may be beamformed in a particular direction. Each wireless device 110 may have a single receiver or multiple receivers for receiving signals 130 from network nodes 120 or other wireless devices 110. Wireless device 110 may receive one or more beams comprising wireless signal 130.

Wireless signals 130 may be transmitted on time-frequency resources. The time-frequency resources may be partitioned into radio frames, subframes, slots, and/or mini-slots. Network node 120 may dynamically schedule subframes/slots/mini-slots as uplink, downlink, or a combination uplink and downlink. Different wireless signals 130 may include different transmission processing times.

Network node 120 may operate in a licensed frequency spectrum, such as an LTE spectrum. Network node 120 may also operate in an unlicensed frequency spectrum, such as a 5 GHz Wi-Fi spectrum. In an unlicensed frequency spectrum, network node 120 may coexist with other devices such as IEEE 802.11 access points and terminals. To share the unlicensed spectrum, network node 120 may perform listen-before-talk (LBT) protocols before transmitting or receiving wireless signals 130. Wireless device 110 may also operate in one or both of licensed or unlicensed spectrum and in some embodiments may also perform LBT protocols before transmitting wireless signals 130. Both network node 120 and wireless device 110 may also operate in licensed shared spectrum.

For example, network node 120a may operate in a licensed spectrum and network node 120b may operate in an unlicensed spectrum. Wireless device 110 may operate in both licensed and unlicensed spectrum. In particular embodiments, network nodes 120a and 120b may be configurable to operate in a licensed spectrum, an unlicensed spectrum, a licensed shared spectrum, or any combination. Although the coverage area of cell 115b is illustrated as included in the coverage area of cell 115a, in particular embodiments the coverage areas of cells 115a and 115b may overlap partially or may not overlap at all.

In particular embodiments, wireless device 110 and network nodes 120 may perform carrier aggregation. For example, network node 120a may serve wireless device 110 as a PCell and network node 120b may serve wireless device 110 as a SCell. Network nodes 120 may perform self-scheduling or cross-scheduling. If network node 120a is operating in licensed spectrum and network node 120b is operating in unlicensed spectrum, network node 120a may provide license assisted access to the unlicensed spectrum (i.e., network node 120a is a LAA PCell and network node 120b is a LAA SCell).

In particular embodiments, wireless signals 130 may be encoded using a polar code. For example, wireless device 110 and/or network node 120 may use a polar code for encoding wireless signal 130. In some embodiments, the encoding may include an interleaver. The interleaver is described in more detail with respect to FIGS. 3-8.

In wireless network 100, each network node 120 may use any suitable radio access technology, such as long term evolution (LTE), LTE-Advanced, UMTS, HSPA, GSM, cdma2000, NR, WiMax, WiFi, and/or other suitable radio access technology. Wireless network 100 may include any suitable combination of one or more radio access technologies. For purposes of example, various embodiments may be described within the context of certain radio access technologies. However, the scope of the disclosure is not limited to the examples and other embodiments could use different radio access technologies.

As described above, embodiments of a wireless network may include one or more wireless devices and one or more different types of radio network nodes capable of communicating with the wireless devices. The network may also include any additional elements suitable to support communication between wireless devices or between a wireless device and another communication device (such as a landline telephone). A wireless device may include any suitable combination of hardware and/or software. For example, in particular embodiments, a wireless device, such as wireless device 110, may include the components described with respect to FIG. 9A below. Similarly, a network node may include any suitable combination of hardware and/or software. For example, in particular embodiments, a network node, such as network node 120, may include the components described with respect to FIG. 10A below.

Particular embodiments include a judiciously designed interleaver, with specific interleaver patterns, between a linear outer code and a polar inner code. The interleaving patterns move the CRC bits to the beginning of the code blocks so that the decoding process may be terminated earlier to reduce average latency if the decoded values of some CRC bits are inconsistent with the values of the corresponding information bits. These interleaving patterns are designed in such a way that the early termination gain is maximized while maintain a low FAR.

According to particular embodiments of the interleaver, a single-pass or single-step decoding is performed using a slightly modified SCL polar decoder to jointly take advantage of the structure of both the inner and outer coder. The interleaver enables some of the parity bits generated by the outer code to be used earlier to positively influence the decisions made in a modified SCL decoder for the polar inner code. This facilitates a single-step decoding for the overall concatenated code while outperforming its two-step counterpart.

Particular embodiments include an interleaver with a specific interleaving pattern, for each possible number of information bits, between a linear outer code, such as a CRC code, and a polar inner code. The interleaver distributes some CRC bits in front of some information bits. This enables a SCL decoder to terminate the decoding process when the decoded value of any of these CRC bits is not consistent with the information bits that the CRC bits depend upon for every candidate in the list Interleaving of CRC bits also facilitates list decoding for the inner polar code that accounts for the dependency structure of the parity bits and the data bits from the outer code. An example is illustrated in FIG. 3.

Figure 3:
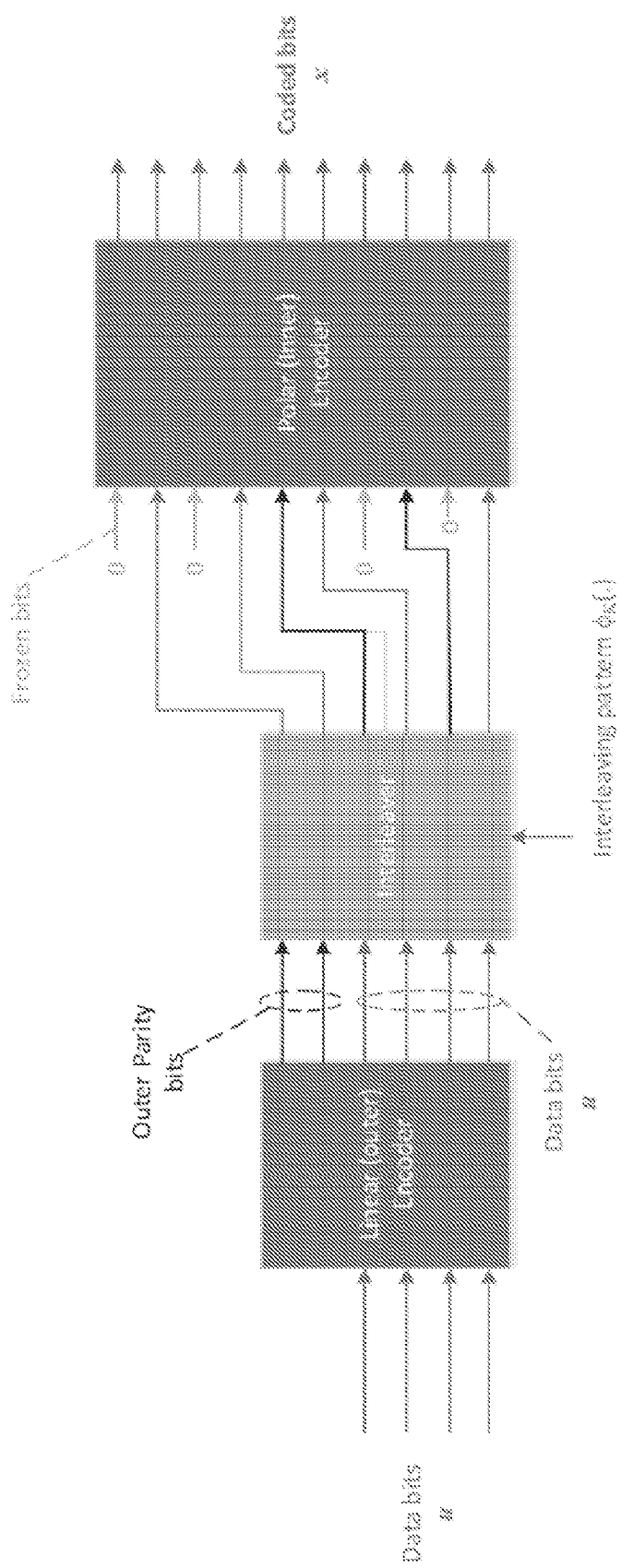
FIG. 3 is a block diagram illustrating the encoder structure of an interleaved concatenated Polar code, according to a particular embodiment.

FIG. 3 is a block diagram illustrating the encoder structure of an interleaved concatenated polar code, according to a particular embodiment. The information-carrying data bits u of length K are first encoded by a linear outer encoder 10 (the linear outer code is typically a CRC code) to generate a number of outer parity bits p along with the data bits u. All the bits $x_{outer} = [u|p]$ are interleaved at interleaver 12 and put into polar inner encoder 14 along with the frozen bits to form the input to polar inner encoder 14, which generates the overall coded bits x. Interleaver 12 operates based on a predetermined interleaving mapping $\phi_K(\cdot)$, which depends on the number of data bits, K.

Figure 4:
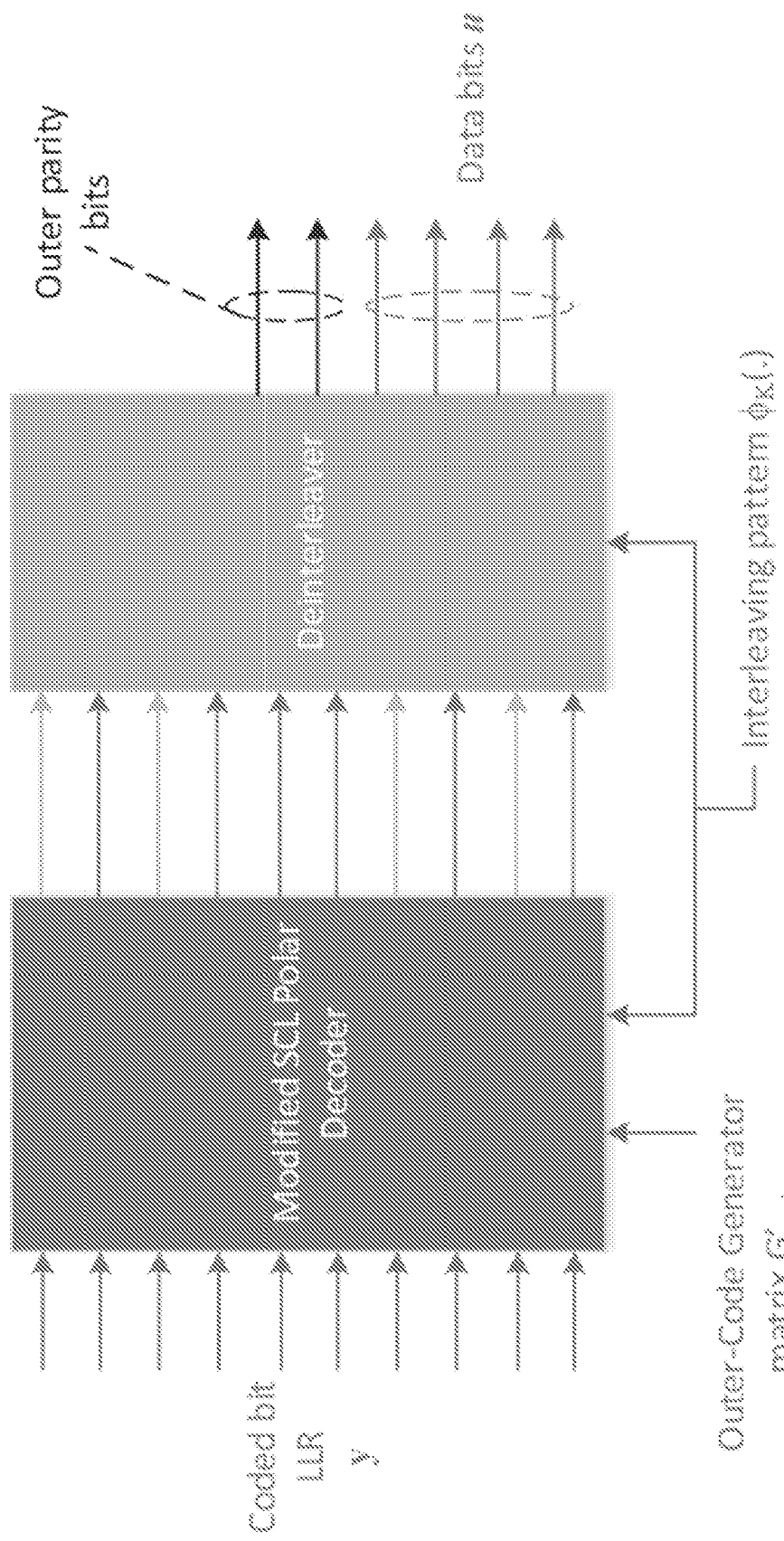
FIG. 4 is a block diagram illustrating a one-step decoder structure of an interleaved concatenated Polar code, according to a particular embodiment.

FIG. 4 is a block diagram illustrating a one-step decoder structure of an interleaved concatenated polar code, according to a particular embodiment. At the receiver, the input log-likelihood ratios (LLRs) y of the coded bits are first decoded using modified SCL polar decoder 16, whose outputs are then passed through deinterleaver 18 that extracts the decoded data bits. Deinterleaver 18 depends on the interleaving mapping $\phi_K(\cdot)$ used in the encoder 14 in a straightforward manner. The operations of the modified SCL polar decoder is similar to an ordinary SCL polar decoder except that whenever an outer parity bit is reached, as indicated by the interleaving mapping $\phi_K(\cdot)$, during the successive decoding process, its value is computed based on the previous data bits as indicated by the corresponding columns of the generating matrix $G_o$ of the outer code.

The size of the interleaver described with respect to FIG. 3, for example, generally depends on the number K of data bits as well as the number $n_{CRC}$ of CRC bits. To ease implementation, particular embodiments implement a single template interleaver $\phi_T(\cdot)$ at the largest possible value of K, dented by $K_{max}$, and then use a subset of this template interleaver to implement the interleaver needed for any given value of K in FIG. 3.

Figure 5:
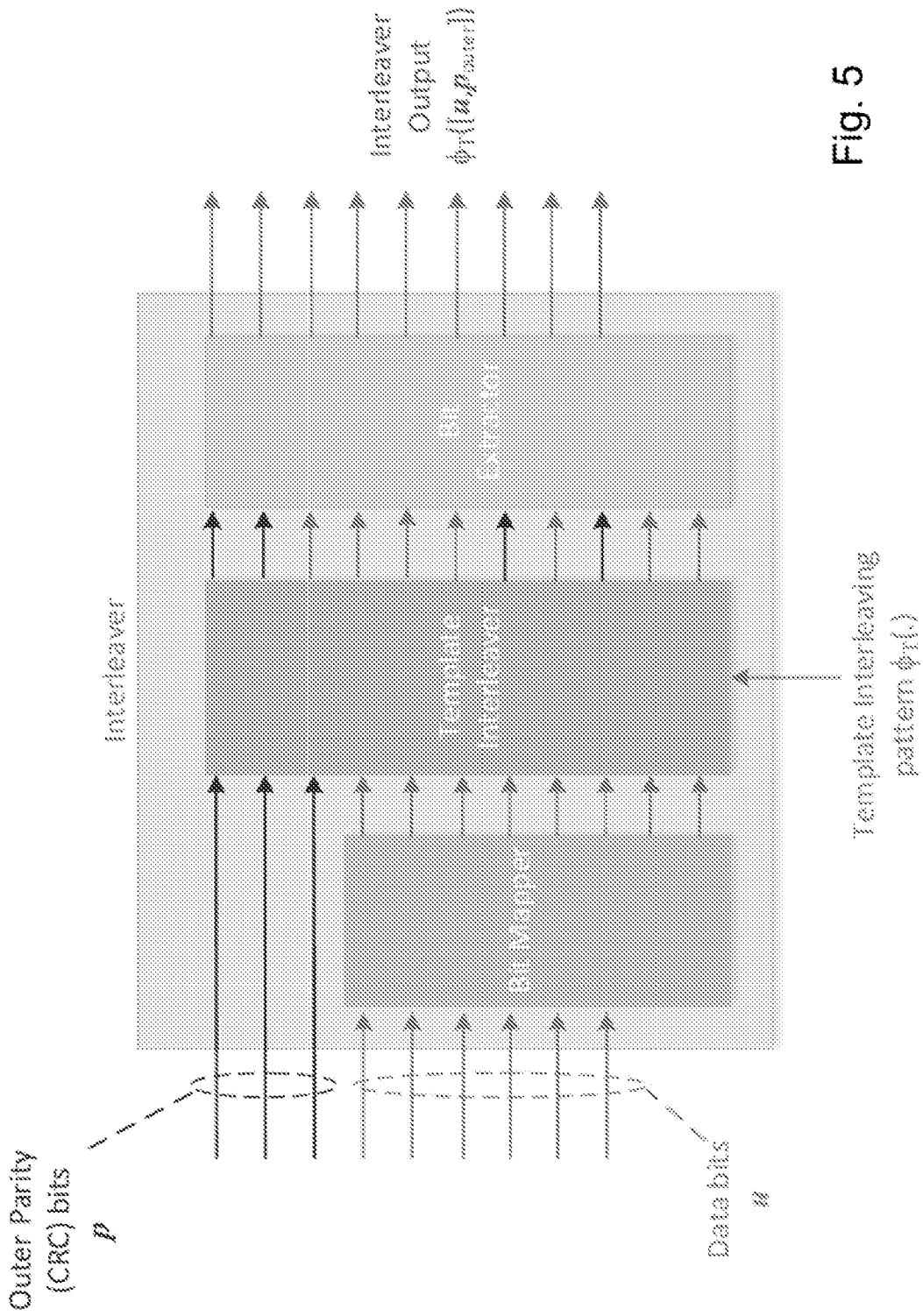
FIG. 5 is a block diagram illustrating a template interleave of a fixed size $K_{max}$, according to a particular embodiment.

FIG. 5 is a block diagram illustrating a template interleaver of a fixed size $K_{max}$, according to a particular embodiment. Interleaver 30 comprises bit mapper 20, template interleaver 22, and bit extractor 24. Bit mapper 20 maps K data bits into certain input positions of template interleaver 22 of size $K_{max}$. Bit mapper $\mu_K(\cdot)$ depends on K. The $n_{CRC}$ CRC bits are mapped into other input positions. The rest of the input positions are filled with NULL. Template interleaver 22 re-orders the data bits, CRC bits, and NULLs. Bit extractor 24 removes the NULLs from the output of template interleaver 22 to form the output of interleaver 30.

The design of the template interleaver is tied to that of the bit mapper. The following are two examples of a bit mapper. A high-index bit mapper loads the K data bits at the high-index positions of the input of the template interleaver. Specifically, let $u=[u_0, u_1, \ldots, u_{K-1}]$ be the data bits. Then the input of the template interleaver, denoted by $v=[v_0, v_1, \ldots, v_{K_{max}-1}]$, is given by the following bit mapping:

$$v_i = \begin{cases} u_{i-K_{max}+K} & K_{max} - K \leq i < K_{max} \\ p_{i-K_{max}} & i \geq K_{max} \\ \text{NULL} & \text{otherwise} \end{cases}$$

Figure 6:
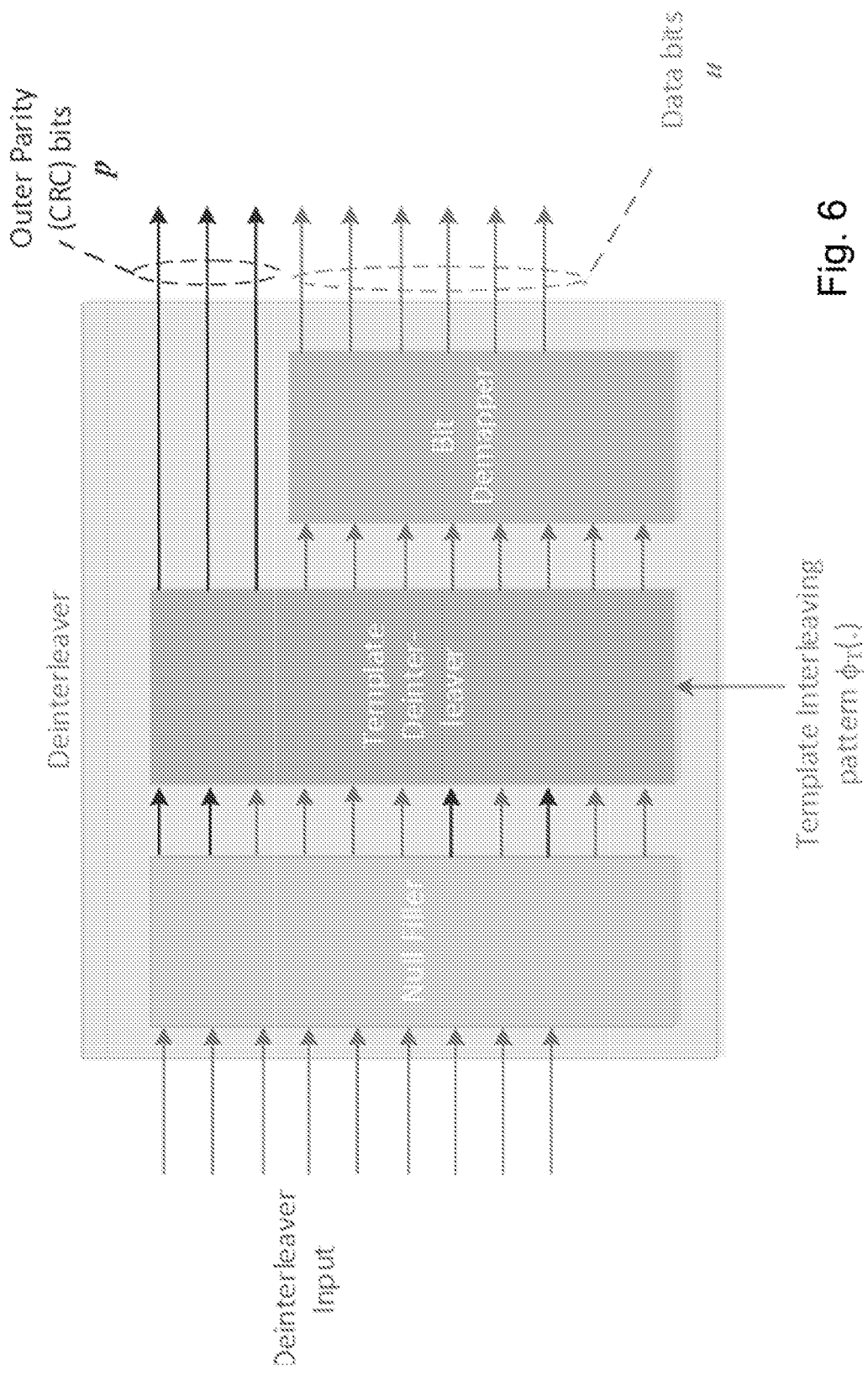
FIG. 6 is a block diagram illustrating the structure of a deinterleaver, according to a particular embodiment.

FIGS. 5 and 6 describe the interleaving and de-interleaving operations for a high-index bit mapper.

Another example includes a low-index bit mapper. The low-index bit mapper loads the K data bits at the low-index positions of the input of the template interleaver in a reversed manner. Specifically, the input of the template interleaver is given by the following bit mapping $$v_i = \begin{cases} u_{K-1-i} & 0 \leq i < K \\ p_{i-K_{max}} & i \geq K_{max} \\ \text{NULL} & \text{otherwise} \end{cases}$$

FIG. 6 is a block diagram illustrating the structure of a deinterleaver, according to a particular embodiment. Deinterleaver 40 includes null filler 26, template deinterleaver 28, and bit demapper 32. The example deinterleaver illustrates the corresponding inverse operations in the deinterleaver of the decoder illustrated in FIG. 4.

After polar decoding, the output of the polar decoder is input to deinterleaver 40. Null filler 26 fills the input with NULLs according to the same NULL positions as used in bit extractor 24 in FIG. 5. Template deinterleaver 40 deinterleaves the null-filled sequence.

Part of the output of the template deinterleaver forms the decoded outer (CRC) parity bits and part of the output is passed through bit demapper 32, which performs the inverse operation of the bit mapping performed in FIG. 4. The output of bit demapper 32 is the decoded data bits. In the case of the outer code being a CRC code used for error detection, the decoded data bits and decoded outer CRC parity bits are used subsequently to check if the CRC passes to detect whether an error has occurred.

Particular embodiments may include any of a number of judiciously designed interleaving patterns for the template interleaver from which the corresponding interleaver for each possible number of information bits can be derived. Particular patterns maximize the potential reduction in decoding latency through earlier termination while maintaining the FAR.

Listed below are some example interleaving patterns for the template interleaver, each associated with a particular bit mapper described above. In all cases, the following two CRC polynomials are used as examples.

$$g_{crc}(D)=D^{24}+D^{23}+D^{21}+D^{20}+D^{17}+D^{15}+D^{13}+D^{12}+D^{8}+D^{4}+D^{2}+D+1$$

$$g_{crc}(D)=D^{19}+D^{16}+D^{14}+D^{13}+D^{12}+D^{10}+D^{8}+D^{7}+D^{4}+D^{3}+1$$

Because the template interleaver $\phi_T(\cdot)$ is a mapping from integers to integers, it can be equivalently described using an integer sequence, denoted by $\phi_T$. The indices corresponding to the CRC bits are underlined.

As examples, value of $K_{max}$ is assumed to be in the set {53, 72, 140, 160, 200}, which are values likely to be used in 5G-NR systems, to generate the following interleaving patterns.

1. For high-index bit mapper for $K_{max}=53$
    (a) $\phi_T=$[1 4 5 8 10 11 14 15 16 20 24 26 28 30 31 35 44 45 46 48 51 52 <u>58</u> 12 19 21 22 25 32 33 37 38 39 47 <u>68</u> 7 9 17 18 27 <u>41</u> 50 <u>61</u> 0 34 36 43 <u>53</u> 40 49 <u>54</u> 29 <u>42</u> 64 13 <u>65</u> 2 <u>62</u> 23 <u>55</u> <u>69</u> <u>71</u> 3 <u>56</u> <u>57</u> <u>67</u> 6 <u>59</u> <u>60</u> <u>63</u> <u>66</u> <u>70</u>];
    (b) $\phi_T=$[1 4 5 8 10 11 14 15 16 20 24 26 28 30 31 35 44 45 46 48 51 52 <u>58</u> 12 19 21 22 25 32 33 37 38 39 47 <u>68</u> 7 9 17 18 27 <u>41</u> 50 <u>61</u> 0 2 3 6 13 23 29 34 36 40 42 <u>43</u> 49 <u>53</u> <u>54</u> <u>55</u> <u>56</u> <u>57</u> <u>59</u> <u>60</u> <u>62</u> <u>63</u> <u>64</u> <u>65</u> <u>66</u> <u>67</u> <u>69</u> <u>70</u> <u>71</u>];
    (c) $\phi_T=$[1 4 5 8 10 11 14 15 16 20 24 26 28 30 31 35 44 45 46 48 51 52 <u>58</u> 12 19 21 22 25 32 33 37 38 39 47 <u>68</u> 7 9 17 18 27 <u>41</u> 50 <u>61</u> 0 34 36 43 <u>53</u> 2 3 6 13 23 29 <u>40</u> 42 49 <u>54</u> <u>55</u> <u>56</u> <u>57</u> <u>59</u> <u>60</u> <u>62</u> <u>63</u> <u>64</u> <u>65</u> <u>66</u> <u>67</u> <u>69</u> <u>70</u> <u>71</u>];
    (d) $\phi_T=$[1 4 5 8 10 11 14 15 16 20 24 26 28 30 31 35 44 45 46 48 51 52 <u>58</u> 12 19 21 22 25 32 33 37 38 39 47 <u>68</u> 7 9 17 18 27 <u>41</u> 50 <u>61</u> 0 34 36 43 <u>53</u> 40 49 <u>54</u> 2 3 6 13 23 29 42 <u>55</u> <u>56</u> <u>57</u> <u>59</u> <u>60</u> <u>62</u> <u>63</u> <u>64</u> <u>65</u> <u>66</u> <u>67</u> <u>69</u> <u>70</u> <u>71</u>];

2. For low-index bit mapper for $K_{max}=53$
    (a) $\phi_T=$[0 1 4 6 7 8 17 21 22 24 26 28 32 36 37 38 41 42 44 47 48 51 <u>58</u> 5 13 14 15 19 20 27 30 31 33 40 <u>68</u> 2 11 25 34 35 <u>43</u> 45 <u>61</u> 9 16 18 52 <u>53</u> 3 12 <u>54</u> 10 <u>23</u> 64 39 <u>65</u> 50 <u>62</u> 29 <u>55</u> <u>69</u> <u>71</u> 49 <u>56</u> <u>57</u> <u>67</u> 46 <u>59</u> <u>60</u> <u>63</u> <u>66</u> <u>70</u>];
    (b) $\phi_T=$[51 48 47 44 42 41 38 37 36 32 28 26 24 22 21 17 8 7 6 4 1 0 <u>58</u> 40 33 31 30 27 20 19 15 14 13 5 <u>68</u> 45 43 35 34 25 11 2 <u>61</u> 52 18 16 9 <u>53</u> 12 3 <u>54</u> 23 10 64 39 <u>65</u> 50 <u>62</u> 29 <u>55</u> <u>69</u> <u>71</u> 49 <u>56</u> <u>67</u> <u>57</u> 46 <u>59</u> <u>66</u> <u>60</u> <u>70</u> <u>63</u>];
    (c) $\phi_T=$[0 1 4 6 7 8 17 21 22 24 26 28 32 36 37 38 41 42 44 47 48 51 <u>58</u> 5 13 14 15 19 20 27 30 31 33 40 <u>68</u> 2 11 25 34 35 <u>43</u> 45 <u>61</u> 3 9 10 12 16 18 23 29 39 <u>46</u> 49 50 52 <u>53</u> <u>54</u> <u>55</u> <u>56</u> <u>57</u> <u>59</u> 60 62 63 64 65 66 67 69 70 71];
    (d) $\phi_T=$[51 48 47 44 42 41 38 37 36 32 28 26 24 22 21 17 8 7 6 4 1 0 <u>58</u> 40 33 31 30 27 20 19 15 14 13 5 <u>68</u> 45 43 35 34 25 11 2 <u>61</u> 3 9 10 12 16 18 23 29 39 <u>46</u> 49 50 52 <u>53</u> <u>54</u> <u>55</u> <u>56</u> <u>57</u> <u>59</u> 60 62 63 64 65 66 67 69 <u>70</u> <u>71</u>];
    (e) $\phi_T=$[0 1 4 6 7 8 17 21 22 24 26 28 32 36 37 38 41 42 44 47 48 51 <u>58</u> 5 13 14 15 19 20 27 30 31 33 40 <u>68</u> 2 11 25 34 35 <u>43</u> 45 <u>61</u> 9 16 18 52 <u>53</u> 3 10 12 23 <u>29</u> 39 46 49 50 <u>54</u> <u>55</u> <u>56</u> <u>57</u> <u>59</u> 60 62 <u>63</u> 64 65 66 67 69 70 <u>71</u>];
    (f) $\phi_T=$[51 48 47 44 42 41 38 37 36 32 28 26 24 22 21 17 8 7 6 4 1 0 <u>58</u> 40 33 31 30 27 20 19 15 14 13 5 <u>68</u> 45 43 35 34 25 <u>11</u> 2 <u>61</u> 52 18 16 9 <u>53</u> 3 10 12 23 <u>29</u> 39 46 49 50 <u>54</u> <u>55</u> <u>56</u> <u>57</u> <u>59</u> 60 62 <u>63</u> 64 65 66 67 69 70 <u>71</u>];
    (g) $\phi_T=$[0 1 4 6 7 8 17 21 22 24 26 28 32 36 37 38 41 42 44 47 48 51 <u>58</u> 5 13 14 15 19 20 27 30 31 33 40 <u>68</u> 2 11 25 34 35 <u>43</u> 45 <u>61</u> 9 16 18 52 <u>53</u> 3 12 <u>54</u> 10 <u>23</u> 29 39 46 49 50 <u>55</u> <u>56</u> <u>57</u> <u>59</u> 60 62 <u>63</u> 64 65 <u>66</u> 67 69 70 <u>71</u>];
    (h) $\phi_T=$[51 48 47 44 42 41 38 37 36 32 28 26 24 22 21 17 8 7 6 4 1 0 <u>58</u> 40 33 31 30 27 20 19 15 14 13 5 <u>68</u> 45 43 35 34 25 <u>11</u> 2 <u>61</u> 52 18 16 9 <u>53</u> 12 3 <u>54</u> 10 <u>23</u> 29 39 46 49 50 <u>55</u> <u>56</u> <u>57</u> <u>59</u> 60 62 <u>63</u> 64 65 <u>66</u> 67 69 70 <u>71</u>];

3. For high-index bit mapper for $K_{max}=72$
    (a) $\phi_T=$[3 4 8 11 13 14 17 18 23 30 31 34 38 40 41 43 44 45 47 49 51 52 56 57 58 63 64 65 66 71 <u>87</u> 5 7 9 12 16 20 24 27 29 33 35 39 50 54 67 70 <u>77</u> 0 <u>15</u> 26 28 36 37 46 60 69 <u>80</u> 1 19 55 59 68 <u>73</u> 32 <u>53</u> 61 84 10 62 <u>72</u> 21 <u>81</u> 48 <u>83</u> <u>22</u> <u>76</u> 42 <u>88</u> 2 <u>74</u> <u>75</u> 25 <u>82</u> <u>85</u> <u>6</u> <u>78</u> <u>79</u> <u>86</u> <u>89</u> <u>90</u>];
    (b) $\phi_T=$[3 4 8 11 13 14 17 18 23 30 31 34 38 40 41 43 44 45 47 49 51 52 56 57 58 63 64 65 66 71 <u>87</u> 5 7 9 12 16 20 24 27 29 33 35 39 50 54 67 70 <u>77</u> 0 <u>15</u> 26 28 36 37 46 60 69 <u>80</u> 1 2 6 10 19 21 22 <u>25</u> <u>32</u> 42 48 53 55 59 61 62 68 <u>72</u> <u>73</u> <u>74</u> <u>75</u> <u>76</u> <u>78</u> <u>79</u> <u>81</u> <u>82</u> <u>83</u> <u>84</u> <u>85</u> <u>86</u> <u>88</u> <u>89</u> <u>90</u>];
    (c) $\phi_T=$[3 4 8 11 13 14 17 18 23 30 31 34 38 40 41 43 44 45 47 49 51 52 56 57 58 63 64 65 66 71 <u>87</u> 5 7 9 12 16 20 24 27 29 33 35 39 50 54 67 70 <u>77</u> 0 <u>15</u> 26 28 36 37 46 60 69 <u>80</u> 1 19 55 59 68 <u>73</u> 2 <u>6</u> 10 21 22 25 32 42 48 53 61 <u>62</u> <u>72</u> <u>74</u> <u>75</u> <u>76</u> <u>78</u> <u>79</u> <u>81</u> <u>82</u> <u>83</u> <u>84</u> <u>85</u> <u>86</u> <u>88</u> <u>89</u> <u>90</u>];
    (d) $\phi_T=$[3 4 8 11 13 14 17 18 23 30 31 34 38 40 41 43 44 45 47 49 51 52 56 57 58 63 64 65 66 71 <u>87</u> 5 7 9 12 16 20 24 27 29 33 35 39 50 54 67 70 <u>77</u> 0 <u>15</u> 26 28 36 37 46 60 69 <u>80</u> 1 19 55 59 68 <u>73</u> 32 <u>53</u> 61 84 2 6 10 21 22 25 42 <u>48</u> 62 <u>72</u> <u>74</u> <u>75</u> <u>76</u> <u>78</u> <u>79</u> <u>81</u> <u>82</u> <u>83</u> <u>85</u> <u>86</u> <u>88</u> <u>89</u> <u>90</u>];

4. For low-index bit mapper for $K_{max}=72$
    (a) $\phi_T=$[0 5 6 7 8 13 14 15 19 20 22 24 26 27 28 30 31 33 37 40 41 48 53 54 57 58 60 63 67 68 <u>87</u> 1 4 17 21 32 36 38 42 44 47 51 55 59 62 64 66 <u>77</u> 2 <u>11</u> 25 34 35 43 45 56 71 <u>80</u> 3 12 16 52 70 <u>73</u> 10 <u>18</u> 39 84 9 61 <u>72</u> 50 <u>81</u> 23 <u>83</u> <u>49</u> <u>76</u> 29 <u>88</u> 69 <u>74</u> <u>75</u> 46 <u>82</u> <u>85</u> 65 <u>78</u> <u>79</u> <u>86</u> <u>89</u> <u>90</u>];
    (b) $\phi_T=$[68 67 63 60 58 57 54 53 48 41 40 37 33 31 30 28 27 26 24 22 20 19 15 14 13 8 7 6 5 0 <u>87</u> 66 64 62

59 55 51 47 44 42 38 36 32 21 17 4 1 <u>77</u> 71 56 45 43 35 34 25 11 2 <u>80</u> 70 52 16 12 3 <u>73</u> 39 <u>18</u> 10 <u>84</u> 61 9 72 50 81 23 <u>83</u> 49 <u>76</u> 29 <u>88</u> 69 <u>74 75</u> 46 <u>82 85</u> 65 <u>86 79 78 89 90</u>];

(c) $\phi_T$=[0 5 6 7 8 13 14 15 19 20 22 24 26 27 28 30 31 33 37 40 41 48 53 54 57 58 60 63 67 68 <u>87</u> 1 4 17 21 32 36 38 42 44 47 51 55 59 62 64 66 <u>77 2 11</u> 25 34 35 43 45 56 71 <u>80</u> 3 9 10 12 16 18 23 29 <u>39</u> 46 49 50 52 61 65 69 70 <u>72 73 74 75 76 78 79 81 82 83 84 85 86 88 89 90</u>];

(d) $\phi_T$=[68 67 63 60 58 57 54 53 48 41 40 37 33 31 30 28 27 26 24 22 20 19 15 14 13 8 7 6 5 0 <u>87</u> 66 64 62 59 55 51 47 44 42 38 36 32 21 17 4 1 <u>77 71</u> 56 45 43 35 34 25 11 2 <u>80</u> 3 9 10 12 16 18 23 <u>29</u> 39 46 49 50 52 61 65 69 70 <u>72 73 74 75 76 78 79 81 82 83 84 85 86 88 89 90</u>];

(e) $\phi_T$=[0 5 6 7 8 13 14 15 19 20 22 24 26 27 28 30 31 33 37 40 41 48 53 54 57 58 60 63 67 68 <u>87</u> 1 4 17 21 32 36 38 42 44 47 51 55 59 62 64 66 <u>77 2 11</u> 25 34 35 43 45 56 71 <u>80</u> 3 12 16 52 70 <u>73</u> 9 <u>10</u> 18 23 29 39 46 49 50 61 65 <u>69 72 74 75 76 78 79 81 82 83 84 85 86 88 89 90</u>];

(f) $\phi_T$=[68 67 63 60 58 57 54 53 48 41 40 37 33 31 30 28 27 26 24 22 20 19 15 14 13 8 7 6 5 0 <u>87</u> 66 64 62 59 55 51 47 44 42 38 36 32 21 17 4 1 <u>77 71</u> 56 45 43 35 34 25 11 2 <u>80</u> 70 52 16 12 3 <u>73</u> 9 <u>10</u> 18 23 29 39 46 49 50 61 65 <u>69 72 74 75 76 78 79 81 82 83 84 85 86 88 89 90</u>];

(g) $\phi_T$=[0 5 6 7 8 13 14 15 19 20 22 24 26 27 28 30 31 33 37 40 41 48 53 54 57 58 60 63 67 68 <u>87</u> 1 4 17 21 32 36 38 42 44 47 51 55 59 62 64 66 <u>77 2 11</u> 25 34 35 43 45 56 71 <u>80</u> 3 12 16 52 70 <u>73</u> 10 <u>18</u> 39 <u>84</u> 9 23 29 46 49 50 61 <u>65</u> 69 <u>72 74 75 76 78 79 81 82 83</u> 85 <u>86 88 89 90</u>];

(h) $\phi_T$=[68 67 63 60 58 57 54 53 48 41 40 37 33 31 30 28 27 26 24 22 20 19 15 14 13 8 7 6 5 0 <u>87</u> 66 64 62 59 55 51 47 44 42 38 36 32 21 17 4 1 <u>77 71</u> 56 45 43 35 34 25 11 2 <u>80</u> 70 52 16 12 3 <u>73</u> 39 <u>18</u> 10 <u>84</u> 9 23 29 46 49 50 61 <u>65</u> 69 <u>72 74 75 76 78 79</u> 81 <u>82 83</u> 85 86 <u>88 89 90</u>];

5. For high-index bit mapper for $K_{max}$=140

(e) $\phi_T$=[0 3 6 9 11 12 13 14 15 17 18 19 <u>21</u> 22 28 29 30 37 38 42 43 48 53 57 59 64 65 66 69 71 72 73 78 79 91 92 97 106 111 114 117 119 122 125 126 127 128 130 131 134 136 137 <u>144</u> 1 4 7 10 16 20 23 31 39 44 49 54 58 60 67 70 74 80 <u>93</u> 98 107 112 115 118 120 123 129 132 135 138 <u>145</u> 2 5 8 24 32 40 45 50 55 61 68 75 81 94 99 108 113 116 121 124 133 139 <u>146</u> 26 33 34 41 46 77 83 87 88 89 100 101 104 109 <u>110 147</u> 25 51 56 62 76 82 95 <u>140</u> 27 84 86 96 102 <u>161</u> 36 <u>103</u> 105 <u>150</u> 90 <u>159</u> 52 <u>163</u> 63 <u>153</u> 47 <u>143</u> 85 <u>151 158</u> 160 <u>162</u> 35 141 <u>142</u> 148 <u>149 152</u> 154 <u>155 156 157</u>];

(f) $\phi_T$=[0 3 6 9 11 12 13 14 15 17 18 19 21 22 28 29 30 37 38 42 43 48 53 57 59 64 65 66 69 71 72 73 78 79 91 92 97 106 111 114 117 119 122 125 126 127 128 130 131 134 136 137 <u>144</u> 1 4 7 10 16 20 23 31 39 44 49 54 58 60 67 70 74 80 <u>93</u> 98 107 112 115 118 120 123 129 132 135 138 <u>145</u> 2 5 8 24 32 40 45 50 55 61 68 75 81 94 99 108 113 116 121 124 133 139 <u>146</u> 25 26 27 33 34 35 36 41 46 47 51 52 56 62 63 76 <u>77</u> 82 83 84 85 86 87 88 89 90 95 96 100 101 102 103 104 105 109 110 140 141 142 143 147 148 149 150 151 152 153 154 155 <u>156 157 158 159 160 161 162 163</u>];

(g) $\phi_T$=[0 3 6 9 11 12 13 14 15 17 18 19 21 22 28 29 30 37 38 42 43 48 53 57 59 64 65 66 69 71 72 73 78 79 91 92 97 106 111 114 117 119 122 125 126 127 128 130 131 134 136 137 <u>144</u> 1 4 7 10 16 20 23 31 39 44 49 54 58 60 67 70 74 80 93 98 107 112 115 118 120 123 129 132 135 138 <u>145</u> 2 5 8 24 32 40 45 50 55 61 68 75 81 94 99 108 113 116 121 124 133 139 <u>146</u> 26 33 34 41 46 77 83 87 88 89 100 101 104 109 <u>110 147</u> 25 27 35 36 47 51 52 56 62 63 76 82 84 85 86 90 <u>95</u> 96 102 103 105 <u>140 141 142</u> 143 148 149 150 <u>151 152 153 154 155 156 157 158 159 160 161 162 163</u>];

(h) $\phi_T$=[0 3 6 9 11 12 13 14 15 17 18 19 21 22 28 29 30 37 38 42 43 48 53 57 59 64 65 66 69 71 72 73 78 79 91 92 97 106 111 114 117 119 122 125 126 127 128 130 131 134 136 137 <u>144</u> 1 4 7 10 16 20 23 31 39 44 49 54 58 60 67 70 74 80 <u>93</u> 98 107 112 115 118 120 123 129 132 135 138 <u>145</u> 2 5 8 24 32 40 45 50 55 61 68 75 81 94 99 108 113 116 121 124 133 139 <u>146</u> 26 33 34 41 46 77 83 87 88 89 100 101 104 109 <u>110 147</u> 25 51 56 62 76 82 95 <u>140</u> 27 35 36 47 52 63 84 85 <u>86</u> 90 96 102 103 105 <u>141 142</u> 143 148 149 150 <u>151 152 153 154 155 156 157 158 159 160 161 162 163</u>];

(i) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 10<u>3</u> 117 125 131 136 <u>142</u> 12 17 23 37 48 75 80 86 137 <u>143</u> 13 18 38 <u>144</u> 39 <u>145</u> 40 146 41 <u>147</u> 148 149 150 <u>151</u> 152 153 <u>154 155 156 157 158 159 160 161 162 163</u>];

(j) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 10<u>3</u> 117 125 131 136 <u>142</u> 12 13 17 18 23 37 38 39 40 41 48 75 80 86 137 <u>143 144</u> 145 146 147 148 149 150 151 152 153 154 155 <u>156 157 158 159 160 161 162 163</u>];

(k) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 10<u>3</u> 117 125 131 136 <u>142</u> 12 17 23 37 48 75 80 86 137 <u>143</u> 13 18 38 39 40 41 <u>144</u> 145 146 147 148 149 150 <u>151</u> 152 153 154 155 156 <u>157 158 159 160 161 162 163</u>];

(l) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 10<u>3</u> 117 125 131 136 <u>142</u> 12 17 23 37 48 75 80 86 137 <u>143</u> 13 18 38 <u>144</u> 39 <u>40</u> 41 <u>145</u> 146 147 148 149 150 <u>151</u> 152 153 <u>154</u> 155 156 <u>157 158 159 160 161 162 163</u>];

(m) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55

57 60 63 68 73 78 84 90 92 94 96 99 102 105 107 109 112 114 116 121 124 128 130 133 135 141 6 11 16 22 30 33 36 44 47 64 74 79 85 97 100 103 117 125 131 136 142 12 17 23 37 48 75 80 86 137 143 13 18 38 144 39 145 40 41 146 147 148 149 150 151 152 153 154 155 156 157 158 159 160 161 162 163];

(n) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 140 1 3 5 8 10 15 21 27 29 32 35 43 46 52 55 57 60 63 68 73 78 84 90 92 94 96 99 102 105 107 109 112 114 116 121 124 128 130 133 135 141 6 11 16 22 30 33 36 44 47 64 74 79 85 97 100 103 117 125 131 136 142 12 13 18 23 38 39 80 137 145 17 40 75 146 48 149 37 86 143 144 41 147 148 150 151 152 153 154 155 156 157 158 159 160 161 162 163];

(o) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 140 1 3 5 8 10 15 21 27 29 32 35 43 46 52 55 57 60 63 68 73 78 84 90 92 94 96 99 102 105 107 109 112 114 116 121 124 128 130 133 135 141 6 11 16 22 30 33 36 44 47 64 74 79 85 97 100 103 117 125 131 136 142 12 13 17 18 23 37 38 39 40 41 48 75 80 86 137 143 144 145 146 147 148 149 150 151 152 153 154 155 156 157 158 159 160 161 162 163];

(p) $\phi_{PT}$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 140 1 3 5 8 10 15 21 27 29 32 35 43 46 52 55 57 60 63 68 73 78 84 90 92 94 96 99 102 105 107 109 112 114 116 121 124 128 130 133 135 141 6 11 16 22 30 33 36 44 47 64 74 79 85 97 100 103 117 125 131 136 142 12 13 18 23 38 39 80 137 145 17 37 40 41 48 75 86 143 144 146 147 148 149 150 151 152 153 154 155 156 157 158 159 160 161 162 163];

(q) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 140 1 3 5 8 10 15 21 27 29 32 35 43 46 52 55 57 60 63 68 73 78 84 90 92 94 96 99 102 105 107 109 112 114 116 121 124 128 130 133 135 141 6 11 16 22 30 33 36 44 47 64 74 79 85 97 100 103 117 125 131 136 142 12 13 18 23 38 39 80 137 145 17 40 75 146 37 41 48 86 143 144 147 148 149 150 151 152 153 154 155 156 157 158 159 160 161 162 163];

(r) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 140 1 3 5 8 10 15 21 27 29 32 35 43 46 52 55 57 60 63 68 73 78 84 90 92 94 96 99 102 105 107 109 112 114 116 121 124 128 130 133 135 141 6 11 16 22 30 33 36 44 47 64 74 79 85 97 100 103 117 125 131 136 142 12 13 18 23 38 39 80 137 145 17 40 75 146 48 149 37 41 86 143 144 147 148 150 151 152 153 154 155 156 157 158 159 160 161 162 163];

(s) $\phi_T$=[0 2 4 5 10 11 12 16 18 19 23 24 25 28 33 35 37 38 39 41 42 47 48 51 52 53 55 56 58 59 62 66 67 71 72 76 79 81 82 85 86 91 98 99 102 106 108 109 111 112 113 115 117 119 120 124 125 126 131 132 133 134 139 155 3 7 9 15 17 21 29 30 40 43 44 46 57 60 61 63 64 77 84 87 90 96 103 104 107 114 116 118 122 129 130 136 137 138 144 8 27 31 34 49 50 65 74 93 94 95 97 100 101 105 121 127 147 13 26 36 54 73 75 89 92 135 146 14 32 80 88 145 68 69 128 152 1 6 20 78 151 22 83 148 149 123 141 45 140 70 153 154 110 142 143 150 156 157 158];

(t) $\phi_T$=[0 2 4 5 10 11 12 16 18 19 23 24 25 28 33 35 37 38 39 41 42 47 48 51 52 53 55 56 58 59 62 66 67 71 72 76 79 81 82 85 86 91 98 99 102 106 108 109 111 112 113 115 117 119 120 124 125 126 131 132 133 134 139 155 3 7 9 15 17 21 29 30 40 43 44 46 57 60 61 63 64 77 84 87 90 96 103 104 107 114 116 118 122 129 130 136 137 138 144 8 27 31 34 49 50 65 74 93 94 95 97 100 101 105 121 127 147 1 6 13 14 20 22 26 32 36 45 54 68 69 70 73 75 78 80 83 88 89 92 110 123 128 135 140 141 142 143 145 146 148 149 150 151 152 153 154 156 157 158];

(u) $\phi_T$=[0 2 4 5 10 11 12 16 18 19 23 24 25 28 33 35 37 38 39 41 42 47 48 51 52 53 55 56 58 59 62 66 67 71 72 76 79 81 82 85 86 91 98 99 102 106 108 109 111 112 113 115 117 119 120 124 125 126 131 132 133 134 139 155 3 7 9 15 17 21 29 30 40 43 44 46 57 60 61 63 64 77 84 87 90 96 103 104 107 114 116 118 122 129 130 136 137 138 144 8 27 31 34 49 50 65 74 93 94 95 97 100 101 105 121 127 147 13 26 36 54 73 75 89 92 135 146 1 6 14 20 22 32 45 68 69 70 78 80 83 88 110 123 128 140 141 142 143 145 148 149 150 151 152 153 154 156 157 158];

(v) $\phi_T$=[0 2 4 5 10 11 12 16 18 19 23 24 25 28 33 35 37 38 39 41 42 47 48 51 52 53 55 56 58 59 62 66 67 71 72 76 79 81 82 85 86 91 98 99 102 106 108 109 111 112 113 115 117 119 120 124 125 126 131 132 133 134 139 155 3 7 9 15 17 21 29 30 40 43 44 46 57 60 61 63 64 77 84 87 90 96 103 104 107 114 116 118 122 129 130 136 137 138 144 8 27 31 34 49 50 65 74 93 94 95 97 100 101 105 121 127 147 13 26 36 54 73 75 89 92 135 146 14 32 80 88 145 1 6 20 22 45 68 69 70 78 83 110 123 128 140 141 142 143 148 149 150 151 152 153 154 156 157 158];

6. For low-index bit mapper for $K_{max}$=140

(i) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 144 1 4 7 10 16 19 21 24 27 32 41 46 59 65 69 72 79 81 85 90 95 100 108 116 119 123 129 132 135 138 145 0 6 15 18 23 26 31 40 45 58 64 71 78 84 89 94 99 107 115 131 134 137 146 29 30 35 38 39 50 51 52 56 62 93 98 105 106 113 147 44 57 63 77 83 88 114 140 37 43 53 55 112 161 34 36 103 150 49 159 87 163 76 153 92 143 54 151 158 160 162 104 141 142 148 149 152 154 155 156 157];

(j) $\phi_T$=[139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 144 138 135 132 129 123 119 116 108 100 95 90 85 81 79 72 69 65 59 46 41 32 27 24 21 19 16 10 7 4 1 145 137 134 131 115 107 99 94 89 84 78 71 64 58 45 40 31 26 23 18 15 6 0 146 113 106 105 98 93 62 56 52 51 50 39 38 35 30 29 147 114 88 83 77 63 57 44 140 112 55 53 43 37 161 103 36 34 150 49 159 87 163 76 153 92 143 54 151 158 160 162 104 141 142 148 149 152 154 155 156 157];

(k) [2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 144 1 4 7 10 16 19 21 24 27 32 41 46 59 65 69 72 79 81 85 90 95 100 108 116 119 123 129 132 135 138 145 0 6 15 18 23 26 31 40 45 58 64 71 78 84

89 94 99 107 115 131 134 137 $\overline{146}$ 29 30 34 35 36 37 38 39 43 44 49 50 51 52 53 54 $\overline{55}$ 56 57 62 63 76 77 83 87 88 92 93 98 103 104 105 106 112 113 114 $\overline{140}$ 141 142 143 147 148 149 150 151 152 153 154 155 $\overline{156}$ 157 158 159 160 161 162 163];

(l) $\phi_T$=[139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 $\overline{144}$ 138 135 132 129 123 119 116 108 100 95 90 85 81 $\overline{79}$ 72 69 65 59 46 41 32 27 24 21 19 16 10 7 4 1 $\overline{145}$ 137 134 131 115 107 99 94 89 84 78 71 64 58 45 $\overline{40}$ 31 26 23 18 15 6 0 $\overline{146}$ 114 113 112 106 105 104 103 98 93 92 88 87 83 $\overline{77}$ 76 63 62 57 56 55 54 53 52 51 50 49 44 43 39 38 37 36 35 34 30 29 $\overline{140}$ 141 142 143 147 148 149 150 151 152 153 154 $\overline{155}$ 156 157 158 159 160 161 162 163];

(m) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 $\overline{144}$ 1 4 7 10 16 19 21 24 27 32 41 46 59 65 69 72 79 $\overline{81}$ 85 90 95 100 108 116 119 123 129 132 135 138 $\overline{145}$ 0 6 15 18 23 26 31 40 45 58 64 71 78 84 89 94 99 $\overline{107}$ 115 131 134 137 $\overline{146}$ 29 30 35 38 39 50 51 52 56 62 93 98 105 106 113 $\overline{147}$ 34 36 37 43 44 49 53 54 55 57 63 76 77 83 87 88 92 $\overline{103}$ 104 112 114 $\overline{140}$ 141 142 143 148 149 150 151 152 153 154 155 156 $\overline{157}$ 158 159 160 161 162 163];

(n) $\phi_T$=[139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 $\overline{144}$ 138 135 132 129 123 119 116 108 100 95 90 85 81 $\overline{79}$ 72 69 65 59 46 41 32 27 24 21 19 16 10 7 4 1 $\overline{145}$ 137 134 131 115 107 99 94 89 84 78 71 64 58 45 $\overline{40}$ 31 26 23 18 15 6 0 $\overline{146}$ 113 106 105 98 93 62 56 52 51 50 39 38 35 30 29 $\overline{147}$ 114 112 104 103 92 88 87 83 77 76 63 57 55 54 $\overline{53}$ 49 44 43 37 36 34 $\overline{140}$ 141 142 143 148 149 150 151 152 153 154 155 156 $\overline{157}$ 158 159 160 161 162 163];

(o) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 $\overline{144}$ 1 4 7 10 16 19 21 24 27 32 41 46 59 65 69 72 79 $\overline{81}$ 85 90 95 100 108 116 119 123 129 132 135 138 $\overline{145}$ 0 6 15 18 23 26 31 40 45 58 64 71 78 84 89 94 99 $\overline{107}$ 115 131 134 137 $\overline{146}$ 29 30 35 38 39 50 51 52 56 62 93 98 105 106 113 $\overline{147}$ 44 57 63 77 83 88 114 $\overline{140}$ 34 36 37 43 49 53 54 55 $\overline{76}$ 87 92 103 104 112 141 $\overline{142}$ 143 148 149 150 151 152 153 154 155 156 $\overline{157}$ 158 159 160 161 162 163];

(p) $\phi_T$=[139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 $\overline{144}$ 138 135 132 129 123 119 116 108 100 95 90 85 81 $\overline{79}$ 72 69 65 59 46 41 32 27 24 21 19 16 10 7 4 1 $\overline{145}$ 137 134 131 115 107 99 94 89 84 78 71 64 58 45 $\overline{40}$ 31 26 23 18 15 6 0 $\overline{146}$ 113 106 105 98 93 62 56 52 51 50 39 38 35 30 29 $\overline{147}$ 114 88 83 77 63 57 44 $\overline{140}$ 112 104 103 92 87 76 $\overline{55}$ 54 53 49 43 37 36 34 $\overline{141}$ $\overline{142}$ 143 148 149 150 151 152 153 154 155 156 $\overline{157}$ 158 159 160 161 162 163];

(q) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 $\overline{140}$ 4 6 9 11 15 18 23 25 27 30 32 34 37 40 43 45 47 $\overline{49}$ 55 61 66 71 76 79 82 84 87 93 96 104 107 110 112 118 124 129 131 134 136 138 $\overline{141}$ 3 8 14 22 36 39 42 54 60 65 75 92 95 103 106 109 117 123 128 133 $\overline{142}$ 2 53 59 64 91 102 116 122 127 $\overline{143}$ 101 121 126 $\overline{144}$ 100 $\overline{145}$ 99 $\overline{146}$ 98 $\overline{147}$ 148 $\overline{149}$ $\overline{150}$ 151 $\overline{152}$ 153 $\overline{154}$ 155 $\overline{156}$ 157 $\overline{158}$ 159 $\overline{160}$ 161 $\overline{162}$ 163];

(r) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 $\overline{140}$ 138 136 134 131 129 124 118 112 110 107 104 96 $\overline{93}$ 87 84 82 79 76 71 66 61 55 49 47 45 43 40 37 34 32 30 27 25 23 18 15 11 9 6 4 $\overline{141}$ 133 128 123 117 109 106 103 95 92 75 65 60 54 $\overline{42}$ 39 36 22 14 8 3 $\overline{142}$ 127 122 116 102 91 64 59 53 2 $\overline{143}$ 126 121 101 $\overline{144}$ 100 $\overline{145}$ 99 $\overline{146}$ 98 $\overline{147}$ 148 149 $\overline{150}$ 151 $\overline{152}$ 153 $\overline{154}$ 155 $\overline{156}$ 157 $\overline{158}$ 159 $\overline{160}$ 161 $\overline{162}$ 163];

(s) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 $\overline{140}$ 4 6 9 11 15 18 23 25 27 30 32 34 37 40 43 45 47 $\overline{49}$ 55 61 66 71 76 79 82 84 87 93 96 104 107 110 112 118 124 129 131 134 136 138 $\overline{141}$ 3 8 14 22 36 39 42 54 60 65 75 92 95 103 106 109 $\overline{117}$ 123 128 133 $\overline{142}$ 2 53 59 64 91 98 99 100 101 102 116 121 122 126 $\overline{127}$ $\overline{143}$ $\overline{144}$ $\overline{145}$ $\overline{146}$ 147 $\overline{148}$ 149 $\overline{150}$ 151 $\overline{152}$ 153 $\overline{154}$ 155 $\overline{156}$ 157 $\overline{158}$ 159 $\overline{160}$ 161 $\overline{162}$ 163];

(t) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 $\overline{140}$ 138 136 134 131 129 124 118 112 110 107 104 96 $\overline{93}$ 87 84 82 79 76 71 66 61 55 49 47 45 43 40 37 34 32 30 27 25 23 18 15 11 9 6 4 $\overline{141}$ 133 128 123 117 109 106 103 95 92 75 65 60 54 $\overline{42}$ 39 36 22 14 8 3 $\overline{142}$ 2 53 59 64 91 98 99 100 101 102 116 121 122 126 $\overline{127}$ $\overline{143}$ $\overline{144}$ $\overline{145}$ $\overline{146}$ 147 $\overline{148}$ 149 $\overline{150}$ 151 $\overline{152}$ 153 $\overline{154}$ 155 $\overline{156}$ 157 $\overline{158}$ 159 $\overline{160}$ 161 $\overline{162}$ 163];

(u) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 $\overline{140}$ 4 6 9 11 15 18 23 25 27 30 32 34 37 40 43 45 47 $\overline{49}$ 55 61 66 71 76 79 82 84 87 93 96 104 107 110 112 118 124 129 131 134 136 138 $\overline{141}$ 3 8 14 22 36 39 42 54 60 65 75 92 95 103 106 109 $\overline{117}$ 123 128 133 $\overline{142}$ 2 53 59 64 91 102 116 122 127 $\overline{143}$ 98 99 100 101 $\overline{121}$ 126 $\overline{144}$ $\overline{145}$ $\overline{146}$ 147 $\overline{148}$ 149 $\overline{150}$ 151 $\overline{152}$ 153 $\overline{154}$ 155 $\overline{156}$ 157 $\overline{158}$ 159 $\overline{160}$ 161 $\overline{162}$ 163];

(v) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 $\overline{140}$ 138 136 134 131 129 124 118 112 110 107 104 96 $\overline{93}$ 87 84 82 79 76 71 66 61 55 49 47 45 43 40 37 34 32 30 27 25 23 18 15 11 9 6 4 $\overline{141}$ 133 128 123 117 109 106 103 95 92 75 65 60 54 $\overline{42}$ 39 36 22 14 8 3 $\overline{142}$ 127 122 116 102 91 64 59 53 2 $\overline{143}$ 98 99 100 101 121 126 $\overline{144}$ $\overline{145}$ $\overline{146}$ 147 $\overline{148}$ 149 $\overline{150}$ 151 $\overline{152}$ 153 $\overline{154}$ 155 $\overline{156}$ 157 $\overline{158}$ 159 $\overline{160}$ 161 $\overline{162}$ 163];

(w) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 $\overline{140}$ 4 6 9 11 15 18 23 25 27 30 32 34 37 40 43 45 47 $\overline{49}$ 55 61 66 71 76 79 82 84 87 93 96 104 107 110 112 118 124 129 131 134 136 138 $\overline{141}$ 3 8 14 22 36 39 42 54 60 65 75 92 95 103 106 109 $\overline{117}$ 123 128 133 $\overline{142}$ 2 53 59 64 91 102 116 122 127 <u>143</u> 101 121 126 <u>144</u> 98 99 100 <u>145</u> <u>146</u> <u>147</u> <u>148</u> <u>149</u> <u>150</u> <u>151</u> <u>152</u> <u>153</u> <u>154</u> <u>155</u> <u>156</u> <u>157</u> <u>158</u> <u>159</u> <u>160</u> <u>161</u> <u>162</u> <u>163</u>];

(x) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 <u>140</u> 138 136 134 131 129 124 118 112 110 107 104 96 <u>93</u> 87 84 82 79 76 71 66 61 55 49 47 45 43 40 37 34 32 30 27 25 23 18 15 11 9 6 4 <u>141</u> 133 128 123 117 109 106 103 95 92 75 65 60 54 <u>42</u> 39 36 22 14 8 3 <u>142</u> 127 122 116 102 91 64 59 53 2 <u>143</u> 126 121 101 <u>144</u> 98 99 100 <u>145</u> <u>146</u> <u>147</u> <u>148</u> <u>149</u> <u>150</u> <u>151</u> <u>152</u> <u>153</u> <u>154</u> 155 156 <u>157</u> <u>158</u> <u>159</u> <u>160</u> <u>161</u> <u>162</u> <u>163</u>];

(y) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 <u>140</u> 4 6 9 11 15 18 23 25 27 30 32 34 37 40 43 45 47 <u>49</u> 55 61 66 71 76 79 82 84 87 93 96 104 107 110 112 118 124 129 131 134 136 138 <u>141</u> 3 8 14 22 36 39 42 54 60 65 75 92 95 103 106 109 <u>117</u> 123 128 133 <u>142</u> 2 53 59 64 91 102 116 122 127 <u>143</u> 101 121 126 <u>144</u> 100 <u>145</u> 98 99 <u>146</u> <u>147</u> <u>148</u> <u>149</u> <u>150</u> <u>151</u> <u>152</u> <u>153</u> <u>154</u> <u>155</u> <u>156</u> 157 <u>158</u> <u>159</u> <u>160</u> <u>161</u> <u>162</u> <u>163</u>];

(z) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 <u>140</u> 138 136 134 131 129 124 118 112 110 107 104 96 <u>93</u> 87 84 82 79 76 71 66 61 55 49 47 45 43 40 37 34 32 30 27 25 23 18 15 11 9 6 4 <u>141</u> 133 128 123 117 109 106 103 95 92 75 65 60 54 <u>42</u> 39 36 22 14 8 3 <u>142</u> 127 122 116 102 91 64 59 53 2 <u>143</u> 126 121 101 <u>144</u> 100 <u>145</u> 98 99 <u>146</u> <u>147</u> <u>148</u> <u>149</u> <u>150</u> <u>151</u> <u>152</u> <u>153</u> <u>154</u> 155 <u>156</u> 157 <u>158</u> <u>159</u> <u>160</u> <u>161</u> <u>162</u> <u>163</u>];

(aa) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 <u>140</u> 4 6 9 11 15 18 23 25 27 30 32 34 37 40 43 45 47 <u>49</u> <u>55</u> 61 66 71 76 79 82 84 87 93 96 104 107 110 112 118 124 129 131 134 136 138 <u>141</u> 3 8 14 22 36 39 42 54 60 65 75 92 95 103 106 109 <u>117</u> 123 128 133 <u>142</u> 2 59 100 101 116 121 126 127 <u>145</u> 64 99 122 <u>146</u> 91 149 53 102 <u>143</u> <u>144</u> 98 <u>147</u> <u>148</u> <u>150</u> <u>151</u> <u>152</u> <u>153</u> <u>154</u> <u>155</u> 156 <u>157</u> <u>158</u> <u>159</u> <u>160</u> <u>161</u> <u>162</u> <u>163</u>];

(bb) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 <u>140</u> 138 136 134 131 129 124 118 112 110 107 104 96 <u>93</u> 87 84 82 79 76 71 66 61 55 49 47 45 43 40 37 34 32 30 27 25 23 18 15 11 9 6 4 <u>141</u> 133 128 123 117 109 106 103 95 92 75 65 60 54 <u>42</u> 39 36 22 14 8 3 <u>142</u> 127 126 121 116 101 100 59 2 <u>145</u> 122 99 64 <u>146</u> 91 <u>149</u> 102 53 <u>143</u> <u>144</u> 98 <u>147</u> <u>148</u> <u>150</u> <u>151</u> <u>152</u> <u>153</u> <u>154</u> <u>155</u> 156 <u>157</u> <u>158</u> <u>159</u> 160 <u>161</u> <u>162</u> <u>163</u>];

(cc) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 <u>140</u> 4 6 9 11 15 18 23 25 27 30 32 34 37 40 43 45 47 <u>49</u> <u>55</u> 61 66 71 76 79 82 84 87 93 96 104 107 110 112 118 124 129 131 134 136 138 <u>141</u> 3 8 14 22 36 39 42 54 60 65 75 92 95 103 106 109 <u>117</u> 123 128 133 <u>142</u> 2 53 59 64 91 98 99 100 101 102 116 121 122 126 127 <u>143</u> <u>144</u> <u>145</u> <u>146</u> <u>147</u> <u>148</u> <u>149</u> <u>150</u> <u>151</u> <u>152</u> <u>153</u> <u>154</u> <u>155</u> <u>156</u> <u>157</u> <u>158</u> <u>159</u> <u>160</u> <u>161</u> <u>162</u> <u>163</u>];

(dd) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 <u>140</u> 138 136 134 131 129 124 118 112 110 107 104 96 <u>93</u> 87 84 82 79 76 71 66 61 55 49 47 45 43 40 37 34 32 30 27 25 23 18 15 11 9 6 4 <u>141</u> 133 128 123 117 109 106 103 95 92 75 65 60 54 <u>42</u> 39 36 22 14 8 3 <u>142</u> 2 53 59 64 91 98 99 100 101 102 116 121 122 126 127 <u>143</u> <u>144</u> <u>145</u> <u>146</u> <u>147</u> <u>148</u> <u>149</u> <u>150</u> <u>151</u> <u>152</u> <u>153</u> <u>154</u> <u>155</u> <u>156</u> <u>157</u> <u>158</u> <u>159</u> <u>160</u> <u>161</u> <u>162</u> <u>163</u>];

(ee) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 <u>140</u> 4 6 9 11 15 18 23 25 27 30 32 34 37 40 43 45 47 <u>49</u> 55 61 66 71 76 79 82 84 87 93 96 104 107 110 112 118 124 129 131 134 136 138 <u>141</u> 3 8 14 22 36 39 42 54 60 65 75 92 95 103 106 109 <u>117</u> 123 128 133 <u>142</u> 2 59 100 101 116 121 126 127 <u>145</u> 53 64 91 98 99 <u>102</u> 122 <u>143</u> <u>144</u> <u>146</u> <u>147</u> <u>148</u> <u>149</u> <u>150</u> <u>151</u> <u>152</u> <u>153</u> <u>154</u> <u>155</u> <u>156</u> <u>157</u> <u>158</u> <u>159</u> <u>160</u> <u>161</u> <u>162</u> <u>163</u>];

(ff) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 <u>140</u> 138 136 134 131 129 124 118 112 110 107 104 96 <u>93</u> 87 84 82 79 76 71 66 61 55 49 47 45 43 40 37 34 32 30 27 25 23 18 15 11 9 6 4 <u>141</u> 133 128 123 117 109 106 103 95 92 75 65 60 54 <u>42</u> 39 36 22 14 8 3 <u>142</u> 127 126 121 116 101 100 59 2 <u>145</u> 53 64 91 98 99 <u>102</u> 122 <u>143</u> <u>144</u> <u>146</u> <u>147</u> <u>148</u> <u>149</u> <u>150</u> <u>151</u> <u>152</u> <u>153</u> <u>154</u> <u>155</u> <u>156</u> <u>157</u> <u>158</u> <u>159</u> <u>160</u> <u>161</u> <u>162</u> <u>163</u>];

(gg) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 <u>140</u> 4 6 9 11 15 18 23 25 27 30 32 34 37 40 43 45 47 <u>49</u> 55 61 66 71 76 79 82 84 87 93 96 104 107 110 112 118 124 129 131 134 136 138 <u>141</u> 3 8 14 22 36 39 42 54 60 65 75 92 95 103 106 109 <u>117</u> 123 128 133 <u>142</u> 2 59 100 101 116 121 126 127 <u>145</u> 64 99 122 <u>146</u> 53 91 98 102 <u>143</u> <u>144</u> <u>147</u> <u>148</u> <u>149</u> <u>150</u> <u>151</u> <u>152</u> <u>153</u> <u>154</u> 155 156 <u>157</u> <u>158</u> <u>159</u> <u>160</u> <u>161</u> <u>162</u> <u>163</u>];

(hh) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 <u>140</u> 138 136 134 131 129 124 118 112 110 107 104 96 <u>93</u> 87 84 82 79 76 71 66 61 55 49 47 45 43 40 37 34 32 30 27 25 23 18 15 11 9 6 4 <u>141</u> 133 128 123 117 109 106 103 95 92 75 65 60 54 <u>42</u> 39 36 22 14 8 3 <u>142</u> 127 126 121 116 101 100 59 2 <u>145</u> 122 99 64 <u>146</u> 53 91 98 102 <u>143</u> <u>144</u> <u>147</u> <u>148</u> <u>149</u> <u>150</u> <u>151</u> <u>152</u> <u>153</u> <u>154</u> 155 <u>156</u> <u>157</u> <u>158</u> <u>159</u> 160 <u>161</u> <u>162</u> <u>163</u>];

(ii) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 <u>140</u> 4 6 9 11 15 18 23 25 27 30 32 34 37 40 43 45 47 <u>49</u> <u>55</u> 61 66 71 76 79 82 84 87 93 96 104 107 110 112 118 124 129 131 134 136 138 <u>141</u> 3 8 14 22 36 39 42 54 60 65 75 92 95 103 106 109 <u>117</u> 123 128 133 <u>142</u> 2 59 100 101 116 121 126 127 <u>145</u> 64 99 122 <u>146</u> 91

149 53 98 102 143 144 147 148 150 151 152 153 154 155 156 157 158 159 160 161 162 163];

(jj) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 126 121 116 101 100 59 2 145 122 99 64 146 91 149 53 98 102 143 144 147 148 150 151 152 153 154 155 156 157 158 159 160 161 162 163];

(kk) $\phi_T$=[0 5 6 7 8 13 14 15 19 20 22 24 26 27 28 30 31 33 37 40 41 48 53 54 57 58 60 63 67 68 72 73 77 80 81 83 84 86 87 88 91 92 97 98 100 101 102 104 106 111 114 115 116 120 121 123 127 128 129 134 135 137 139 155 1 2 3 9 10 17 21 23 25 32 35 36 43 49 52 55 62 75 76 78 79 82 93 95 96 99 109 110 118 122 124 130 132 136 144 12 18 34 38 39 42 44 45 46 65 74 89 90 105 108 112 131 147 4 47 50 64 66 85 103 113 126 146 51 59 107 125 145 11 70 71 152 61 119 133 138 151 56 117 148 149 16 141 94 140 69 153 154 29 142 143 150 156 157 158];

(ll) $\phi_T$=[139 137 135 134 129 128 127 123 121 120 116 115 114 111 106 104 102 101 100 98 97 92 91 88 87 86 84 83 81 80 77 73 72 68 67 63 60 58 57 54 53 48 41 40 37 33 31 30 28 27 26 24 22 20 19 15 14 13 8 7 6 5 0 155 136 132 130 124 122 118 110 109 99 96 95 93 82 79 78 76 75 62 55 52 49 43 36 35 32 25 23 21 17 10 9 3 2 1 144 131 112 108 105 90 89 74 65 46 45 44 42 39 38 34 18 12 147 126 113 103 85 66 64 50 47 4 146 125 107 59 51 145 71 70 11 152 138 133 119 61 151 117 56 148 149 16 141 94 140 69 153 154 29 143 142 150 156 157 158];

(mm) $\phi_T$=[0 5 6 7 8 13 14 15 19 20 22 24 26 27 28 30 31 33 37 40 41 48 53 54 57 58 60 63 67 68 72 73 77 80 81 83 84 86 87 88 91 92 97 98 100 101 102 104 106 111 114 115 116 120 121 123 127 128 129 134 135 137 139 155 1 2 3 9 10 17 21 23 25 32 35 36 43 49 52 55 62 75 76 78 79 82 93 95 96 99 109 110 118 122 124 130 132 136 144 12 18 34 38 39 42 44 45 46 65 74 89 90 105 108 112 131 147 4 11 16 29 47 50 51 56 59 61 64 66 69 70 71 85 94 103 107 113 117 119 125 126 133 138 140 141 142 143 145 146 148 149 150 151 152 153 154 156 157 158];

(nn) $\phi_T$=[139 137 135 134 129 128 127 123 121 120 116 115 114 111 106 104 102 101 100 98 97 92 91 88 87 86 84 83 81 80 77 73 72 68 67 63 60 58 57 54 53 48 41 40 37 33 31 30 28 27 26 24 22 20 19 15 14 13 8 7 6 5 0 155 136 132 130 124 122 118 110 109 99 96 95 93 82 79 78 76 75 62 55 52 49 43 36 35 32 25 23 21 17 10 9 3 2 1 144 131 112 108 105 90 89 74 65 46 45 44 42 39 38 34 18 12 147 4 11 16 29 47 50 51 56 59 61 64 66 69 70 71 85 94 103 107 113 117 119 125 126 133 138 140 141 142 143 145 146 148 149 150 151 152 153 154 156 157 158];

(oo) $\phi_T$=[0 5 6 7 8 13 14 15 19 20 22 24 26 27 28 30 31 33 37 40 41 48 53 54 57 58 60 63 67 68 72 73 77 80 81 83 84 86 87 88 91 92 97 98 100 101 102 104 106 111 114 115 116 120 121 123 127 128 129 134 135 137 139 155 1 2 3 9 10 17 21 23 25 32 35 36 43 49 52 55 62 75 76 78 79 82 93 95 96 99 109 110 118 122 124 130 132 136 144 12 18 34 38 39 42 44 45 46 65 74 89 90 105 108 112 131 147 4 47 50 64 66 85 103 113 126 146 11 16 29 51 56 59 61 69 70 71 94 107 117 119 125 133 138 140 141 142 143 145 148 149 150 151 152 153 154 156 157 158];

(pp) $\phi_T$=[139 137 135 134 129 128 127 123 121 120 116 115 114 111 106 104 102 101 100 98 97 92 91 88 87 86 84 83 81 80 77 73 72 68 67 63 60 58 57 54 53 48 41 40 37 33 31 30 28 27 26 24 22 20 19 15 14 13 8 7 6 5 0 155 136 132 130 124 122 118 110 109 99 96 95 93 82 79 78 76 75 62 55 52 49 43 36 35 32 25 23 21 17 10 9 3 2 1 144 131 112 108 105 90 89 74 65 46 45 44 42 39 38 34 18 12 147 126 113 103 85 66 64 50 47 4 146 11 16 29 51 56 59 61 69 70 71 94 107 117 119 125 133 138 140 141 142 143 145 148 149 150 151 152 153 154 156 157 158 ];

(qq) $\phi_T$=[0 5 6 7 8 13 14 15 19 20 22 24 26 27 28 30 31 33 37 40 41 48 53 54 57 58 60 63 67 68 72 73 77 80 81 83 84 86 87 88 91 92 97 98 100 101 102 104 106 111 114 115 116 120 121 123 127 128 129 134 135 137 139 155 1 2 3 9 10 17 21 23 25 32 35 36 43 49 52 55 62 75 76 78 79 82 93 95 96 99 109 110 118 122 124 130 132 136 144 12 18 34 38 39 42 44 45 46 65 74 89 90 105 108 112 131 147 4 47 50 64 66 85 103 113 126 146 51 59 107 125 145 11 16 29 56 61 69 70 71 94 117 119 133 138 140 141 142 143 148 149 150 151 152 153 154 156 157 158];

(rr) $\phi_T$=[139 137 135 134 129 128 127 123 121 120 116 115 114 111 106 104 102 101 100 98 97 92 91 88 87 86 84 83 81 80 77 73 72 68 67 63 60 58 57 54 53 48 41 40 37 33 31 30 28 27 26 24 22 20 19 15 14 13 8 7 6 5 0 155 136 132 130 124 122 118 110 109 99 96 95 93 82 79 78 76 75 62 55 52 49 43 36 35 32 25 23 21 17 10 9 3 2 1 144 131 112 108 105 90 89 74 65 46 45 44 42 39 38 34 18 12 147 126 113 103 85 66 64 50 47 4 146 125 107 59 51 145 11 16 29 56 61 69 70 71 94 117 119 133 138 140 141 142 143 148 149 150 151 152 153 154 156 157 158];

7. For high-index bit mapper for $K_{max}$=160

(a) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 160 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 161 12 26 31 36 42 50 53 56 64 67 84 94 99 105 117 120 123 137 145 151 156 162 13 32 37 43 57 68 95 100 106 157 163 33 38 58 164 59 165 60 166 61 167 168 169 170 171 172 173 174 175 176 177 178 179 180 181 182 183];

(b) $\phi_T$=[0 3 4 5 7 12 16 18 20 23 26 29 31 32 33 34 35 37 38 39 41 42 48 49 50 57 58 62 63 68 73 77 79 84 85 86 89 91 92 93 98 99 111 112 117 126 131 134 137 139 142 145 146 147 148 150 151 154 156 157 164 1 6 8 13 17 19 21 24 27 30 36 40 43 51 59 64 69 74 78 80 87 90 94 100 113 118 127 132 135 138 140 143 149 152 155 158 165 2 9 14 22 25 28 44 52 60 65 70 75 81 88 95 101 114 119 128 133 136 141 144 153 159 166 46 53 54 61 66 97 103 107 108 109 120 121 124 129 130 167 10 15 45 71 76 82 96 102 115 160 11 47 104 106 116 122 181 56 123 125 170 110 179 72 183 83 173 67 163 105 171 178 180 182 55 161 162 168 169 172 174 175 176 177];

(c) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133

135 138 139 140 142 143 146 147 149 152 154 158 159 160 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 161 12 26 31 36 42 50 53 56 64 67 84 94 99 105 117 120 123 137 145 151 156 162 13 32 33 37 38 43 57 58 59 60 61 68 95 100 106 157 163 164 165 166 167 168 169 170 171 172 173 174 175 176 177 178 179 180 181 182 183];

(d) $\phi_T$=[0 3 4 5 7 12 16 18 20 23 26 29 31 32 33 34 35 37 38 39 41 42 48 49 50 57 58 62 63 68 73 77 79 84 85 86 89 91 92 93 98 99 111 112 117 126 131 134 137 139 142 145 146 147 148 150 151 154 156 157 164 1 6 8 13 17 19 21 24 27 30 36 40 43 51 59 64 69 74 78 80 87 90 94 100 113 118 127 132 135 138 140 143 149 152 155 158 165 2 9 14 22 25 28 44 52 60 65 70 75 81 88 95 101 114 119 128 133 136 141 144 153 159 166 10 11 15 45 46 47 53 54 55 56 61 66 67 71 72 76 82 83 96 97 102 103 104 105 106 107 108 109 110 115 116 120 121 122 123 124 125 129 130 160 161 162 163 167 168 169 170 171 172 173 174 175 176 177 178 179 180 181 182 183];

(e) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 160 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 161 12 26 31 36 42 50 53 56 64 67 84 94 99 105 117 120 123 137 145 151 156 162 13 32 37 43 57 68 95 100 106 157 163 33 38 58 59 60 61 164 165 166 167 168 169 170 171 172 173 174 175 176 177 178 179 180 181 182 183];

(f) $\phi_T$=[0 3 4 5 7 12 16 18 20 23 26 29 31 32 33 34 35 37 38 39 41 42 48 49 50 57 58 62 63 68 73 77 79 84 85 86 89 91 92 93 98 99 111 112 117 126 131 134 137 139 142 145 146 147 148 150 151 154 156 157 164 1 6 8 13 17 19 21 24 27 30 36 40 43 51 59 64 69 74 78 80 87 90 94 100 113 118 127 132 135 138 140 143 149 152 155 158 165 2 9 14 22 25 28 44 52 60 65 70 75 81 88 95 101 114 119 128 133 136 141 144 153 159 166 46 53 54 61 66 97 103 107 108 109 120 121 124 129 130 167 10 11 15 45 47 55 56 67 71 72 76 82 83 96 102 104 105 106 110 115 116 122 123 125 160 161 162 163 168 169 170 171 172 173 174 175 176 177 178 179 180 181 182 183];

(g) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 160 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 161 12 26 31 36 42 50 53 56 64 67 84 94 99 105 117 120 123 137 145 151 156 162 13 32 37 43 57 68 95 100 106 157 163 33 38 58 164 59 60 61 165 166 167 168 169 170 171 172 173 174 175 176 177 178 179 180 181 182 183];

(h) $\phi_T$=[0 3 4 5 7 12 16 18 20 23 26 29 31 32 33 34 35 37 38 39 41 42 48 49 50 57 58 62 63 68 73 77 79 84 85 86 89 91 92 93 98 99 111 112 117 126 131 134 137 139 142 145 146 147 148 150 151 154 156 157 164 1 6 8 13 17 19 21 24 27 30 36 40 43 51 59 64 69 74 78 80 87 90 94 100 113 118 127 132 135 138 140 143 149 152 155 158 165 2 9 14 22 25 28 44 52 60 65 70 75 81 88 95 101 114 119 128 133 136 141 144 153 159 166 46 53 54 61 66 97 103 107 108 109 120 121 124 129 130 167 10 15 45 71 76 82 96 102 115 160 11 47 55 56 67 72 83 104 105 106 110 116 122 123 125 161 162 163 168 169 170 171 172 173 174 175 176 177 178 179 180 181 182 183];

(i) $\phi_{PT}$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 160 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 161 12 26 31 36 42 50 53 56 64 67 84 94 99 105 117 120 123 137 145 151 156 162 13 32 37 43 57 68 95 100 106 157 163 33 38 58 164 59 165 60 61 166 167 168 169 170 171 172 173 174 175 176 177 178 179 180 181 182 183];

(j) $\phi_T$=[0 3 4 5 7 12 16 18 20 23 26 29 31 32 33 34 35 37 38 39 41 42 48 49 50 57 58 62 63 68 73 77 79 84 85 86 89 91 92 93 98 99 111 112 117 126 131 134 137 139 142 145 146 147 148 150 151 154 156 157 164 1 6 8 13 17 19 21 24 27 30 36 40 43 51 59 64 69 74 78 80 87 90 94 100 113 118 127 132 135 138 140 143 149 152 155 158 165 2 9 14 22 25 28 44 52 60 65 70 75 81 88 95 101 114 119 128 133 136 141 144 153 159 166 46 53 54 61 66 97 103 107 108 109 120 121 124 129 130 167 10 15 45 71 76 82 96 102 115 160 11 47 104 106 116 122 181 55 56 67 72 83 105 110 123 125 161 162 163 168 169 170 171 172 173 174 175 176 177 178 179 180 182 183];

(k) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 160 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 161 12 26 31 36 42 50 53 56 64 67 84 94 99 105 117 120 123 137 145 151 156 162 13 32 33 38 43 58 59 100 157 165 37 60 95 166 68 169 57 106 163 164 61 167 168 170 171 172 173 174 175 176 177 178 179 180 181 182 183];

(l) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 160 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 161 12 26 31 36 42 50 53 56 64 67 84 94 99 105 117 120 123 137 145 151 156 162 13 32 33 37 38 43 57 58 59 60 61 68 95 100 106 157 163 164 165 166 167 168 169 170 171 172 173 174 175 176 177 178 179 180 181 182 183];

(m) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 160 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153

155 161 12 26 31 36 42 50 53 56 64 67 84 94 99 105 117 120 123 137 145 151 156 162 13 32 33 38 43 58 59 100 157 165 37 57 60 61 68 95 106 163 164 166 167 168 169 170 171 172 173 174 175 176 177 178 179 180 181 182 183];

(n) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 160 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 161 12 26 31 36 42 50 53 56 64 67 84 94 99 105 117 120 123 137 145 151 156 162 13 32 33 38 43 58 59 100 157 165 37 60 95 166 57 61 68 106 163 164 167 168 169 170 171 172 173 174 175 176 177 178 179 180 181 182 183];

(o) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 160 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 161 12 26 31 36 42 50 53 56 64 67 84 94 99 105 117 120 123 137 145 151 156 162 13 32 33 38 43 58 59 100 157 165 37 60 95 166 68 169 57 61 106 163 164 167 168 170 171 172 173 174 175 176 177 178 179 180 181 182 183];

8. For low-index bit mapper for $K_{max}$=160

(a) $\phi_T$=[0 1 5 7 10 12 13 16 17 19 20 21 24 26 28 29 31 33 35 38 41 44 46 48 50 51 52 55 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 53 59 64 91 102 116 122 127 146 163 101 121 126 164 100 165 99 166 98 167 168 169 170 171 172 173 174 175 176 177 178 179 180 181 182 183];

(b) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 164 1 4 7 10 16 19 21 24 27 32 41 46 59 65 69 72 79 81 85 90 95 100 108 116 119 123 129 132 135 138 140 142 146 151 153 158 165 0 6 15 18 23 26 31 40 45 58 64 71 78 84 89 94 99 107 115 131 134 137 145 150 157 166 29 30 35 38 39 50 51 52 56 62 93 98 105 106 113 167 44 57 63 77 83 88 114 144 149 160 37 43 53 55 112 148 181 34 36 103 170 49 179 87 183 76 173 92 163 54 171 178 180 182 104 161 162 168 169 172 174 175 176 177];

(c) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 122 116 102 91 64 59 53 2 163 126 121 101 164 100 165 99 166 98 167 168 169 170 171 172 173 174 175 176 177 178 179 180 181 182 183];

(d) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 164 158 153 151 146 142 140 138 135 132 129 123 119 116 108 100 95 90 85 81 79 72 69 65 59 46 41 32 27 24 21 19 16 10 7 4 1 165 157 150 145 137 134 131 115 107 99 94 89 84 78 71 64 58 45 40 31 26 23 18 15 6 0 166 113 106 105 98 93 62 56 52 51 50 39 38 35 30 29 167 149 144 114 88 83 77 63 57 44 160 148 112 55 53 43 37 181 103 36 34 170 49 179 87 183 76 173 92 163 54 171 178 180 182 104 161 162 168 169 172 174 175 176 177];

(e) $\phi_T$=[0 1 5 7 10 12 13 16 17 19 20 21 24 26 28 29 31 33 35 38 41 44 46 48 50 51 52 55 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 53 59 64 91 98 99 100 101 102 116 121 122 126 127 146 163 164 165 166 167 168 169 170 171 172 173 174 175 176 177 178 179 180 181 182 183];

(f) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 164 1 4 7 10 16 19 21 24 27 32 41 46 59 65 69 72 79 81 85 90 95 100 108 116 119 123 129 132 135 138 140 142 146 151 153 158 165 0 6 15 18 23 26 31 40 45 58 64 71 78 84 89 94 99 107 115 131 134 137 145 150 157 166 29 30 34 35 36 37 38 39 43 44 49 50 51 52 53 54 55 56 57 62 63 76 77 83 87 88 92 93 98 103 104 105 106 112 113 114 144 148 149 160 161 162 163 167 168 169 170 171 172 173 174 175 176 177 178 179 180 181 182 183];

(g) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 2 53 59 64 91 98 99 100 101 102 116 121 122 126 127 146 163 164 165 166 167 168 169 170 171 172 173 174 175 176 177 178 179 180 181 182 183];

(h) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 164 158 153 151 146 142 140 138 135 132 129 123 119 116 108 100 95 90 85 81 79 72 69 65 59 46 41 32 27 24 21 19 16 10 7 4 1 165 157 150 145 137 134 131 115 107 99 94 89 84 78 71 64 58 45 40 31 26 23 18 15 6 0 166 29 30 34 35 36 37 38 39 43 44 49 50 51 52 53 54 55 56 57 62 63 76 77 83 87 88 92 93 98 103 104 105

106 112 113 114 144 148 149 160 161 162 163 167 168 169 170 171 172 173 174 175 176 177 178 179 180 181 182 183];

(i) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 53 59 64 91 102 116 122 127 146 163 98 99 100 101 121 126 164 165 166 167 168 169 170 171 172 173 174 175 176 177 178 179 180 181 182 183];

(j) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 164 1 4 7 10 16 19 21 24 27 32 41 46 59 65 69 72 79 81 85 90 95 100 108 116 119 123 129 132 135 138 140 142 146 151 153 158 165 0 6 15 18 23 26 31 40 45 58 64 71 78 84 89 94 99 107 115 131 134 137 145 150 157 166 29 30 35 38 39 50 51 52 56 62 93 98 105 106 113 167 34 36 37 43 44 49 53 54 55 57 63 76 77 83 87 88 92 103 104 112 114 144 148 149 160 161 162 163 168 169 170 171 172 173 174 175 176 177 178 179 180 181 182 183];

(k) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 122 116 102 91 64 59 53 2 163 98 99 100 101 121 126 164 165 166 167 168 169 170 171 172 173 174 175 176 177 178 179 180 181 182 183];

(l) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 164 158 153 151 146 142 140 138 135 132 129 123 119 116 108 100 95 90 85 81 79 72 69 65 59 46 41 32 27 24 21 19 16 10 7 4 1 165 157 150 145 137 134 131 115 107 99 94 89 84 78 71 64 58 45 40 31 26 23 18 15 6 0 166 113 106 105 98 93 62 56 52 51 50 39 38 35 30 29 167 34 36 37 43 44 49 53 54 55 57 63 76 77 83 87 88 92 103 104 112 114 144 148 149 160 161 162 163 168 169 170 171 172 173 174 175 176 177 178 179 180 181 182 183];

(m) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 53 59 64 91 102 116 122 127 146 163 101 121 126 164 98 99 100 165 166 167 168 169 170 171 172 173 174 175 176 177 178 179 180 181 182 183];

(n) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 164 1 4 7 10 16 19 21 24 27 32 41 46 59 65 69 72 79 81 85 90 95 100 108 116 119 123 129 132 135 138 140 142 146 151 153 158 165 0 6 15 18 23 26 31 40 45 58 64 71 78 84 89 94 99 107 115 131 134 137 145 150 157 166 29 30 35 38 39 50 51 52 56 62 93 98 105 106 113 167 44 57 63 77 83 88 114 144 149 160 34 36 37 43 49 53 54 55 75 87 92 103 104 112 148 161 162 163 168 169 170 171 172 173 174 175 176 177 178 179 180 181 182 183];

(o) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 122 116 102 91 64 59 53 2 163 126 121 101 164 98 99 100 165 166 167 168 169 170 171 172 173 174 175 176 177 178 179 180 181 182 183];

(p) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 164 158 153 151 146 142 140 138 135 132 129 123 119 116 108 100 95 90 85 81 79 72 69 65 59 46 41 32 27 24 21 19 16 10 7 4 1 165 157 150 145 137 134 131 115 107 99 94 89 84 78 71 64 58 45 40 31 26 23 18 15 6 0 166 113 106 105 98 93 62 56 52 51 50 39 38 35 30 29 167 149 144 114 88 83 77 63 57 44 160 34 36 37 43 49 53 54 55 76 87 92 103 104 112 148 161 162 163 168 169 170 171 172 173 174 175 176 177 178 179 180 181 182 183];

(q) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 53 59 64 91 102 116 122 127 146 163 101 121 126 164 100 165 98 99 166 167 168 169 170 171 172 173 174 175 176 177 178 179 180 181 182 183];

(r) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 164 1 4 7 10 16 19 21 24 27 32 41 46 59 65 69 72 79 81 85 90 95 100 108 116 119 123 129 132 135 138 140 142 146 151 153 158 165 0 6 15 18 23 26 31 40 45 58 64 71 78 84 89 94 99 107 115 131 134 137 145 150 157 166 29 30 35 38 39 50 51 52 56 62 93 98 105 106 113 167 44 57 63 77 83 88 114 144 149 160 37 43 53 55

112 148 181 34 36 49 54 76 87 92 103 104 161 162 163 168 169 170 171 172 173 174 175 176 177 178 179 180 182 183];

(s) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 122 116 102 91 64 59 53 2 163 126 121 101 164 100 165 98 99 166 167 168 169 170 171 172 173 174 175 176 177 178 179 180 181 182 183];

(t) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 164 158 153 151 146 142 140 138 135 132 129 123 119 116 108 100 95 90 85 81 79 72 69 65 59 46 41 32 27 24 21 19 16 10 7 4 1 165 157 150 145 137 134 131 115 107 99 94 89 84 78 71 64 58 45 40 31 26 23 18 15 6 0 166 113 106 105 98 93 62 56 52 51 50 39 38 35 30 29 167 149 144 114 88 83 77 63 57 44 160 148 112 55 53 43 37 181 34 36 49 54 76 87 92 103 104 161 162 163 168 169 170 171 172 173 174 175 176 177 178 179 180 182 183];

(u) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 59 100 101 116 121 126 127 146 165 64 99 122 166 91 169 53 102 163 164 98 167 168 170 171 172 173 174 175 176 177 178 179 180 181 182 183];

(v) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 59 100 101 116 121 126 127 146 165 64 99 122 166 91 169 53 102 163 164 98 167 168 170 171 172 173 174 175 176 177 178 179 180 181 182 183];

(w) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 126 121 116 101 100 59 2 165 122 99 64 166 91 169 102 53 163 164 98 167 168 170 171 172 173 174 175 176 177 178 179 180 181 182 183];

(x) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 53 59 64 91 98 99 100 101 102 116 121 122 126 127 146 163 164 165 166 167 168 169 170 171 172 173 174 175 176 177 178 179 180 181 182 183];

(y) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 2 53 59 64 91 98 99 100 101 102 116 121 122 126 127 146 163 164 165 166 167 168 169 170 171 172 173 174 175 176 177 178 179 180 181 182 183];

(z) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 59 100 101 116 121 126 127 146 165 53 64 91 98 99 102 122 163 164 166 167 168 169 170 171 172 173 174 175 176 177 178 179 180 181 182 183];

(aa) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 126 121 116 101 100 59 2 165 53 64 91 98 99 102 122 163 164 166 167 168 169 170 171 172 173 174 175 176 177 178 179 180 181 182 183];

(bb) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 59 100 101 116 121 126

127 146 165 64 99 122 166 53 91 98 102 163 164 167 168 169 170 171 172 173 174 175 176 177 178 179 180 181 182 183];

(cc) φ_T=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 126 121 116 101 100 59 2 165 122 99 64 166 53 91 98 102 163 164 167 168 169 170 171 172 173 174 175 176 177 178 179 180 181 182 183];

(dd) φ_T=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 59 100 101 116 121 126 127 146 165 64 99 122 166 91 169 53 98 102 163 164 167 168 170 171 172 173 174 175 176 177 178 179 180 181 182 183];

(ee) φ_T=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 126 121 116 101 100 59 2 165 122 99 64 166 91 169 53 98 102 163 164 167 168 170 171 172 173 174 175 176 177 178 179 180 181 182 183];

9. For high-index bit mapper for $K_{max}$=200

(a) φ_T=[0 1 2 3 9 10 12 16 20 21 23 26 27 29 31 34 36 38 39 40 43 44 45 47 52 56 58 60 63 66 69 71 72 73 74 75 77 78 79 81 82 88 89 90 97 98 102 103 108 113 117 119 124 125 126 129 131 132 133 138 139 151 152 157 166 171 174 177 179 182 185 186 187 188 190 191 194 196 197 204 4 11 13 17 22 24 28 30 32 35 37 41 46 48 53 57 59 61 64 67 70 76 80 83 91 99 104 109 114 118 120 127 130 134 140 153 158 167 172 175 178 180 183 189 192 195 198 205 5 14 18 25 33 42 49 54 62 65 68 84 92 100 105 110 115 121 128 135 141 154 159 168 173 176 181 184 193 199 206 8 15 86 93 94 101 106 137 143 147 148 149 160 161 164 169 170 207 6 19 50 55 85 111 116 122 136 142 155 200 87 95 107 144 150 162 165 208 51 156 214 7 146 221 163 219 96 210 145 202 212 112 211 216 223 123 201 203 209 213 215 217 218 220 222];

(b) φ_T=[0 1 2 3 9 10 12 16 20 21 23 26 27 29 31 34 36 38 39 40 43 44 45 47 52 56 58 60 63 66 69 71 72 73 74 75 77 78 79 81 82 88 89 90 97 98 102 103 108 113 117 119 124 125 126 129 131 132 133 138 139 151 152 157 166 171 174 177 179 182 185 186 187 188 190 191 194 196 197 204 4 11 13 17 22 24 28 30 32 35 37 41 46 48 53 57 59 61 64 67 70 76 80 83 91 99 104 109 114 118 120 127 130 134 140 153 158 167 172 175 178 180 183 189 192 195 198 205 5 14 18 25 33 42 49 54 62 65 68 84 92 100 105 110 115 121 128 135 141 154 159 168 173 176 181 184 193 199 206 6 7 8 15 19 50 51 55 85 86 87 93 94 95 96 101 106 107 111 112 116 122 123 136 137 142 143 144 145 146 147 148 149 150 155 156 160 161 162 163 164 165 169 170 200 201 202 203 207 208 209 210 211 212 213 214 215 216 217 218 219 220 221 222 223];

(c) φ_T=[0 1 2 3 9 10 12 16 20 21 23 26 27 29 31 34 36 38 39 40 43 44 45 47 52 56 58 60 63 66 69 71 72 73 74 75 77 78 79 81 82 88 89 90 97 98 102 103 108 113 117 119 124 125 126 129 131 132 133 138 139 151 152 157 166 171 174 177 179 182 185 186 187 188 190 191 194 196 197 204 4 11 13 17 22 24 28 30 32 35 37 41 46 48 53 57 59 61 64 67 70 76 80 83 91 99 104 109 114 118 120 127 130 134 140 153 158 167 172 175 178 180 183 189 192 195 198 205 5 14 18 25 33 42 49 54 62 65 68 84 92 100 105 110 115 121 128 135 141 154 159 168 173 176 181 184 193 199 206 8 15 86 93 94 101 106 137 143 147 148 149 160 161 164 169 170 207 6 7 19 50 51 55 85 87 95 96 107 111 112 116 122 123 136 142 144 145 146 150 155 156 162 163 165 200 201 202 203 208 209 210 211 212 213 214 215 216 217 218 219 220 221 222 223];

(d) φ_T=[0 1 2 3 9 10 12 16 20 21 23 26 27 29 31 34 36 38 39 40 43 44 45 47 52 56 58 60 63 66 69 71 72 73 74 75 77 78 79 81 82 88 89 90 97 98 102 103 108 113 117 119 124 125 126 129 131 132 133 138 139 151 152 157 166 171 174 177 179 182 185 186 187 188 190 191 194 196 197 204 4 11 13 17 22 24 28 30 32 35 37 41 46 48 53 57 59 61 64 67 70 76 80 83 91 99 104 109 114 118 120 127 130 134 140 153 158 167 172 175 178 180 183 189 192 195 198 205 5 14 18 25 33 42 49 54 62 65 68 84 92 100 105 110 115 121 128 135 141 154 159 168 173 176 181 184 193 199 206 8 15 86 93 94 101 106 137 143 147 148 149 160 161 164 169 170 207 6 19 50 55 85 111 116 122 136 142 155 200 7 51 87 95 96 107 112 123 144 145 146 150 156 162 163 165 201 202 203 208 209 210 211 212 213 214 215 216 217 218 219 220 221 222 223];

(e) φ_T=[0 2 3 5 6 8 11 12 13 16 19 20 22 24 28 32 33 35 37 38 39 40 41 42 44 46 47 49 50 54 55 57 59 60 62 64 67 69 74 79 80 84 85 86 88 91 94 102 105 109 110 111 113 114 116 118 119 121 122 125 126 127 129 130 131 132 136 137 141 142 143 147 148 149 151 153 155 158 161 164 166 168 170 171 173 175 178 179 180 182 183 186 187 189 192 194 198 199 200 1 4 7 9 14 17 21 23 25 29 34 36 43 45 48 51 56 58 61 63 65 68 70 75 81 87 89 92 95 103 106 112 115 117 120 123 128 133 138 144 150 152 154 156 159 162 165 167 169 172 174 176 181 184 188 190 193 195 201 10 15 18 26 30 52 66 71 76 82 90 93 96 104 107 124 134 139 145 157 160 163 177 185 191 196 202 27 31 53 72 77 83 97 108 135 140 146 197 203 73 78 98 204 99 205 100 206 101 207 208 209 210 211 212 213 214 215 216 217 218 219 220 221 222 223];

(f) φ_T=[0 2 3 5 6 8 11 12 13 16 19 20 22 24 28 32 33 35 37 38 39 40 41 42 44 46 47 49 50 54 55 57 59 60 62 64 67 69 74 79 80 84 85 86 88 91 94 102 105 109 110 111 113 114 116 118 119 121 122 125 126 127 129 130 131 132 136 137 141 142 143 147 148 149 151 153 155 158 161 164 166 168 170 171 173 175 178 179 180 182 183 186 187 189 192 194 198 199 200 1 4 7 9 14 17 21 23 25 29 34 36 43 45 48 51 56 58 61 63 65 68 70 75 81 87 89 92 95 103 106 112 115 117 120 123 128 133 138 144 150 152 154 156 159 162 165 167 169 172 174 176 181 184 188 190 193 195 201 10 15 18 26 30

52 66 71 76 82 90 93 96 104 107 124 134 139 145 157 160 163 177 185 191 196 202 27 31 53 72 73 77 78 83 97 98 99 100 101 108 135 140 146 197 203 204 205 206 207 208 209 210 211 212 213 214 215 216 217 218 219 220 221 222 223];

(g) $\phi_T$=[0 2 3 5 6 8 11 12 13 16 19 20 22 24 28 32 33 35 37 38 39 40 41 42 44 46 47 49 50 54 55 57 59 60 62 64 67 69 74 79 80 84 85 86 88 91 94 102 105 109 110 111 113 114 116 118 119 121 122 125 126 127 129 130 131 132 136 137 141 142 143 147 148 149 151 153 155 158 161 164 166 168 170 171 173 175 178 179 180 182 183 186 187 189 192 194 198 199 200 1 4 7 9 14 17 21 23 25 29 34 36 43 45 48 51 56 58 61 63 65 68 70 75 81 87 89 92 95 103 106 112 115 117 120 123 128 133 138 144 150 152 154 156 159 162 165 167 169 172 174 176 181 184 188 190 193 195 201 10 15 18 26 30 52 66 71 76 82 90 93 96 104 107 124 134 139 145 157 160 163 177 185 191 196 202 27 31 53 72 77 83 97 108 135 140 146 197 203 73 78 98 99 100 101 204 205 206 207 208 209 210 211 212 213 214 215 216 217 218 219 220 221 222 223];

(h) $\phi_T$=[0 2 3 5 6 8 11 12 13 16 19 20 22 24 28 32 33 35 37 38 39 40 41 42 44 46 47 49 50 54 55 57 59 60 62 64 67 69 74 79 80 84 85 86 88 91 94 102 105 109 110 111 113 114 116 118 119 121 122 125 126 127 129 130 131 132 136 137 141 142 143 147 148 149 151 153 155 158 161 164 166 168 170 171 173 175 178 179 180 182 183 186 187 189 192 194 198 199 200 1 4 7 9 14 17 21 23 25 29 34 36 43 45 48 51 56 58 61 63 65 68 70 75 81 87 89 92 95 103 106 112 115 117 120 123 128 133 138 144 150 152 154 156 159 162 165 167 169 172 174 176 181 184 188 190 193 195 201 10 15 18 26 30 52 66 71 76 82 90 93 96 104 107 124 134 139 145 157 160 163 177 185 191 196 202 27 31 53 72 77 83 97 108 135 140 146 197 203 73 78 98 204 99 100 101 205 206 207 208 209 210 211 212 213 214 215 216 217 218 219 220 221 222 223];

(i) $\phi_T$=[0 2 3 5 6 8 11 12 13 16 19 20 22 24 28 32 33 35 37 38 39 40 41 42 44 46 47 49 50 54 55 57 59 60 62 64 67 69 74 79 80 84 85 86 88 91 94 102 105 109 110 111 113 114 116 118 119 121 122 125 126 127 129 130 131 132 136 137 141 142 143 147 148 149 151 153 155 158 161 164 166 168 170 171 173 175 178 179 180 182 183 186 187 189 192 194 198 199 200 1 4 7 9 14 17 21 23 25 29 34 36 43 45 48 51 56 58 61 63 65 68 70 75 81 87 89 92 95 103 106 112 115 117 120 123 128 133 138 144 150 152 154 156 159 162 165 167 169 172 174 176 181 184 188 190 193 195 201 10 15 18 26 30 52 66 71 76 82 90 93 96 104 107 124 134 139 145 157 160 163 177 185 191 196 202 27 31 53 72 77 83 97 108 135 140 146 197 203 73 78 98 204 99 205 100 101 206 207 208 209 210 211 212 213 214 215 216 217 218 219 220 221 222 223];

(j) $\phi_T$=[0 2 3 5 6 8 11 12 13 16 19 20 22 24 28 32 33 35 37 38 39 40 41 42 44 46 47 49 50 54 55 57 59 60 62 64 67 69 74 79 80 84 85 86 88 91 94 102 105 109 110 111 113 114 116 118 119 121 122 125 126 127 129 130 131 132 136 137 141 142 143 147 148 149 151 153 155 158 161 164 166 168 170 171 173 175 178 179 180 182 183 186 187 189 192 194 198 199 200 1 4 7 9 14 17 21 23 25 29 34 36 43 45 48 51 56 58 61 63 65 68 70 75 81 87 89 92 95 103 106 112 115 117 120 123 128 133 138 144 150 152 154 156 159 162 165 167 169 172 174 176 181 184 188 190 193 195 201 10 15 18 26 30 52 66 71 76 82 90 93 96 104 107 124 134 139 145 157 160 163 177 185 191 196 202 27 53 72 73 78 83 98 99 140 197 205 31 77 100 135 206 108 209 97 146 203 204 101 207 208 210 211 212 213 214 215 216 217 218 219 220 221 222 223];

(k) $\phi_T$=[0 2 3 5 6 8 11 12 13 16 19 20 22 24 28 32 33 35 37 38 39 40 41 42 44 46 47 49 50 54 55 57 59 60 62 64 67 69 74 79 80 84 85 86 88 91 94 102 105 109 110 111 113 114 116 118 119 121 122 125 126 127 129 130 131 132 136 137 141 142 143 147 148 149 151 153 155 158 161 164 166 168 170 171 173 175 178 179 180 182 183 186 187 189 192 194 198 199 200 1 4 7 9 14 17 21 23 25 29 34 36 43 45 48 51 56 58 61 63 65 68 70 75 81 87 89 92 95 103 106 112 115 117 120 123 128 133 138 144 150 152 154 156 159 162 165 167 169 172 174 176 181 184 188 190 193 195 201 10 15 18 26 30 52 66 71 76 82 90 93 96 104 107 124 134 139 145 157 160 163 177 185 191 196 202 27 31 53 72 73 77 78 83 97 98 99 100 101 108 135 140 146 197 203 204 205 206 207 208 209 210 211 212 213 214 215 216 217 218 219 220 221 222 223];

(l) $\phi_T$=[0 2 3 5 6 8 11 12 13 16 19 20 22 24 28 32 33 35 37 38 39 40 41 42 44 46 47 49 50 54 55 57 59 60 62 64 67 69 74 79 80 84 85 86 88 91 94 102 105 109 110 111 113 114 116 118 119 121 122 125 126 127 129 130 131 132 136 137 141 142 143 147 148 149 151 153 155 158 161 164 166 168 170 171 173 175 178 179 180 182 183 186 187 189 192 194 198 199 200 1 4 7 9 14 17 21 23 25 29 34 36 43 45 48 51 56 58 61 63 65 68 70 75 81 87 89 92 95 103 106 112 115 117 120 123 128 133 138 144 150 152 154 156 159 162 165 167 169 172 174 176 181 184 188 190 193 195 201 10 15 18 26 30 52 66 71 76 82 90 93 96 104 107 124 134 139 145 157 160 163 177 185 191 196 202 27 53 72 73 78 83 98 99 140 197 205 31 77 97 100 101 108 135 146 203 204 206 207 208 209 210 211 212 213 214 215 216 217 218 219 220 221 222 223];

(m) $\phi_T$=[0 2 3 5 6 8 11 12 13 16 19 20 22 24 28 32 33 35 37 38 39 40 41 42 44 46 47 49 50 54 55 57 59 60 62 64 67 69 74 79 80 84 85 86 88 91 94 102 105 109 110 111 113 114 116 118 119 121 122 125 126 127 129 130 131 132 136 137 141 142 143 147 148 149 151 153 155 158 161 164 166 168 170 171 173 175 178 179 180 182 183 186 187 189 192 194 198 199 200 1 4 7 9 14 17 21 23 25 29 34 36 43 45 48 51 56 58 61 63 65 68 70 75 81 87 89 92 95 103 106 112 115 117 120 123 128 133 138 144 150 152 154 156 159 162 165 167 169 172 174 176 181 184 188 190 193 195 201 10 15 18 26 30 52 66 71 76 82 90 93 96 104 107 124 134 139 145 157 160 163 177 185 191 196 202 27 53 72 73 78 83 98 99 140 197 205 31 77 100 135 206 97 101 108 146 203 204 207 208 209 210 211 212 213 214 215 216 217 218 219 220 221 222 223];

(n) $\phi_T$=[0 2 3 5 6 8 11 12 13 16 19 20 22 24 28 32 33 35 37 38 39 40 41 42 44 46 47 49 50 54 55 57 59 60 62 64 67 69 74 79 80 84 85 86 88 91 94 102 105 109 110 111 113 114 116 118 119 121 122 125 126 127 129 130 131 132 136 137 141 142 143 147 148 149 151 153 155 158 161 164 166 168 170 171 173 175 178 179 180 182 183 186 187 189 192 194 198 199 200 1 4 7 9 14 17 21 23 25 29 34 36 43 45 48 51 56 58 61 63 65 68 70 75 81 87 89 92 95 103 106 112 115 117 120 123 128 133 138 144 150 152 154 156 159 162 165 167 169 172 174 176 181 184 188 190 193 195 201 10 15 18 26 30 52 66 71 76 82 90 93 96 104 107 124 134 139 145 157 160 163 177 185 191 196 202 27 53 72 73 78 83 98 99 140 197 205 31 77 100 135 206 108 209 97 101 146 203 204 207 208 210 211 212 213 214 215 216 217 218 219 220 221 222 223];

(o) $\phi_T$=[0 1 4 5 9 11 12 17 18 19 21 24 26 28 31 34 41 42 47 52 54 57 63 64 68 69 70 71 72 73 74 76 78 79 83 85 89 90 97 98 99 102 103 104 106 108 109 110 114 116 118 120 121 122 123 125 128 129 132 135 137 141 142 144 148 152 156 158 160 161 162 163 164 166 171 172 174 177 178 179 180 181 187 188 189 191 192 194 196 197 212 2 7 8 13 20 25 27 32 35 36 38 45 46 50 51 58 60 62 65 84 88 93 95 101 107 111 112 113 115 119 126 127 131 136 139 145 146 151 159 168 169 173 175 184 185 186 193 199 215 3 10 14 16 23 29 30 37 40 43 55 56 67 75 77 81 100 117 124 147 150 167 176 182 190 198 204 33 44 87 91 94 134 153 154 155 157 165 207 53 61 66 80 138 195 211 82 96 105 140 143 170 218 6 39 86 92 208 15 22 183 200 49 130 210 149 203 48 202 59 201 209 214 133 205 206 213 216 217];

(p) $\phi_T$=[0 1 4 5 9 11 12 17 18 19 21 24 26 28 31 34 41 42 47 52 54 57 63 64 68 69 70 71 72 73 74 76 78 79 83 85 89 90 97 98 99 102 103 104 106 108 109 110 114 116 118 120 121 122 123 125 128 129 132 135 137 141 142 144 148 152 156 158 160 161 162 163 164 166 171 172 174 177 178 179 180 181 187 188 189 191 192 194 196 197 212 2 7 8 13 20 25 27 32 35 36 38 45 46 50 51 58 60 62 65 84 88 93 95 101 107 111 112 113 115 119 126 127 131 136 139 145 146 151 159 168 169 173 175 184 185 186 193 199 215 3 10 14 16 23 29 30 37 40 43 55 56 67 75 77 81 100 117 124 147 150 167 176 182 190 198 204 6 15 22 33 39 44 48 49 53 59 61 66 80 82 86 87 91 92 94 96 105 130 133 134 138 140 143 149 153 154 155 157 165 170 183 195 200 201 202 203 205 206 207 208 209 210 211 213 214 216 217 218];

(q) $\phi_T$=[0 1 4 5 9 11 12 17 18 19 21 24 26 28 31 34 41 42 47 52 54 57 63 64 68 69 70 71 72 73 74 76 78 79 83 85 89 90 97 98 99 102 103 104 106 108 109 110 114 116 118 120 121 122 123 125 128 129 132 135 137 141 142 144 148 152 156 158 160 161 162 163 164 166 171 172 174 177 178 179 180 181 187 188 189 191 192 194 196 197 212 2 7 8 13 20 25 27 32 35 36 38 45 46 50 51 58 60 62 65 84 88 93 95 101 107 111 112 113 115 119 126 127 131 136 139 145 146 151 159 168 169 173 175 184 185 186 193 199 215 3 10 14 16 23 29 30 37 40 43 55 56 67 75 77 81 100 117 124 147 150 167 176 182 190 198 204 33 44 87 91 94 134 153 154 155 157 165 207 6 15 22 39 48 49 53 59 61 66 80 82 86 92 96 105 130 133 138 140 143 149 170 183 195 200 201 202 203 205 206 208 209 210 211 213 214 216 217 218];

(r) $\phi_T$=[0 1 4 5 9 11 12 17 18 19 21 24 26 28 31 34 41 42 47 52 54 57 63 64 68 69 70 71 72 73 74 76 78 79 83 85 89 90 97 98 99 102 103 104 106 108 109 110 114 116 118 120 121 122 123 125 128 129 132 135 137 141 142 144 148 152 156 158 160 161 162 163 164 166 171 172 174 177 178 179 180 181 187 188 189 191 192 194 196 197 212 2 7 8 13 20 25 27 32 35 36 38 45 46 50 51 58 60 62 65 84 88 93 95 101 107 111 112 113 115 119 126 127 131 136 139 145 146 151 159 168 169 173 175 184 185 186 193 199 215 3 10 14 16 23 29 30 37 40 43 55 56 67 75 77 81 100 117 124 147 150 167 176 182 190 198 204 33 44 87 91 94 134 153 154 155 157 165 207 53 61 66 80 138 195 211 6 15 22 39 48 49 59 82 86 92 96 105 130 133 140 143 149 170 183 200 201 202 203 205 206 208 209 210 213 214 216 217 218];

10. For low-index bit mapper for $K_{max}$=200

(a) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 160 161 163 165 168 170 172 173 176 178 179 183 187 189 190 196 197 198 199 204 1 4 7 10 16 19 21 24 27 32 41 46 59 65 69 72 79 81 85 90 95 100 108 116 119 123 129 132 135 138 140 142 146 151 153 158 162 164 167 169 171 175 177 182 186 188 195 205 0 6 15 18 23 26 31 40 45 58 64 71 78 84 89 94 99 107 115 131 134 137 145 150 157 166 174 181 185 194 206 29 30 35 38 39 50 51 52 56 62 93 98 105 106 113 184 191 207 44 57 63 77 83 88 114 144 149 180 193 200 34 37 49 55 92 104 112 208 43 148 214 53 192 221 36 219 103 210 54 202 212 87 211 216 223 76 201 203 209 213 215 217 218 220 222];

(b) $\phi_T$=[199 198 197 196 190 189 187 183 179 178 176 173 172 170 168 165 163 161 160 159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 204 195 188 186 182 177 175 171 169 167 164 162 158 153 151 146 142 140 138 135 132 129 123 119 116 108 100 95 90 85 81 79 72 69 65 59 46 41 32 27 24 21 19 16 10 7 4 1 205 194 185 181 174 166 157 150 145 137 134 131 115 107 99 94 89 84 78 71 64 58 45 40 31 26 23 18 15 6 0 206 191 184 113 106 105 98 93 62 56 52 51 50 39 38 35 30 29 207 193 180 149 144 114 88 83 77 63 57 44 200 112 104 92 55 49 37 34 208 148 43 192 214 53 219 221 36 103 210 54 212 202 87 211 216 223 76 215 201 203 209 213 217 218 201 220 203 222 209];

(c) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 160 161 163 165 168 170 172 173 176 178 179 183 187 189 190 196 197 198 199 204 1 4 7 10 16 19 21 24 27 32 41 46 59 65 69 72 79 81 85 90 95 100 108 116 119 123 129 132 135 138 140 142 146 151 153 158 162 164 167 169 171 175 177 182 186 188 195 205 0 6 15 18 23 26 31 40 45 58 64 71 78 84 89 94 99 107 115 131 134 137 145 150 157 166 174 181 185 194 206 29 30 34 35 36 37 38 39 43 44 49 50 51 52 53 54 55 56 57 62 63 76 77 83 87 88 92 93 98 103 104 105 106 112 113 114 144 148 149 180 184 191 192 193 200 201 202 203 207 208 209 210 211 212 213 214 215 216 217 218 219 220 221 222 223];

(d) $\phi_T$=[199 198 197 196 190 189 187 183 179 178 176 173 172 170 168 165 163 161 160 159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 204 195 188 186 182 177 175 171 169 167 164 162 158 153 151 146 142 140 138 135 132 129 123 119 116 108 100 95 90 85 81 79 72 69 65 59 46 41 32 27 24 21 19 16 10 7 4 1 205 194 185 181 174 166 157 150 145 137 134 131 115 107 99 94 89 84 78 71 64 58 45 40 31 26 23 18 15 6 0 206 29 30 34 35 36 37 38 39 43 44 49 50 51 52 53 54 55 56 57 62 63 76 77 83 87 88 92 93 98 103 104 105 106 112 113 114 144 148 149 180 184 191 192 193 200 201 202 203 207 208 209 210 211 212 213 214 215 216 217 218 219 220 221 222 223];

(e) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 160 161 163 165 168 170 172 173 176 178 179 183 187 189 190 196 197 198 199 204 1 4 7 10 16 19 21 24 27 32 41 46 59 65 69 72 79 81 85 90 95 100 108 116 119 123 129 132 135 138 140 142 146 151 153 158 162 164 167 169 171 175 177 182 186 188 195 205 0 6 15 18

23 26 31 40 45 58 64 71 78 84 89 94 99 107 115 131 134 137 <u>145</u> <u>150</u> 157 166 <u>174</u> 181 185 194 <u>206</u> 29 30 35 38 39 <u>50</u> <u>51</u> 52 56 62 <u>93</u> 98 105 106 113 184 191 <u>207</u> 34 36 37 43 44 49 53 54 55 57 63 76 77 83 87 88 92 103 104 112 114 144 <u>148</u> <u>149</u> 180 192 193 <u>200</u> <u>201</u> <u>202</u> <u>203</u> <u>208</u> <u>209</u> <u>210</u> <u>211</u> <u>212</u> <u>213</u> <u>214</u> <u>215</u> <u>216</u> <u>217</u> <u>218</u> <u>219</u> <u>220</u> <u>221</u> <u>222</u> <u>223</u>];

(f) $\phi_T$=[199 198 197 196 190 189 187 183 <u>179</u> <u>178</u> 176 173 172 170 168 165 163 161 <u>160</u> <u>159</u> 156 <u>155</u> <u>154</u> <u>152</u> <u>147</u> <u>143</u> <u>141</u> 139 136 133 130 <u>128</u> 127 126 125 124 <u>122</u> 121 120 118 117 111 110 109 102 101 97 96 91 86 82 80 75 74 73 70 68 67 66 61 60 48 47 42 33 28 25 22 20 17 14 13 12 11 9 8 5 3 2 <u>204</u> 195 188 186 182 177 <u>175</u> <u>171</u> 169 167 164 <u>162</u> <u>158</u> <u>153</u> 151 146 142 140 138 135 132 129 123 119 <u>116</u> 108 100 95 90 <u>85</u> <u>81</u> 79 72 69 65 59 46 41 32 27 24 21 19 16 10 7 4 1 <u>205</u> 194 185 181 <u>174</u> 166 <u>157</u> <u>150</u> <u>145</u> 137 134 131 115 107 99 94 89 84 78 71 <u>64</u> <u>58</u> <u>45</u> <u>40</u> 31 26 23 18 15 6 0 <u>206</u> 191 184 113 106 105 98 93 62 56 52 51 50 39 38 <u>35</u> <u>30</u> 29 <u>207</u> 34 36 37 43 44 49 53 54 55 57 63 76 77 83 87 88 92 103 104 112 114 144 <u>148</u> <u>149</u> 180 192 193 <u>200</u> <u>201</u> <u>202</u> <u>203</u> <u>208</u> <u>209</u> <u>210</u> <u>211</u> <u>212</u> <u>213</u> <u>214</u> <u>215</u> <u>216</u> <u>217</u> <u>218</u> <u>219</u> <u>220</u> <u>221</u> <u>222</u> <u>223</u>];

(g) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 <u>141</u> <u>143</u> <u>147</u> 152 154 <u>155</u> 156 159 160 161 163 165 168 <u>170</u> <u>172</u> <u>173</u> 176 <u>178</u> <u>179</u> 183 187 189 190 196 197 198 199 <u>204</u> 1 4 7 10 16 19 21 24 27 32 41 46 59 65 69 72 79 <u>81</u> <u>85</u> 90 95 100 108 116 119 123 129 132 135 138 140 <u>142</u> <u>146</u> 151 153 158 162 164 167 <u>169</u> 171 175 177 <u>182</u> 186 188 195 <u>205</u> 0 6 15 18 23 26 31 <u>40</u> <u>45</u> 58 64 <u>71</u> 78 84 89 94 99 <u>107</u> 115 131 134 137 <u>145</u> <u>150</u> 157 166 <u>174</u> 181 185 194 <u>206</u> 29 30 35 38 39 <u>50</u> <u>51</u> 52 56 62 <u>93</u> 98 105 106 113 184 191 <u>207</u> 44 57 63 77 83 88 114 <u>144</u> <u>149</u> 180 193 <u>200</u> 34 36 37 43 49 53 54 55 76 87 92 <u>103</u> <u>104</u> 112 <u>148</u> 192 <u>201</u> <u>202</u> <u>203</u> <u>208</u> <u>209</u> <u>210</u> <u>211</u> <u>212</u> <u>213</u> <u>214</u> <u>215</u> <u>216</u> <u>217</u> <u>218</u> <u>219</u> <u>220</u> <u>221</u> <u>222</u> <u>223</u>];

(h) $\phi_T$=[199 198 197 196 190 189 187 183 <u>179</u> <u>178</u> 176 173 172 170 168 165 163 161 <u>160</u> <u>159</u> 156 <u>155</u> <u>154</u> <u>152</u> <u>147</u> <u>143</u> <u>141</u> 139 136 133 130 <u>128</u> 127 126 125 124 <u>122</u> 121 120 118 117 111 110 109 102 101 97 96 91 86 82 80 75 74 73 70 68 67 66 61 60 48 47 42 33 28 25 22 20 17 14 13 12 11 9 8 5 3 2 <u>204</u> 195 188 186 182 177 <u>175</u> <u>171</u> 169 167 164 <u>162</u> <u>158</u> <u>153</u> 151 146 142 140 138 135 132 129 123 119 <u>116</u> 108 100 95 90 <u>85</u> <u>81</u> 79 72 69 65 59 46 41 32 27 24 21 19 16 10 7 4 1 <u>205</u> 194 185 181 <u>174</u> 166 <u>157</u> <u>150</u> <u>145</u> 137 134 131 115 107 99 94 89 84 78 71 <u>64</u> <u>58</u> <u>45</u> <u>40</u> 31 26 23 18 15 6 0 <u>206</u> 191 184 113 106 105 98 93 62 56 52 51 50 39 38 <u>35</u> <u>30</u> 29 <u>207</u> 193 180 149 144 114 88 83 77 63 57 44 <u>200</u> 34 36 37 43 49 53 54 55 76 87 92 103 104 112 <u>148</u> 192 <u>201</u> <u>202</u> <u>203</u> <u>208</u> <u>209</u> <u>210</u> <u>211</u> <u>212</u> <u>213</u> <u>214</u> <u>215</u> <u>216</u> <u>217</u> <u>218</u> <u>219</u> <u>220</u> <u>221</u> <u>222</u> <u>223</u>];

(i) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 <u>140</u> <u>142</u> <u>144</u> <u>145</u> 149 150 152 <u>153</u> <u>155</u> <u>157</u> <u>158</u> <u>159</u> <u>160</u> <u>161</u> <u>162</u> 164 166 167 <u>171</u> <u>175</u> <u>177</u> <u>179</u> <u>180</u> 183 186 187 188 191 193 194 196 197 199 <u>200</u> 4 6 9 11 15 18 23 25 27 30 32 34 37 40 43 45 47 49 55 61 66 71 76 79 82 84 87 93 96 104 107 110 112 118 124 129 131 134 136 138 <u>141</u> <u>143</u> 148 151 154 156 163 165 170 <u>174</u> <u>176</u> <u>178</u> <u>182</u> <u>185</u> 190 192 195 198 <u>201</u> 3 8 14 22 36 39 42 54 60 65 75 92 95 103 106 109 117 123 128 133 147 169 <u>173</u> 181 184 189 <u>202</u> 2 53 59 64 91 102 116 122 127 <u>146</u> <u>168</u> <u>172</u> <u>203</u> <u>101</u> 121 126 <u>204</u> 100 <u>205</u> 99 <u>206</u> 98 <u>207</u> <u>208</u> <u>209</u> <u>210</u> <u>211</u> 212 213 214 215 216 217 <u>218</u> <u>219</u> <u>220</u> <u>221</u> <u>222</u> <u>223</u>];

(j) $\phi_T$=[199 197 196 194 193 191 188 187 186 183 <u>180</u> <u>179</u> 177 175 171 167 166 164 <u>162</u> <u>161</u> <u>160</u> 159 158 <u>157</u> <u>155</u> 153 <u>152</u> <u>150</u> 149 145 144 <u>142</u> <u>140</u> 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 <u>200</u> 198 195 192 190 185 <u>182</u> <u>178</u> 176 174 170 165 <u>163</u> <u>156</u> 154 <u>151</u> 148 <u>143</u> <u>141</u> 138 136 134 131 129 124 118 112 110 107 104 96 93 87 84 82 79 76 71 66 61 55 49 47 45 43 40 37 34 32 30 27 25 23 18 15 11 9 6 4 <u>201</u> 189 184 181 <u>173</u> <u>169</u> <u>147</u> 133 128 123 117 109 106 103 95 92 75 65 60 54 42 39 36 22 14 8 3 <u>202</u> 172 168 146 127 122 116 102 91 64 59 53 2 <u>203</u> 126 121 101 <u>204</u> 100 <u>205</u> 99 <u>206</u> 98 <u>207</u> <u>208</u> <u>209</u> <u>210</u> <u>211</u> 212 213 214 215 216 217 <u>218</u> <u>219</u> <u>220</u> <u>221</u> <u>222</u> <u>223</u>];

(k) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 <u>140</u> <u>142</u> <u>144</u> <u>145</u> 149 150 152 <u>153</u> <u>155</u> <u>157</u> <u>158</u> <u>159</u> <u>160</u> <u>161</u> <u>162</u> 164 166 167 <u>171</u> <u>175</u> <u>177</u> <u>179</u> <u>180</u> 183 186 187 188 191 193 194 196 197 199 <u>200</u> 4 6 9 11 15 18 23 25 27 30 32 34 37 40 43 45 47 49 55 61 66 71 76 79 82 84 87 93 96 104 107 110 112 118 124 129 131 134 136 138 <u>141</u> <u>143</u> 148 151 154 156 163 165 170 <u>174</u> <u>176</u> <u>178</u> <u>182</u> <u>185</u> 190 192 195 198 <u>201</u> 3 8 14 22 36 39 42 54 60 65 75 92 95 103 106 109 117 123 128 133 147 169 <u>173</u> 181 184 189 <u>202</u> 2 53 59 64 91 98 99 100 101 102 116 121 122 126 <u>127</u> <u>146</u> <u>168</u> <u>172</u> <u>203</u> <u>204</u> <u>205</u> <u>206</u> <u>207</u> <u>208</u> <u>209</u> <u>210</u> <u>211</u> 212 213 214 215 216 217 218 <u>219</u> <u>220</u> <u>221</u> <u>222</u> <u>223</u>];

(l) $\phi_T$=[199 197 196 194 193 191 188 187 186 183 <u>180</u> <u>179</u> 177 175 171 167 166 164 <u>162</u> <u>161</u> <u>160</u> 159 158 <u>157</u> <u>155</u> 153 <u>152</u> <u>150</u> 149 145 144 <u>142</u> <u>140</u> 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 <u>200</u> 198 195 192 190 185 <u>182</u> <u>178</u> 176 174 170 165 <u>163</u> <u>156</u> 154 <u>151</u> 148 <u>143</u> <u>141</u> 138 136 134 131 129 124 118 112 110 107 104 96 93 87 84 82 79 76 71 66 61 55 49 47 45 43 40 37 34 32 30 27 25 23 18 15 11 9 6 4 <u>201</u> 189 184 181 <u>173</u> <u>169</u> <u>147</u> 133 128 123 117 109 106 103 95 92 75 65 60 54 42 39 36 22 14 8 3 <u>202</u> 2 53 59 64 91 98 99 100 101 102 116 121 122 126 <u>127</u> <u>146</u> 168 172 <u>203</u> <u>204</u> <u>205</u> <u>206</u> <u>207</u> <u>208</u> 209 210 211 212 213 214 215 <u>216</u> <u>217</u> <u>218</u> <u>219</u> <u>220</u> <u>221</u> <u>222</u> <u>223</u>];

(m) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 <u>140</u> <u>142</u> <u>144</u> <u>145</u> 149 150 152 <u>153</u> <u>155</u> <u>157</u> <u>158</u> <u>159</u> <u>160</u> <u>161</u> <u>162</u> 164 166 167 <u>171</u> <u>175</u> <u>177</u> <u>179</u> <u>180</u> 183 186 187 188 191 193 194 196 197 199 <u>200</u> 4 6 9 11 15 18 23 25 27 30 32 34 37 40 43 45 47 49 55 61 66 71 76 79 82 84 87 93 96 104 107 110 112 118 124 129 131 134 136 138 <u>141</u> <u>143</u> 148 151 154 156 163 165 170 <u>174</u> <u>176</u> <u>178</u> <u>182</u> <u>185</u> 190 192 195 198 <u>201</u> 3 8 14 22 36 39 42 54 60 65 75 92 95 103 106 109 117 123 128 133 147 169 <u>173</u> 181 184 189 <u>202</u> 2 53 59 64 91 102 116 122

127 146 168 172 203 98 99 100 101 121 126 204 205 206 207 208 209 210 211 212 213 214 215 216 217 218 219 220 221 222 223];

(n) $\phi_T$=[199 197 196 194 193 191 188 187 186 183 180 179 177 175 171 167 166 164 162 161 160 159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 200 198 195 192 190 185 182 178 176 174 170 165 163 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 201 189 184 181 173 169 147 133 128 123 117 109 106 103 95 92 75 65 60 54 42 39 36 22 14 8 3 202 172 168 146 127 122 116 102 91 64 59 53 2 203 98 99 100 101 121 126 204 205 206 207 208 209 210 211 212 213 214 215 216 217 218 219 220 221 222 223];

(o) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 161 162 164 166 167 171 175 177 179 180 183 186 187 188 191 193 194 196 197 199 200 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 163 165 170 174 176 178 182 185 190 192 195 198 201 3 8 14 22 36 39 42 54 60 65 75 92 95 103 106 109 117 123 128 133 147 169 173 181 184 189 202 2 53 59 64 91 102 116 122 127 146 168 172 203 101 121 126 204 98 99 100 205 206 207 208 209 210 211 212 213 214 215 216 217 218 219 220 221 222 223];

(p) $\phi_T$=[199 197 196 194 193 191 188 187 186 183 180 179 177 175 171 167 166 164 162 161 160 159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 200 198 195 192 190 185 182 178 176 174 170 165 163 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 201 189 184 181 173 169 147 133 128 123 117 109 106 103 95 92 75 65 60 54 42 39 36 22 14 8 3 202 172 168 146 127 122 116 102 91 64 59 53 2 203 126 121 101 204 98 99 100 205 206 207 208 209 210 211 212 213 214 215 216 217 218 219 220 221 222 223];

(q) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 161 162 164 166 167 171 175 177 179 180 183 186 187 188 191 193 194 196 197 199 200 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 163 165 170 174 176 178 182 185 190 192 195 198 201 3 8 14 22 36 39 42 54 60 65 75 92 95 103 106 109 117 123 128 133 147 169 173 181 184 189 202 2 53 59 64 91 102 116 122 127 146 168 172 203 101 121 126 204 100 205 98 99 206 207 208 209 210 211 212 213 214 215 216 217 218 219 220 221 222 223];

(r) $\phi_T$=[199 197 196 194 193 191 188 187 186 183 180 179 177 175 171 167 166 164 162 161 160 159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 200 198 195 192 190 185 182 178 176 174 170 165 163 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 201 189 184 181 173 169 147 133 128 123 117 109 106 103 95 92 75 65 60 54 42 39 36 22 14 8 3 202 172 168 146 127 122 116 102 91 64 59 53 2 203 126 121 101 204 100 205 98 99 206 207 208 209 210 211 212 213 214 215 216 217 218 219 220 221 222 223];

(s) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 161 162 164 166 167 171 175 177 179 180 183 186 187 188 191 193 194 196 197 199 200 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 163 165 170 174 176 178 182 185 190 192 195 198 201 3 8 14 22 36 39 42 54 60 65 75 92 95 103 106 109 117 123 128 133 147 169 173 181 184 189 202 2 59 100 101 116 121 126 127 146 172 205 64 99 122 168 206 91 209 53 102 203 204 98 207 208 210 211 212 213 214 215 216 217 218 219 220 221 222 223];

(t) $\phi_T$=[199 197 196 194 193 191 188 187 186 183 180 179 177 175 171 167 166 164 162 161 160 159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 200 198 195 192 190 185 182 178 176 174 170 165 163 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 201 189 184 181 173 169 147 133 128 123 117 109 106 103 95 92 75 65 60 54 42 39 36 22 14 8 3 202 172 146 127 126 121 116 101 100 59 2 205 168 122 99 64 206 91 209 102 53 203 204 98 207 208 210 211 212 213 214 215 216 217 218 219 220 221 222 223];

(u) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 161 162 164 166 167 171 175 177 179 180 183 186 187 188 191 193 194 196 197 199 200 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 163 165 170 174 176 178 182 185 190 192 195 198 201 3 8 14 22 36 39 42 54 60 65 75 92 95 103 106 109 117 123 128 133 147 169 173 181 184 189 202 2 53 59 64 91 98 99 100 101 102 116 121 122 126 127 146 168 172 203 204 205 206 207 208 209 210 211 212 213 214 215 216 217 218 219 220 221 222 223];

(v) $\phi_T$=[199 197 196 194 193 191 188 187 186 183 180 179 177 175 171 167 166 164 162 161 160 159 158 157 155 153 152 150 149 145 144 142 140 139 137 135 132

130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 2 53 59 64 91 98 99 100 101
102 116 121 122 126 127 146 168 172 203 204 205 206
207 208 209 210 211 212 213 214 215 216 217 218 219
220 221 222 223];

(w) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 200 4 6 9 11 15 18
23 25 27 30 32 34 37 40 43 45 47 49 55 61 66 71 76
79 82 84 87 93 96 104 107 110 112 118 124 129 131
134 136 138 141 143 148 151 154 156 163 165 170 174
176 178 182 185 190 192 195 198 201 3 8 14 22 36 39
42 54 60 65 75 92 95 103 106 109 117 123 128 133 147
169 173 181 184 189 202 2 59 100 101 116 121 126
127 146 172 205 53 64 91 98 99 102 122 168 203 204
206 207 208 209 210 211 212 213 214 215 216 217 218
219 220 221 222 223];

(x) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 172 146 127 126 121 116
101 100 59 2 205 53 64 91 98 99 102 122 168 203 204
206 207 208 209 210 211 212 213 214 215 216 217 218
219 220 221 222 223];

(y) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 200 4 6 9 11 15 18
23 25 27 30 32 34 37 40 43 45 47 49 55 61 66 71 76
79 82 84 87 93 96 104 107 110 112 118 124 129 131
134 136 138 141 143 148 151 154 156 163 165 170 174
176 178 182 185 190 192 195 198 201 3 8 14 22 36 39
42 54 60 65 75 92 95 103 106 109 117 123 128 133 147
169 173 181 184 189 202 2 59 100 101 116 121 126
127 146 172 205 64 99 122 168 206 53 91 98 102 203
204 207 208 209 210 211 212 213 214 215 216 217 218
219 220 221 222 223];

(z) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 172 146 127 126 121 116
101 100 59 2 205 168 122 99 64 206 53 91 98 102 203
204 207 208 209 210 211 212 213 214 215 216 217 218
219 220 221 222 223];

(aa) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 200 4 6 9 11 15 18
23 25 27 30 32 34 37 40 43 45 47 49 55 61 66 71 76
79 82 84 87 93 96 104 107 110 112 118 124 129 131
134 136 138 141 143 148 151 154 156 163 165 170 174
176 178 182 185 190 192 195 198 201 3 8 14 22 36 39
42 54 60 65 75 92 95 103 106 109 117 123 128 133 147
169 173 181 184 189 202 2 59 100 101 116 121 126
127 146 172 205 64 99 122 168 206 91 209 53 98 102
203 204 207 208 210 211 212 213 214 215 216 217 218
219 220 221 222 223];

(bb) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 172 146 127 126 121 116
101 100 59 2 205 168 122 99 64 206 91 209 53 98 102
203 204 207 208 210 211 212 213 214 215 216 217 218
219 220 221 222 223];

(cc) $\phi_T$=[2, 3 5 7 8 10 11 12 18 19 20 21 22 25 27 28 33
35 36 37 38 39 41 43 47 51 55 57 58 62 64 67 70 71
74 76 77 78 79 81 83 85 89 90 91 93 95 96 97 100 101
102 109 110 114 116 120 121 123 125 126 127 128 129
130 131 135 136 142 145 147 152 157 158 165 168 171
173 175 178 180 181 182 187 188 190 194 195 198 199
212 0 6 13 14 15 24 26 30 31 40 48 53 54 60 63 68 72
73 80 84 86 87 88 92 98 104 106 111 115 134 137 139
141 148 149 153 154 161 163 164 167 172 174 179 186
191 192 197 215 1 9 17 23 32 49 52 75 82 99 118 122
124 132 143 144 156 159 162 169 170 176 183 185 189
196 204 34 42 44 45 46 65 105 108 112 155 166 207
4 61 119 133 138 146 211 29 56 59 94 103 117 218 107
113 160 193 208 16 177 184 200 69 150 210 50 203
151 202 140 201 209 214 66 205 206 213 216 217];

(dd) $\phi_T$=[199 198 195 194 190 188 187 182 181 180 178
175 173 171 168 165 158 157 152 147 145 142 136 135
131 130 129 128 127 126 125 123 121 120 116 114 110
109 102 101 100 97 96 95 93 91 90 89 85 83 81 79 78
77 76 74 71 70 67 64 62 58 57 55 51 47 43 41 39 38
37 36 35 33 28 27 25 22 21 20 19 18 12 11 10 8 7 5
3 2 212 197 192 191 186 179 174 172 167 164 163 161
154 153 149 148 141 139 137 134 115 111 106 104 98
92 88 87 86 84 80 73 72 68 63 60 54 53 48 40 31 30
26 24 15 14 13 6 0 215 196 189 185 183 176 170 169

162 159 156 144 143 132 124 122 118 99 82 75 52 49 32 23 17 9 1 204 166 155 112 108 105 65 46 45 44 42 34 207 146 138 133 119 61 4 211 117 103 94 59 56 29 218 193 160 113 107 208 184 177 16 200 150 69 210 50 203 151 202 140 209 214 201 66 206 213 216 217 205];

(ee) $\phi_T$=[2, 3 5 7 8 10 11 12 18 19 20 21 22 25 27 28 33 35 36 37 38 39 41 43 47 51 55 57 58 62 64 67 70 71 74 76 77 78 79 81 83 85 89 90 91 93 95 96 97 100 101 102 109 110 114 116 120 121 123 125 126 127 128 129 130 131 135 136 142 145 147 152 157 158 165 168 171 173 175 178 180 181 182 187 188 190 194 195 198 199 212 0 6 13 14 15 24 26 30 31 40 48 53 54 60 63 68 72 73 80 84 86 87 88 92 98 104 106 111 115 134 137 139 141 148 149 153 154 161 163 164 167 172 174 179 186 191 192 197 215 1 9 17 23 32 49 52 75 82 99 118 122 124 132 143 144 156 159 162 169 170 176 183 185 189 196 204 4 16 29 34 42 44 45 46 50 56 59 61 65 66 69 94 103 105 107 108 112 113 117 119 133 138 140 146 150 151 155 160 166 177 184 193 200 201 202 203 205 206 207 208 209 210 211 213 214 216 217 218];

(ff) $\phi_T$=[199 198 195 194 190 188 187 182 181 180 178 175 173 171 168 165 158 157 152 147 145 142 136 135 131 130 129 128 127 126 125 123 121 120 116 114 110 109 102 101 100 97 96 95 93 91 90 89 85 83 81 79 78 77 76 74 71 70 67 64 62 58 57 55 51 47 43 41 39 38 37 36 35 33 28 27 25 22 21 20 19 18 12 11 10 8 7 5 3 2 212 197 192 191 186 179 174 172 167 164 163 161 154 153 149 148 141 139 137 134 115 111 106 104 98 92 88 87 86 84 80 73 72 68 63 60 54 53 48 40 31 30 26 24 15 14 13 6 0 215 196 189 185 183 176 170 169 162 159 156 144 143 132 124 122 118 99 82 75 52 49 32 23 17 9 1 204 4 16 29 34 42 44 45 46 50 56 59 61 65 66 69 94 103 105 107 108 112 113 117 119 133 138 140 146 150 151 155 160 166 177 184 193 200 201 202 203 205 206 207 208 209 210 211 213 214 216 217 218];

(gg) $\phi_T$=[2, 3 5 7 8 10 11 12 18 19 20 21 22 25 27 28 33 35 36 37 38 39 41 43 47 51 55 57 58 62 64 67 70 71 74 76 77 78 79 81 83 85 89 90 91 93 95 96 97 100 101 102 109 110 114 116 120 121 123 125 126 127 128 129 130 131 135 136 142 145 147 152 157 158 165 168 171 173 175 178 180 181 182 187 188 190 194 195 198 199 212 0 6 13 14 15 24 26 30 31 40 48 53 54 60 63 68 72 73 80 84 86 87 88 92 98 104 106 111 115 134 137 139 141 148 149 153 154 161 163 164 167 172 174 179 186 191 192 197 215 1 9 17 23 32 49 52 75 82 99 118 122 124 132 143 144 156 159 162 169 170 176 183 185 189 196 204 34 42 44 45 46 65 105 108 112 155 166 207 4 16 29 50 56 59 61 66 69 94 103 107 113 117 119 133 138 140 146 150 151 160 177 184 193 200 201 202 203 205 206 208 209 210 211 213 214 216 217 218];

(hh) $\phi_T$=[199 198 195 194 190 188 187 182 181 180 178 175 173 171 168 165 158 157 152 147 145 142 136 135 131 130 129 128 127 126 125 123 121 120 116 114 110 109 102 101 100 97 96 95 93 91 90 89 85 83 81 79 78 77 76 74 71 70 67 64 62 58 57 55 51 47 43 41 39 38 37 36 35 33 28 27 25 22 21 20 19 18 12 11 10 8 7 5 3 2 212 197 192 191 186 179 174 172 167 164 163 161 154 153 149 148 141 139 137 134 115 111 106 104 98 92 88 87 86 84 80 73 72 68 63 60 54 53 48 40 31 30 26 24 15 14 13 6 0 215 196 189 185 183 176 170 169 162 159 156 144 143 132 124 122 118 99 82 75 52 49 32 23 17 9 1 204 166 155 112 108 105 65 46 45 44 42 34 207 4 16 29 50 56 59 61 66 69 94 103 107 113 117 119 133 138 140 146 150 151 160 177 184 193 200 201 202 203 205 206 208 209 210 211 213 214 216 217 218];

(ii) $\phi_T$=[2 3 5 7 8 10 11 12 18 19 20 21 22 25 27 28 33 35 36 37 38 39 41 43 47 51 55 57 58 62 64 67 70 71 74 76 77 78 79 81 83 85 89 90 91 93 95 96 97 100 101 102 109 110 114 116 120 121 123 125 126 127 128 129 130 131 135 136 142 145 147 152 157 158 165 168 171 173 175 178 180 181 182 187 188 190 194 195 198 199 212 0 6 13 14 15 24 26 30 31 40 48 53 54 60 63 68 72 73 80 84 86 87 88 92 98 104 106 111 115 134 137 139 141 148 149 153 154 161 163 164 167 172 174 179 186 191 192 197 215 1 9 17 23 32 49 52 75 82 99 118 122 124 132 143 144 156 159 162 169 170 176 183 185 189 196 204 34 42 44 45 46 65 105 108 112 155 166 207 4 61 119 133 138 146 211 16 29 50 56 59 66 69 94 103 107 113 117 140 150 151 160 177 184 193 200 201 202 203 205 206 208 209 210 213 214 216 217 218];

(jj) $\phi_T$=[199 198 195 194 190 188 187 182 181 180 178 175 173 171 168 165 158 157 152 147 145 142 136 135 131 130 129 128 127 126 125 123 121 120 116 114 110 109 102 101 100 97 96 95 93 91 90 89 85 83 81 79 78 77 76 74 71 70 67 64 62 58 57 55 51 47 43 41 39 38 37 36 35 33 28 27 25 22 21 20 19 18 12 11 10 8 7 5 3 2 212 197 192 191 186 179 174 172 167 164 163 161 154 153 149 148 141 139 137 134 115 111 106 104 98 92 88 87 86 84 80 73 72 68 63 60 54 53 48 40 31 30 26 24 15 14 13 6 0 215 196 189 185 183 176 170 169 162 159 156 144 143 132 124 122 118 99 82 75 52 49 32 23 17 9 1 204 166 155 112 108 105 65 46 45 44 42 34 207 146 138 133 119 61 4 211 16 29 50 56 59 66 69 94 103 107 113 117 140 150 151 160 177 184 193 200 201 202 203 205 206 208 209 210 213 214 216 217 218];

(kk) $\phi_T$=[2, 3, 5, 7, 8, 10, 11, 12, 18, 19, 20, 21, 22, 25, 27, 28, 33, 35, 36, 37, 38, 39, 41, 43, 47, 51, 55, 57, 58, 62, 64, 67, 70, 71, 74, 76, 77, 78, 79, 81, 83, 85, 89, 90, 91, 93, 95, 96, 97, 100, 101, 102, 109, 110, 114, 116, 120, 121, 123, 125, 126, 127, 128, 129, 130, 131, 135, 136, 142, 145, 147, 152, 157, 158, 165, 168, 171, 173, 175, 178, 180, 181, 182, 187, 188, 190, 194, 195, 198, 199, 212, 0, 6, 13, 14, 15, 24, 26, 30, 31, 40, 48, 53, 54, 60, 63, 68, 72, 73, 80, 84, 86, 87, 88, 92, 98, 104, 106, 111, 115, 134, 137, 139, 141, 148, 149, 153, 154, 161, 163, 164, 167, 172, 174, 179, 186, 191, 192, 197, 215, 1, 9, 17, 23, 32, 49, 52, 75, 82, 99, 118, 122, 124, 132, 143, 144, 156, 159, 162, 169, 170, 176, 183, 185, 189, 196, 204, 34, 42, 44, 45, 46, 65, 105, 108, 112, 155, 166, 207, 4, 61, 119, 133, 138, 146, 211, 29, 56, 59, 94, 103, 117, 218, 107, 113, 160, 193, 208, 16, 177, 184, 200, 140, 151, 201, 66, 205, 50, 209, 150, 206, 69, 202, 203, 210, 213, 214, 216, 217];

Particular embodiments include some of the following features and benefits. In particular embodiments, CRC checking can be done bit-by-bit for each individual CRC bit. This is in contrast to existing methods where the entire length-$K_{CRC}$ vector of CRC bits are used in CRC checking. Bit-by-bit CRC checking enables the decoder to terminate the decoding process earlier should the decoded value of any of the CRC bits be found to be inconsistent with the decoded values of the information bits upon which the CRC bits depend, for all candidate paths in the list. The CRC checking can be performed during the SCL decoding. This is in contrast to existing methods which performs CRC checking only after the end of SCL decoding.

In particular embodiments, the decoder at the receiver can be run with the early termination feature, using the distributed CRC bits. In some embodiments, the distributed CRC bits do not carry a mask. When the decoder reaches a distributed CRC bit $p_i$, the decoder performs the following to decide if the decoding process should terminate early.

Step 1: The decoder calculates L estimated values, $p_i(\ell)$, of the distributed CRC bit $p_i$, one for each list $\ell$, $\ell = 0, 1, \ldots, L-1$.

Step 2: For each $p_i(\ell)$, the decoder checks if the info bits associated with $p_i(\ell)$ results in a successful parity check.

Step 3: if no parity check for each $p_i(\ell)$ are successful, the decoding process can terminate and deliver a 'decoding failure' message as the decoder output. If parity check(s) for one or more of $p_i(\ell)$ are successful, then the decoding process continues normally.

In another embodiment, the distributed CRC bits carry a mask (i.e., the distributed CRC bit $q_i$, and becomes: $w_i = (p_i + q_i)$ mod 2. When the decoder reaches the bit location of a distributed CRC bit $p_i$, the decoder performs the following to decide if the decoding process should terminate early.

Step 1: The decoder calculates L estimated values, $w_i(\ell)$, of the distributed CRC bit $p_i$, one for each list $\ell$, $\ell = 0, 1, \ldots, L-1$.

Step 2: For each $w_i(\ell)$, the decoder removes the mask, $p_i = (w_i + q_i)$ mod 2. Step 3: For each $p_i(\ell)$, the decoder checks if the info bits associated with $p_i(\ell)$ results in a successful parity check.

Step 4: If no parity check for each $p_i(\ell)$ are successful, the decoding process can terminate and deliver the 'decoding failure' message as the decoder output. If parity check(s) for one or more of $p_i(\ell)$ are successful, then the decoding process continues normally.

Figure 7:
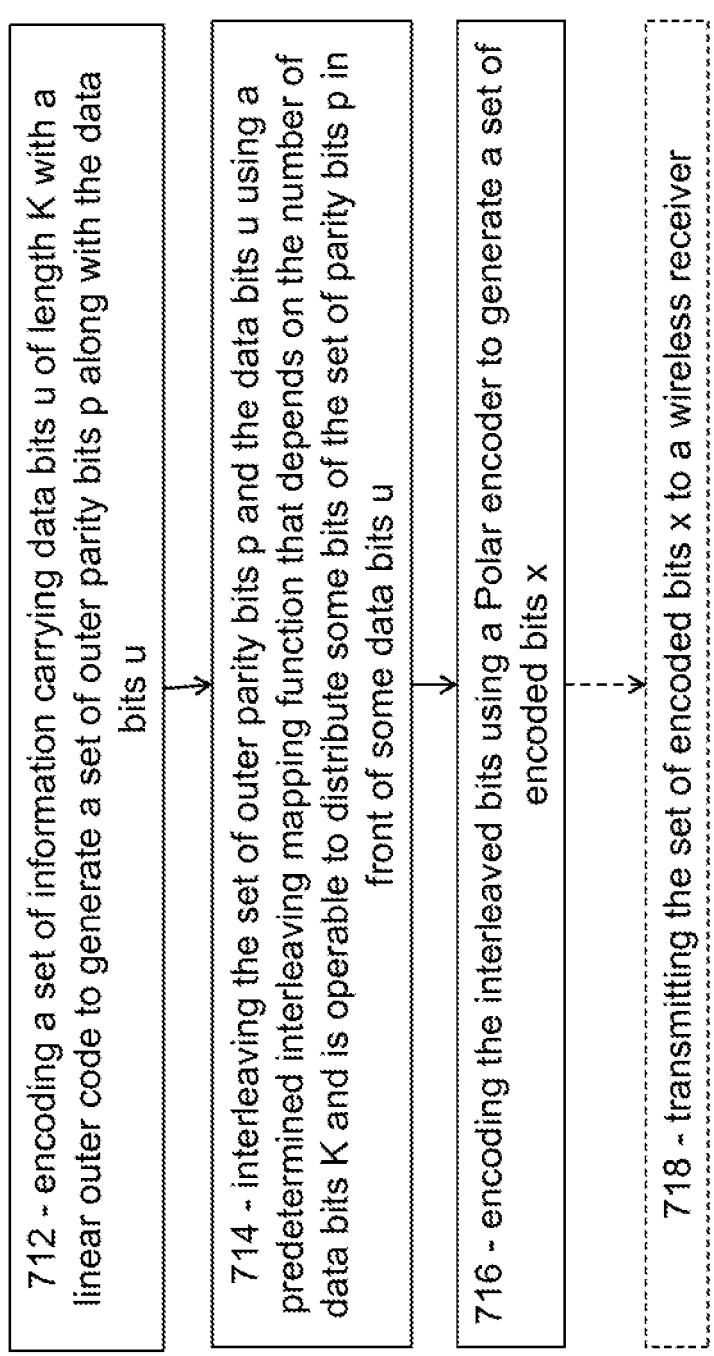
FIG. 7 is a flow diagram illustrating an example method in a wireless transmitter, according to particular embodiments.

FIG. 7 is a flow diagram illustrating an example method in a wireless transmitter, according to particular embodiments. In particular embodiments, one or more steps of FIG. 7 may be performed by network node 120 or wireless device 110 of network 100 described with respect to FIG. 2.

The method begins at step 712, where a wireless transmitter encodes a set of information carrying data bits u of length K with a linear outer code to generate a set of outer parity bits p along with the data bits u. For example, network node 120 may encode a set of outer parity bits (e.g., using a CRC) and data bits according to any of the embodiments and examples described above with respect to FIGS. 3-6.

At step 714, the wireless transmitter interleaves the set of outer parity bits p and the data bits u using a predetermined interleaving mapping function that depends on the number of data bits K and is operable to distribute some bits of the set of parity bits p in front of some data bits u. For example, network node 120 may interleave the set of outer parity bits p and the data bits u using any of the embodiments and examples described above with respect to FIGS. 3-6.

At step 716, the wireless transmitter encodes the interleaved bits using a polar encoder to generate a set of encoded bits x. For example, network node 120 may encode the interleaved bits according to any of the embodiments and examples described above with respect to FIGS. 3-6.

At step 718, the wireless transmitter may transmit the set of encoded bits x to a wireless receiver. For example, network node 120 transmits the set of encoded bits x to wireless device 110.

Modifications, additions, or omissions may be made to method 700 of FIG. 7. Additionally, one or more steps in the method of FIG. 7 may be performed in parallel or in any suitable order. The steps may be repeated over time as necessary.

Figure 8:
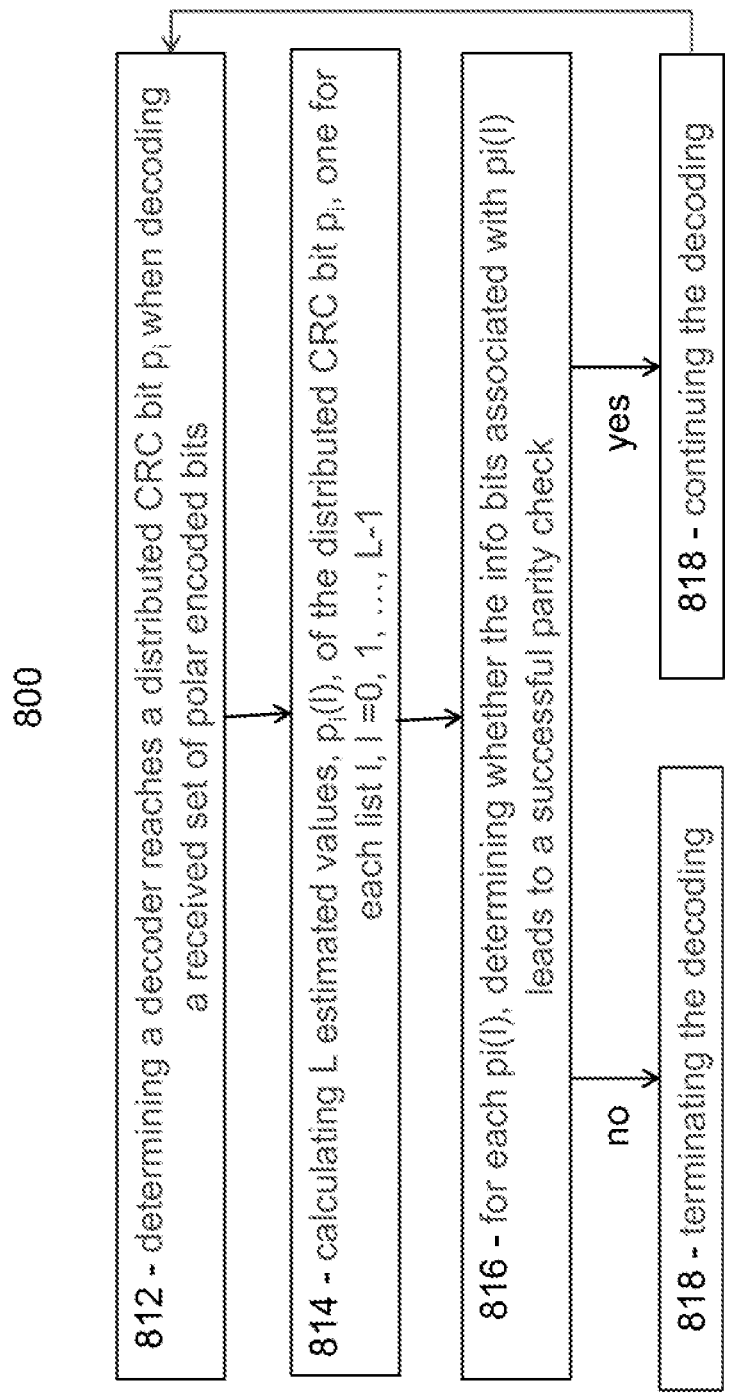
FIG. 8 is a flow diagram illustrating an example method in a wireless receiver, according to particular embodiments.

FIG. 8 is a flow diagram illustrating an example method in a wireless receiver, according to particular embodiments. In particular embodiments, one or more steps of FIG. 8 may be performed by network node 120 or wireless device 110 of network 100 described with respect to FIG. 2.

The method begins at step 812, where a wireless receiver determines that a decoder reaches a distributed CRC bit $p_i$ when decoding a received set of polar encoded bits. For example, wireless device 110 may decode a set of polar encoded bits according to any of the deinterleaving embodiments or examples described above, such as successive cancellation list (SCL) decoding.

At step 814, the wireless receiver calculates L estimated values, $p_i(\ell)$, of the distributed CRC bit $p_i$, one for each list $\ell$, $\ell = 0, 1, \ldots, L-1$. For example, wireless device 110 may estimate a list of values for a parity bit.

At step 814, for each $p_i(\ell)$, the wireless receiver determines whether the info bits associated with $p_i(\ell)$ leads to a successful parity check. For example, wireless device 110 determines if a data bit was correctly received using the list of values for the parity bit. If the decoding is not successful, then the method continues to step 816 where the wireless receiver terminates the decoding. If the decoding is successful, then the method continues to step 818 where the wireless receiver continues the decoding.

Modifications, additions, or omissions may be made to method 800 of FIG. 8. Additionally, one or more steps in the method of FIG. 8 may be performed in parallel or in any suitable order. The steps may be repeated over time as necessary.

Figure 9B:
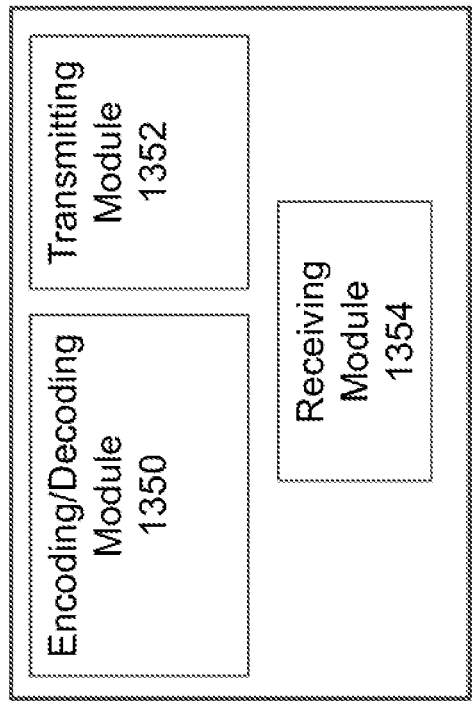
FIG. 9B is a block diagram illustrating example components of a wireless device.
Figure 9A:
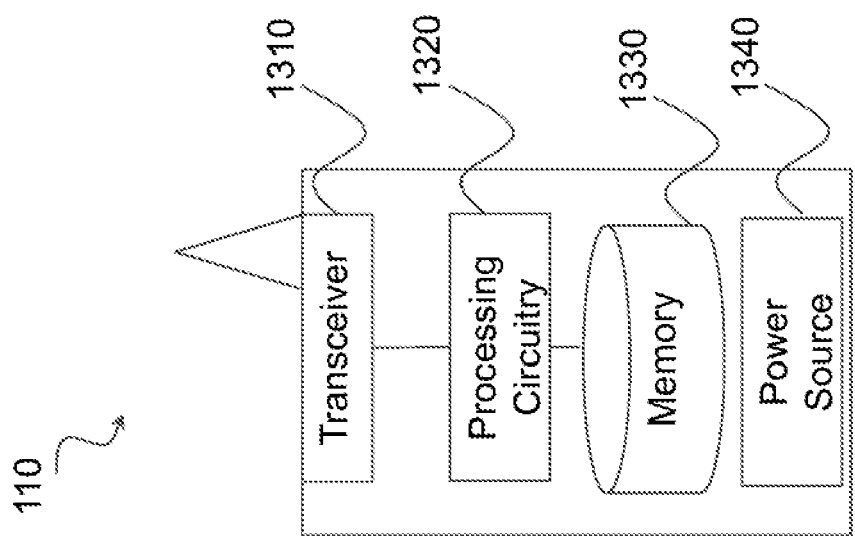
FIG. 9A is a block diagram illustrating an example embodiment of a wireless device.

FIG. 9A is a block diagram illustrating an example embodiment of a wireless device. The wireless device is an example of the wireless devices 110 illustrated in FIG. 2. In particular embodiments, the wireless device is capable of encoding and decoding a transmission using a CRC interleaving pattern for polar codes.

Particular examples of a wireless device include a mobile phone, a smart phone, a PDA (Personal Digital Assistant), a portable computer (e.g., laptop, tablet), a sensor, a modem, a machine type (MTC) device/machine to machine (M2M) device, laptop embedded equipment (LEE), laptop mounted equipment (LME), USB dongles, a device-to-device capable device, a vehicle-to-vehicle device, or any other device that can provide wireless communication. The wireless device includes transceiver 1310, processing circuitry 1320, memory 1330, and power source 1340. In some embodiments, transceiver 1310 facilitates transmitting wireless signals to and receiving wireless signals from wireless network node 120 (e.g., via an antenna), processing circuitry 1320 executes instructions to provide some or all of the functionality described herein as provided by the wireless device, and memory 1330 stores the instructions executed by processing circuitry 1320. Power source 1340 supplies electrical power to one or more of the components of wireless device 110, such as transceiver 1310, processing circuitry 1320, and/or memory 1330.

Processing circuitry 1320 includes any suitable combination of hardware and software implemented in one or more integrated circuits or modules to execute instructions and manipulate data to perform some or all of the described functions of the wireless device. In some embodiments, processing circuitry 1320 may include, for example, one or more computers, one more programmable logic devices, one or more central processing units (CPUs), one or more microprocessors, one or more applications, and/or other logic, and/or any suitable combination of the preceding. Processing circuitry 1320 may include analog and/or digital circuitry configured to perform some or all of the described functions of wireless device 110. For example, processing circuitry 1320 may include resistors, capacitors, inductors, transistors, diodes, and/or any other suitable circuit components.

Memory 1330 is generally operable to store computer executable code and data. Examples of memory 1330 include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or or any other volatile or non-volatile, non-transitory computer-readable and/or computer-executable memory devices that store information.

Power source 1340 is generally operable to supply electrical power to the components of wireless device 110. Power source 1340 may include any suitable type of battery, such as lithium-ion, lithium-air, lithium polymer, nickel cadmium, nickel metal hydride, or any other suitable type of battery for supplying power to a wireless device.

Other embodiments of the wireless device may include additional components (beyond those shown in FIG. 9A) responsible for providing certain aspects of the wireless device's functionality, including any of the functionality described above and/or any additional functionality (including any functionality necessary to support the solution described above).

FIG. 9B is a block diagram illustrating example components of a wireless device 110. The components may include encoding/decoding module 1350, transmitting module 1352 and receiving module 1354.

Encoding/decoding module 1350 may perform the encoding and decoding functions of wireless device 110. For example, encoding/decoding module 1350 may encode and decode a set of bits according to any of the CRC interleaving examples and embodiments described above. In some embodiments, encoding/decoding module 1350 may perform only encoding, may perform only decoding, or may perform both encoding and decoding. In certain embodiments, encoding/decoding module 1350 may include or be included in processing circuitry 1320. In particular embodiments, encoding/decoding module 1350 may communicate with transmitting module 1352 and receiving module 1354.

Transmitting module 1352 may perform the transmitting functions of wireless device 110. For example, transmitting module 1352 may transmit an encoded set of bits to network node 120. In certain embodiments, transmitting module 1352 may include or be included in processing circuitry 1320. In particular embodiments, transmitting module 1352 may communicate with scheduling module 1350 and receiving module 1354.

Receiving module 1354 may perform the receiving functions of wireless device 110. For example, receiving module 1354 may receive an encoded set of bits from network node 120. In certain embodiments, receiving module 1354 may include or be included in processing circuitry 1320. In particular embodiments, transmitting module 1352 may communicate with scheduling module 1350 and transmitting module 1352.

Figure 10B:
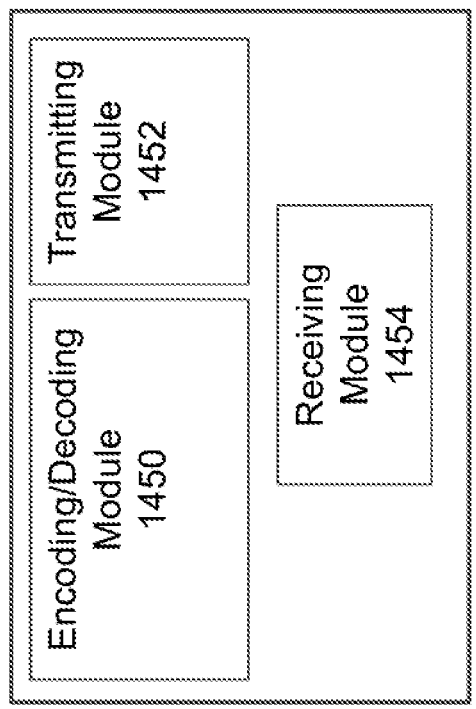
FIG. 10B is a block diagram illustrating example components of a network node.
Figure 10A:
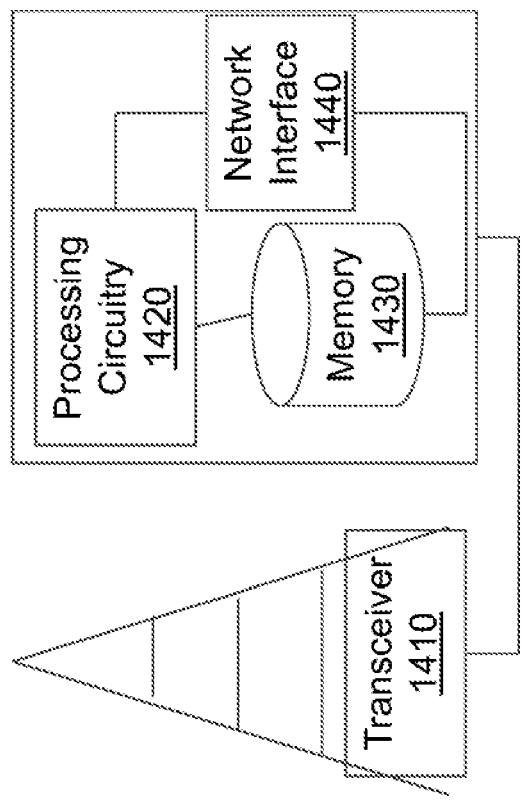
FIG. 10A is a block diagram illustrating an example embodiment of a network node.

FIG. 10A is a block diagram illustrating an example embodiment of a network node. The network node is an example of the network node 120 illustrated in FIG. 2. In particular embodiments, the network node is capable of encoding and decoding a transmission using a CRC interleaving pattern for polar codes.

Network node 120 can be an eNodeB, a nodeB, gNB, a base station, a wireless access point (e.g., a Wi-Fi access point), a low power node, a base transceiver station (BTS), a transmission point or node, a remote RF unit (RRU), a remote radio head (RRH), or other radio access node. The network node includes at least one transceiver 1410, at least one processing circuitry 1420, at least one memory 1430, and at least one network interface 1440. Transceiver 1410 facilitates transmitting wireless signals to and receiving wireless signals from a wireless device, such as wireless devices 110 (e.g., via an antenna); processing circuitry 1420 executes instructions to provide some or all of the functionality described above as being provided by a network node 120; memory 1430 stores the instructions executed by processing circuitry 1420; and network interface 1440 communicates signals to backend network components, such as a gateway, switch, router, Internet, Public Switched Telephone Network (PSTN), controller, and/or other network nodes 120. Processing circuitry 1420 and memory 1430 can be of the same types as described with respect to processing circuitry 1320 and memory 1330 of FIG. 9A above.

In some embodiments, network interface 1440 is communicatively coupled to processing circuitry 1420 and refers to any suitable device operable to receive input for network node 120, send output from network node 120, perform suitable processing of the input or output or both, communicate to other devices, or any combination of the preceding. Network interface 1440 includes appropriate hardware (e.g., port, modem, network interface card, etc.) and software, including protocol conversion and data processing capabilities, to communicate through a network.

FIG. 10B is a block diagram illustrating example components of a network node 120. The components may include encoding/decoding module 1450, transmitting module 1452 and receiving module 1454.

Encoding/decoding module 1450 may perform the encoding and decoding functions of network node 120. For example, encoding/decoding module 1450 may encode and decode a set of bits according to any of the CRC interleaving examples and embodiments described above. In some embodiments, encoding/decoding module 1450 may perform only encoding, may perform only decoding, or may perform both encoding and decoding. In certain embodiments, encoding/decoding module 1450 may include or be included in processing circuitry 1420. In particular embodiments, encoding/decoding module 1450 may communicate with transmitting module 1452 and receiving module 1454.

Transmitting module 1452 may perform the transmitting functions of network node 120. For example, transmitting module 1452 may transmit an encoded set of bits to wireless device 110. In certain embodiments, transmitting module 1452 may include or be included in processing circuitry 1420. In particular embodiments, transmitting module 1452 may communicate with encoding/decoding module 1450 and receiving module 1454.

Receiving module 1454 may perform the receiving functions of network node 120. For example, receiving module 1454 may receive an encoded set of bits from wireless device 110. In certain embodiments, receiving module 1454 may include or be included in processing circuitry 1420. In particular embodiments, transmitting module 1452 may communicate with encoding/decoding module 1450 and transmitting module 1452.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the claims below.

Abbreviations Used in the Preceding Description Include:
3GPP Third Generation Partnership Project
BBU Baseband Unit
BTS Base Transceiver Station
CC Component Carrier
CRC Cyclic Redundancy Check
CQI Channel Quality Information
CSI Channel State Information
D2D Device to Device
DCI Downlink Control Information
DFT Discrete Fourier Transform
DMRS Demodulation Reference Signal
eNB eNodeB
FDD Frequency Division Duplex
FFT Fast Fourier Transform
gNB Next-generation NodeB
LAA Licensed-Assisted Access
LBT Listen-before-talk
LDPC Low-Density Parity Check
LTE Long Term Evolution
LTE-U LTE in Unlicensed Spectrum
M2M Machine to Machine
MCS Modulation and Coding Scheme
MIB Master Information Block
MIMO Multi-Input Multi-Output
MTC Machine Type Communication
NR New Radio
OFDM Orthogonal Frequency Division Multiplexing
PCM Parity Check Matrix
PRB Physical Resource Block
RAN Radio Access Network
RAT Radio Access Technology
RBS Radio Base Station
RNC Radio Network Controller
RRC Radio Resource Control
RRH Remote Radio Head
RRU Remote Radio Unit
SCell Secondary Cell
SI System Information
SIB System Information Block
TB Transport Block
TBS Transport Block Size
TDD Time Division Duplex
TTI Transmission Time Interval
UE User Equipment
UL Uplink
UTRAN Universal Terrestrial Radio Access Network
WAN Wireless Access Network

The invention claimed is:

1. A method of operation of a wireless receiver in a wireless communication network, the method comprising:
receiving a set of polar encoded bits;
determining a decoder reaches a distributed CRC bit $p_i$ when decoding the set of polar encoded bits;
calculating L estimated values, $p_i(\ell)$, of the distributed CRC bit $p_i$, one for each list $\ell$, $\ell = 0, 1, \ldots, L-1$;
for each $p_i(\ell)$, determining whether the info bits associated with $p_i(\ell)$ leads to a successful parity check;
upon determining there is no successful parity check for each $p_i(\ell)$, terminating the decoding; and
upon determining there exists a successful parity check, continuing the decoding;
wherein the decoding comprises template deinterleaving.

2. The method of claim 1, wherein the template deinterleaving is based on a predetermined interleaving mapping function comprising a template interleaver for a largest value of K, referred to as $K_{max}$, and the template interleaver comprises a high-index bit mapper wherein:
the K data bits are loaded at the high-index positions of the input of the template interleaver, where $u = [u_0, u_1, \ldots, u_{K-1}]$ and the input of the template interleaver, denoted by $v = [v_0, u_1, \ldots, v_{K_{max}-1}]$, is given by the following bit mapping:

$$v_i = \begin{cases} u_{i-K_{max}+K} & K_{max} - K \leq i < K_{max} \\ p_{i-K_{max}} & i \geq K_{max} \\ \text{NULL} & \text{otherwise} \end{cases}.$$

3. The method of claim 2, wherein $K_{max}$ is 72 and the template interleaver uses an interleaving pattern comprising any one of the following interleaving patterns, wherein indices corresponding to cyclic redundancy check (CRC) bits are underlined:
(a) $\phi_7 = $[3 4 8 11 13 14 17 18 23 30 31 34 38 40 41 43 44 45 47 49 51 52 56 57 58 63 64 65 66 71 <u>87</u> 5 7 9 12 16 20 24 27 29 33 35 39 50 54 67 70 <u>77</u> 0 <u>15</u> 26 28 36 37 46 60 69 <u>80</u> 1 19 55 59 68 <u>73</u> 32 <u>53</u> 61 <u>84</u> 10 62 <u>72</u> 21 <u>81</u> 48 <u>83</u> <u>22</u> <u>76</u> 42 <u>88</u> 2 <u>74</u> <u>75</u> 25 <u>82</u> <u>85</u> 6 <u>78</u> <u>79</u> <u>86</u> <u>89</u> <u>90</u>];
(b) $\phi_7 = $[3 4 8 11 13 14 17 18 23 30 31 34 38 40 41 43 44 45 47 49 51 52 56 57 58 63 64 65 66 71 <u>87</u> 5 7 9 12 16 20 24 27 29 33 35 39 50 54 67 70 <u>77</u> 0 <u>15</u> 26 28 36 37 46 60 69 <u>80</u> 1 2 6 10 19 21 22 <u>25</u> <u>32</u> 42 48 53 55 59 61 62 68 <u>72</u> <u>73</u> <u>74</u> <u>75</u> <u>76</u> <u>78</u> <u>79</u> <u>81</u> <u>82</u> <u>83</u> <u>84</u> <u>85</u> <u>86</u> <u>88</u> <u>89</u> <u>90</u>];
(c) $\phi_7 = $[3 4 8 11 13 14 17 18 23 30 31 34 38 40 41 43 44 45 47 49 51 52 56 57 58 63 64 65 66 71 <u>87</u> 5 7 9 12 16 20 24 27 29 33 35 39 50 54 67 70 <u>77</u> 0 <u>15</u> 26 28 36 37 46 60 69 <u>80</u> 1 19 55 59 68 <u>73</u> 2 <u>6</u> 10 21 22 25 32 42 48 53 61 <u>62</u> <u>72</u> <u>74</u> <u>75</u> <u>76</u> <u>78</u> <u>79</u> <u>81</u> <u>82</u> <u>83</u> <u>84</u> <u>85</u> <u>86</u> <u>88</u> <u>89</u> <u>90</u>];
(d) $\phi_7 = $[3 4 8 11 13 14 17 18 23 30 31 34 38 40 41 43 44 45 47 49 51 52 56 57 58 63 64 65 66 71 <u>87</u> 5 7 9 12 16 20 24 27 29 33 35 39 50 54 67 70 <u>77</u> 0 <u>15</u> 26 28 36 37 46 60 69 <u>80</u> 1 19 55 59 68 <u>73</u> 32 <u>53</u> 61 <u>84</u> 2 6 10 21 22 25 42 <u>48</u> 62 <u>72</u> <u>74</u> <u>75</u> <u>76</u> <u>78</u> <u>79</u> <u>81</u> <u>82</u> <u>83</u> <u>85</u> <u>86</u> <u>88</u> <u>89</u> <u>90</u>].

4. The method of claim 2, wherein $K_{max}$ is <u>140</u> and the template interleaver uses an interleaving pattern comprising any one of the following interleaving patterns, wherein indices corresponding to cyclic redundancy check (CRC) bits are underlined:
(a) $\phi_7 = $[0 3 6 9 11 12 13 14 15 17 18 19 21 22 28 29 30 37 38 42 43 48 53 57 59 64 65 66 69 71 72 73 78 79 91 92 97 106 111 114 117 119 122 125 126 127 128 130 131 134 136 137 <u>144</u> 1 4 7 10 16 20 23 31 39 44 49 54 58 60 67 70 74 <u>80</u> <u>93</u> 98 107 112 115 118 120 123 129

132 135 138 145 2 5 8 24 32 40 45 50 55 61 68 75 81
94 99 108 113 116 121 124 133 139 146 26 33 34 41
46 77 83 87 88 89 100 101 104 109 110 147 25 51 56
62 76 82 95 140 27 84 86 96 102 161 36 103 105 150
90 159 52 163 63 153 47 143 85 151 158 160 162 35
141 142 148 149 152 154 155 156 157];

(b) $\phi_T$=[0 3 6 9 11 12 13 14 15 17 18 19 21 22 28 29 30
37 38 42 43 48 53 57 59 64 65 66 69 71 72 73 78 79
91 92 97 106 111 114 117 119 122 125 126 127 128 130
131 134 136 137 144 1 4 7 10 16 20 23 31 39 44 49 54
58 60 67 70 74 80 93 98 107 112 115 118 120 123 129
132 135 138 145 2 5 8 24 32 40 45 50 55 61 68 75 81
94 99 108 113 116 121 124 133 139 146 25 26 27 33
34 35 36 41 46 47 51 52 56 62 63 76 77 82 83 84 85
86 87 88 89 90 95 96 100 101 102 103 104 105 109 110
140 141 142 143 147 148 149 150 151 152 153 154 155
156 157 158 159 160 161 162 163];

(c) $\phi_T$=[0 3 6 9 11 12 13 14 15 17 18 19 21 22 28 29 30
37 38 42 43 48 53 57 59 64 65 66 69 71 72 73 78 79
91 92 97 106 111 114 117 119 122 125 126 127 128 130
131 134 136 137 144 1 4 7 10 16 20 23 31 39 44 49 54
58 60 67 70 74 80 93 98 107 112 115 118 120 123 129
132 135 138 145 2 5 8 24 32 40 45 50 55 61 68 75 81
94 99 108 113 116 121 124 133 139 146 26 33 34 41
46 77 83 87 88 89 100 101 104 109 110 147 25 27 35
36 47 51 52 56 62 63 76 82 84 85 86 90 95 96 102 103
105 140 141 142 143 148 149 150 151 152 153 154 155
156 157 158 159 160 161 162 163];

(d) $\phi_T$=[0 3 6 9 11 12 13 14 15 17 18 19 21 22 28 29 30
37 38 42 43 48 53 57 59 64 65 66 69 71 72 73 78 79
91 92 97 106 111 114 117 119 122 125 126 127 128 130
131 134 136 137 144 1 4 7 10 16 20 23 31 39 44 49 54
58 60 67 70 74 80 93 98 107 112 115 118 120 123 129
132 135 138 145 2 5 8 24 32 40 45 50 55 61 68 75 81
94 99 108 113 116 121 124 133 139 146 26 33 34 41
46 77 83 87 88 89 100 101 104 109 110 147 25 51 56
62 76 82 95 140 27 35 36 47 52 63 84 85 86 90 96 102
103 105 141 142 143 148 149 150 151 152 153 154 155
156 157 158 159 160 161 162 163];

(e) $\phi_T$=[0 2 4 7 9 14 19 20 24 25 26 28 31 34 42 45 49
50 51 53 54 56 58 59 61 62 65 66 67 69 70 71 72 76
77 81 82 83 87 88 89 91 93 95 98 101 104 106 108 110
111 113 115 118 119 120 122 123 126 127 129 132 134
138 139 140 1 3 5 8 10 15 21 27 29 32 35 43 46 52 55
57 60 63 68 73 78 84 90 92 94 96 99 102 105 107 109
112 114 116 121 124 128 130 133 135 141 6 11 16 22
30 33 36 44 47 64 74 79 85 97 100 103 117 125 131
136 142 12 17 23 37 48 75 80 86 137 143 13 18 38 144
39 145 40 146 41 147 148 149 150 151 152 153 154
155 156 157 158 159 160 161 162 163];

(f) $\phi_T$=[0 2 4 7 9 14 19 20 24 25 26 28 31 34 42 45 49
50 51 53 54 56 58 59 61 62 65 66 67 69 70 71 72 76
77 81 82 83 87 88 89 91 93 95 98 101 104 106 108 110
111 113 115 118 119 120 122 123 126 127 129 132 134
138 139 140 1 3 5 8 10 15 21 27 29 32 35 43 46 52 55
57 60 63 68 73 78 84 90 92 94 96 99 102 105 107 109
112 114 116 121 124 128 130 133 135 141 6 11 16 22
30 33 36 44 47 64 74 79 85 97 100 103 117 125 131
136 142 12 13 17 18 23 37 38 39 40 41 48 75 80 86 137
143 144 145 146 147 148 149 150 151 152 153 154 155
156 157 158 159 160 161 162 163];

(g) $\phi_T$=[0 2 4 7 9 14 19 20 24 25 26 28 31 34 42 45 49
50 51 53 54 56 58 59 61 62 65 66 67 69 70 71 72 76
77 81 82 83 87 88 89 91 93 95 98 101 104 106 108 110
111 113 115 118 119 120 122 123 126 127 129 132 134
138 139 140 1 3 5 8 10 15 21 27 29 32 35 43 46 52 55
57 60 63 68 73 78 84 90 92 94 96 99 102 105 107 109
112 114 116 121 124 128 130 133 135 141 6 11 16 22
30 33 36 44 47 64 74 79 85 97 100 103 117 125 131
136 142 12 17 23 37 48 75 80 86 137 143 13 18 38 39
40 41 144 145 146 147 148 149 150 151 152 153 154
155 156 157 158 159 160 161 162 163];

(h) $\phi_T$=[0 2 4 7 9 14 19 20 24 25 26 28 31 34 42 45 49
50 51 53 54 56 58 59 61 62 65 66 67 69 70 71 72 76
77 81 82 83 87 88 89 91 93 95 98 101 104 106 108 110
111 113 115 118 119 120 122 123 126 127 129 132 134
138 139 140 1 3 5 8 10 15 21 27 29 32 35 43 46 52 55
57 60 63 68 73 78 84 90 92 94 96 99 102 105 107 109
112 114 116 121 124 128 130 133 135 141 6 11 16 22
30 33 36 44 47 64 74 79 85 97 100 103 117 125 131
136 142 12 17 23 37 48 75 80 86 137 143 13 18 38 144
39 40 41 145 146 147 148 149 150 151 152 153 154
155 156 157 158 159 160 161 162 163];

(i) $\phi_T$=[0 2 4 7 9 14 19 20 24 25 26 28 31 34 42 45 49 50
51 53 54 56 58 59 61 62 65 66 67 69 70 71 72 76 77
81 82 83 87 88 89 91 93 95 98 101 104 106 108 110
111 113 115 118 119 120 122 123 126 127 129 132 134
138 139 140 1 3 5 8 10 15 21 27 29 32 35 43 46 52 55
57 60 63 68 73 78 84 90 92 94 96 99 102 105 107 109
112 114 116 121 124 128 130 133 135 141 6 11 16 22
30 33 36 44 47 64 74 79 85 97 100 103 117 125 131
136 142 12 17 23 37 48 75 80 86 137 143 13 18 38 144
39 145 40 41 146 147 148 149 150 151 152 153 154
155 156 157 158 159 160 161 162 163];

(j) $\phi_T$=[0 2 4 7 9 14 19 20 24 25 26 28 31 34 42 45 49 50
51 53 54 56 58 59 61 62 65 66 67 69 70 71 72 76 77
81 82 83 87 88 89 91 93 95 98 101 104 106 108 110
111 113 115 118 119 120 122 123 126 127 129 132 134
138 139 140 1 3 5 8 10 15 21 27 29 32 35 43 46 52 55
57 60 63 68 73 78 84 90 92 94 96 99 102 105 107 109
112 114 116 121 124 128 130 133 135 141 6 11 16 22
30 33 36 44 47 64 74 79 85 97 100 103 117 125 131
136 142 12 13 18 23 38 39 80 137 145 17 40 75 146
48 149 37 86 143 144 41 147 148 150 151 152 153 154
155 156 157 158 159 160 161 162 163];

(k) $\phi_T$=[0 2 4 7 9 14 19 20 24 25 26 28 31 34 42 45 49
50 51 53 54 56 58 59 61 62 65 66 67 69 70 71 72 76
77 81 82 83 87 88 89 91 93 95 98 101 104 106 108 110
111 113 115 118 119 120 122 123 126 127 129 132 134
138 139 140 1 3 5 8 10 15 21 27 29 32 35 43 46 52 55
57 60 63 68 73 78 84 90 92 94 96 99 102 105 107 109
112 114 116 121 124 128 130 133 135 141 6 11 16 22
30 33 36 44 47 64 74 79 85 97 100 103 117 125 131
136 142 12 13 17 18 23 37 38 39 40 41 48 75 80 86 137
143 144 145 146 147 148 149 150 151 152 153 154 155
156 157 158 159 160 161 162 163];

(l) $\phi_T$=[0 2 4 7 9 14 19 20 24 25 26 28 31 34 42 45 49 50
51 53 54 56 58 59 61 62 65 66 67 69 70 71 72 76 77
81 82 83 87 88 89 91 93 95 98 101 104 106 108 110
111 113 115 118 119 120 122 123 126 127 129 132 134
138 139 140 1 3 5 8 10 15 21 27 29 32 35 43 46 52 55
57 60 63 68 73 78 84 90 92 94 96 99 102 105 107 109
112 114 116 121 124 128 130 133 135 141 6 11 16 22
30 33 36 44 47 64 74 79 85 97 100 103 117 125 131
136 142 12 13 18 23 38 39 80 137 145 17 37 40 41 48
75 86 143 144 146 147 148 149 150 151 152 153 154
155 156 157 158 159 160 161 162 163];

(m) $\phi_T$=[0 2 4 7 9 14 19 20 24 25 26 28 31 34 42 45 49
50 51 53 54 56 58 59 61 62 65 66 67 69 70 71 72 76
77 81 82 83 87 88 89 91 93 95 98 101 104 106 108 110
111 113 115 118 119 120 122 123 126 127 129 132 134
138 139 140 1 3 5 8 10 15 21 27 29 32 35 43 46 52 55
57 60 63 68 73 78 84 90 92 94 96 99 102 105 107 109
112 114 116 121 124 128 130 133 135 141 6 11 16 22

30 33 36 44 47 64 74 79 85 97 100 103 117 125 131 136 <u>142</u> 12 13 18 23 38 39 80 137 <u>145</u> 17 40 75 <u>146</u> 37 41 48 86 <u>143</u> <u>144</u> <u>147</u> <u>148</u> <u>149</u> <u>150</u> <u>151</u> <u>152</u> <u>153</u> <u>154</u> <u>155</u> <u>156</u> <u>157</u> <u>158</u> <u>159</u> <u>160</u> <u>161</u> <u>162</u> <u>163</u>];

(n) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 <u>103</u> 117 125 131 136 <u>142</u> 12 13 18 23 38 39 80 137 <u>145</u> 17 40 75 <u>146</u> 48 <u>149</u> 37 41 86 <u>143</u> <u>144</u> <u>147</u> <u>148</u> <u>150</u> <u>151</u> <u>152</u> <u>153</u> <u>154</u> <u>155</u> <u>156</u> <u>157</u> <u>158</u> <u>159</u> <u>160</u> <u>161</u> <u>162</u> <u>163</u>];

(o) $\phi_T$=[0 2 4 5 10 11 12 16 18 19 23 24 25 28 33 35 37 38 39 41 42 47 48 51 52 53 55 56 58 59 62 66 67 71 72 76 79 81 82 85 86 91 98 99 102 106 108 109 111 112 113 115 117 119 120 124 125 126 131 132 133 134 139 <u>155</u> 3 7 9 15 17 21 29 30 40 43 44 46 57 60 61 63 64 <u>77</u> 84 87 90 96 103 104 107 114 116 118 122 129 130 136 137 138 <u>144</u> 8 27 31 34 49 50 65 74 93 94 95 97 100 101 105 1<u>21</u> 127 <u>147</u> 13 26 36 54 73 75 89 92 135 <u>146</u> 14 32 80 88 <u>145</u> <u>68</u> 69 128 <u>152</u> 1 6 20 78 <u>151</u> 22 <u>83</u> <u>148</u> <u>149</u> 123 <u>141</u> 45 <u>140</u> 70 <u>153</u> <u>154</u> 110 <u>142</u> <u>143</u> <u>150</u> <u>156</u> <u>157</u> <u>158</u>];

(p) $\phi_T$=[0 2 4 5 10 11 12 16 18 19 23 24 25 28 33 35 37 38 39 41 42 47 48 51 52 53 55 56 58 59 62 66 67 71 72 76 79 81 82 85 86 91 98 99 102 106 108 109 111 112 113 115 117 119 120 124 125 126 131 132 133 134 139 <u>155</u> 3 7 9 15 17 21 29 30 40 43 44 46 57 60 61 63 64 <u>77</u> 84 87 90 96 103 104 107 114 116 118 122 129 130 136 137 138 <u>144</u> 8 27 31 34 49 50 65 74 93 94 95 97 100 101 105 1<u>21</u> 127 <u>147</u> 1 6 13 14 20 22 26 32 36 45 54 68 69 70 73 75 78 <u>80</u> 83 88 89 92 110 123 128 135 <u>140</u> <u>141</u> <u>142</u> <u>143</u> <u>145</u> <u>146</u> <u>148</u> <u>149</u> <u>150</u> <u>151</u> <u>152</u> <u>153</u> <u>154</u> <u>156</u> <u>157</u> <u>158</u>];

(q) $\phi_T$=[0 2 4 5 10 11 12 16 18 19 23 24 25 28 33 35 37 38 39 41 42 47 48 51 52 53 55 56 58 59 62 66 67 71 72 76 79 81 82 85 86 91 98 99 102 106 108 109 111 112 113 115 117 119 120 124 125 126 131 132 133 134 139 <u>155</u> 3 7 9 15 17 21 29 30 40 43 44 46 57 60 61 63 64 <u>77</u> 84 87 90 96 103 104 107 114 116 118 122 129 130 136 137 138 <u>144</u> 8 27 31 34 49 50 65 74 93 94 95 97 100 101 105 1<u>21</u> 127 <u>147</u> 13 26 36 54 73 75 89 92 135 <u>146</u> 1 6 14 20 22 32 <u>45</u> 68 69 70 78 80 83 88 110 123 <u>128</u> <u>140</u> <u>141</u> <u>142</u> <u>143</u> <u>145</u> <u>148</u> <u>149</u> <u>150</u> <u>151</u> <u>152</u> <u>153</u> <u>154</u> <u>156</u> <u>157</u> <u>158</u>];

(r) $\phi_T$=[0 2 4 5 <u>10</u> 11 12 16 18 19 23 24 25 28 33 35 37 38 39 41 42 47 48 51 52 53 55 56 58 59 62 66 67 71 72 76 79 81 82 85 86 91 98 99 102 106 108 109 111 112 113 115 117 119 120 124 125 126 131 132 133 134 139 <u>155</u> 3 7 9 15 17 21 29 30 40 43 44 46 57 60 61 63 64 <u>77</u> 84 87 90 96 103 104 107 114 116 118 122 129 130 136 137 138 <u>144</u> 8 27 31 34 49 50 65 74 93 94 95 97 100 101 105 1<u>21</u> 127 <u>147</u> 13 26 36 54 73 75 89 92 135 <u>146</u> 14 32 80 88 <u>145</u> <u>1</u> 6 20 22 45 68 69 70 78 83 110 <u>123</u> 128 <u>140</u> <u>141</u> <u>142</u> <u>143</u> 148 <u>149</u> <u>150</u> <u>151</u> <u>152</u> <u>153</u> <u>154</u> <u>156</u> <u>157</u> <u>158</u>].

5. The method of claim 2, wherein $K_{max}$ is <u>160</u> and the template interleaver uses an interleaving pattern comprising any one of the following interleaving patterns, wherein indices corresponding to cyclic redundancy check (CRC) bits are underlined:

(a) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 <u>140</u> <u>142</u> <u>143</u> 146 147 149 152 154 158 159 <u>160</u> 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 <u>161</u> 12 26 31 36 42 50 53 56 64 67 84 94 99 105 117 <u>120</u> 123 137 145 151 156 <u>162</u> 13 32 37 43 57 68 95 100 106 157 <u>163</u> 33 38 58 <u>164</u> 59 <u>165</u> 60 <u>166</u> 61 <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(b) $\phi_T$=[0 3 4 5 7 12 16 18 20 23 26 29 31 32 33 34 35 37 38 39 41 42 48 49 50 57 58 62 63 68 73 77 79 84 85 86 89 91 92 93 98 99 111 112 117 126 131 134 137 139 142 145 146 147 148 150 151 154 156 157 <u>164</u> 1 6 8 13 17 19 21 24 27 30 36 40 43 51 59 64 69 <u>74</u> 78 80 87 90 94 100 113 118 127 132 135 138 140 143 149 152 155 158 <u>165</u> 2 9 14 22 25 28 44 52 60 65 70 75 81 88 95 101 11<u>4</u> 119 128 133 136 141 144 153 159 <u>166</u> 46 53 54 61 66 97 103 107 108 109 120 121 124 <u>129</u> 130 <u>167</u> 10 15 45 71 76 82 96 102 115 <u>160</u> 11 47 104 106 <u>116</u> 122 <u>181</u> 56 123 125 <u>170</u> 110 <u>179</u> 72 <u>183</u> 83 <u>173</u> 67 <u>163</u> <u>105</u> <u>171</u> <u>178</u> <u>180</u> <u>182</u> 55 <u>161</u> <u>162</u> <u>168</u> <u>169</u> <u>172</u> <u>174</u> <u>175</u> <u>176</u> <u>177</u>];

(c) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 <u>160</u> 3 5 8 11 16 18 21 23 25 28 30 35 41 47 49 52 55 <u>63</u> 66 72 75 77 80 83 88 93 98 104 110 112 114 116 119 122 125 127 129 132 134 136 141 144 148 150 153 155 <u>161</u> 12 26 31 36 42 50 53 56 64 67 84 94 99 105 117 <u>120</u> 123 137 145 151 156 <u>162</u> 13 32 33 37 38 43 57 58 59 60 61 68 95 100 106 15<u>7</u> <u>163</u> <u>164</u> <u>165</u> <u>166</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(d) $\phi_T$=[0 3 4 5 7 12 16 18 20 23 26 29 31 32 33 34 35 37 38 39 41 42 48 49 50 57 58 62 63 68 73 77 79 84 85 86 89 91 92 93 98 99 111 112 117 126 131 134 137 139 142 145 146 147 148 150 151 154 156 157 <u>164</u> 1 6 8 13 17 19 21 24 27 30 36 40 43 51 59 64 69 <u>74</u> 78 80 87 90 94 100 113 118 127 132 135 138 140 143 149 152 155 158 <u>165</u> 2 9 14 22 25 28 44 52 60 65 70 75 81 88 95 101 11<u>4</u> 119 128 133 136 141 144 153 159 <u>166</u> 10 11 15 45 46 47 53 54 55 56 61 66 67 71 72 76 <u>82</u> 83 96 97 102 103 104 105 106 107 108 109 110 115 116 120 121 122 123 124 125 129 130 <u>160</u> <u>161</u> <u>162</u> <u>163</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(e) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 <u>140</u> <u>142</u> <u>143</u> 146 147 149 152 154 158 159 <u>160</u> 3 5 8 11 <u>16</u> <u>18</u> <u>21</u> <u>23</u> 25 28 30 35 41 47 49 52 55 <u>63</u> 66 72 75 77 80 83 88 93 98 104 110 112 114 116 119 122 125 127 129 132 134 136 141 144 148 150 153 155 <u>161</u> 12 26 31 36 42 50 53 56 64 67 84 94 99 105 117 <u>120</u> 123 137 145 151 156 <u>162</u> 13 32 37 43 57 68 95 100 106 157 <u>163</u> 33 38 58 59 60 61 <u>164</u> <u>165</u> <u>166</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(f) $\phi_T$=[0 3 4 5 7 12 16 18 20 23 26 29 31 32 33 34 35 37 38 39 41 42 48 49 50 57 58 62 63 68 73 77 79 84 85 86 89 91 92 93 98 99 111 112 117 126 131 134 137 139 142 145 146 147 148 150 151 154 156 157 <u>164</u> 1 6 8 13 17 19 21 24 27 30 36 40 43 51 59 64 69 <u>74</u> 78

80 87 90 94 100 113 118 127 132 135 138 140 143 149 152 155 158 <u>165</u> 2 9 14 22 25 28 44 52 60 65 70 75 81 88 95 101 114 <u>119</u> 128 133 136 141 144 153 159 <u>166</u> 46 53 54 61 66 97 103 107 108 109 120 121 124 <u>129</u> 130 <u>167</u> 10 11 15 45 47 55 56 67 71 72 76 82 83 96 102 104 <u>105</u> 106 110 115 116 122 123 125 <u>160</u> <u>161</u> <u>162</u> <u>163</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(g) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 <u>160</u> 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 <u>161</u> 12 26 31 36 42 50 53 56 64 67 84 94 99 105 117 <u>120</u> 123 137 145 151 156 <u>162</u> 13 32 37 43 57 68 95 100 106 157 <u>163</u> 33 38 58 <u>164</u> 59 60 61 <u>165</u> <u>166</u> <u>167</u> <u>168</u> <u>169</u> <u>170</u> <u>171</u> <u>172</u> <u>173</u> <u>174</u> <u>175</u> 176 <u>177</u> <u>178</u> <u>179</u> <u>180</u> <u>181</u> <u>182</u> <u>183</u>];

(h) $\phi_T$=[0 3 4 5 7 12 16 18 20 23 26 29 31 32 33 34 35 37 38 39 41 42 48 49 50 57 58 62 63 68 73 77 79 84 85 86 89 91 92 93 98 99 111 112 117 126 131 134 137 139 142 145 146 147 148 150 151 154 156 157 <u>164</u> 1 6 8 13 17 19 21 24 27 30 36 40 43 51 59 64 69 <u>74</u> 78 80 87 90 94 100 113 118 127 132 135 138 140 143 149 152 155 158 <u>165</u> 2 9 14 22 25 28 44 52 60 65 70 75 81 88 95 101 114 <u>119</u> 128 133 136 141 144 153 159 <u>166</u> 46 53 54 61 66 97 103 107 108 109 120 121 124 <u>129</u> 130 <u>167</u> 10 15 45 71 76 82 96 102 115 <u>160</u> 11 47 55 56 67 72 83 104 105 106 110 116 122 123 125 <u>161</u> <u>162</u> <u>163</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(i) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 <u>160</u> 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 <u>161</u> 12 26 31 36 42 50 53 56 64 67 84 94 99 105 117 <u>120</u> 123 137 145 151 156 <u>162</u> 13 32 37 43 57 68 95 100 106 157 <u>163</u> 33 38 58 <u>164</u> 59 <u>165</u> 60 61 <u>166</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(j) $\phi_T$=[0 3 4 5 7 12 16 18 20 23 26 29 31 32 33 34 35 37 38 39 41 42 48 49 50 57 58 62 63 68 73 77 79 84 85 86 89 91 92 93 98 99 111 112 117 126 131 134 137 139 142 145 146 147 148 150 151 154 156 157 <u>164</u> 1 6 8 13 17 19 21 24 27 30 36 40 43 51 59 64 69 <u>74</u> 78 80 87 90 94 100 113 118 127 132 135 138 140 143 149 152 155 158 <u>165</u> 2 9 14 22 25 28 44 52 60 65 70 75 81 88 95 101 114 <u>119</u> 128 133 136 141 144 153 159 <u>166</u> 46 53 54 61 66 97 103 107 108 109 120 121 124 <u>129</u> 130 <u>167</u> 10 15 45 71 76 82 96 102 115 <u>160</u> 11 47 104 106 <u>116</u> 122 <u>181</u> 55 56 67 72 83 105 110 <u>123</u> 125 <u>161</u> <u>162</u> <u>163</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>182</u> <u>183</u>];

(k) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 <u>140</u> <u>142</u> <u>143</u> 146 147 149 152 154 158 159 <u>160</u> 3 5 8 11 <u>16</u> <u>18</u> <u>21</u> <u>23</u> 25 28 30 35 41 47 49 52 55 63 66 72 75 77 80 83 88 93 98 104 110 112 114 116 119 122 125 127 129 132 134 136 141 144 148 150 153 155 <u>161</u> 12 26 31 36 42 50 53 56 64 67 84 94 99 105 117 <u>120</u> 123 137 145 151 156 <u>162</u> 13 32 33 38 43 58 59 100 157 <u>165</u> 37 60 95 <u>166</u> <u>68</u> <u>169</u> 57 106 <u>163</u> <u>164</u> 61 <u>167</u> <u>168</u> <u>170</u> <u>171</u> <u>172</u> <u>173</u> <u>174</u> <u>175</u> 176 <u>177</u> <u>178</u> <u>179</u> <u>180</u> <u>181</u> <u>182</u> <u>183</u>];

(l) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 <u>160</u> 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 <u>161</u> 12 26 31 36 42 50 53 56 64 67 84 94 99 105 117 <u>120</u> 123 137 145 151 156 <u>162</u> 13 32 33 37 38 43 57 58 59 60 61 68 95 100 106 1<u>57</u> <u>163</u> <u>164</u> <u>165</u> <u>166</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(m) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 <u>160</u> 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 <u>161</u> 12 26 31 36 42 50 53 56 64 67 84 94 99 105 117 <u>120</u> 123 137 145 151 156 <u>162</u> 13 32 33 38 43 58 59 100 157 <u>165</u> 37 57 60 61 68 <u>95</u> 106 <u>163</u> <u>164</u> <u>166</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(n) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 <u>160</u> 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 <u>161</u> 12 26 31 36 42 50 53 56 64 67 84 94 99 105 117 <u>120</u> 123 137 145 151 156 <u>162</u> 13 32 33 38 43 58 59 100 157 <u>165</u> 37 60 95 <u>166</u> 57 <u>61</u> 68 106 <u>163</u> <u>164</u> 167 <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(o) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 <u>160</u> 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 <u>161</u> 12 26 31 36 42 50 53 56 64 67 84 94 99 105 117 <u>120</u> 123 137 145 151 156 <u>162</u> 13 32 33 38 43 58 59 100 157 <u>165</u> 37 60 95 166 68 <u>169</u> 57 61 106 <u>163</u> <u>164</u> 167 <u>168</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>].

6. The method of claim 2, wherein $K_{max}$ is 200 and the template interleaver uses an interleaving pattern comprising any one of the following interleaving patterns, wherein indices corresponding to cyclic redundancy check (CRC) bits are underlined:

(a) $\phi_T$=[0 1 2 3 9 10 12 16 20 21 23 26 27 29 31 34 36 38 39 40 43 44 45 47 52 56 58 60 63 66 69 71 72 73 74 75 77 78 79 81 82 88 89 90 97 98 102 103 108 113 117 119 124 125 126 129 131 132 133 138 139 151 152

157 166 171 174 177 179 182 185 186 187 188 190 191
194 196 197 204 4 11 13 17 22 24 28 30 32 35 37 41
46 48 53 57 59 61 64 67 70 76 80 83 91 99 104 109 114
118 120 127 130 134 140 153 158 167 172 175 178 180
183 189 192 195 198 205 5 14 18 25 33 42 49 54 62
65 68 84 92 100 105 110 115 121 128 135 141 154 159
168 173 176 181 184 193 199 206 8 15 86 93 94 101
106 137 143 147 148 149 160 161 164 169 170 207 6
19 50 55 85 111 116 122 136 142 155 200 87 95 107
144 150 162 165 208 51 156 214 7 146 221 163 219 96
210 145 202 212 112 211 216 223 123 201 203 209 213
215 217 218 220 222];

(b) $\phi_T$=[0 1 2 3 9 10 12 16 20 21 23 26 27 29 31 34 36
38 39 40 43 44 45 47 52 56 58 60 63 66 69 71 72 73
74 75 77 78 79 81 82 88 89 90 97 98 102 103 108 113
117 119 124 125 126 129 131 132 133 138 139 151 152
157 166 171 174 177 179 182 185 186 187 188 190 191
194 196 197 204 4 11 13 17 22 24 28 30 32 35 37 41
46 48 53 57 59 61 64 67 70 76 80 83 91 99 104 109 114
118 120 127 130 134 140 153 158 167 172 175 178 180
183 189 192 195 198 205 5 14 18 25 33 42 49 54 62
65 68 84 92 100 105 110 115 121 128 135 141 154 159
168 173 176 181 184 193 199 206 6 7 8 15 19 50 51
55 85 86 87 93 94 95 101 106 107 111 112 116 122
123 136 137 142 143 144 145 146 147 148 149 150 155
156 160 161 162 163 164 165 169 170 200 201 202 203
207 208 209 210 211 212 213 214 215 216 217 218 219
220 221 222 223];

(c) $\phi_T$=[0 1 2 3 9 10 12 16 20 21 23 26 27 29 31 34 36
38 39 40 43 44 45 47 52 56 58 60 63 66 69 71 72 73
74 75 77 78 79 81 82 88 89 90 97 98 102 103 108 113
117 119 124 125 126 129 131 132 133 138 139 151 152
157 166 171 174 177 179 182 185 186 187 188 190 191
194 196 197 204 4 11 13 17 22 24 28 30 32 35 37 41
46 48 53 57 59 61 64 67 70 76 80 83 91 99 104 109 114
118 120 127 130 134 140 153 158 167 172 175 178 180
183 189 192 195 198 205 5 14 18 25 33 42 49 54 62
65 68 84 92 100 105 110 115 121 128 135 141 154 159
168 173 176 181 184 193 199 206 8 15 86 93 94 101
106 137 143 147 148 149 160 161 164 169 170 207 6
7 19 50 51 55 85 87 95 96 107 111 112 116 122 123
136 142 144 145 146 150 155 156 162 163 165 200 201
202 203 208 209 210 211 212 213 214 215 216 217 218
219 220 221 222 223];

(d) $\phi_T$=[0 1 2 3 9 10 12 16 20 21 23 26 27 29 31 34 36
38 39 40 43 44 45 47 52 56 58 60 63 66 69 71 72 73
74 75 77 78 79 81 82 88 89 90 97 98 102 103 108 113
117 119 124 125 126 129 131 132 133 138 139 151 152
157 166 171 174 177 179 182 185 186 187 188 190 191
194 196 197 204 4 11 13 17 22 24 28 30 32 35 37 41
46 48 53 57 59 61 64 67 70 76 80 83 91 99 104 109 114
118 120 127 130 134 140 153 158 167 172 175 178 180
183 189 192 195 198 205 5 14 18 25 33 42 49 54 62
65 68 84 92 100 105 110 115 121 128 135 141 154 159
168 173 176 181 184 193 199 206 8 15 86 93 94 101
106 137 143 147 148 149 160 161 164 169 170 207 6
19 50 55 85 111 116 122 136 142 155 200 7 51 87 95
96 107 112 123 144 145 146 150 156 162 163 165 201
202 203 208 209 210 211 212 213 214 215 216 217 218
219 220 221 222 223];

(e) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 31 53 72 77 83 97 108
135 140 146 197 203 73 78 98 204 99 205 100 206 101
207 208 209 210 211 212 213 214 215 216 217 218 219
220 221 222 223];

(f) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 31 53 72 73 77 78 83
97 98 99 100 101 108 135 140 146 197 203 204 205
206 207 208 209 210 211 212 213 214 215 216 217 218
219 220 221 222 223];

(g) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 31 53 72 77 83 97 108
135 140 146 197 203 73 78 98 99 100 101 204 205 206
207 208 209 210 211 212 213 214 215 216 217 218 219
220 221 222 223];

(h) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 31 53 72 77 83 97 108
135 140 146 197 203 73 78 98 204 99 100 101 205 206
207 208 209 210 211 212 213 214 215 216 217 218 219
220 221 222 223];

(i) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172

174 176 181 184 188 190 193 195 201 10 15 18 26 30
52 66 71 76 82 90 93 96 104 107 124 134 139 145 157
160 163 177 185 191 196 202 27 31 53 72 77 83 97 108
135 140 146 197 203 73 78 98 204 99 205 100 101 206
207 208 209 210 211 212 213 214 215 216 217 218 219
220 221 222 223];

(j) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 53 72 73 78 83 98 99
140 197 205 31 77 100 135 206 108 209 97 146 203
204 101 207 208 210 211 212 213 214 215 216 217 218
219 220 221 222 223];

(k) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 31 53 72 73 77 78 83
97 98 99 100 101 108 135 140 146 197 203 204 205
206 207 208 209 210 211 212 213 214 215 216 217 218
219 220 221 222 223];

(l) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 53 72 73 78 83 98 99
140 197 205 31 77 97 100 101 108 135 146 203 204
206 207 208 209 210 211 212 213 214 215 216 217 218
219 220 221 222 223];

(m) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 53 72 73 78 83 98 99
140 197 205 31 77 100 135 206 97 101 108 146 203
204 207 208 209 210 211 212 213 214 215 216 217 218
219 220 221 222 223];

(n) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 53 72 73 78 83 98 99
140 197 205 31 77 100 135 206 108 209 97 101 146
203 204 207 208 210 211 212 213 214 215 216 217 218
219 220 221 222 223];

(o) $\phi_T$=[0 1 4 5 9 11 12 17 18 19 21 24 26 28 31 34 41
42 47 52 54 57 63 64 68 69 70 71 72 73 74 76 78 79
83 85 89 90 97 98 99 102 103 104 106 108 109 110 114
116 118 120 121 122 123 125 128 129 132 135 137 141
142 144 148 152 156 158 160 161 162 163 164 166 171
172 174 177 178 179 180 181 187 188 189 191 192 194
196 197 212 2 7 8 13 20 25 27 32 35 36 38 45 46 50
51 58 60 62 65 84 88 93 95 101 107 111 112 113 115
119 126 127 131 136 139 145 146 151 159 168 169 173
175 184 185 186 193 199 215 3 10 14 16 23 29 30 37
40 43 55 56 67 75 77 81 100 117 124 147 150 167 176
182 190 198 204 33 44 87 91 94 134 153 154 155 157
165 207 53 61 66 80 138 195 211 82 96 105 140 143
170 218 6 39 86 92 208 15 22 183 200 49 130 210 149
203 48 202 59 201 209 214 133 205 206 213 216 217];

(p) $\phi_T$=[0 1 4 5 9 11 12 17 18 19 21 24 26 28 31 34 41
42 47 52 54 57 63 64 68 69 70 71 72 73 74 76 78 79
83 85 89 90 97 98 99 102 103 104 106 108 109 110 114
116 118 120 121 122 123 125 128 129 132 135 137 141
142 144 148 152 156 158 160 161 162 163 164 166 171
172 174 177 178 179 180 181 187 188 189 191 192 194
196 197 212 2 7 8 13 20 25 27 32 35 36 38 45 46 50
51 58 60 62 65 84 88 93 95 101 107 111 112 113 115
119 126 127 131 136 139 145 146 151 159 168 169 173
175 184 185 186 193 199 215 3 10 14 16 23 29 30 37
40 43 55 56 67 75 77 81 100 117 124 147 150 167 176
182 190 198 204 6 15 22 33 39 44 48 49 53 59 61 66
80 82 86 87 91 92 94 96 105 130 133 134 138 140 143
149 153 154 155 157 165 170 183 195 200 201 202 203
205 206 207 208 209 210 211 213 214 216 217 218];

(q) $\phi_T$=[0 1 4 5 9 11 12 17 18 19 21 24 26 28 31 34 41
42 47 52 54 57 63 64 68 69 70 71 72 73 74 76 78 79
83 85 89 90 97 98 99 102 103 104 106 108 109 110 114
116 118 120 121 122 123 125 128 129 132 135 137 141
142 144 148 152 156 158 160 161 162 163 164 166 171
172 174 177 178 179 180 181 187 188 189 191 192 194
196 197 212 2 7 8 13 20 25 27 32 35 36 38 45 46 50
51 58 60 62 65 84 88 93 95 101 107 111 112 113 115
119 126 127 131 136 139 145 146 151 159 168 169 173
175 184 185 186 193 199 215 3 10 14 16 23 29 30 37
40 43 55 56 67 75 77 81 100 117 124 147 150 167 176
182 190 198 204 33 44 87 91 94 134 153 154 155 157
165 207 6 15 22 39 48 49 53 59 61 66 80 82 86 92 96
105 130 133 138 140 143 149 170 183 195 200 201 202
203 205 206 208 209 210 211 213 214 216 217];

(r) $\phi_T$=[0 1 4 5 9 11 12 17 18 19 21 24 26 28 31 34 41 42
47 52 54 57 63 64 68 69 70 71 72 73 74 76 78 79 83
85 89 90 97 98 99 102 103 104 106 108 109 110 114

116 118 120 121 122 123 125 128 129 132 135 137 141 142 144 148 152 156 158 160 161 162 163 164 166 171 172 174 177 178 179 180 181 187 188 189 191 192 194 196 197 212 2 7 8 13 20 25 27 32 35 36 38 45 46 50 51 58 60 62 65 84 88 93 95 101 107 111 112 113 115 119 126 127 131 136 139 145 146 151 159 168 169 173 175 184 185 186 193 199 215 3 10 14 16 23 29 30 37 40 43 55 56 67 75 77 81 100 117 124 147 150 167 176 182 190 198 204 33 44 87 91 94 134 153 154 155 157 165 207 53 61 66 80 138 195 211 6 15 22 39 48 49 59 82 86 92 96 105 130 133 140 143 149 170 183 200 201 202 203 205 206 208 209 210 213 214 216 217 218].

7. The method of claim 2, wherein the template deinterleaving is based on a predetermined interleaving mapping function comprising a template interleaver for a largest value of K, referred to as $K_{max}$, and the template interleaver comprises a low-index bit mapper wherein:

the K data bits are loaded at the low-index positions of the input of the template interleaver in reverse, where $u=[u_0, u_1, \ldots, u_{K-1}]$ and the input of the template interleaver, denoted by $v=[v_0, v_1, \ldots, v_{K_{max}-1}]$, is given by the following bit mapping:

$$v_i = \begin{cases} u_{K-1-i} & 0 \le i < K \\ p_{i-K_{max}} & i \ge K_{max} \\ \text{NULL} & \text{otherwise} \end{cases}$$

8. The method of claim 7, wherein $K_{max}$ is 53 and the template interleaver uses an interleaving pattern comprising any one of the following interleaving patterns, wherein indices corresponding to cyclic redundancy check (CRC) bits are underlined:

(a) $\phi_7$=[0 1 4 6 7 8 17 21 22 24 26 28 32 36 37 38 41 42 44 47 48 51 58 5 13 14 15 19 20 27 30 31 33 40 68 2 11 25 34 35 43 45 61 9 16 18 52 53 3 12 54 10 23 64 39 65 50 62 29 55 69 71 49 56 57 67 46 59 60 63 66 70];

(b) $\phi_7$=[51 48 47 44 42 41 38 37 36 32 28 26 24 22 21 17 8 7 6 4 1 0 58 40 33 31 30 27 20 19 15 14 13 5 68 45 43 35 34 25 11 2 61 52 18 16 9 53 12 3 54 23 10 64 39 65 50 62 29 55 69 71 49 56 67 57 46 59 66 60 70 63];

(c) $\phi_7$=[0 1 4 6 7 8 17 21 22 24 26 28 32 36 37 38 41 42 44 47 48 51 58 5 13 14 15 19 20 27 30 31 33 40 68 2 11 25 34 35 43 45 61 3 9 10 12 16 18 23 29 39 46 49 50 52 53 54 55 56 57 59 60 62 63 64 65 66 67 69 70 71];

(d) $\phi_7$=[51 48 47 44 42 41 38 37 36 32 28 26 24 22 21 17 8 7 6 4 1 0 58 40 33 31 30 27 20 19 15 14 13 5 68 45 43 35 34 25 11 2 61 3 9 10 12 16 18 23 29 39 46 49 50 52 53 54 55 56 57 59 60 62 63 64 65 66 67 69 70 71];

(e) $\phi_7$=[0 1 4 6 7 8 17 21 22 24 26 28 32 36 37 38 41 42 44 47 48 51 58 5 13 14 15 19 20 27 30 31 33 40 68 2 11 25 34 35 43 45 61 9 16 18 52 53 3 10 12 23 29 39 46 49 50 54 55 56 57 59 60 62 63 64 65 66 67 69 70 71];

(f) $\phi_7$=[51 48 47 44 42 41 38 37 36 32 28 26 24 22 21 17 8 7 6 4 1 0 58 40 33 31 30 27 20 19 15 14 13 5 68 45 43 35 34 25 11 2 61 52 18 16 9 53 3 10 12 23 29 39 46 49 50 54 55 56 57 59 60 62 63 64 65 66 67 69 70 71];

(g) $\phi_7$=[0 1 4 6 7 8 17 21 22 24 26 28 32 36 37 38 41 42 44 47 48 51 58 5 13 14 15 19 20 27 30 31 33 40 68 2 11 25 34 35 43 45 61 9 16 18 52 53 3 12 54 10 23 29 39 46 49 50 55 56 57 59 60 62 63 64 65 66 67 69 70 71];

(h) $\phi_7$=[51 48 47 44 42 41 38 37 36 32 28 26 24 22 21 17 8 7 6 4 1 0 58 40 33 31 30 27 20 19 15 14 13 5 68 45 43 35 34 25 11 2 61 52 18 16 9 53 12 3 54 10 23 29 39 46 49 50 55 56 57 59 60 62 63 64 65 66 67 69 70 71].

9. The method of claim 7, wherein $K_{max}$ is 72 and the template interleaver uses an interleaving pattern comprising any one of the following interleaving patterns, wherein indices corresponding to cyclic redundancy check (CRC) bits are underlined:

(a) $\phi_7$=[0 5 6 7 8 13 14 15 19 20 22 24 26 27 28 30 31 33 37 40 41 48 53 54 57 58 60 63 67 68 87 1 4 17 21 32 36 38 42 44 47 51 55 59 62 64 66 77 2 11 25 34 35 43 45 56 71 80 3 12 16 52 70 73 10 18 39 84 9 61 72 50 81 23 83 49 76 29 88 69 74 75 46 82 85 65 78 79 86 89 90];

(b) $\phi_7$=[68 67 63 60 58 57 54 53 48 41 40 37 33 31 30 28 27 26 24 22 20 19 15 14 13 8 7 6 5 0 87 66 64 62 59 55 51 47 44 42 38 36 32 21 17 4 1 77 71 56 45 43 35 34 25 11 2 80 70 52 16 12 3 73 39 18 10 84 61 9 72 50 81 23 83 49 76 29 88 69 74 75 46 82 85 65 86 79 78 89 90];

(c) $\phi_7$=[0 5 6 7 8 13 14 15 19 20 22 24 26 27 28 30 31 33 37 40 41 48 53 54 57 58 60 63 67 68 87 1 4 17 21 32 36 38 42 44 47 51 55 59 62 64 66 77 2 11 25 34 35 43 45 56 71 80 3 9 10 12 16 18 23 29 39 46 49 50 52 61 65 69 70 72 73 74 75 76 78 79 81 82 83 84 85 86 88 89 90];

(d) $\phi_7$=[68 67 63 60 58 57 54 53 48 41 40 37 33 31 30 28 27 26 24 22 20 19 15 14 13 8 7 6 5 0 87 66 64 62 59 55 51 47 44 42 38 36 32 21 17 4 1 77 71 56 45 43 35 34 25 11 2 80 3 9 10 12 16 18 23 29 39 46 49 50 52 61 65 69 70 72 73 74 75 76 78 79 81 82 83 84 85 86 88 89 90];

(e) $\phi_7$=[0 5 6 7 8 13 14 15 19 20 22 24 26 27 28 30 31 33 37 40 41 48 53 54 57 58 60 63 67 68 87 1 4 17 21 32 36 38 42 44 47 51 55 59 62 64 66 77 2 11 25 34 35 43 45 56 71 80 3 12 16 52 70 73 9 10 18 23 29 39 46 49 50 61 65 69 72 74 75 76 78 79 81 82 83 84 85 86 88 89 90];

(f) $\phi_7$=[68 67 63 60 58 57 54 53 48 41 40 37 33 31 30 28 27 26 24 22 20 19 15 14 13 8 7 6 5 0 87 66 64 62 59 55 51 47 44 42 38 36 32 21 17 4 1 77 71 56 45 43 35 34 25 11 2 80 70 52 16 12 3 73 9 10 18 23 29 39 46 49 50 61 65 69 72 74 75 76 78 79 81 82 83 84 85 86 88 89 90];

(g) $\phi_7$=[0 5 6 7 8 13 14 15 19 20 22 24 26 27 28 30 31 33 37 40 41 48 53 54 57 58 60 63 67 68 87 1 4 17 21 32 36 38 42 44 47 51 55 59 62 64 66 77 2 11 25 34 35 43 45 56 71 80 3 12 16 52 70 73 10 18 39 84 9 23 29 46 49 50 61 65 69 72 74 75 76 78 79 81 82 83 85 86 88 89 90];

(h) $\phi_7$=[68 67 63 60 58 57 54 53 48 41 40 37 33 31 30 28 27 26 24 22 20 19 15 14 13 8 7 6 5 0 87 66 64 62 59 55 51 47 44 42 38 36 32 21 17 4 1 77 71 56 45 43 35 34 25 11 2 80 70 52 16 12 3 73 39 18 10 84 9 23 29 46 49 50 61 65 69 72 74 75 76 78 79 81 82 83 85 86 88 89 90].

10. The method of claim 7, wherein $K_{max}$ is 140 and the template interleaver uses an interleaving pattern comprising any one of the following interleaving patterns, wherein indices corresponding to cyclic redundancy check (CRC) bits are underlined:

(a) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 144 1 4 7 10 16 19 21 24 27 32 41 46 59 65 69 72 79 81 85 90 95 100 108 116 119 123 129 132 135 138 145 0 6 15 18 23 26 31 40 45 58 64 71 78 84 89 94 99 107 115 131 134 137 146 29 30 35 38 39 50 51 52 56 62 93 98 105 106 113 147 44 57 63 77 83 88 114 140 37 43 53 55 112 161 34 36 103 150 49 159 87 163 76 153 92 143 54 151 158 160 162 104 141 142 148 149 152 154 155 156 157];

(b) $\phi_T$=[139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 144 138 135 132 129 123 119 116 108 100 95 90 85 81 79 72 69 65 59 46 41 32 27 24 21 19 16 10 7 4 1 145 137 134 131 115 107 99 94 89 84 78 71 64 58 45 40 31 26 23 18 15 6 0 146 113 106 105 98 93 62 56 52 51 50 39 38 35 30 29 147 114 88 83 77 63 57 44 140 112 55 53 43 37 161 103 36 34 150 49 159 87 163 76 153 92 143 54 151 158 160 162 104 141 142 148 149 152 154 155 156 157];

(c) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 144 1 4 7 10 16 19 21 24 27 32 41 46 59 65 69 72 79 81 85 90 95 100 108 116 119 123 129 132 135 138 145 0 6 15 18 23 26 31 40 45 58 64 71 78 84 89 94 99 107 115 131 134 137 146 29 30 34 35 36 37 38 39 43 44 49 50 51 52 53 54 55 56 57 62 63 76 77 83 87 88 92 93 98 103 104 105 106 112 113 114 140 141 142 143 147 148 149 150 151 152 153 154 155 156 157 158 159 160 161 162];

(d) $\phi_T$=[139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 144 138 135 132 129 123 119 116 108 100 95 90 85 81 79 72 69 65 59 46 41 32 27 24 21 19 16 10 7 4 1 145 137 134 131 115 107 99 94 89 84 78 71 64 58 45 40 31 26 23 18 15 6 0 146 114 113 112 106 105 104 103 98 93 92 88 87 83 77 76 63 62 57 56 55 54 53 52 51 50 49 44 43 39 38 37 36 35 34 30 29 140 141 142 143 147 148 149 150 151 152 153 154 155 156 157 158 159 160 161 162 163];

(e) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 144 1 4 7 10 16 19 21 24 27 32 41 46 59 65 69 72 79 81 85 90 95 100 108 116 119 123 129 132 135 138 145 0 6 15 18 23 26 31 40 45 58 64 71 78 84 89 94 99 107 115 131 134 137 146 29 30 35 38 39 50 51 52 56 62 93 98 105 106 113 147 34 36 37 43 44 49 53 54 55 57 63 76 77 83 87 88 92 103 104 112 114 140 141 142 143 148 149 150 151 152 153 154 155 156 157 158 159 160 161 162 163];

(f) $\phi_T$=[139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 144 138 135 132 129 123 119 116 108 100 95 90 85 81 79 72 69 65 59 46 41 32 27 24 21 19 16 10 7 4 1 145 137 134 131 115 107 99 94 89 84 78 71 64 58 45 40 31 26 23 18 15 6 0 146 113 106 105 98 93 62 56 52 51 50 39 38 35 30 29 147 114 112 104 103 92 88 87 83 77 76 63 57 55 54 53 49 44 43 37 36 34 140 141 142 143 148 149 150 151 152 153 154 155 156 157 158 159 160 161 162];

(g) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 144 1 4 7 10 16 19 21 24 27 32 41 46 59 65 69 72 79 81 85 90 95 100 108 116 119 123 129 132 135 138 145 0 6 15 18 23 26 31 40 45 58 64 71 78 84 89 94 99 107 115 131 134 137 146 29 30 35 38 39 50 51 52 56 62 93 98 105 106 113 147 44 57 63 77 83 88 114 140 34 36 37 43 49 53 54 55 76 87 92 103 104 112 141 142 143 148 149 150 151 152 153 154 155 156 157 158 159 160 161 162 163];

(h) $\phi_T$=[139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 144 138 135 132 129 123 119 116 108 100 95 90 85 81 79 72 69 65 59 46 41 32 27 24 21 19 16 10 7 4 1 145 137 134 131 115 107 99 94 89 84 78 71 64 58 45 40 31 26 23 18 15 6 0 146 113 106 105 98 93 62 56 52 51 50 39 38 35 30 29 147 114 88 83 77 63 57 44 140 112 104 103 92 87 76 55 54 53 49 43 37 36 34 141 142 143 148 149 150 151 152 153 154 155 156 157 158 159 160 161 162 163];

(i) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 53 59 64 91 102 116 122 127 143 101 121 126 144 100 145 99 146 98 147 148 149 150 151 152 153 154 155 156 157 158 159 160 161 162 163];

(j) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 122 116 102 91 64 59 53 2 143 126 121 101 144 100 145 99 146 98 147 148 149 150 151 152 153 154 155 156 157 158 159 160 161 162 163];

(k) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 53 59 64 91 98 99 100 101 102 116 121 122 126 127 143 144 145 146 147 148 149 150 151 152 153 154 155 156 157 158 159 160 161 162 163];

(l) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 2 53 59 64 91 98 99 100 101 102 116 121 122 126 127 143 144 145 146 147 148 149 150 151 152 153 154 155 156 157 158 159 160 161 162]163];

(m) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 53 59 64 91 102 116 122 127 143 98 99 100 101 121 126 144 145 146 147 148 149 150 151 152 153 154 155 156 157 158 159 160 161 162 163];

(n) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 122 116 102 91 64 59 53 2 143 98 99 100 101 121 126 144 145 146 147 148 149 150 151 152 153 154 155 156 157 158 159 160 161 162 163];

(o) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 53 59 64 91 102 116 122 127 143 101 121 126 144 98 99 100 145 146 147 148 149 150 151 152 153 154 155 156 157 158 159 160 161 162 163];

(p) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 122 116 102 91 64 59 53 2 143 126 121 101 144 98 99 100 145 146 147 148 149 150 151 152 153 154 155 156 157 158 159 160 161 162 163];

(q) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 53 59 64 91 102 116 122 127 143 101 121 126 144 100 145 98 99 146 147 148 149 150 151 152 153 154 155 156 157 158 159 160 161 162 163];

(r) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 122 116 102 91 64 59 53 2 143 126 121 101 144 100 145 98 99 146 147 148 149 150 151 152 153 154 155 156 157 158 159 160 161 162 163];

(s) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 59 100 101 116 121 126 127 145 64 99 122 146 91 149 53 102 143 144 98 147 148 150 151 152 153 154 155 156 157 158 159 160 161 162 163];

(t) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 126 121 116 101 100 59 2 145 122 99 64 146 91 149 102 53 143 144 98 147 148 150 151 152 153 154 155 156 157 158 159 160 161 162 163];

(u) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 53 59 64 91 98 99 100 101 102 116 121 122 126 127 143 144 145 146 147 148 149 150 151 152 153 154 155 156 157 158 159 160 161 162 163];

(v) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 2 53 59 64 91 98 99 100 101 102 116 121 122 126 127 143 144 145 146 147 148 149 150 151 152 153 154 155 156 157 158 159 160 161 162];

(w) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 59 100 101 116 121 126 127 145 53 64 91 98 99 102 122 143 144 146 147 148 149 150 151 152 153 154 155 156 157 158 159 160 161 162 163];

(x) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 126 121 116 101 100 59 2 145 53 64 91 98 99 102 122 143 144 146 147 148 149 150 151 152 153 154 155 156 157 158 159 160 161 162 163];

(y) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 59 100 101 116 121 126 127 145 64 99 122 146 53 91 98 102 143 144 147 148 149 150 151 152 153 154 155 156 157 158 159 160 161 162 163];

(z) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 126 121 116 101 100 59 2 145 122 99 64 146 53 91 98 102 143 144 147 148 149 150 151 152 153 154 155 156 157 158 159 160 161 162];

(aa) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 59 100 101 116 121 126 127 145 64 99 122 146 91 149 53 98 102 143 144 147 148 150 151 152 153 154 155 156 157 158 159 160 161 162 163];

(bb) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 126 121 116 101 100 59 2 145 122 99 64 146 91 149 53 98 102 143 144 147 148 150 151 152 153 154 155 156 157 158 159 160 161 162 163];

(cc) $\phi_T$=[0 5 6 7 8 13 14 15 19 20 22 24 26 27 28 30 31 33 37 40 41 48 53 54 57 58 60 63 67 68 72 73 77 80 81 83 84 86 87 88 91 92 97 98 100 101 102 104 106 111 114 115 116 120 121 123 127 128 129 134 135 137 139 155 1 2 3 9 10 17 21 23 25 32 35 36 43 49 52 55 62 75 76 78 79 82 93 95 96 99 109 110 118 122 124 130 132 136 144 12 18 34 38 39 42 44 45 46 65 74 89 90 105 108 112 131 147 4 47 50 64 66 85 103 113 126 146 51 59 107 125 145 11 70 71 152 61 119 133 138 151 56 117 148 149 16 141 94 140 69 153 154 29 142 143 150 156 157 158];

(dd) $\phi_T$=[139 137 135 134 129 128 127 123 121 120 116 115 114 111 106 104 102 101 100 98 97 92 91 88 87 86 84 83 81 80 77 73 72 68 67 63 60 58 57 54 53 48 41 40 37 33 31 30 28 27 26 24 22 20 19 15 14 13 8 7 6 5 0 155 136 132 130 124 122 118 110 109 99 96 95 93 82 79 78 76 75 62 55 52 49 43 36 35 32 25 23 21 17 10 9 3 2 1 144 131 112 108 105 90 89 74 65 46 45 44 42 39 38 34 18 12 147 126 113 103 85 66 64 50 47 4 146 125 107 59 51 145 71 70 11 152 138 133 119 61 151 117 56 148 149 16 141 94 140 69 153 154 29 143 142 150 156 157 158];

(ee) $\phi_T$=[0 5 6 7 8 13 14 15 19 20 22 24 26 27 28 30 31 33 37 40 41 48 53 54 57 58 60 63 67 68 72 73 77 80 81 83 84 86 87 88 91 92 97 98 100 101 102 104 106 111 114 115 116 120 121 123 127 128 129 134 135 137 139 155 1 2 3 9 10 17 21 23 25 32 35 36 43 49 52 55 62 75 76 78 79 82 93 95 96 99 109 110 118 122 124 130 132 136 144 12 18 34 38 39 42 44 45 46 65 74 89 90 105 108 112 131 147 4 11 16 29 47 50 51 56 59 61 64 66 69 70 71 85 94 103 107 113 117 119 125 126 133 138 140 141 142 143 145 146 148 149 150 151 152 153 154 156 157 158];

(ff) $\phi_T$=[139 137 135 134 129 128 127 123 121 120 116 115 114 111 106 104 102 101 100 98 97 92 91 88 87 86 84 83 81 80 77 73 72 68 67 63 60 58 57 54 53 48 41 40 37 33 31 30 28 27 26 24 22 20 19 15 14 13 8 7 6 5 0 155 136 132 130 124 122 118 110 109 99 96 95 93 82 79 78 76 75 62 55 52 49 43 36 35 32 25 23 21 17 10 9 3 2 1 144 131 112 108 105 90 89 74 65 46 45 44 42 39 38 34 18 12 147 4 11 16 29 47 50 51 56 59 61 64 66 69 70 71 85 94 103 107 113 117 119 125 126 133 138 140 141 142 143 145 146 148 149 150 151 152 153 154 156 157 158];

(gg) $\phi_T$=[0 5 6 7 8 13 14 15 19 20 22 24 26 27 28 30 31 33 37 40 41 48 53 54 57 58 60 63 67 68 72 73 77 80 81 83 84 86 87 88 91 92 97 98 100 101 102 104 106 111 114 115 116 120 121 123 127 128 129 134 135 137 139 155 1 2 3 9 10 17 21 23 25 32 35 36 43 49 52 55 62 75 76 78 79 82 93 95 96 99 109 110 118 122 124 130 132 136 144 12 18 34 38 39 42 44 45 46 65 74 89 90 105 108 112 131 147 4 47 50 64 66 85 103 113 126 146 11 16 29 51 56 59 61 69 70 71 94 107 117 119 125 133 138 140 141 142 143 145 148 149 150 151 152 153 154 156 157 158];

(hh) $\phi_T$=[139 137 135 134 129 128 127 123 121 120 116 115 114 111 106 104 102 101 100 98 97 92 91 88 87 86 84 83 81 80 77 73 72 68 67 63 60 58 57 54 53 48 41 40 37 33 31 30 28 27 26 24 22 20 19 15 14 13 8 7 6 5 0 155 136 132 130 124 122 118 110 109 99 96 95 93 82 79 78 76 75 62 55 52 49 43 36 35 32 25 23 21 17 10 9 3 2 1 144 131 112 108 105 90 89 74 65 46 45 44 42 39 38 34 18 12 147 126 113 103 85 66 64 50 47 4 146 11 16 29 51 56 59 61 69 70 71 94 107 117 119 125 133 138 140 141 142 143 145 148 149 150 151 152 153 154 156 157 158];

(ii) $\phi_T$=[0 5 6 7 8 13 14 15 19 20 22 24 26 27 28 30 31 33 37 40 41 48 53 54 57 58 60 63 67 68 72 73 77 80 81 83 84 86 87 88 91 92 97 98 100 101 102 104 106 111 114 115 116 120 121 123 127 128 129 134 135 137 139 155 1 2 3 9 10 17 21 23 25 32 35 36 43 49 52 55 62 75 76 78 79 82 93 95 96 99 109 110 118 122 124 130 132 136 144 12 18 34 38 39 42 44 45 46 65 74 89 90 105 108 112 131 147 4 47 50 64 66 85 103 113 126 146 51 59 107 125 145 11 16 29 56 61 69 70 71 94 117 119 133 138 140 141 142 143 148 149 150 151 152 153 154 156 157 158];

(jj) $\phi_T$=[139 137 135 134 129 128 127 123 121 120 116 115 114 111 106 104 102 101 100 98 97 92 91 88 87 86 84 83 81 80 77 73 72 68 67 63 60 58 57 54 53 48 41 40 37 33 31 30 28 27 26 24 22 20 19 15 14 13 8 7 6 5 0 155 136 132 130 124 122 118 110 109 99 96 95 93 82 79 78 76 75 62 55 52 49 43 36 35 32 25 23 21 17 10 9 3 2 1 144 131 112 108 105 90 89 74 65 46 45 44 42 39 38 34 18 12 147 126 113 103 85 66 64 50 47 4 146 125 107 59 51 145 11 16 29 56 61 69 70 71 94 117 119 133 138 140 141 142 143 148 149 150 151 152 153 154 156 157 158].

11. The method of claim 7, wherein $K_{max}$ is <u>160</u> and the template interleaver uses an interleaving pattern comprising any one of the following interleaving patterns, wherein indices corresponding to cyclic redundancy check (CRC) bits are underlined:

(a) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 <u>160</u> 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 <u>161</u> 3 8 14 22 36 39 42 54 60 65 75 92 95 103 106 109 117 123 128 133 147 <u>162</u> 2 53 59 64 91 102 116 122 127 146 <u>163</u> 101 121 <u>126</u> 164 100 <u>165</u> 99 <u>166</u> 98 <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(b) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 <u>164</u> 1 4 7 10 16 19 21 24 27 32 41 46 59 65 69 72 79 81 85 90 95 100 108 116 119 123 129 132 135 138 140 142 146 151 153 158 <u>165</u> 0 6 15 18 23 26 31 40 45 58 64 71 78 84 89 94 99 <u>107</u> 115 131 134 137 145 150 157 <u>166</u> 29 30 35 38 39 50 51 52 56 62 93 98 105 106 113 <u>167</u> 44 57 63 77 83 88 114 144 149 <u>160</u> 37 43 53 55 <u>112</u> 148 <u>181</u> 34 36 103 <u>170</u> 49 <u>179</u> 87 <u>183</u> 76 <u>173</u> 92 163 54 <u>171</u> 178 180 182 <u>104</u> <u>161</u> <u>162</u> <u>168</u> <u>169</u> <u>172</u> 174 <u>175</u> <u>176</u> <u>177</u>];

(c) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 <u>160</u> 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 <u>161</u> 147 133 128 123 117 109 106 103 95 92 75 65 60 <u>54</u> 42 39 36 22 14 8 3 <u>162</u> 146 127 122 116 102 91 64 59 53 2 <u>163</u> 126 121 10<u>1</u> <u>164</u> 100 <u>165</u> 99 <u>166</u> 98 <u>167</u> <u>168</u> <u>169</u> <u>170</u> <u>171</u> 172 173 <u>174</u> 175 <u>176</u> <u>177</u> <u>178</u> <u>179</u> <u>180</u> <u>181</u> <u>182</u> <u>183</u>];

(d) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 <u>164</u> 158 153 151 146 142 140 138 135 132 129 123 119 <u>116</u> 108 100 95 90 85 81 79 72 69 65 59 46 41 32 27 24 21 19 16 10 7 4 1 <u>165</u> 157 150 145 137 134 131 115 107 99 94 89 84 78 <u>71</u> 64 58 45 40 31 26 23 18 15 6 0 <u>166</u> 113 106 105 98 93 62 56 52 51 50 39 38 35 30 29 <u>167</u> 149 144 114 88 83 77 63 57 44 <u>160</u> 148 112 55 53 <u>43</u> 37 <u>181</u> 103 36 34 <u>170</u> 49 <u>179</u> 87 <u>183</u> 76 <u>173</u> 92 163 54 <u>171</u> 178 180 182 <u>104</u> <u>161</u> <u>162</u> <u>168</u> <u>169</u> <u>172</u> 174 <u>175</u> <u>176</u> <u>177</u>];

(e) $\phi_T$=[0 1 5 7 10 12 13 <u>161</u> 7 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 <u>160</u> 4 6 9 11 15 18 23 25 27 30 32 34 37 40 43 45 47 <u>49</u> 55 61 66 71 76 79 82 84 87 93 96 104 107 110 112 118 124 129 131 134 136 138 141 143 148 151 154 156 <u>161</u> 3 8 14 22 36 39 42 54 60 65 75 92 95 103 106 109 117 123 128 133 147 <u>162</u> 2 53 59 64 91 98 99 100 101 102 116 121 122 126 <u>163</u> 164 165 166 167 168 169 170 171 172 173 174 175 176 177 178 179 180 181 182 183];

(f) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 <u>164</u> 1 4 7 10 16 19 21 24 27 32 41 46 59 65 69 72 79 81 85 90 95 100 108 116 119 123 129 132 135 138 140 142 146 151 153 158 <u>165</u> 0 6 15 18 23 26 31 40 45 58 64 71 78 84 89 94 99 <u>107</u> 115 131 134 137 145 150 157 <u>166</u> 29 30 34 35 36 37 38 39 43 44 49 50 51 52 53 54 55 56 57 62 63 76 77 83 87 88 92 93 98 103 104 105 106 112 113 114 144 148 149 <u>160</u> <u>161</u> <u>162</u> <u>163</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(g) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 <u>160</u> 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 <u>161</u> 147 133 128 123 117 109 106 103 95 92 75 65 60 <u>54</u> 42 39 36 22 14 8 3 <u>162</u> 2 53 59 64 91 98 99 100 101 102 116 121 122 126 <u>127</u> 146 <u>163</u> <u>164</u> <u>165</u> <u>166</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(h) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 <u>164</u> 158 153 151 146 142 140 138 135 132 129 123 119 <u>116</u> 108 100 95 90 85 81 79 72 69 65 59 46 41 32 27 24 21 19 16 10 7 4 1 <u>165</u> 157 150 145 137 134 131 115 107 99 94 89 84 78 <u>71</u> 64 58 45 40 31 26 23 18 15 6 0 <u>166</u> 29 30 34 35 36 37 38 39 43 44 49 50 51 52 53 54 55 56 57 62 63 76 77 83 87 88 92 93 98 103 104 105 106 112 113 114 144 148 149 <u>160</u> <u>161</u> <u>162</u> <u>163</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(i) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 <u>160</u> 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 <u>161</u> 3 8 14 22 36 39 42 54 60 65 75 92 95 103 106 109 117 123 128 133 147 <u>162</u> 2 53 59 64 91 102 116 122 127 146 <u>163</u> 98 99 100 <u>101</u> 121 126 <u>164</u> <u>165</u> <u>166</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(j) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 <u>164</u> 1 4 7 10 16 19 21 24 27 32 41 46 59 65 69 72 79 81 85 90 95 100 108 116 119 123 129 132 135 138 140 142 146 151 153 158 <u>165</u> 0 6 15 18 23 26 31 40 45 58 64 71 78 84 89 94 99 <u>107</u> 115 131 134 137 145 150 157 <u>166</u> 29 30 35 38 39 50 51 52 56 62 93 98 105 106 113 <u>167</u> 34 36 37 43 44 49 53 54 55 57 63 76 77 83 87 88

92 103 104 112 114 144 148 149 160 161 162 163 168 169 170 171 172 173 174 175 176 177 178 179 180 181 182 183];

(k) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 122 116 102 91 64 59 53 2 163 98 99 100 101 121 126 164 165 166 167 168 169 170 171 172 173 174 175 176 177 178 179 180 181 182 183];

(l) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 164 158 153 151 146 142 140 138 135 132 129 123 119 116 108 100 95 90 85 81 79 72 69 65 59 46 41 32 27 24 21 19 16 10 7 4 1 165 157 150 145 137 134 131 115 107 99 94 89 84 78 71 64 58 45 40 31 26 23 18 15 6 0 166 113 106 105 98 93 62 56 52 51 50 39 38 35 30 29 167 34 36 37 43 44 49 53 54 55 57 63 76 77 83 87 88 92 103 104 112 114 144 148 149 160 161 162 163 168 169 170 171 172 173 174 175 176 177 178 179 180 181 182 183];

(m) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 53 59 64 91 102 116 122 127 146 163 101 121 126 164 98 99 100 165 166 167 168 169 170 171 172 173 174 175 176 177 178 179 180 181 182 183];

(n) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 164 1 4 7 10 16 19 21 24 27 32 41 46 59 65 69 72 79 81 85 90 95 100 108 116 119 123 129 132 135 138 140 142 146 151 153 158 165 0 6 15 18 23 26 31 40 45 58 64 71 78 84 89 94 99 107 115 131 134 137 145 150 157 166 29 30 35 38 39 50 51 52 56 62 93 98 105 106 113 167 44 57 63 77 83 88 114 144 149 160 34 36 37 43 49 53 54 55 76 87 92 103 104 112 148 161 162 163 168 169 170 171 172 173 174 175 176 177 178 179 180 181 182 183];

(o) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 122 116 102 91 64 59 53 2 163 126 121 101 164 98 99 100 165 166 167 168 169 170 171 172 173 174 175 176 177 178 179 180 181 182 183];

(p) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 164 158 153 151 146 142 140 138 135 132 129 123 119 116 108 100 95 90 85 81 79 72 69 65 59 46 41 32 27 24 21 19 16 10 7 4 1 165 157 150 145 137 134 131 115 107 99 94 89 84 78 71 64 58 45 40 31 26 23 18 15 6 0 166 113 106 105 98 93 62 56 52 51 50 39 38 35 30 29 167 149 144 114 88 83 77 63 57 44 160 34 36 37 43 49 53 54 55 76 87 92 103 104 112 148 161 162 163 168 169 170 171 172 173 174 175 176 177 178 179 180 181 182 183];

(q) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 53 59 64 91 102 116 122 127 146 163 101 121 126 164 100 165 98 99 166 167 168 169 170 171 172 173 174 175 176 177 178 179 180 181 182 183];

(r) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 164 1 4 7 10 16 19 21 24 27 32 41 46 59 65 69 72 79 81 85 90 95 100 108 116 119 123 129 132 135 138 140 142 146 151 153 158 165 0 6 15 18 23 26 31 40 45 58 64 71 78 84 89 94 99 107 115 131 134 137 145 150 157 166 29 30 35 38 39 50 51 52 56 62 93 98 105 106 113 167 44 57 63 77 83 88 114 144 149 160 37 43 53 55 112 148 181 34 36 49 54 76 87 92 103 104 161 162 163 168 169 170 171 172 173 174 175 176 177 178 179 180 182 183];

(s) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 122 116 102 91 64 59 53 2 163 126 121 101 164 100 165 98 99 166 167 168 169 170 171 172 173 174 175 176 177 178 179 180 181 182 183];

(t) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 164 158 153 151 146 142 140 138 135 132 129 123 119 116 108 100 95 90 85 81 79 72 69 65 59 46 41 32 27 24 21 19 16 10 7 4 1 165 157 150 145 137 134 131 115 107 99 94 89 84 78 71 64 58 45 40 31 26 23 18 15 6 0 166 113 106 105 98 93 62 56 52 51 50 39 38 35 30 29 167 149 144 114 88 83 77 63 57 44 160 148 112 55

53 43 37 181 34 36 49 54 76 87 92 103 104 161 162
163 168 169 170 171 172 173 174 175 176 177 178 179
180 182 183];

(u) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 4 6 9 11 15 18 23 25 27 30 32 34 37 40 43 45 47
49 55 61 66 71 76 79 82 84 87 93 96 104 107 110 112
118 124 129 131 134 136 138 141 143 148 151 154 156
161 3 8 14 22 36 39 42 54 60 65 75 92 95 103 106 109
117 123 128 133 147 162 2 59 100 101 116 121 126
127 146 165 64 99 122 166 91 169 53 102 163 164 98
167 168 170 171 172 173 174 175 176 177 178 179 180
181 182 183];

(v) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 4 6 9 11 15 18 23 25 27 30 32 34 37 40 43 45 47
49 55 61 66 71 76 79 82 84 87 93 96 104 107 110 112
118 124 129 131 134 136 138 141 143 148 151 154 156
161 3 8 14 22 36 39 42 54 60 65 75 92 95 103 106 109
117 123 128 133 147 162 2 59 100 101 116 121 126
127 146 165 64 99 122 166 91 169 53 102 163 164 98
167 168 170 171 172 173 174 175 176 177 178 179 180
181 182 183];

(w) $\phi_T$=[159 158 157 155 153 152 150 149 145 144 142
140 139 137 135 132 130 125 120 119 115 114 113 111
108 105 97 94 90 89 88 86 85 83 81 80 78 77 74 73 72
70 69 68 67 63 62 58 57 56 52 51 50 48 46 44 41 38
35 33 31 29 28 26 24 21 20 19 17 16 13 12 10 7 5 1
0 160 156 154 151 148 143 141 138 136 134 131 129
124 118 112 110 107 104 96 93 87 84 82 79 76 71 66
61 55 49 47 45 43 40 37 34 32 30 27 25 23 18 15 11
9 6 4 161 147 133 128 123 117 109 106 103 95 92 75
65 60 54 42 39 36 22 14 8 3 162 146 127 126 121 116
101 100 59 2 165 122 99 64 166 91 169 102 53 163 164
98 167 168 170 171 172 173 174 175 176 177 178 179
180 181 182 183];

(x) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 4 6 9 11 15 18 23 25 27 30 32 34 37 40 43 45 47
49 55 61 66 71 76 79 82 84 87 93 96 104 107 110 112
118 124 129 131 134 136 138 141 143 148 151 154 156
161 3 8 14 22 36 39 42 54 60 65 75 92 95 103 106 109
117 123 128 133 147 162 2 53 59 64 91 98 99 100 101
102 116 121 122 126 127 146 163 164 165 166 167 168
169 170 171 172 173 174 175 176 177 178 179 180 181
182 183];

(y) $\phi_T$=[159 158 157 155 153 152 150 149 145 144 142
140 139 137 135 132 130 125 120 119 115 114 113 111
108 105 97 94 90 89 88 86 85 83 81 80 78 77 74 73 72
70 69 68 67 63 62 58 57 56 52 51 50 48 46 44 41 38
35 33 31 29 28 26 24 21 20 19 17 16 13 12 10 7 5 1
0 160 156 154 151 148 143 141 138 136 134 131 129
124 118 112 110 107 104 96 93 87 84 82 79 76 71 66
61 55 49 47 45 43 40 37 34 32 30 27 25 23 18 15 11
9 6 4 161 147 133 128 123 117 109 106 103 95 92 75
65 60 54 42 39 36 22 14 8 3 162 2 53 59 64 91 98 99
100 101 102 116 121 122 126 127 146 163 164 165 166
167 168 169 170 171 172 173 174 175 176 177 178 179
180 181 182 183];

(z) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 4 6 9 11 15 18 23 25 27 30 32 34 37 40 43 45 47
49 55 61 66 71 76 79 82 84 87 93 96 104 107 110 112
118 124 129 131 134 136 138 141 143 148 151 154 156
161 3 8 14 22 36 39 42 54 60 65 75 92 95 103 106 109
117 123 128 133 147 162 2 59 100 101 116 121 126
127 146 165 53 64 91 98 99 102 122 163 164 166 167
168 169 170 171 172 173 174 175 176 177 178 179 180
181 182 183];

(aa) $\phi_T$=[159 158 157 155 153 152 150 149 145 144 142
140 139 137 135 132 130 125 120 119 115 114 113 111
108 105 97 94 90 89 88 86 85 83 81 80 78 77 74 73 72
70 69 68 67 63 62 58 57 56 52 51 50 48 46 44 41 38
35 33 31 29 28 26 24 21 20 19 17 16 13 12 10 7 5 1
0 160 156 154 151 148 143 141 138 136 134 131 129
124 118 112 110 107 104 96 93 87 84 82 79 76 71 66
61 55 49 47 45 43 40 37 34 32 30 27 25 23 18 15 11
9 6 4 161 147 133 128 123 117 109 106 103 95 92 75
65 60 54 42 39 36 22 14 8 3 162 146 127 126 121 116
101 100 59 2 165 53 64 91 98 99 102 122 163 164 166
167 168 169 170 171 172 173 174 175 176 177 178 179
180 181 182 183];

(bb) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 4 6 9 11 15 18 23 25 27 30 32 34 37 40 43 45 47
49 55 61 66 71 76 79 82 84 87 93 96 104 107 110 112
118 124 129 131 134 136 138 141 143 148 151 154 156
161 3 8 14 22 36 39 42 54 60 65 75 92 95 103 106 109
117 123 128 133 147 162 2 59 100 101 116 121 126
127 146 165 64 99 122 166 53 91 98 102 163 164 167
168 169 170 171 172 173 174 175 176 177 178 179 180
181 182 183];

(cc) $\phi_T$=[159 158 157 155 153 152 150 149 145 144 142
140 139 137 135 132 130 125 120 119 115 114 113 111
108 105 97 94 90 89 88 86 85 83 81 80 78 77 74 73 72
70 69 68 67 63 62 58 57 56 52 51 50 48 46 44 41 38
35 33 31 29 28 26 24 21 20 19 17 16 13 12 10 7 5 1
0 160 156 154 151 148 143 141 138 136 134 131 129
124 118 112 110 107 104 96 93 87 84 82 79 76 71 66
61 55 49 47 45 43 40 37 34 32 30 27 25 23 18 15 11
9 6 4 161 147 133 128 123 117 109 106 103 95 92 75
65 60 54 42 39 36 22 14 8 3 162 146 127 126 121 116
101 100 59 2 165 122 99 64 166 53 91 98 102 163 164
167 168 169 170 171 172 173 174 175 176 177 178 179
180 181 182 183];

(dd) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 4 6 9 11 15 18 23 25 27 30 32 34 37 40 43 45 47
49 55 61 66 71 76 79 82 84 87 93 96 104 107 110 112
118 124 129 131 134 136 138 141 143 148 151 154 156
161 3 8 14 22 36 39 42 54 60 65 75 92 95 103 106 109
117 123 128 133 147 162 2 59 100 101 116 121 126

127 146 165 64 99 122 166 91 169 53 98 102 163 164 167 168 170 171 172 173 174 175 176 177 178 179 180 181 182 183];

(ee) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 126 121 116 101 100 59 2 165 122 99 64 166 91 169 53 98 102 163 164 167 168 170 171 172 173 174 175 176 177 178 179 180 181 182 183].

12. The method of claim 7, wherein $K_{max}$ is 200 and the template interleaver uses an interleaving pattern comprising any one of the following interleaving patterns, wherein indices corresponding to cyclic redundancy check (CRC) bits are underlined:

(a) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 160 161 163 165 168 170 172 173 176 178 179 183 187 189 190 196 197 198 199 204 1 4 7 10 16 19 21 24 27 32 41 46 59 65 69 72 79 81 85 90 95 100 108 116 119 123 129 132 135 138 140 142 146 151 153 158 162 164 167 169 171 175 177 182 186 188 195 205 0 6 15 18 23 26 31 40 45 58 64 71 78 84 89 94 99 107 115 131 134 137 145 150 157 166 174 181 185 194 206 29 30 35 38 39 50 51 52 56 62 93 98 105 106 113 184 191 207 44 57 63 77 83 88 114 144 149 180 193 200 34 37 49 55 92 104 112 208 43 148 214 53 192 221 36 219 103 210 54 202 212 87 211 216 223 76 201 203 209 213 215 217 218 220 222];

(b) $\phi_T$=[199 198 197 196 190 189 187 183 179 178 176 173 172 170 168 165 163 161 160 159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 204 195 188 186 182 177 175 171 169 167 164 162 158 153 151 146 142 140 138 135 132 129 123 119 116 108 100 95 90 85 81 79 72 69 65 59 46 41 32 27 24 21 19 16 10 7 4 1 205 194 185 181 174 166 157 150 145 137 134 131 115 107 99 94 89 84 78 71 64 58 45 40 31 26 23 18 15 6 0 206 191 184 113 106 105 98 93 62 56 52 51 50 39 38 35 30 29 207 193 180 149 144 114 88 83 77 63 57 44 200 112 104 92 55 49 37 34 208 148 43 214 192 53 221 36 219 103 210 54 212 202 87 211 216 223 76 215 213 217 218 201 220 203 222 209];

(c) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 160 161 163 165 168 170 172 173 176 178 179 183 187 189 190 196 197 198 199 204 1 4 7 10 16 19 21 24 27 32 41 46 59 65 69 72 79 81 85 90 95 100 108 116 119 123 129 132 135 138 140 142 146 151 153 158 162 164 167 169 171 175 177 182 186 188 195 205 0 6 15 18 23 26 31 40 45 58 64 71 78 84 89 94 99 107 115 131 134 137 145 150 157 166 174 181 185 194 206 29 30 34 35 36 37 38 39 43 44 49 50 51 52 53 54 55 56 57 62 63 76 77 83 87 88 92 93 98 103 104 105 106 112 113 114 144 148 149 180 184 191 192 193 200 201 202 203 207 208 209 210 211 212 213 214 215 216 217 218 219 220 221 222 223];

(d) $\phi_T$=[199 198 197 196 190 189 187 183 179 178 176 173 172 170 168 165 163 161 160 159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 204 195 188 186 182 177 175 171 169 167 164 162 158 153 151 146 142 140 138 135 132 129 123 119 116 108 100 95 90 85 81 79 72 69 65 59 46 41 32 27 24 21 19 16 10 7 4 1 205 194 185 181 174 166 157 150 145 137 134 131 115 107 99 94 89 84 78 71 64 58 45 40 31 26 23 18 15 6 0 206 29 30 34 35 36 37 38 39 43 44 49 50 51 52 53 54 55 56 57 62 63 76 77 83 87 88 92 93 98 103 104 105 106 112 113 114 144 148 149 180 184 191 192 193 200 201 202 203 207 208 209 210 211 212 213 214 215 216 217 218 219 220 221 222 223];

(e) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 160 161 163 165 168 170 172 173 176 178 179 183 187 189 190 196 197 198 199 204 1 4 7 10 16 19 21 24 27 32 41 46 59 65 69 72 79 81 85 90 95 100 108 116 119 123 129 132 135 138 140 142 146 151 153 158 162 164 167 169 171 175 177 182 186 188 195 205 0 6 15 18 23 26 31 40 45 58 64 71 78 84 89 94 99 107 115 131 134 137 145 150 157 166 174 181 185 194 206 29 30 35 38 39 50 51 52 56 62 93 98 105 106 113 184 191 207 34 36 37 43 44 49 53 54 55 57 63 76 77 83 87 88 92 103 104 112 114 144 148 149 180 192 193 200 201 202 203 208 209 210 211 212 213 214 215 216 217 218 219 220 221 222 223];

(f) $\phi_T$=[199 198 197 196 190 189 187 183 179 178 176 173 172 170 168 165 163 161 160 159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 204 195 188 186 182 177 175 171 169 167 164 162 158 153 151 146 142 140 138 135 132 129 123 119 116 108 100 95 90 85 81 79 72 69 65 59 46 41 32 27 24 21 19 16 10 7 4 1 205 194 185 181 174 166 157 150 145 137 134 131 115 107 99 94 89 84 78 71 64 58 45 40 31 26 23 18 15 6 0 206 191 184 113 106 105 98 93 62 56 52 51 50 39 38 35 30 29 207 34 36 37 43 44 49 53 54 55 57 63 76 77 83 87 88 92 103 104 112 114 144 148 149 180 192 193 200 201 202 203 208 209 210 211 212 213 214 215 216 217 218 219 220 221 222 223];

(g) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 160 161 163 165 168 170 172 173 176 178 179 183 187 189 190 196 197 198 199 204 1 4 7 10 16 19 21 24 27 32 41 46 59 65 69 72 79 81 85 90 95 100 108 116 119 123 129 132 135 138 140 142 146 151 153 158 162 164 167 169 171 175 177 182 186 188 195 205 0 6 15 18 23 26 31 40 45 58 64 71 78 84 89 94 99 107 115 131 134 137 145 150 157 166 174 181 185 194 206 29 30 35 38 39 50 51 52 56 62 93 98 105 106 113 184 191 207 44 57 63 77 83 88 114 144 149 180 193 200 34 36 37 43 49 53 54 55 76 87 92 103 104 112 114 148 192 201 202 203 208 209 210 211 212 213 214 215 216 217 218 219 220 221 222 223];

(h) $\phi_T$=[199 198 197 196 190 189 187 183 179 178 176 173 172 170 168 165 163 161 160 159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 204 195 188 186 182 177 175 171 169 167 164 162 158 153 151 146 142 140 138 135 132 129 123 119 116 108 100 95 90 85 81 79 72 69 65 59 46 41 32 27 24 21 19 16 10 7 4 1 205 194 185 181 174 166 157 150 145 137 134 131 115 107 99 94 89 84 78 71 64 58 45 40 31 26 23 18 15 6 0 206 191 184 113 106 105 98 93 62 56 52 51 50 39 38 35 30 29 207 193 180 149 144 114 88 83 77 63 57 44 200 34 36 37 43 49 53 54 55 76 87 92 103 104 112 148 192 201 202 203 208 209 210 211 212 213 214 215 216 217 218 219 220 221 222 223];

(i) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 161 162 164 166 167 171 175 177 179 180 183 186 187 188 191 193 194 196 197 199 200 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 163 165 170 174 176 178 182 185 190 192 195 198 201 3 8 14 22 36 39 42 54 60 65 75 92 95 103 106 109 117 123 128 133 147 169 173 181 184 189 202 2 53 59 64 91 102 116 122 127 146 168 172 203 101 121 126 204 100 205 99 206 98 207 208 209 210 211 212 213 214 215 216 217 218 219 220 221 222 223];

(j) $\phi_T$=[199 197 196 194 193 191 188 187 186 183 180 179 177 175 171 167 166 164 162 161 160 159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 200 198 195 192 190 185 182 178 176 174 170 165 163 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 201 189 184 181 173 169 147 133 128 123 117 109 106 103 95 92 75 65 60 54 42 39 36 22 14 8 3 202 172 168 146 127 122 116 102 91 64 59 53 2 203 126 121 101 204 100 205 99 206 98 207 208 209 210 211 212 213 214 215 216 217 218 219 220 221 222 223];

(k) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 161 162 164 166 167 171 175 177 179 180 183 186 187 188 191 193 194 196 197 199 200 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 163 165 170 174 176 178 182 185 190 192 195 198 201 3 8 14 22 36 39 42 54 60 65 75 92 95 103 106 109 117 123 128 133 147 169 173 181 184 189 202 2 53 59 64 91 98 99 100 101 102 116 121 122 126 127 146 168 172 203 204 205 206 207 208 209 210 211 212 213 214 215 216 217 218 219 220 221 222 223];

(l) $\phi_T$=[199 197 196 194 193 191 188 187 186 183 180 179 177 175 171 167 166 164 162 161 160 159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 200 198 195 192 190 185 182 178 176 174 170 165 163 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 201 189 184 181 173 169 147 133 128 123 117 109 106 103 95 92 75 65 60 54 42 39 36 22 14 8 3 202 2 53 59 64 91 98 99 100 101 102 116 121 122 126 127 146 168 172 203 204 205 206 207 208 209 210 211 212 213 214 215 216 217 218 219 220 221 222 223];

(m) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 161 162 164 166 167 171 175 177 179 180 183 186 187 188 191 193 194 196 197 199 200 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 163 165 170 174 176 178 182 185 190 192 195 198 201 3 8 14 22 36 39 42 54 60 65 75 92 95 103 106 109 117 123 128 133 147 169 173 181 184 189 202 2 53 59 64 91 102 116 122 127 146 168 172 203 98 99 100 101 121 126 204 205 206 207 208 209 210 211 212 213 214 215 216 217 218 219 220 221 222 223];

(n) $\phi_T$=[199 197 196 194 193 191 188 187 186 183 180 179 177 175 171 167 166 164 162 161 160 159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 200 198 195 192 190 185 182 178 176 174 170 165 163 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 201 189 184 181 173 169 147 133 128 123 117 109 106 103 95 92 75 65 60 54 42 39 36 22 14 8 3 202 172 168 146 127 122 116 102 91 64 59 53 2 203 98 99 100 101 121 126 204 205 206 207 208 209 210 211 212 213 214 215 216 217 218 219 220 221 222 223];

(o) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 161 162 164 166 167 171 175 177 179 180 183 186 187 188 191 193 194 196 197 199 200 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 163 165 170 174 176 178 182 185 190 192 195 198 201 3 8 14 22 36 39 42 54 60 65 75 92 95 103 106 109 117 123 128 133 147 169 173 181 184 189 202 2 53 59 64 91 102 116 122 127 146 168 172 203 101 121 126 204 98 99 100 205 206 207 208 209 210 211 212 213 214 215 216 217 218 219 220 221 222 223];

(p) $\phi_T$=[199 197 196 194 193 191 188 187 186 183 180 179 177 175 171 167 166 164 162 161 160 159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26

24 21 20 19 17 16 13 12 10 7 5 1 0 $\overline{200}$ 198 195 192
190 185 182 178 176 174 170 165 163 $\overline{156}$ 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 $\overline{201}$ 189 184 181 173
169 147 133 128 123 117 109 106 $\overline{103}$ 95 92 75 65 60
54 42 39 36 22 14 8 3 $\overline{202}$ 172 168 146 127 122 116
102 91 64 59 53 2 $\overline{203}$ $\overline{126}$ 121 101 $\overline{204}$ 98 99 100 $\overline{205}$
$\overline{206}$ $\overline{207}$ $\overline{208}$ $\overline{209}$ $\overline{210}$ $\overline{211}$ 212 213 $\overline{214}$ $\overline{215}$ 216 217 $\overline{218}$
$\overline{219}$ $\overline{220}$ $\overline{221}$ $\overline{222}$ $\overline{223}$];

(q) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 $\overline{200}$ 4 6 9 11 15 18
23 25 27 30 32 34 37 40 43 45 47 $\overline{49}$ 55 61 66 71 76
79 82 84 87 93 96 104 107 110 112 118 124 129 131
134 136 138 141 143 148 151 154 156 163 165 170 174
176 178 182 185 190 192 195 198 $\overline{201}$ 3 8 14 22 36 39
42 54 60 65 75 92 95 103 106 109 $\overline{117}$ 123 128 133 147
169 173 181 184 189 $\overline{202}$ 2 53 59 64 91 102 116 122
127 146 168 172 $\overline{203}$ 101 121 126 $\overline{204}$ 100 $\overline{205}$ 98 99
$\overline{206}$ $\overline{207}$ $\overline{208}$ $\overline{209}$ $\overline{210}$ $\overline{211}$ 212 213 $\overline{214}$ $\overline{215}$ 216 217 $\overline{218}$
$\overline{219}$ $\overline{220}$ $\overline{221}$ $\overline{222}$ $\overline{223}$];

(r) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 $\overline{200}$ 198 195 192
190 185 182 178 176 174 170 165 163 $\overline{156}$ 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 $\overline{201}$ 189 184 181 173
169 147 133 128 123 117 109 106 $\overline{103}$ 95 92 75 65 60
54 42 39 36 22 14 8 3 $\overline{202}$ 172 168 146 127 122 116
102 91 64 59 53 2 $\overline{203}$ $\overline{126}$ 121 101 $\overline{204}$ 100 $\overline{205}$ 98 99
$\overline{206}$ $\overline{207}$ $\overline{208}$ $\overline{209}$ $\overline{210}$ $\overline{211}$ 212 213 $\overline{214}$ $\overline{215}$ 216 217 $\overline{218}$
$\overline{219}$ $\overline{220}$ $\overline{221}$ $\overline{222}$ $\overline{223}$];

(s) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 $\overline{200}$ 4 6 9 11 15 18
23 25 27 30 32 34 37 40 43 45 47 $\overline{49}$ 55 61 66 71 76
79 82 84 87 93 96 104 107 110 112 118 124 129 131
134 136 138 141 143 148 151 154 156 163 165 170 174
176 178 182 185 190 192 195 198 $\overline{201}$ 3 8 14 22 36 39
42 54 60 65 75 92 95 103 106 109 $\overline{117}$ 123 128 133 147
169 173 181 184 189 $\overline{202}$ 2 59 100 101 116 121 126
127 146 172 $\overline{205}$ 64 99 $\overline{122}$ 168 $\overline{206}$ 91 $\overline{209}$ 53 102 $\overline{203}$
$\overline{204}$ 98 $\overline{207}$ $\overline{208}$ $\overline{209}$ 210 $\overline{211}$ 212 $\overline{213}$ 214 $\overline{215}$ 216 $\overline{217}$
$\overline{218}$ $\overline{219}$ $\overline{220}$ $\overline{221}$ $\overline{222}$ $\overline{223}$];

(t) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 $\overline{200}$ 198 195 192
190 185 182 178 176 174 170 165 163 $\overline{156}$ 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 $\overline{201}$ 189 184 181 173
169 147 133 128 123 117 109 106 $\overline{103}$ 95 92 75 65 60
54 42 39 36 22 14 8 3 $\overline{202}$ 172 146 127 126 121 116
101 100 59 2 $\overline{205}$ 168 $\overline{122}$ 99 64 $\overline{206}$ 91 $\overline{209}$ 102 53 $\overline{203}$
$\overline{204}$ 98 $\overline{207}$ $\overline{208}$ $\overline{209}$ 210 $\overline{211}$ 212 $\overline{213}$ 214 $\overline{215}$ 216 $\overline{217}$
$\overline{218}$ $\overline{219}$ $\overline{220}$ $\overline{221}$ $\overline{222}$ $\overline{223}$];

(u) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 $\overline{200}$ 4 6 9 11 15 18
23 25 27 30 32 34 37 40 43 45 47 $\overline{49}$ 55 61 66 71 76
79 82 84 87 93 96 104 107 110 112 118 124 129 131
134 136 138 141 143 148 151 154 156 163 165 170 174
176 178 182 185 190 192 195 198 $\overline{201}$ 3 8 14 22 36 39
42 54 60 65 75 92 95 103 106 109 $\overline{117}$ 123 128 133 147
169 173 181 184 189 $\overline{202}$ 2 53 59 64 91 98 99 100 101
102 116 121 122 126 $\overline{127}$ 146 168 172 $\overline{203}$ $\overline{204}$ $\overline{205}$ $\overline{206}$
$\overline{207}$ $\overline{208}$ $\overline{209}$ 210 $\overline{211}$ 212 213 214 215 $\overline{216}$ 217 $\overline{218}$ 219
$\overline{220}$ $\overline{221}$ $\overline{222}$ $\overline{223}$];

(v) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 $\overline{200}$ 198 195 192
190 185 182 178 176 174 170 165 163 $\overline{156}$ 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 $\overline{201}$ 189 184 181 173
169 147 133 128 123 117 109 106 $\overline{103}$ 95 92 75 65 60
54 42 39 36 22 14 8 3 $\overline{202}$ 2 53 59 64 91 98 99 100 101
102 116 121 122 126 $\overline{127}$ 146 168 172 $\overline{203}$ $\overline{204}$ $\overline{205}$ $\overline{206}$
$\overline{207}$ $\overline{208}$ $\overline{209}$ 210 $\overline{211}$ 212 213 214 215 $\overline{216}$ 217 $\overline{218}$ 219
$\overline{220}$ $\overline{221}$ $\overline{222}$ $\overline{223}$];

(w) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 $\overline{200}$ 4 6 9 11 15 18
23 25 27 30 32 34 37 40 43 45 47 $\overline{49}$ 55 61 66 71 76
79 82 84 87 93 96 104 107 110 112 118 124 129 131
134 136 138 141 143 148 151 154 156 163 165 170 174
176 178 182 185 190 192 195 198 $\overline{201}$ 3 8 14 22 36 39
42 54 60 65 75 92 95 103 106 109 $\overline{117}$ 123 128 133 147
169 173 181 184 189 $\overline{202}$ 2 59 100 101 116 121 126
127 146 172 $\overline{205}$ 53 64 $\overline{91}$ 98 99 102 122 168 $\overline{203}$ $\overline{204}$
$\overline{205}$ $\overline{206}$ $\overline{207}$ $\overline{208}$ $\overline{209}$ 210 $\overline{211}$ 212 213 214 215 $\overline{216}$ 217
$\overline{218}$ $\overline{219}$ $\overline{220}$ $\overline{221}$ $\overline{222}$ $\overline{223}$];

(x) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 $\overline{200}$ 198 195 192
190 185 182 178 176 174 170 165 163 $\overline{156}$ 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 $\overline{201}$ 189 184 181 173
169 147 133 128 123 117 109 106 $\overline{103}$ 95 92 75 65 60

54 42 39 36 22 14 8 3 202 172 146 127 126 121 116
101 100 59 2 205 53 64 91 98 99 102 122 168 203 204
205 206 207 208 209 210 211 212 213 214 215 216 217
218 219 220 221 222 223];

(y) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 200 4 6 9 11 15 18
23 25 27 30 32 34 37 40 43 45 47 49 55 61 66 71 76
79 82 84 87 93 96 104 107 110 112 118 124 129 131
134 136 138 141 143 148 151 154 156 163 165 170 174
176 178 182 185 190 192 195 198 201 3 8 14 22 36 39
42 54 60 65 75 92 95 103 106 109 117 123 128 133 147
169 173 181 184 189 202 2 59 100 101 116 121 126
127 146 172 205 64 99 122 168 206 53 91 98 102 203
204 205 206 207 208 209 210 211 212 213 214 215 216
217 218 219 220 221 222 223];

(z) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 172 146 127 126 121 116
101 100 59 2 205 168 122 99 64 206 53 91 98 102 203
204 205 206 207 208 209 210 211 212 213 214 215 216
217 218 219 220 221 222 223];

(aa) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 200 4 6 9 11 15 18
23 25 27 30 32 34 37 40 43 45 47 49 55 61 66 71 76
79 82 84 87 93 96 104 107 110 112 118 124 129 131
134 136 138 141 143 148 151 154 156 163 165 170 174
176 178 182 185 190 192 195 198 201 3 8 14 22 36 39
42 54 60 65 75 92 95 103 106 109 117 123 128 133 147
169 173 181 184 189 202 2 59 100 101 116 121 126
127 146 172 205 64 99 122 168 206 91 209 53 98 102
203 204 205 206 207 208 209 210 211 212 213 214 215
216 217 218 219 220 221 222 223];

(bb) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 172 146 127 126 121 116
101 100 59 2 205 168 122 99 64 206 91 209 53 98 102
203 204 205 206 207 208 209 210 211 212 213 214 215
216 217 218 219 220 221 222 223];

(cc) $\phi_T$=[2 3 5 7 8 10 11 12 18 19 20 21 22 25 27 28 33
35 36 37 38 39 41 43 47 51 55 57 58 62 64 67 70 71
74 76 77 78 79 81 83 85 89 90 91 93 95 96 97 100 101
102 109 110 114 116 120 121 123 125 126 127 128 129
130 131 135 136 142 145 147 152 157 158 165 168 171
173 175 178 180 181 182 187 188 190 194 195 198 199
212 0 6 13 14 15 24 26 30 31 40 48 53 54 60 63 68 72
73 80 84 86 87 88 92 98 104 106 111 115 134 137 139
141 148 149 153 154 161 163 164 167 172 174 179 186
191 192 197 215 1 9 17 23 32 49 52 75 82 99 118 122
124 132 143 144 156 159 162 169 170 176 183 185 189
196 204 34 42 44 45 46 65 105 108 112 155 166 207
4 61 119 133 138 146 211 29 56 59 94 103 117 218 107
113 160 193 208 16 177 184 200 69 150 210 50 203
151 202 140 201 209 214 66 205 206 213 216 217];

(dd) $\phi_T$=[199 198 195 194 190 188 187 182 181 180 178
175 173 171 168 165 158 157 152 147 145 142 136 135
131 130 129 128 127 126 125 123 121 120 116 114 110
109 102 101 100 97 96 95 93 91 90 89 85 83 81 79 78
77 76 74 71 70 67 64 62 58 57 55 51 47 43 41 39 38
37 36 35 33 28 27 25 22 21 20 19 18 12 11 10 8 7 5
3 2 212 197 192 191 186 179 174 172 167 164 163 161
154 153 149 148 141 139 137 134 115 111 106 104 98
92 88 87 86 84 80 73 72 68 63 60 54 53 48 40 31 30
26 24 15 14 13 6 0 215 196 189 185 183 176 170 169
162 159 156 144 143 132 124 122 118 99 82 75 52 49
32 23 17 9 1 204 166 155 112 108 105 65 46 45 44 42
34 207 146 138 133 119 61 4 211 117 103 94 59 56 29
218 193 160 113 107 208 184 177 16 200 150 69 210
50 203 151 202 140 209 214 201 66 206 213 216 217];

(ee) $\phi_T$=[2 3 5 7 8 10 11 12 18 19 20 21 22 25 27 28 33
35 36 37 38 39 41 43 47 51 55 57 58 62 64 67 70 71
74 76 77 78 79 81 83 85 89 90 91 93 95 96 97 100 101
102 109 110 114 116 120 121 123 125 126 127 128 129
130 131 135 136 142 145 147 152 157 158 165 168 171
173 175 178 180 181 182 187 188 190 194 195 198 199
212 0 6 13 14 15 24 26 30 31 40 48 53 54 60 63 68 72
73 80 84 86 87 88 92 98 104 106 111 115 134 137 139
141 148 149 153 154 161 163 164 167 172 174 179 186
191 192 197 215 1 9 17 23 32 49 52 75 82 99 118 122
124 132 143 144 156 159 162 169 170 176 183 185 189
196 204 4 16 29 34 42 44 45 46 50 56 59 61 65 66 69
94 103 105 107 108 112 113 117 119 133 138 140 146
150 151 155 160 166 177 184 193 200 201 202 203 205
206 207 208 209 210 211 213 214 216 217 218];

(ff) $\phi_T$=[199 198 195 194 190 188 187 182 181 180 178
175 173 171 168 165 158 157 152 147 145 142 136 135
131 130 129 128 127 126 125 123 121 120 116 114 110
109 102 101 100 97 96 95 93 91 90 89 85 83 81 79 78
77 76 74 71 70 67 64 62 58 57 55 51 47 43 41 39 38
37 36 35 33 28 27 25 22 21 20 19 18 12 11 10 8 7 5
3 2 212 197 192 191 186 179 174 172 167 164 163 161
154 153 149 148 141 139 137 134 115 111 106 104 98
92 88 87 86 84 80 73 72 68 63 60 54 53 48 40 31 30
26 24 15 14 13 6 0 215 196 189 185 183 176 170 169
162 159 156 144 143 132 124 122 118 99 82 75 52 49
32 23 17 9 1 204 4 16 29 34 42 44 45 46 50 56 59 61
65 66 69 94 103 105 107 108 112 113 117 119 133 138
140 146 150 151 155 160 166 177 184 193 200 201 202
203 205 206 207 208 209 210 211 213 214 216 217];

(gg) $\phi_T$=[2 3 5 7 8 10 11 12 18 19 20 21 22 25 27 28 33
35 36 37 38 39 41 43 47 51 55 57 58 62 64 67 70 71
74 76 77 78 79 81 83 85 89 90 91 93 95 96 97 100 101
102 109 110 114 116 120 121 123 125 126 127 128 129
130 131 135 136 142 145 147 152 157 158 165 168 171

173 175 178 180 181 182 187 188 190 194 195 198 199 212 0 6 13 14 15 24 26 30 31 40 48 53 54 60 63 68 72 73 80 84 86 87 88 92 98 104 106 111 115 134 137 139 141 148 149 153 154 161 163 164 167 172 174 179 186 191 192 197 215 1 9 17 23 32 49 52 75 82 99 118 122 124 132 143 144 156 159 162 169 170 176 183 185 189 196 204 34 42 44 45 46 65 105 108 112 155 166 207 4 16 29 50 56 59 61 66 69 94 103 107 113 117 119 133 138 140 146 150 151 160 177 184 193 200 201 202 203 205 206 208 209 210 211 213 214 216 217 218];

(hh) $\phi_7$=[199 198 195 194 190 188 187 182 181 180 178 175 173 171 168 165 158 157 152 147 145 142 136 135 131 130 129 128 127 126 125 123 121 120 116 114 110 109 102 101 100 97 96 95 93 91 90 89 85 83 81 79 78 77 76 74 71 70 67 64 62 58 57 55 51 47 43 41 39 38 37 36 35 33 28 27 25 22 21 20 19 18 12 11 10 8 7 5 3 2 212 197 192 191 186 179 174 172 167 164 163 161 154 153 149 148 141 139 137 134 115 111 106 104 98 92 88 87 86 84 80 73 72 68 63 60 54 53 48 40 31 30 26 24 15 14 13 6 0 215 196 189 185 183 176 170 169 162 159 156 144 143 132 124 122 118 99 82 75 52 49 32 23 17 9 1 204 166 155 112 108 105 65 46 45 44 42 34 207 4 16 29 50 56 59 61 66 69 94 103 107 113 117 119 133 138 140 146 150 151 160 177 184 193 200 201 202 203 205 206 208 209 210 211 213 214 216 217];

(ii) $\phi_7$=[2 3 5 7 8 10 11 12 18 19 20 21 22 25 27 28 33 35 36 37 38 39 41 43 47 51 55 57 58 62 64 67 70 71 74 76 77 78 79 81 83 85 89 90 91 93 95 96 97 100 101 102 109 110 114 116 120 121 123 125 126 127 128 129 130 131 135 136 142 145 147 152 157 158 165 168 171 173 175 178 180 181 182 187 188 190 194 195 198 199 212 0 6 13 14 15 24 26 30 31 40 48 53 54 60 63 68 72 73 80 84 86 87 88 92 98 104 106 111 115 134 137 139 141 148 149 153 154 161 163 164 167 172 174 179 186 191 192 197 215 1 9 17 23 32 49 52 75 82 99 118 122 124 132 143 144 156 159 162 169 170 176 183 185 189 196 204 34 42 44 45 46 65 105 108 112 155 166 207 4 61 119 133 138 146 211 16 29 50 56 59 66 69 94 103 107 113 117 140 150 151 160 177 184 193 200 201 202 203 205 206 208 209 210 213 214 216 217 218];

(jj) $\phi_7$=[199 198 195 194 190 188 187 182 181 180 178 175 173 171 168 165 158 157 152 147 145 142 136 135 131 130 129 128 127 126 125 123 121 120 116 114 110 109 102 101 100 97 96 95 93 91 90 89 85 83 81 79 78 77 76 74 71 70 67 64 62 58 57 55 51 47 43 41 39 38 37 36 35 33 28 27 25 22 21 20 19 18 12 11 10 8 7 5 3 2 212 197 192 191 186 179 174 172 167 164 163 161 154 153 149 148 141 139 137 134 115 111 106 104 98 92 88 87 86 84 80 73 72 68 63 60 54 53 48 40 31 30 26 24 15 14 13 6 0 215 196 189 185 183 176 170 169 162 159 156 144 143 132 124 122 118 99 82 75 52 49 32 23 17 9 1 204 166 155 112 108 105 65 46 45 44 42 34 207 146 138 133 119 61 4 211 16 29 50 56 59 66 69 94 103 107 113 117 140 150 151 160 177 184 193 200 201 202 203 205 206 208 209 210 213 214 216 217];

(kk) $\phi_7$=[2, 3, 5, 7, 8, 10, 11, 12, 18, 19, 20, 21, 22, 25, 27, 28, 33, 35, 36, 37, 38, 39, 41, 43, 47, 51, 55, 57, 58, 62, 64, 67, 70, 71, 74, 76, 77, 78, 79, 81, 83, 85, 89, 90, 91, 93, 95, 96, 97, 100, 101, 102, 109, 110, 114, 116, 120, 121, 123, 125, 126, 127, 128, 129, 130, 131, 135, 136, 142, 145, 147, 152, 157, 158, 165, 168, 171, 173, 175, 178, 180, 181, 182, 187, 188, 190, 194, 195, 198, 199, 212, 0, 6, 13, 14, 15, 24, 26, 30, 31, 40, 48, 53, 54, 60, 63, 68, 72, 73, 80, 84, 86, 87, 88, 92, 98, 104, 106, 111, 115, 134, 137, 139, 141, 148, 149, 153, 154, 161, 163, 164, 167, 172, 174, 179, 186, 191, 192, 197, 215, 1, 9, 17, 23, 32, 49, 52, 75, 82, 99, 118, 122, 124, 132, 143, 144, 156, 159, 162, 169, 170, 176, 183, 185, 189, 196, 204, 34, 42, 44, 45, 46, 65, 105, 108, 112, 155, 166, 207, 4, 61, 119, 133, 138, 146, 211, 29, 56, 59, 94, 103, 117, 218, 107, 113, 160, 193, 208, 16, 177, 184, 200, 140, 151, 201, 66, 205, 50, 209, 150, 206, 69, 202, 203, 210, 213, 214, 216, 217].

13. The method of claim 2, wherein $K_{max}$ is 53 and the template interleaver uses an interleaving pattern comprising any one of the following interleaving patterns, wherein indices corresponding to cyclic redundancy check (CRC) bits are underlined:

(a) $\phi_7$=[1 4 5 8 10 11 14 15 16 20 24 26 28 30 31 35 44 45 46 48 51 52 58 12 19 21 22 25 32 33 37 38 39 47 68 7 9 17 18 27 41 50 61 0 34 36 43 53 40 49 54 29 42 64 13 65 2 62 23 55 69 71 3 56 57 67 6 59 60 63 66 70];

(b) $\phi_7$=[1 4 5 8 10 11 14 15 16 20 24 26 28 30 31 35 44 45 46 48 51 52 58 12 19 21 22 25 32 33 37 38 39 47 68 7 9 17 18 27 41 50 61 0 2 3 6 13 23 29 34 36 40 42 43 49 53 54 55 56 57 59 60 62 63 64 65 66 67 69 70 71];

(c) $\phi_7$=[1 4 5 8 10 11 14 15 16 20 24 26 28 30 31 35 44 45 46 48 51 52 58 12 19 21 22 25 32 33 37 38 39 47 68 7 9 17 18 27 41 50 61 0 34 36 43 53 2 3 6 13 23 29 40 42 49 54 55 56 57 59 60 62 63 64 65 66 67 69 70 71];

(d) $\phi_7$=[1 4 5 8 10 11 14 15 16 20 24 26 28 30 31 35 44 45 46 48 51 52 58 12 19 21 22 25 32 33 37 38 39 47 68 7 9 17 18 27 41 50 61 0 34 36 43 53 40 49 54 2 3 6 13 23 29 42 55 56 57 59 60 62 63 64 65 66 67 69 70 71].

14. A wireless receiver comprising processing circuitry, the processing circuitry operable to:
receive a set of polar encoded bits;
determine a decoder reaches a distributed CRC bit $p_i$ when decoding the received set of polar encoded bits;
calculate L estimated values, $p_i(\ell)$, of the distributed CRC bit $p_i$, one for each list $\ell$, $\ell=0, 1, \ldots, L-1$;
for each $p_i(\ell)$, determine whether the info bits associated with $p_i(\ell)$ leads to a successful parity check; and
upon determining there is no successful parity check for each $p_i(\ell)$, terminate the decoding;
upon determining there exists a successful parity check, continue the decoding;
wherein the decoding comprises template deinterleaving.

15. The wireless receiver of claim 14, wherein the template deinterleaving is based on a predetermined interleaving mapping function comprising a template interleaver for a largest value of K, referred to as $K_{max}$, and the template interleaver comprises a high-index bit mapper wherein:
the K data bits are loaded at the high-index positions of the input of the template interleaver, where $u=[u_0, u_1, \ldots, u_{K-1}]$ and the input of the template interleaver, denoted by $v=[v_0, v_1, \ldots, v_{K_{max}-1}]$, is given by the following bit mapping:

$$v_i = \begin{cases} u_{i-K_{max}+K} & K_{max} - K \leq i < K_{max} \\ p_{i-K_{max}} & i \geq K_{max} \\ \text{NULL} & \text{otherwise} \end{cases}.$$

16. The wireless receiver of claim 15, wherein $K_{max}$ is 53 and the template interleaver uses an interleaving pattern comprising any one of the following interleaving patterns, wherein indices corresponding to cyclic redundancy check (CRC) bits are underlined:

(a) $\phi_T$=[1 4 5 8 10 11 14 15 16 20 24 26 28 30 31 35 44 45 46 48 51 52 <u>58</u> 12 19 21 22 25 32 33 37 38 39 47 <u>68</u> 7 9 17 18 27 <u>41</u> 50 <u>61</u> 0 34 36 43 <u>53</u> 40 49 <u>54</u> 29 42 <u>64</u> 13 <u>65</u> 2 <u>62</u> 23 <u>55</u> <u>69</u> <u>71</u> 3 <u>56</u> <u>57</u> <u>67</u> 6 <u>59</u> <u>60</u> <u>63</u> <u>66</u> <u>70</u>];

(b) $\phi_T$=[1 4 5 8 10 11 14 15 16 20 24 26 28 30 31 35 44 45 46 48 51 52 <u>58</u> 12 19 21 22 25 32 33 37 38 39 47 <u>68</u> 7 9 17 18 27 <u>41</u> 50 <u>61</u> 0 2 3 6 13 23 29 34 36 40 42 <u>43</u> 49 <u>53</u> <u>54</u> <u>55</u> <u>56</u> <u>57</u> <u>59</u> <u>60</u> <u>62</u> <u>63</u> <u>64</u> <u>65</u> <u>66</u> <u>67</u> <u>69</u> <u>70</u> <u>71</u>];

(c) $\phi_T$=[1 4 5 8 10 11 14 15 16 20 24 26 28 30 31 35 44 45 46 48 51 52 <u>58</u> 12 19 21 22 25 32 33 37 38 39 47 <u>68</u> 7 9 17 18 27 <u>41</u> 50 <u>61</u> 0 34 36 43 <u>53</u> 2 3 6 13 23 29 40 42 49 <u>54</u> <u>55</u> <u>56</u> <u>57</u> <u>59</u> <u>60</u> <u>62</u> <u>63</u> <u>64</u> <u>65</u> <u>66</u> <u>67</u> <u>69</u> <u>70</u> <u>71</u>];

(d) $\phi_T$=[1 4 5 8 10 11 14 15 16 20 24 26 28 30 31 35 44 45 46 48 51 52 <u>58</u> 12 19 21 22 25 32 33 37 38 39 47 <u>68</u> 7 9 17 18 27 <u>41</u> 50 <u>61</u> 0 34 36 43 <u>53</u> 40 49 <u>54</u> 2 3 6 13 23 29 42 <u>55</u> <u>56</u> <u>57</u> <u>59</u> <u>60</u> <u>62</u> <u>63</u> <u>64</u> <u>65</u> <u>66</u> <u>67</u> <u>69</u> <u>70</u> <u>71</u>].

17. The wireless receiver of claim 15, wherein $K_{max}$ is 72 and the template interleaver uses an interleaving pattern comprising any one of the following interleaving patterns, wherein indices corresponding to cyclic redundancy check (CRC) bits are underlined:

(a) $\phi_T$=[3 4 8 11 13 14 17 18 23 30 31 34 38 40 41 43 44 45 47 49 51 52 56 57 58 63 64 65 66 71 <u>87</u> 5 7 9 12 16 20 24 27 29 33 35 39 50 54 67 70 <u>77</u> 0 <u>15</u> 26 28 36 37 46 60 69 <u>80</u> 1 19 55 59 68 <u>73</u> 32 <u>53</u> <u>61</u> <u>84</u> 10 62 <u>72</u> 21 <u>81</u> 48 <u>83</u> <u>22</u> 76 42 <u>88</u> 2 <u>74</u> <u>75</u> 25 <u>82</u> <u>85</u> 6 <u>78</u> <u>79</u> <u>86</u> <u>89</u> <u>90</u>];

(b) $\phi_T$=[3 4 8 11 13 14 17 18 23 30 31 34 38 40 41 43 44 45 47 49 51 52 56 57 58 63 64 65 66 71 <u>87</u> 5 7 9 12 16 20 24 27 29 33 35 39 50 54 67 70 <u>77</u> 0 <u>15</u> 26 28 36 37 46 60 69 <u>80</u> 1 2 6 10 19 21 22 25 <u>32</u> 42 48 53 55 59 61 62 68 <u>72</u> <u>73</u> <u>74</u> <u>75</u> <u>76</u> <u>78</u> <u>79</u> <u>81</u> <u>82</u> <u>83</u> <u>84</u> <u>85</u> <u>86</u> <u>88</u> <u>89</u> <u>90</u>];

(c) $\phi_T$=[3 4 8 11 13 14 17 18 23 30 31 34 38 40 41 43 44 45 47 49 51 52 56 57 58 63 64 65 66 71 <u>87</u> 5 7 9 12 16 20 24 27 29 33 35 39 50 54 67 70 <u>77</u> 0 <u>15</u> 26 28 36 37 46 60 69 <u>80</u> 1 19 55 59 68 <u>73</u> 2 <u>6</u> 10 21 22 25 32 42 48 53 61 <u>62</u> <u>72</u> <u>74</u> <u>75</u> <u>76</u> <u>78</u> <u>79</u> <u>81</u> <u>82</u> <u>83</u> <u>84</u> <u>85</u> <u>86</u> <u>88</u> <u>89</u> <u>90</u>];

(d) $\phi_T$=[3 4 8 11 13 14 17 18 23 30 31 34 38 40 41 43 44 45 47 49 51 52 56 57 58 63 64 65 66 71 <u>87</u> 5 7 9 12 16 20 24 27 29 33 35 39 50 54 67 70 <u>77</u> 0 <u>15</u> 26 28 36 37 46 60 69 <u>80</u> 1 19 55 59 68 <u>73</u> 32 <u>53</u> 61 <u>84</u> 2 6 10 21 22 25 42 <u>48</u> 62 <u>72</u> <u>74</u> <u>75</u> <u>76</u> <u>78</u> <u>79</u> <u>81</u> <u>82</u> <u>83</u> <u>85</u> <u>86</u> <u>88</u> <u>89</u> <u>90</u>].

18. The wireless receiver of claim 15, wherein $K_{max}$ is 140 and the template interleaver uses an interleaving pattern comprising any one of the following interleaving patterns, wherein indices corresponding to cyclic redundancy check (CRC) bits are underlined:

(a) $\phi_T$=[0 3 6 9 11 12 13 14 15 17 18 19 21 22 28 29 30 37 38 42 43 48 53 57 59 64 65 66 69 71 72 73 78 79 91 92 97 106 111 114 117 119 122 125 126 127 128 130 131 134 136 137 <u>144</u> 1 4 7 10 16 20 23 31 39 44 49 54 58 60 67 70 74 80 <u>93</u> 98 107 112 115 118 120 123 129 132 135 138 <u>145</u> 2 5 8 24 32 40 45 50 55 61 68 75 81 94 99 108 113 116 121 124 133 139 <u>146</u> 26 33 34 41 46 77 83 87 88 89 100 101 104 109 <u>110</u> <u>147</u> 25 51 56 62 76 82 95 <u>140</u> 27 84 86 96 102 <u>161</u> 36 <u>103</u> 105 <u>150</u> 90 <u>159</u> 52 <u>163</u> 63 <u>153</u> 47 <u>143</u> 85 <u>151</u> <u>158</u> <u>160</u> <u>162</u> 35 <u>141</u> <u>142</u> <u>148</u> <u>149</u> <u>152</u> <u>154</u> <u>155</u> <u>156</u> <u>157</u>];

(b) $\phi_T$=[0 3 6 9 11 12 13 14 15 17 18 19 21 22 28 29 30 37 38 42 43 48 53 57 59 64 65 66 69 71 72 73 78 79 91 92 97 106 111 114 117 119 122 125 126 127 128 130 131 134 136 137 <u>144</u> 1 4 7 10 16 20 23 31 39 44 49 54 58 60 67 70 74 80 93 98 107 112 115 118 120 123 129 132 135 138 <u>145</u> 2 5 8 24 32 40 45 50 55 61 68 75 81 94 99 108 113 116 121 124 133 139 <u>146</u> 25 26 27 33 34 35 36 41 46 47 51 52 56 62 63 76 <u>77</u> 82 83 84 85 86 87 88 89 90 95 96 100 101 102 103 104 105 109 110 <u>140</u> <u>141</u> <u>142</u> <u>143</u> <u>147</u> <u>148</u> <u>149</u> <u>150</u> <u>151</u> <u>152</u> <u>153</u> <u>154</u> <u>155</u> <u>156</u> <u>157</u> <u>158</u> <u>159</u> <u>160</u> <u>161</u> <u>162</u> <u>163</u>];

(c) $\phi_T$=[0 3 6 9 11 12 13 14 15 17 18 19 21 22 28 29 30 37 38 42 43 48 53 57 59 64 65 66 69 71 72 73 78 79 91 92 97 106 111 114 117 119 122 125 126 127 128 130 131 134 136 137 <u>144</u> 1 4 7 10 16 20 23 31 39 44 49 54 58 60 67 70 74 80 93 98 107 112 115 118 120 123 129 132 135 138 <u>145</u> 2 5 8 24 32 40 45 50 55 61 68 75 81 94 99 108 113 116 121 124 133 139 <u>146</u> 26 33 34 41 46 77 83 87 88 89 100 101 104 109 <u>110</u> <u>147</u> 25 27 35 36 47 51 52 56 62 63 76 82 84 85 86 90 <u>95</u> 96 102 103 105 <u>140</u> <u>141</u> <u>142</u> <u>143</u> <u>148</u> <u>149</u> <u>150</u> <u>151</u> <u>152</u> <u>153</u> <u>154</u> <u>155</u> <u>156</u> <u>157</u> <u>158</u> <u>159</u> <u>160</u> <u>161</u> <u>162</u> <u>163</u>];

(d) $\phi_T$=[0 3 6 9 11 12 13 14 15 17 18 19 21 22 28 29 30 37 38 42 43 48 53 57 59 64 65 66 69 71 72 73 78 79 91 92 97 106 111 114 117 119 122 125 126 127 128 130 131 134 136 137 <u>144</u> 1 4 7 10 16 20 23 31 39 44 49 54 58 60 67 70 74 80 93 98 107 112 115 118 120 123 129 132 135 138 <u>145</u> 2 5 8 24 32 40 45 50 55 61 68 75 81 94 99 108 113 116 121 124 133 139 <u>146</u> 26 33 34 41 46 77 83 87 88 89 100 101 104 109 <u>110</u> <u>147</u> 25 51 56 62 76 82 95 <u>140</u> 27 35 36 47 52 63 84 85 86 90 96 102 103 105 <u>141</u> <u>142</u> 143 148 149 150 151 <u>152</u> <u>153</u> <u>154</u> <u>155</u> <u>156</u> <u>157</u> <u>158</u> <u>159</u> <u>160</u> <u>161</u> <u>162</u> <u>163</u>];

(e) $\phi_T$=[0 2 4 7 9 14 19 <u>20</u> 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 <u>103</u> 117 125 131 136 <u>142</u> 12 17 23 37 48 75 80 86 137 <u>143</u> 13 18 38 <u>144</u> 39 <u>145</u> 40 146 41 <u>147</u> 148 149 150 <u>151</u> 152 153 <u>154</u> 155 <u>156</u> <u>157</u> 158 <u>159</u> 160 <u>161</u> <u>162</u> <u>163</u>];

(f) $\phi_T$=[0 2 4 7 9 14 19 <u>20</u> 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 10<u>3</u> 117 125 131 136 <u>142</u> 12 13 17 18 23 37 38 39 40 41 48 75 80 86 137 <u>143</u> <u>144</u> 145 146 147 148 149 150 151 152 153 154 155 <u>156</u> <u>157</u> <u>158</u> <u>159</u> <u>160</u> <u>161</u> <u>162</u> <u>163</u>];

(g) $\phi_T$=[0 2 4 7 9 14 19 <u>20</u> 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 <u>103</u> 117 125 131 136 <u>142</u> 12 17 23 37 48 75 80 86 137 <u>143</u> 13 18 38 39

40 41 <u>144 145 146 147 148 149 150 151 152 153 154 155 156 157 158 159 160 161 162 163</u>];

(h) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 <u>103</u> 117 125 131 136 <u>142</u> 12 17 23 37 48 75 80 86 137 <u>143</u> 13 18 38 <u>144</u> 39 40 41 <u>145 146 147 148 149 150 151</u> 152 153 <u>154 155 156 157 158 159 160 161 162 163</u>];

(i) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 <u>103</u> 117 125 131 136 <u>142</u> 12 17 23 37 48 75 80 86 137 <u>143</u> 13 18 38 <u>144</u> 39 <u>145</u> 40 41 <u>146 147 148 149 150</u> <u>151</u> 152 153 <u>154 155 156 157 158 159 160 161 162 163</u>];

(j) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 <u>103</u> 117 125 131 136 <u>142</u> 12 13 18 23 38 39 80 137 <u>145</u> 17 40 75 <u>146</u> 48 <u>149</u> 37 86 <u>143</u> 144 41 147 148 <u>150</u> <u>151</u> 152 153 <u>154 155 156 157 158 159 160 161 162 163</u>];

(k) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 <u>103</u> 117 125 131 136 <u>142</u> 12 13 17 18 23 37 38 39 40 41 48 75 80 86 137 <u>143 144 145 146 147 148 149 150 151 152 153 154 155 156 157 158 159 160 161 162 163</u>];

(l) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 <u>103</u> 117 125 131 136 <u>142</u> 12 13 18 23 38 39 80 137 <u>145</u> 17 37 40 41 48 75 86 <u>143</u> 144 146 147 148 149 <u>150</u> <u>151</u> 152 153 <u>154 155 156 157 158 159 160 161 162 163</u>];

(m) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 <u>103</u> 117 125 131 136 <u>142</u> 12 13 18 23 38 39 80 137 <u>145</u> 17 40 75 <u>146</u> 48 <u>149</u> 37 41 48 86 <u>143</u> 144 147 148 149 <u>150</u> <u>151</u> 152 153 <u>154 155 156 157 158 159 160 161 162 163</u>];

(n) $\phi_T$=[0 2 4 7 9 14 19 20 24 25 26 28 31 34 42 45 49 50 51 53 54 56 58 59 61 62 65 66 67 69 70 71 72 76 77 81 82 83 87 88 89 91 93 95 98 101 104 106 108 110 111 113 115 118 119 120 122 123 126 127 129 132 134 138 139 <u>140</u> 1 3 5 8 10 15 21 27 29 32 35 43 46 52 55 57 60 63 <u>68</u> 73 78 84 90 92 94 96 99 102 105 107 109 112 114 116 121 124 128 130 133 135 <u>141</u> 6 11 16 22 30 33 36 44 47 64 74 79 85 97 100 <u>103</u> 117 125 131 136 <u>142</u> 12 13 18 23 38 39 80 137 <u>145</u> 17 40 75 <u>146</u> 48 <u>149</u> 37 41 86 <u>143</u> 144 147 148 <u>150</u> <u>151</u> 152 153 <u>154 155 156 157 158 159 160 161 162 163</u>];

(o) $\phi_T$=[0 2 4 5 10 11 12 16 18 19 23 24 25 28 33 35 37 38 39 41 42 47 48 51 52 53 55 56 58 59 62 66 67 71 72 76 79 81 82 85 86 91 98 99 102 106 108 109 111 112 113 115 117 119 120 124 125 126 131 132 133 134 139 <u>155</u> 3 7 9 15 17 21 29 30 40 43 44 46 57 60 61 63 64 <u>77</u> 84 87 90 96 103 104 107 114 116 118 122 129 130 136 137 138 <u>144</u> 8 27 31 34 49 50 65 74 93 94 95 97 100 101 105 <u>121</u> 127 <u>147</u> 13 26 36 54 73 75 89 92 135 <u>146</u> 14 32 80 88 <u>145</u> <u>68</u> 69 128 <u>152</u> 1 6 20 78 <u>151</u> 22 <u>83</u> <u>148</u> 149 123 <u>141</u> 45 <u>140</u> 70 <u>153</u> <u>154</u> 110 <u>142</u> <u>143</u> 150 <u>156 157 158</u>];

(p) $\phi_T$=[0 2 4 5 10 11 12 16 18 19 23 24 25 28 33 35 37 38 39 41 42 47 48 51 52 53 55 56 58 59 62 66 67 71 72 76 79 81 82 85 86 91 98 99 102 106 108 109 111 112 113 115 117 119 120 124 125 126 131 132 133 134 139 <u>155</u> 3 7 9 15 17 21 29 30 40 43 44 46 57 60 61 63 64 <u>77</u> 84 87 90 96 103 104 107 114 116 118 122 129 130 136 137 138 <u>144</u> 8 27 31 34 49 50 65 74 93 94 95 97 100 101 105 <u>121</u> 127 <u>147</u> 1 6 13 14 20 22 26 32 36 45 54 68 69 70 73 75 78 <u>80</u> 83 88 89 92 110 123 128 135 140 141 142 143 145 146 148 149 150 151 152 153 154 <u>156 157 158</u>];

(q) $\phi_T$=[0 2 4 5 10 11 12 16 18 19 23 24 25 28 33 35 37 38 39 41 42 47 48 51 52 53 55 56 58 59 62 66 67 71 72 76 79 81 82 85 86 91 98 99 102 106 108 109 111 112 113 115 117 119 120 124 125 126 131 132 133 134 139 <u>155</u> 3 7 9 15 17 21 29 30 40 43 44 46 57 60 61 63 64 <u>77</u> 84 87 90 96 103 104 107 114 116 118 122 129 130 136 137 138 <u>144</u> 8 27 31 34 49 50 65 74 93 94 95 97 100 101 105 <u>121</u> 127 <u>147</u> 13 26 36 54 73 75 89 92 135 <u>146</u> 1 6 14 20 22 32 <u>45</u> 68 69 70 78 80 83 88 110 123 <u>128</u> 140 141 142 143 145 148 149 150 151 152 153 154 156 <u>157 158</u>];

(r) $\phi_T$=[0 2 4 5 10 11 12 16 18 19 23 24 25 28 33 35 37 38 39 41 42 47 48 51 52 53 55 56 58 59 62 66 67 71 72 76 79 81 82 85 86 91 98 99 102 106 108 109 111 112 113 115 117 119 120 124 125 126 131 132 133 134 139 <u>155</u> 3 7 9 15 17 21 29 30 40 43 44 46 57 60 61 63 64 <u>77</u> 84 87 90 96 103 104 107 114 116 118 122 129 130 136 137 138 <u>144</u> 8 27 31 34 49 50 65 74 93 94 95 97 100 101 105 <u>121</u> 127 <u>147</u> 13 26 36 54 73 75 89 92 135 <u>146</u> 14 32 80 88 <u>145</u> 1 6 20 22 45 68 69 70 78 83 110 <u>123</u> 128 140 141 <u>142</u> 143 148 149 150 151 152 153 154 <u>156 157 158</u>].

19. The wireless receiver of claim 15, wherein $K_{max}$ is 160 and the template interleaver uses an interleaving pattern comprising any one of the following interleaving patterns, wherein indices corresponding to cyclic redundancy check (CRC) bits are underlined:

(a) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159

160 3 5 8 11 16 18 21 23 25 28 30 35 41 47 49 52 55
63 66 72 75 77 80 83 88 93 98 104 110 112 114 116
119 122 125 127 129 132 134 136 141 144 148 150 153
155 161 12 26 31 36 42 50 53 56 64 67 84 94 99 105
117 120 123 137 145 151 156 162 13 32 37 43 57 68
95 100 106 157 163 33 38 58 164 59 165 60 166 61 167
168 169 170 171 172 173 174 175 176 177 178 179 180
181 182 183];

(b) $\phi_T=$[0 3 4 5 7 12 16 18 20 23 26 29 31 32 33 34 35
37 38 39 41 42 48 49 50 57 58 62 63 68 73 77 79 84
85 86 89 91 92 93 98 99 111 112 117 126 131 134 137
139 142 145 146 147 148 150 151 154 156 157 164 1
6 8 13 17 19 21 24 27 30 36 40 43 51 59 64 69 74 78
80 87 90 94 100 113 118 127 132 135 138 140 143 149
152 155 158 165 2 9 14 22 25 28 44 52 60 65 70 75 81
88 95 101 114 119 128 133 136 141 144 153 159 166
46 53 54 61 66 97 103 107 108 109 120 121 124 129
130 167 10 15 45 71 76 82 96 102 115 160 11 47 104
106 116 122 181 56 123 125 170 110 179 72 183 83
173 67 163 105 171 178 180 182 55 161 162 168 169
172 174 175 176 177];

(c) $\phi_T=$[0 1 2 4 6 7 9 10 14 15 17 19 20 22 24 27 29 34
39 40 44 45 46 48 51 54 62 65 69 70 71 73 74 76 78
79 81 82 85 86 87 89 90 91 92 96 97 101 102 103 107
108 109 111 113 115 118 121 124 126 128 130 131 133
135 138 139 140 142 143 146 147 149 152 154 158 159
160 3 5 8 11 16 18 21 23 25 28 30 35 41 47 49 52 55
63 66 72 75 77 80 83 88 93 98 104 110 112 114 116
119 122 125 127 129 132 134 136 141 144 148 150 153
155 161 12 26 31 36 42 50 53 56 64 67 84 94 99 105
117 120 123 137 145 151 156 162 13 32 33 37 38 43
57 58 59 60 61 68 95 100 106 157 163 164 165 166 167
168 169 170 171 172 173 174 175 176 177 178 179 180
181 182 183];

(d) $\phi_T=$[0 3 4 5 7 12 16 18 20 23 26 29 31 32 33 34 35
37 38 39 41 42 48 49 50 57 58 62 63 68 73 77 79 84
85 86 89 91 92 93 98 99 111 112 117 126 131 134 137
139 142 145 146 147 148 150 151 154 156 157 164 1
6 8 13 17 19 21 24 27 30 36 40 43 51 59 64 69 74 78
80 87 90 94 100 113 118 127 132 135 138 140 143 149
152 155 158 165 2 9 14 22 25 28 44 52 60 65 70 75 81
88 95 101 114 119 128 133 136 141 144 153 159 166
10 11 15 45 46 47 53 54 55 56 61 66 67 71 72 76 82
83 96 97 102 103 104 105 106 107 108 109 110 115 116
120 121 122 123 124 125 129 130 160 161 162 163 167
168 169 170 171 172 173 174 175 176 177 178 179 180
181 182 183];

(e) $\phi_T=$[0 1 2 4 6 7 9 10 14 15 17 19 20 22 24 27 29 34
39 40 44 45 46 48 51 54 62 65 69 70 71 73 74 76 78
79 81 82 85 86 87 89 90 91 92 96 97 101 102 103 107
108 109 111 113 115 118 121 124 126 128 130 131 133
135 138 139 140 142 143 146 147 149 152 154 158 159
160 3 5 8 11 16 18 21 23 25 28 30 35 41 47 49 52 55
63 66 72 75 77 80 83 88 93 98 104 110 112 114 116
119 122 125 127 129 132 134 136 141 144 148 150 153
155 161 12 26 31 36 42 50 53 56 64 67 84 94 99 105
117 120 123 137 145 151 156 162 13 32 37 43 57 68
95 100 106 157 163 33 38 58 59 60 61 164 165 166 167
168 169 170 171 172 173 174 175 176 177 178 179 180
181 182 183];

(f) $\phi_T=$[0 3 4 5 7 12 16 18 20 23 26 29 31 32 33 34 35
37 38 39 41 42 48 49 50 57 58 62 63 68 73 77 79 84
85 86 89 91 92 93 98 99 111 112 117 126 131 134 137
139 142 145 146 147 148 150 151 154 156 157 164 1
6 8 13 17 19 21 24 27 30 36 40 43 51 59 64 69 74 78
80 87 90 94 100 113 118 127 132 135 138 140 143 149
152 155 158 165 2 9 14 22 25 28 44 52 60 65 70 75 81
88 95 101 114 119 128 133 136 141 144 153 159 166
46 53 54 61 66 97 103 107 108 109 120 121 124 129
130 167 10 11 15 45 47 55 56 67 71 72 76 82 83 96 102
104 105 106 110 115 116 122 123 125 160 161 162 163
168 169 170 171 172 173 174 175 176 177 178 179 180
181 182 183];

(g) $\phi_T=$[0 1 2 4 6 7 9 10 14 15 17 19 20 22 24 27 29 34
39 40 44 45 46 48 51 54 62 65 69 70 71 73 74 76 78
79 81 82 85 86 87 89 90 91 92 96 97 101 102 103 107
108 109 111 113 115 118 121 124 126 128 130 131 133
135 138 139 140 142 143 146 147 149 152 154 158 159
160 3 5 8 11 16 18 21 23 25 28 30 35 41 47 49 52 55
63 66 72 75 77 80 83 88 93 98 104 110 112 114 116
119 122 125 127 129 132 134 136 141 144 148 150 153
155 161 12 26 31 36 42 50 53 56 64 67 84 94 99 105
117 120 123 137 145 151 156 162 13 32 37 43 57 68
95 100 106 157 163 33 38 58 164 59 60 61 165 166 167
168 169 170 171 172 173 174 175 176 177 178 179 180
181 182 183];

(h) $\phi_T=$[0 3 4 5 7 12 16 18 20 23 26 29 31 32 33 34 35
37 38 39 41 42 48 49 50 57 58 62 63 68 73 77 79 84
85 86 89 91 92 93 98 99 111 112 117 126 131 134 137
139 142 145 146 147 148 150 151 154 156 157 164 1
6 8 13 17 19 21 24 27 30 36 40 43 51 59 64 69 74 78
80 87 90 94 100 113 118 127 132 135 138 140 143 149
152 155 158 165 2 9 14 22 25 28 44 52 60 65 70 75 81
88 95 101 114 119 128 133 136 141 144 153 159 166
46 53 54 61 66 97 103 107 108 109 120 121 124 129
130 167 10 15 45 71 76 82 96 102 115 160 11 47 55
56 67 72 83 104 105 106 110 116 122 123 125 161 162
163 168 169 170 171 172 173 174 175 176 177 178 179
180 181 182 183];

(i) $\phi_T=$[0 1 2 4 6 7 9 10 14 15 17 19 20 22 24 27 29 34 39
40 44 45 46 48 51 54 62 65 69 70 71 73 74 76 78 79
81 82 85 86 87 89 90 91 92 96 97 101 102 103 107 108
109 111 113 115 118 121 124 126 128 130 131 133 135
138 139 140 142 143 146 147 149 152 154 158 159 160
3 5 8 11 16 18 21 23 25 28 30 35 41 47 49 52 55 63
66 72 75 77 80 83 88 93 98 104 110 112 114 116 119
122 125 127 129 132 134 136 141 144 148 150 153 155
161 12 26 31 36 42 50 53 56 64 67 84 94 99 105 117
120 123 137 145 151 156 162 13 32 37 43 57 68 95 100
106 157 163 33 38 58 164 59 165 60 61 166 167 168
169 170 171 172 173 174 175 176 177 178 179 180 181
182 183];

(j) $\phi_T=$[0 3 4 5 7 12 16 18 20 23 26 29 31 32 33 34 35 37
38 39 41 42 48 49 50 57 58 62 63 68 73 77 79 84 85
86 89 91 92 93 98 99 111 112 117 126 131 134 137 139
142 145 146 147 148 150 151 154 156 157 164 1 6 8
13 17 19 21 24 27 30 36 40 43 51 59 64 69 74 78 80
87 90 94 100 113 118 127 132 135 138 140 143 149
152 155 158 165 2 9 14 22 25 28 44 52 60 65 70 75 81
88 95 101 114 119 128 133 136 141 144 153 159 166
46 53 54 61 66 97 103 107 108 109 120 121 124 129
130 167 10 15 45 71 76 82 96 102 115 160 11 47 104
106 116 122 181 55 56 67 72 83 105 110 123 125 161
162 163 168 169 170 171 172 173 174 175 176 177 178
179 180 182 183];

(k) $\phi_T=$[0 1 2 4 6 7 9 10 14 15 17 19 20 22 24 27 29 34
39 40 44 45 46 48 51 54 62 65 69 70 71 73 74 76 78
79 81 82 85 86 87 89 90 91 92 96 97 101 102 103 107
108 109 111 113 115 118 121 124 126 128 130 131 133
135 138 139 140 142 143 146 147 149 152 154 158 159
160 3 5 8 11 16 18 21 23 25 28 30 35 41 47 49 52 55
63 66 72 75 77 80 83 88 93 98 104 110 112 114 116
119 122 125 127 129 132 134 136 141 144 148 150 153
155 161 12 26 31 36 42 50 53 56 64 67 84 94 99 105

117 120 123 137 145 151 156 <u>162</u> 13 32 33 38 43 58 59 100 157 165 37 60 95 166 <u>68 169</u> 57 106 <u>163 164</u> 61 <u>167 168 170 171 172 173 174 175 176 177 178 179 180 181 182 183</u>];

(l) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 <u>160</u> 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 <u>161</u> 12 26 31 36 42 50 53 56 64 67 84 94 99 105 117 <u>120</u> 123 137 145 151 156 <u>162</u> 13 32 33 37 38 43 57 58 59 60 61 68 95 100 106 1<u>57 163 164</u> 165 166 167 <u>168 169 170 171 172 173 174 175 176 177 178 179 180 181 182 183</u>];

(m) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 <u>160</u> 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 <u>161</u> 12 26 31 36 42 50 53 56 64 67 84 94 99 105 117 <u>120</u> 123 137 145 151 156 <u>162</u> 13 32 33 38 43 58 59 100 157 <u>165</u> 37 57 60 61 68 <u>95</u> 106 <u>163 164 166 167 168 169 170 171 172 173 174 175 176 177 178 179 180 181 182 183</u>];

(n) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 <u>160</u> 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 <u>161</u> 12 26 31 36 42 50 53 56 64 67 84 94 99 105 117 <u>120</u> 123 137 145 151 156 <u>162</u> 13 32 33 38 43 58 59 100 157 <u>165</u> 37 60 95 166 57 61 68 106 <u>163 164 167 168 169 170 171 172 173 174 175 176 177 178 179 180 181 182 183</u>];

(o) $\phi_T$=[0 1 2 4 6 7 9 10 14 15 17 19 20 22 24 27 29 34 39 40 44 45 46 48 51 54 62 65 69 70 71 73 74 76 78 79 81 82 85 86 87 89 90 91 92 96 97 101 102 103 107 108 109 111 113 115 118 121 124 126 128 130 131 133 135 138 139 140 142 143 146 147 149 152 154 158 159 <u>160</u> 3 5 8 11 16 18 21 23 25 28 30 35 41 47 49 52 55 63 66 72 75 77 80 83 88 93 98 104 110 112 114 116 119 122 125 127 129 132 134 136 141 144 148 150 153 155 <u>161</u> 12 26 31 36 42 50 53 56 64 67 84 94 99 105 117 <u>120</u> 123 137 145 151 156 <u>162</u> 13 32 33 38 43 58 59 100 157 <u>165</u> 37 60 95 <u>166 68 169</u> 57 61 106 <u>163 164 167 168 170 171 172 173 174 175 176 177 178 179 180 181 182 183</u>].

20. The wireless receiver of claim 15, wherein $K_{max}$ is 200 and the template interleaver uses an interleaving pattern comprising any one of the following interleaving patterns, wherein indices corresponding to cyclic redundancy check (CRC) bits are underlined:

(a) $\phi_T$=[0 1 2 3 9 10 12 16 20 21 23 26 27 29 31 34 36 38 39 40 43 44 45 47 52 56 58 60 63 66 69 71 72 73 74 75 77 78 79 81 82 88 89 90 97 98 102 103 108 113 117 119 124 125 126 129 131 132 133 138 139 151 152 157 166 171 174 177 179 182 185 186 187 188 190 191 194 196 197 <u>204</u> 4 11 13 17 22 24 28 30 32 35 37 41 46 48 53 57 59 61 64 67 70 76 80 83 91 99 104 109 114 118 120 127 130 134 140 153 158 167 172 175 178 180 183 189 192 195 198 <u>205</u> 5 14 18 25 33 42 49 54 62 65 68 84 92 100 105 110 115 121 128 135 141 154 159 168 173 176 181 184 193 199 <u>206</u> 8 15 86 93 94 101 106 137 143 147 148 149 160 <u>161</u> 164 169 170 <u>207</u> 6 19 50 55 85 111 116 122 136 142 155 <u>200</u> 87 9<u>5 107</u> 144 150 162 165 <u>208</u> 51 156 <u>214</u> 7 146 <u>221</u> 163 <u>219</u> 96 <u>210</u> 145 <u>202 212 112 211 216 223</u> 123 <u>201 203 209 213 215 217 218 220 222</u>];

(b) $\phi_T$=[0 1 2 3 9 10 12 16 20 21 23 26 27 29 31 34 36 38 39 40 43 44 45 47 52 56 58 60 63 66 69 71 72 73 74 75 77 78 79 81 82 88 89 90 97 98 102 103 108 113 117 119 124 125 126 129 131 132 133 138 139 151 152 157 166 171 174 177 179 182 185 186 187 188 190 191 194 196 197 <u>204</u> 4 11 13 17 22 24 28 30 32 35 37 41 46 48 53 57 59 <u>61</u> 64 67 70 76 80 83 91 99 104 109 114 118 120 127 130 134 140 153 158 167 172 175 178 180 183 189 192 195 198 <u>205</u> 5 14 18 25 33 42 49 54 62 65 68 84 92 100 105 110 115 121 128 135 141 154 159 168 173 176 181 184 193 199 <u>206</u> 6 7 8 15 19 50 51 55 85 86 87 93 94 95 96 101 106 <u>107</u> 111 112 116 122 123 136 137 142 143 144 145 146 147 148 149 150 155 156 160 161 162 163 164 165 169 170 <u>200 201 202 203 207 208 209 210 211 212 213 214 215 216 217 218 219 220 221 222 223</u>];

(c) $\phi_T$=[0 1 2 3 9 10 12 16 20 21 23 26 27 29 31 34 36 38 39 40 43 44 45 47 52 56 58 60 63 66 69 71 72 73 74 75 77 78 79 81 82 88 89 90 97 98 102 103 108 113 117 119 124 125 126 129 131 132 133 138 139 151 152 157 166 171 174 177 179 182 185 186 187 188 190 191 194 196 197 <u>204</u> 4 11 13 17 22 24 28 30 32 35 37 41 46 48 53 57 59 <u>61</u> 64 67 70 76 80 83 91 99 104 109 114 118 120 127 130 134 140 153 158 167 172 175 178 180 183 189 192 195 198 <u>205</u> 5 14 18 25 33 42 49 54 62 65 68 84 92 100 105 110 115 121 128 135 141 154 159 168 173 176 181 184 193 199 <u>206</u> 8 15 86 93 94 101 106 137 143 147 148 149 160 <u>161</u> 164 169 170 <u>207</u> 6 7 19 50 51 55 85 87 95 96 107 111 112 116 12<u>2 123</u> 136 142 144 145 146 150 155 156 162 163 165 <u>200 201 202 203 208 209 210 211 212 213 214 215 216 217 218 219 220 221 222 223</u>];

(d) $\phi_T$=[0 1 2 3 9 10 12 16 20 21 23 26 27 29 31 34 36 38 39 40 43 44 45 47 52 56 58 60 63 66 69 71 72 73 74 75 77 78 79 81 82 88 89 90 97 98 102 103 108 113 117 119 124 125 126 129 131 132 133 138 139 151 152 157 166 171 174 177 179 182 185 186 187 188 190 191 194 196 197 <u>204</u> 4 11 13 17 22 24 28 30 32 35 37 41 46 48 53 57 <u>59 61</u> 64 67 70 76 80 83 91 99 104 109 114 118 120 127 130 134 140 153 158 167 172 175 178 180 183 189 192 195 198 <u>205</u> 5 14 18 25 33 42 49 54 62 65 68 84 92 100 105 110 115 121 128 135 141 154 159 168 173 176 181 184 193 199 <u>206</u> 8 15 86 93 94 101 106 137 143 147 148 149 160 <u>161</u> 164 169 170 <u>207</u> 6 19 50 55 85 111 116 122 136 142 155 <u>200</u> 7 51 <u>87</u> 95 96 107 112 123 144 145 146 150 156 1<u>62</u> 163 165 <u>201 202 203 208 209 210 211 212 213 214 215 216 217 218 219 220 221 222 223</u>];

(e) $\phi_T$=[0 2 3 5 6 8 11 12 13 16 19 20 22 24 28 32 33 35 37 38 39 40 41 42 44 46 47 49 50 54 55 57 59 60 62 64 67 69 74 79 80 84 85 86 88 91 94 102 105 109 110 111 113 114 116 118 119 121 122 125 126 127 129 130 131 132 136 137 141 142 143 147 148 149 151 153 155 158 161 164 166 168 170 171 173 175 178 179 180 182 183 186 187 189 192 194 198 199 <u>200</u> 1 4 7 9 14 17 21 23 25 29 34 36 43 45 48 51 56 <u>58</u> 61 63 65 68 70 75 81 87 89 92 95 103 106 112 115 117 120 123 128

133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 31 53 72 77 83 97 108
135 140 146 197 203 73 78 98 204 99 205 100 206 101
207 208 209 210 211 212 213 214 215 216 217 218 219
220 221 222 223];

(f) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 31 53 72 73 77 78 83
97 98 99 100 101 108 135 140 146 197 203 204 205
206 207 208 209 210 211 212 213 214 215 216 217 218
219 220 221 222 223];

(g) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 31 53 72 77 83 97 108
135 140 146 197 203 73 78 98 99 100 101 204 205 206
207 208 209 210 211 212 213 214 215 216 217 218 219
220 221 222 223];

(h) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 31 53 72 77 83 97 108
135 140 146 197 203 73 78 98 204 99 100 101 205 206
207 208 209 210 211 212 213 214 215 216 217 218 219
220 221 222 223];

(i) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 31 53 72 77 83 97 108
135 140 146 197 203 73 78 98 204 99 205 100 101 206
207 208 209 210 211 212 213 214 215 216 217 218 219
220 221 222 223];

(j) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 53 72 73 78 83 98 99
140 197 205 31 77 100 135 206 108 209 97 146 203
204 101 207 208 210 211 212 213 214 215 216 217 218
219 220 221 222 223];

(k) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 31 53 72 73 77 78 83
97 98 99 100 101 108 135 140 146 197 203 204 205
206 207 208 209 210 211 212 213 214 215 216 217 218
219 220 221 222 223];

(l) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 53 72 73 78 83 98 99
140 197 205 31 77 97 100 101 108 135 146 203 204
206 207 208 209 210 211 212 213 214 215 216 217 218
219 220 221 222 223];

(m) $\phi_T$=[0 2 3 5 6 8 11 12 13 16 19 20 22 24 28 32 33 35
37 38 39 40 41 42 44 46 47 49 50 54 55 57 59 60 62
64 67 69 74 79 80 84 85 86 88 91 94 102 105 109 110
111 113 114 116 118 119 121 122 125 126 127 129 130
131 132 136 137 141 142 143 147 148 149 151 153 155
158 161 164 166 168 170 171 173 175 178 179 180 182
183 186 187 189 192 194 198 199 200 1 4 7 9 14 17
21 23 25 29 34 36 43 45 48 51 56 58 61 63 65 68 70
75 81 87 89 92 95 103 106 112 115 117 120 123 128
133 138 144 150 152 154 156 159 162 165 167 169 172
174 176 181 184 188 190 193 195 201 10 15 18 26 30
52 66 71 76 82 90 93 96 104 107 124 134 139 145 157
160 163 177 185 191 196 202 27 53 72 73 78 83 98 99

140 197 205 31 77 100 135 206 97 101 108 146 203 204 207 208 209 210 211 212 213 214 215 216 217 218 219 220 221 222 223];

(n) φ<sub>7</sub>=[0 2 3 5 6 8 11 12 13 16 19 20 22 24 28 32 33 35 37 38 39 40 41 42 44 46 47 49 50 54 55 57 59 60 62 64 67 69 74 79 80 84 85 86 88 91 94 102 105 109 110 111 113 114 116 118 119 121 122 125 126 127 129 130 131 132 136 137 141 142 143 147 148 149 151 153 155 158 161 164 166 168 170 171 173 175 178 179 180 182 183 186 187 189 192 194 198 199 200 1 4 7 9 14 17 21 23 25 29 34 36 43 45 48 51 56 58 61 63 65 68 70 75 81 87 89 92 95 103 106 112 115 117 120 123 128 133 138 144 150 152 154 156 159 162 165 167 169 172 174 176 181 184 188 190 193 195 201 10 15 18 26 30 52 66 71 76 82 90 93 96 104 107 124 134 139 145 157 160 163 177 185 191 196 202 27 53 72 73 78 83 98 99 140 197 205 31 77 100 135 206 108 209 97 101 146 203 204 207 208 210 211 212 213 214 215 216 217 218 219 220 221 222 223];

(o) φ<sub>7</sub>=[0 1 4 5 9 11 12 17 18 19 21 24 26 28 31 34 41 42 47 52 54 57 63 64 68 69 70 71 72 73 74 76 78 79 83 85 89 90 97 98 99 102 103 104 106 108 109 110 114 116 118 120 121 122 123 125 128 129 132 135 137 141 142 144 148 152 156 158 160 161 162 163 164 166 171 172 174 177 178 179 180 181 187 188 189 191 192 194 196 197 212 2 7 8 13 20 25 27 32 35 36 38 45 46 50 51 58 60 62 65 84 88 93 95 101 107 111 112 113 115 119 126 127 131 136 139 145 146 151 159 168 169 173 175 184 185 186 193 199 215 3 10 14 16 23 29 30 37 40 43 55 56 67 75 77 81 100 117 124 147 150 167 176 182 190 198 204 33 44 87 91 94 134 153 154 155 157 165 207 53 61 66 80 138 195 211 82 96 105 140 143 170 218 6 39 86 92 208 15 22 183 200 49 130 210 149 203 48 202 59 201 209 214 133 205 206 213 216];

(p) φ<sub>7</sub>=[0 1 4 5 9 11 12 17 18 19 21 24 26 28 31 34 41 42 47 52 54 57 63 64 68 69 70 71 72 73 74 76 78 79 83 85 89 90 97 98 99 102 103 104 106 108 109 110 114 116 118 120 121 122 123 125 128 129 132 135 137 141 142 144 148 152 156 158 160 161 162 163 164 166 171 172 174 177 178 179 180 181 187 188 189 191 192 194 196 197 212 2 7 8 13 20 25 27 32 35 36 38 45 46 50 51 58 60 62 65 84 88 93 95 101 107 111 112 113 115 119 126 127 131 136 139 145 146 151 159 168 169 173 175 184 185 186 193 199 215 3 10 14 16 23 29 30 37 40 43 55 56 67 75 77 81 100 117 124 147 150 167 176 182 190 198 204 6 15 22 33 39 44 48 49 53 59 61 66 80 82 86 87 91 92 94 96 105 130 133 134 138 140 143 149 153 154 155 157 165 170 183 195 200 201 202 203 205 206 207 208 209 210 211 213 214 216 217 218];

(q) φ<sub>7</sub>=[0 1 4 5 9 11 12 17 18 19 21 24 26 28 31 34 41 42 47 52 54 57 63 64 68 69 70 71 72 73 74 76 78 79 83 85 89 90 97 98 99 102 103 104 106 108 109 110 114 116 118 120 121 122 123 125 128 129 132 135 137 141 142 144 148 152 156 158 160 161 162 163 164 166 171 172 174 177 178 179 180 181 187 188 189 191 192 194 196 197 212 2 7 8 13 20 25 27 32 35 36 38 45 46 50 51 58 60 62 65 84 88 93 95 101 107 111 112 113 115 119 126 127 131 136 139 145 146 151 159 168 169 173 175 184 185 186 193 199 215 3 10 14 16 23 29 30 37 40 43 55 56 67 75 77 81 100 117 124 147 150 167 176 182 190 198 204 33 44 87 91 94 134 153 154 155 157 165 207 6 15 22 39 48 49 53 59 61 66 80 82 86 92 96 105 130 133 138 140 143 149 170 183 195 200 201 202 203 205 206 208 209 210 211 213 214 216 217];

(r) φ<sub>7</sub>=[0 1 4 5 9 11 12 17 18 19 21 24 26 28 31 34 41 42 47 52 54 57 63 64 68 69 70 71 72 73 74 76 78 79 83 85 89 90 97 98 99 102 103 104 106 108 109 110 114 116 118 120 121 122 123 125 128 129 132 135 137 141 142 144 148 152 156 158 160 161 162 163 164 166 171 172 174 177 178 179 180 181 187 188 189 191 192 194 196 197 212 2 7 8 13 20 25 27 32 35 36 38 45 46 50 51 58 60 62 65 84 88 93 95 101 107 111 112 113 115 119 126 127 131 136 139 145 146 151 159 168 169 173 175 184 185 186 193 199 215 3 10 14 16 23 29 30 37 40 43 55 56 67 75 77 81 100 117 124 147 150 167 176 182 190 198 204 33 44 87 91 94 134 153 154 155 157 165 207 53 61 66 80 138 195 211 6 15 22 39 48 49 59 82 86 92 96 105 130 133 140 143 149 170 183 200 201 202 203 205 206 208 209 210 213 214 216 217 218].

21. The method of claim 14, wherein the template deinterleaving is based on a predetermined interleaving mapping function comprising a template interleaver for a largest value of K, referred to as $K_{max}$, and the template interleaver comprises a low-index bit mapper wherein:

the K data bits are loaded at the low-index positions of the input of the template interleaver in reverse, where $u=[u_0, u_1, \ldots, u_{K-1}]$ and the input of the template interleaver, denoted by $v=[v_0, v_1, \ldots, v_{K_{max}-1}]$, is given by the following bit mapping:

$$v_i = \begin{cases} u_{K-1-i} & 0 \le i < K \\ p_{i-K_{max}} & i \ge K_{max} \\ \text{NULL} & \text{otherwise} \end{cases}.$$

22. The wireless receiver of claim 21, wherein $K_{max}$ is 53 and the template interleaver uses an interleaving pattern comprising any one of the following interleaving patterns, wherein indices corresponding to cyclic redundancy check (CRC) bits are underlined:

(a) φ<sub>7</sub>=[0 1 4 6 7 8 17 21 22 24 26 28 32 36 37 38 41 42 44 47 48 51 58 5 13 14 15 19 20 27 30 31 33 40 68 2 11 25 34 35 43 45 61 9 16 18 52 53 3 12 54 10 23 64 39 65 50 62 29 55 69 71 49 56 57 67 46 59 60 63 66 70];

(b) φ<sub>7</sub>=[51 48 47 44 42 41 38 37 36 32 28 26 24 22 21 17 8 7 6 4 1 0 58 40 33 31 30 27 20 19 15 14 13 5 68 45 43 35 34 25 11 2 61 52 18 16 9 53 12 3 54 23 10 64 39 65 50 62 29 55 69 71 49 56 67 57 46 59 66 60 70 63];

(c) φ<sub>7</sub>=[0 1 4 6 7 8 17 21 22 24 26 28 32 36 37 38 41 42 44 47 48 51 58 5 13 14 15 19 20 27 30 31 33 40 68 2 11 25 34 35 43 45 61 3 9 10 12 16 18 23 29 39 46 49 50 52 53 54 55 56 57 59 60 62 63 64 65 66 67 69 70 71];

(d) φ<sub>7</sub>=[51 48 47 44 42 41 38 37 36 32 28 26 24 22 21 17 8 7 6 4 1 0 58 40 33 31 30 27 20 19 15 14 13 5 68 45 43 35 34 25 11 2 61 3 9 10 12 16 18 23 29 39 46 49 50 52 53 54 55 56 57 59 60 62 63 64 65 66 67 69 70 71];

(e) φ<sub>7</sub>=[0 1 4 6 7 8 17 21 22 24 26 28 32 36 37 38 41 42 44 47 48 51 58 5 13 14 15 19 20 27 30 31 33 40 68 2 11 25 34 35 43 45 61 9 16 18 52 53 3 10 12 23 29 39 46 49 50 54 55 56 57 59 60 62 63 64 65 66 67 69 70 71];

(f) φ<sub>7</sub>=[51 48 47 44 42 41 38 37 36 32 28 26 24 22 21 17 8 7 6 4 1 0 58 40 33 31 30 27 20 19 15 14 13 5 68 45 43 35 34 25 11 2 61 52 18 16 9 53 3 10 12 23 29 39 46 49 50 54 55 56 57 59 60 62 63 64 65 66 67 69 70 71];

(g) φ<sub>7</sub>=[0 1 4 6 7 8 17 21 22 24 26 28 32 36 37 38 41 42 44 47 48 51 58 5 13 14 15 19 20 27 30 31 33 40 68 2

11 25 34 35 43 45 <u>61</u> 9 16 18 52 <u>53</u> 3 12 <u>54</u> 10 23 29 39 46 49 50 <u>55</u> <u>56</u> <u>57</u> <u>59</u> <u>60</u> <u>62</u> <u>63</u> <u>64</u> <u>65</u> <u>66</u> <u>67</u> <u>69</u> <u>70</u> <u>71</u>];

(h) $\phi_T$=[51 48 47 44 42 41 38 37 36 32 28 26 24 22 21 17 8 7 6 4 1 0 <u>58</u> 40 33 31 30 27 20 19 15 14 13 5 <u>68</u> 45 43 35 34 25 11 2 <u>61</u> 52 18 16 9 <u>53</u> 12 3 <u>54</u> 10 <u>23</u> 29 39 46 49 50 <u>55</u> <u>56</u> <u>57</u> <u>59</u> <u>60</u> <u>62</u> <u>63</u> <u>64</u> <u>65</u> <u>66</u> <u>67</u> <u>69</u> <u>70</u> <u>71</u>].

23. The wireless receiver of claim 21, wherein $K_{max}$ is 72 and the template interleaver uses an interleaving pattern comprising any one of the following interleaving patterns, wherein indices corresponding to cyclic redundancy check (CRC) bits are underlined:

(a) $\phi_T$=[0 5 6 7 8 13 14 15 19 20 22 24 26 27 28 30 31 33 37 40 41 48 53 54 57 58 60 63 67 68 <u>87</u> 1 4 17 21 32 36 38 42 44 47 51 55 59 62 64 66 <u>77</u> <u>2</u> 11 25 34 35 43 45 56 71 <u>80</u> 3 12 16 52 70 <u>73</u> 10 <u>18</u> 39 <u>84</u> 9 61 <u>72</u> 50 <u>81</u> 23 <u>83</u> <u>49</u> <u>76</u> 29 <u>88</u> 69 <u>74</u> <u>75</u> 46 <u>82</u> <u>85</u> 65 <u>78</u> <u>79</u> <u>86</u> <u>89</u> <u>90</u>];

(b) $\phi_T$=[68 67 63 60 58 57 54 53 48 41 40 37 33 31 30 28 27 26 24 22 20 19 15 14 13 8 7 6 5 0 <u>87</u> 66 64 62 59 55 51 47 44 42 38 36 32 21 17 4 1 <u>77</u> <u>71</u> 56 45 43 35 34 25 11 2 <u>80</u> 70 52 16 12 3 <u>73</u> 39 <u>18</u> 10 <u>84</u> 61 9 <u>72</u> 50 <u>81</u> 23 <u>83</u> <u>49</u> <u>76</u> 29 <u>88</u> 69 <u>74</u> <u>75</u> 46 <u>82</u> <u>85</u> 65 <u>86</u> <u>79</u> <u>78</u> <u>89</u> <u>90</u>];

(c) $\phi_T$=[0 5 6 7 8 13 14 15 19 20 22 24 26 27 28 30 31 33 37 40 41 48 53 54 57 58 60 63 67 68 <u>87</u> 1 4 17 21 32 36 38 42 44 47 51 55 59 62 64 66 <u>77</u> <u>2</u> 11 25 34 35 43 45 56 71 <u>80</u> 3 9 10 12 16 18 23 29 <u>39</u> 46 49 50 52 61 65 69 70 <u>72</u> <u>73</u> <u>74</u> <u>75</u> <u>76</u> <u>78</u> <u>79</u> <u>81</u> <u>82</u> <u>83</u> <u>84</u> <u>85</u> 86 <u>88</u> <u>89</u> <u>90</u>];

(d) $\phi_T$=[68 67 63 60 58 57 54 53 48 41 40 37 33 31 30 28 27 26 24 22 20 19 15 14 13 8 7 6 5 0 <u>87</u> 66 64 62 59 55 51 47 44 42 38 36 32 21 17 4 1 <u>77</u> <u>71</u> 56 45 43 35 34 25 11 2 <u>80</u> 3 9 10 12 16 18 23 <u>29</u> 39 46 49 50 52 61 65 69 70 <u>72</u> <u>73</u> <u>74</u> <u>75</u> <u>76</u> <u>78</u> <u>79</u> <u>81</u> <u>82</u> <u>83</u> <u>84</u> <u>85</u> <u>86</u> <u>88</u> <u>89</u> <u>90</u>];

(e) $\phi_T$=[0 5 6 7 8 13 14 15 19 20 22 24 26 27 28 30 31 33 37 40 41 48 53 54 57 58 60 63 67 68 <u>87</u> 1 4 17 21 32 36 38 42 44 47 51 55 59 62 64 66 <u>77</u> <u>2</u> 11 25 34 35 43 45 56 71 <u>80</u> 3 12 16 52 70 73 9 <u>10</u> 18 23 29 39 46 49 50 61 <u>69</u> <u>72</u> <u>74</u> <u>75</u> <u>76</u> <u>78</u> <u>79</u> <u>81</u> <u>82</u> <u>83</u> <u>84</u> <u>85</u> <u>86</u> <u>88</u> <u>89</u> <u>90</u>];

(f) $\phi_T$=[68 67 63 60 58 57 54 53 48 41 40 37 33 31 30 28 27 26 24 22 20 19 15 14 13 8 7 6 5 0 <u>87</u> 66 64 62 59 55 51 47 44 42 38 36 32 21 17 4 1 <u>77</u> <u>71</u> 56 45 43 35 34 25 11 2 <u>80</u> 70 52 16 12 3 73 9 <u>10</u> 18 23 29 39 46 49 50 61 65 <u>69</u> <u>72</u> <u>74</u> <u>75</u> <u>76</u> <u>78</u> <u>79</u> <u>81</u> <u>82</u> <u>83</u> <u>84</u> <u>85</u> <u>86</u> <u>88</u> <u>89</u> <u>90</u>];

(g) $\phi_T$=[0 5 6 7 8 13 14 15 19 20 22 24 26 27 28 30 31 33 37 40 41 48 53 54 57 58 60 63 67 68 <u>87</u> 1 4 17 21 32 36 38 42 44 47 51 55 59 62 64 66 <u>77</u> <u>2</u> 11 25 34 35 43 45 56 71 <u>80</u> 3 12 16 52 70 <u>73</u> 10 <u>18</u> 39 <u>84</u> 9 23 29 46 49 50 61 <u>65</u> 69 <u>72</u> <u>74</u> <u>75</u> <u>76</u> <u>78</u> <u>79</u> <u>81</u> <u>82</u> <u>83</u> <u>85</u> <u>86</u> <u>88</u> <u>89</u> <u>90</u>];

(h) $\phi_T$=[68 67 63 60 58 57 54 53 48 41 40 37 33 31 30 28 27 26 24 22 20 19 15 14 13 8 7 6 5 0 <u>87</u> 66 64 62 59 55 51 47 44 42 38 36 32 21 17 4 1 <u>77</u> <u>71</u> 56 45 43 35 34 25 11 2 <u>80</u> 70 52 16 12 3 <u>73</u> 39 <u>18</u> 10 <u>84</u> 9 23 29 46 49 50 61 65 69 <u>72</u> <u>74</u> <u>75</u> <u>76</u> <u>78</u> <u>79</u> <u>81</u> <u>82</u> <u>83</u> <u>85</u> <u>86</u> <u>88</u> <u>89</u> <u>90</u>].

24. The wireless receiver of claim 21, wherein $K_{max}$ is 140 and the template interleaver uses an interleaving pattern comprising any one of the following interleaving patterns, wherein indices corresponding to cyclic redundancy check (CRC) bits are underlined:

(a) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 <u>144</u> 1 4 7 10 16 19 21 24 27 32 41 46 59 65 69 72 79 <u>81</u> 85 90 95 100 108 116 119 123 129 132 135 138 <u>145</u> 0 6 15 18 23 26 31 40 45 58 64 71 78 84 89 94 99 <u>107</u> 115 131 134 137 <u>146</u> 29 30 35 38 39 50 51 52 56 62 93 98 105 106 113 <u>147</u> 44 57 63 77 83 88 114 <u>140</u> 37 43 53 55 112 <u>161</u> 34 36 103 150 49 <u>159</u> 87 <u>163</u> <u>76</u> <u>153</u> 92 <u>143</u> 54 <u>151</u> <u>158</u> <u>160</u> <u>162</u> 104 <u>141</u> <u>142</u> <u>148</u> <u>149</u> <u>152</u> <u>154</u> <u>155</u> <u>156</u> <u>157</u>];

(b) $\phi_T$=[139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 <u>144</u> 138 135 132 129 123 119 116 108 100 95 90 85 81 <u>79</u> 72 69 65 59 46 41 32 27 24 21 19 16 10 7 4 1 <u>145</u> 137 134 131 115 107 99 94 89 84 78 71 64 58 45 <u>40</u> 31 26 23 18 15 6 0 <u>146</u> 113 106 105 98 93 62 56 52 51 50 39 38 35 30 29 <u>147</u> 114 88 83 77 63 57 44 <u>140</u> 112 55 53 43 37 <u>161</u> 103 36 34 150 49 <u>159</u> 87 <u>163</u> <u>76</u> <u>153</u> 92 <u>143</u> 54 <u>151</u> <u>158</u> <u>160</u> <u>162</u> 104 <u>141</u> <u>142</u> <u>148</u> <u>149</u> <u>152</u> <u>154</u> <u>155</u> <u>156</u> <u>157</u>];

(c) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 <u>144</u> 1 4 7 10 16 19 21 24 27 32 41 46 59 65 69 72 79 <u>81</u> 85 90 95 100 108 116 119 123 129 132 135 138 <u>145</u> 0 6 15 18 23 26 31 40 45 58 64 71 78 84 89 94 99 <u>107</u> 115 131 134 137 <u>146</u> 29 30 35 35 36 37 38 39 43 44 49 50 51 52 53 54 <u>55</u> 56 57 62 63 76 77 83 87 88 92 93 98 103 104 105 106 112 113 114 <u>140</u> <u>141</u> <u>142</u> <u>143</u> <u>147</u> <u>148</u> <u>149</u> <u>150</u> <u>151</u> <u>152</u> <u>153</u> <u>154</u> <u>155</u> <u>156</u> <u>157</u> <u>158</u> <u>159</u> <u>160</u> <u>161</u> <u>162</u>];

(d) $\phi_T$=[139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 <u>144</u> 138 135 132 129 123 119 116 108 100 95 90 85 81 <u>79</u> 72 69 65 59 46 41 32 27 24 21 19 16 10 7 4 1 <u>145</u> 137 134 131 115 107 99 94 89 84 78 71 64 58 45 <u>40</u> 31 26 23 18 15 6 0 <u>146</u> 114 113 112 106 105 104 103 98 93 92 88 87 83 <u>77</u> <u>76</u> 63 62 57 56 55 54 52 51 50 49 44 43 39 38 37 36 35 34 30 29 <u>140</u> <u>141</u> <u>142</u> <u>143</u> <u>147</u> <u>148</u> <u>149</u> <u>150</u> <u>151</u> <u>152</u> <u>153</u> <u>154</u> <u>155</u> <u>156</u> <u>157</u> <u>158</u> <u>159</u> <u>160</u> <u>161</u> <u>162</u> <u>163</u>];

(e) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 <u>144</u> 1 4 7 10 16 19 21 24 27 32 41 46 59 65 69 72 79 <u>81</u> 85 90 95 100 108 116 119 123 129 132 135 138 <u>145</u> 0 6 15 18 23 26 31 40 45 58 64 71 78 84 89 94 99 <u>107</u> 115 131 134 137 <u>146</u> 29 30 35 38 39 50 51 52 56 62 93 98 105 106 113 <u>147</u> 34 36 37 43 44 49 53 54 55 57 63 76 77 83 87 88 92 <u>103</u> 104 112 114 <u>140</u> <u>141</u> <u>142</u> <u>143</u> <u>148</u> <u>149</u> <u>150</u> <u>151</u> <u>152</u> <u>153</u> <u>154</u> <u>155</u> <u>156</u> <u>157</u> <u>158</u> <u>159</u> <u>160</u> <u>161</u> <u>162</u> <u>163</u>];

(f) $\phi_T$=[139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 <u>144</u> 138 135 132 129 123 119 116 108 100 95 90 85 81 <u>79</u> 72 69 65 59 46 41 32 27 24 21 19 16 10 7 4 1 <u>145</u> 137 134 131 115 107 99 94 89 84 78 71 64 58 45 <u>40</u> 31 26 23 18 15 6 0 <u>146</u> 113 106 105 98 93 62 56 52 51 50 39 38 35 30 29 <u>147</u> 114 112 104 103 92 88 87 83 77 76 63 57 55 54 <u>53</u> <u>49</u> 44 43 37 36 34 <u>140</u> <u>141</u> <u>142</u> <u>143</u> <u>148</u> <u>149</u> <u>150</u> <u>151</u> <u>152</u> <u>153</u> <u>154</u> <u>155</u> <u>156</u> <u>157</u> <u>158</u> <u>159</u> <u>160</u> <u>161</u> <u>162</u>];

(g) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 144 1 4 7 10 16 19 21 24 27 32 41 46 59 65 69 72 79 81 85 90 95 100 108 116 119 123 129 132 135 138 145 0 6 15 18 23 26 31 40 45 58 64 71 78 84 89 94 99 107 115 131 134 137 146 29 30 35 38 39 50 51 52 56 62 93 98 105 106 113 147 44 57 63 77 83 88 114 140 34 36 37 43 49 53 54 55 76 87 92 103 104 112 141 142 143 148 149 150 151 152 153 154 155 156 157 158 159 160 161 162 163];

(h) $\phi_T$=[139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 144 138 135 132 129 123 119 116 108 100 95 90 85 81 79 72 69 65 59 46 41 32 27 24 21 19 16 10 7 4 1 145 137 134 131 115 107 99 94 89 84 78 71 64 58 45 40 31 26 23 18 15 6 0 146 113 106 105 98 93 62 56 52 51 50 39 38 35 30 29 147 114 88 83 77 63 57 44 140 112 104 103 92 87 76 55 54 53 49 43 37 36 34 141 142 143 148 149 150 151 152 153 154 155 156 157 158 159 160 161 162 163];

(i) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 53 59 64 91 102 116 122 127 143 101 121 126 144 100 145 99 146 98 147 148 149 150 151 152 153 154 155 156 157 158 159 160 161 162 163];

(j) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 122 116 102 91 64 59 53 2 143 126 121 101 144 100 145 99 146 98 147 148 149 150 151 152 153 154 155 156 157 158 159 160 161 162 163];

(k) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 53 59 64 91 98 99 100 101 102 116 121 122 126 127 143 144 145 146 147 148 149 150 151 152 153 154 155 156 157 158 159 160 161 162 163];

(l) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 2 53 59 64 91 98 99 100 101 102 116 121 122 126 127 143 144 145 146 147 148 149 150 151 152 153 154 155 156 157 158 159 160 161 162 163];

(m) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 53 59 64 91 102 116 122 127 143 98 99 100 101 121 126 144 145 146 147 148 149 150 151 152 153 154 155 156 157 158 159 160 161 162 163];

(n) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 122 116 102 91 64 59 53 2 143 98 99 100 101 121 126 144 145 146 147 148 149 150 151 152 153 154 155 156 157 158 159 160 161 162];

(o) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 53 59 64 91 102 116 122 127 143 101 121 126 144 98 99 100 145 146 147 148 149 150 151 152 153 154 155 156 157 158 159 160 161 162 163];

(p) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 122 116 102 91 64 59 53 2 143 126 121 101 144 98 99 100 145 146 147 148 149 150 151 152 153 154 155 156 157 158 159 160 161 162];

(q) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 53 59 64 91 102 116 122 127 143 101 121 126 144 100 145 98 99 146 147 148 149 150 151 152 153 154 155 156 157 158 159 160 161 162 163];

(r) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 122 116 102 91 64 59 53 2 143 126 121 101 144 100 145 98 99 146 147 148 149 150 151 152 153 154 155 156 157 158 159 160 161 162 163];

(s) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 59 100 101 116 121 126 127 145 64 99 122 146 91 149 53 102 143 144 98 147 148 150 151 152 153 154 155 156 157 158 159 160 161 162 163];

(t) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 126 121 116 101 100 59 2 145 122 99 64 146 91 149 102 53 143 144 98 147 148 150 151 152 153 154 155 156 157 158 159 160 161 162 163];

(u) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 53 59 64 91 98 99 100 101 102 116 121 122 126 127 143 144 145 146 147 148 149 150 151 152 153 154 155 156 157 158 159 160 161 162 163];

(v) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 2 53 59 64 91 98 99 100 101 102 116 121 122 126 127 143 144 145 146 147 148 149 150 151 152 153 154 155 156 157 158 159 160 161 162];

(w) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 59 100 101 116 121 126 127 145 53 64 91 98 99 102 122 143 144 146 147 148 149 150 151 152 153 154 155 156 157 158 159 160 161 162 163];

(x) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 126 121 116 101 100 59 2 145 53 64 91 98 99 102 122 143 144 146 147 148 149 150 151 152 153 154 155 156 157 158 159 160 161 162];

(y) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 59 100 101 116 121 126 127 145 64 99 122 146 53 91 98 102 143 144 147 148 149 150 151 152 153 154 155 156 157 158 159 160 161 162 163];

(z) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 126 121 116 101 100 59 2 145 122 99 64 146 53 91 98 102 143 144 147 148 149 150 151 152 153 154 155 156 157 158 159 160 161 162];

(aa) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 4 6 9 11 15 18 23 25 27 30 32 34 37 40 43 45 47 49 55 61 66 71 76 79 82 84 87 93 96 104 107 110 112 118 124 129 131 134 136 138 141 3 8 14 22 36 39 42 54 60 65 75 92 95 103 106 109 117 123 128 133 142 2 59 100 101 116 121 126 127 145 64 99 122 146 91 149 53 98 102 143 144 147 148 150 151 152 153 154 155 156 157 158 159 160 161 162 163];

(bb) $\phi_T$=[139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 140 138 136 134 131 129 124 118 112 110 107 104 96 93 87 84 82 79 76 71 66 61 55 49 47 45 43 40 37 34 32 30 27 25 23 18 15 11 9 6 4 141 133 128 123 117 109 106 103 95 92 75 65 60 54 42 39 36 22 14 8 3 142 127 126 121 116 101 100 59 2 145 122 99 64 146 91 149 53 98 102 143 144 147 148 150 151 152 153 154 155 156 157 158 159 160 161 162 163];

(cc) $\phi_T$=[0 5 6 7 8 13 14 15 19 20 22 24 26 27 28 30 31 33 37 40 41 48 53 54 57 58 60 63 67 68 72 73 77 80 81 83 84 86 87 88 91 92 97 98 100 101 102 104 106 111 114 115 116 120 121 123 127 128 129 134 135 137 139 155 1 2 3 9 10 17 21 23 25 32 35 36 43 49 52 55 62 75 76 78 79 82 93 95 96 99 109 110 118 122 124 130 132 136 144 12 18 34 38 39 42 44 45 46 65 74 89 90 105 108 112 131 147 4 47 50 64 66 85 103 113 126 146 51 59 107 125 145 11 70 71 152 61 119 133 138 151 56 117 148 149 16 141 94 140 69 153 154 29 142 143 150 156 157 158];

(dd) $\phi_T$=[139 137 135 134 129 128 127 123 121 120 116 115 114 111 106 104 102 101 100 98 97 92 91 88 87 86 84 83 81 80 77 73 72 68 67 63 60 58 57 54 53 48 41 40 37 33 31 30 28 27 26 24 22 20 19 15 14 13 8 7 6 5 0 155 136 132 130 124 122 118 110 109 99 96 95 93 82 79 78 76 75 62 55 52 49 43 36 35 32 25 23 21 17 10 9 3 2 1 144 131 112 108 105 90 89 74 65 46 45 44 42 39 38 34 18 12 147 126 113 103 85 66 64 50 47 4 146 125 107 59 51 145 71 70 11 152 138 133 119 61 151 117 56 148 149 16 141 94 140 69 153 154 29 143 142 150 156 157 158];

(ee) $\phi_T$=[0 5 6 7 8 13 14 15 19 20 22 24 26 27 28 30 31 33 37 40 41 48 53 54 57 58 60 63 67 68 72 73 77 80 81 83 84 86 87 88 91 92 97 98 100 101 102 104 106 111 114 115 116 120 121 123 127 128 129 134 135 137 139 <u>155</u> 1 2 3 9 10 17 21 23 25 32 35 36 43 49 52 55 62 <u>75</u> <u>76</u> 78 79 82 93 95 96 99 109 110 118 122 124 130 132 136 <u>144</u> 12 18 34 38 39 42 44 45 46 65 74 89 90 105 108 <u>112</u> 131 <u>147</u> 4 11 16 29 47 50 51 56 59 61 64 66 69 70 71 85 94 <u>103</u> 107 113 117 119 125 126 133 138 <u>140</u> <u>141</u> <u>142</u> <u>143</u> <u>145</u> <u>146</u> <u>148</u> <u>149</u> <u>150</u> <u>151</u> <u>152</u> <u>153</u> <u>154</u> <u>156</u> <u>157</u> <u>158</u>];

(ff) $\phi_T$=[139 137 135 134 129 128 127 123 121 120 116 115 114 111 106 104 102 101 100 98 97 92 91 88 87 86 84 83 81 80 77 73 72 68 67 63 60 58 57 54 53 48 41 40 37 33 31 30 28 27 26 24 22 20 19 15 14 13 8 7 6 5 0 <u>155</u> 136 132 130 124 122 118 110 109 99 96 95 93 82 <u>79</u> 78 76 75 62 55 52 49 43 36 35 32 25 23 21 17 10 9 3 2 1 <u>144</u> 131 112 108 105 90 89 74 65 46 45 44 42 39 38 34 18 12 <u>147</u> 4 11 16 29 47 50 51 56 59 61 64 66 69 70 71 85 94 <u>103</u> 107 113 117 119 125 126 133 138 <u>140</u> <u>141</u> <u>142</u> <u>143</u> <u>145</u> <u>146</u> <u>148</u> <u>149</u> <u>150</u> <u>151</u> <u>152</u> <u>153</u> <u>154</u> <u>156</u> <u>157</u> <u>158</u>];

(gg) $\phi_T$=[0 5 6 7 8 13 14 15 19 20 22 24 26 27 28 30 31 33 37 40 41 48 53 54 57 58 60 63 67 68 72 73 77 80 81 83 84 86 87 88 91 92 97 98 100 101 102 104 106 111 114 115 116 120 121 123 127 128 129 134 135 137 139 <u>155</u> 1 2 3 9 10 17 21 23 25 32 35 36 43 49 52 55 62 <u>75</u> <u>76</u> 78 79 82 93 95 96 99 109 110 118 122 124 130 132 136 <u>144</u> 12 18 34 38 39 42 44 45 46 65 74 89 90 105 108 <u>112</u> 131 <u>147</u> 4 47 50 64 66 85 103 113 126 <u>146</u> 11 16 29 51 56 <u>59</u> 61 69 70 71 94 107 117 119 125 <u>133</u> 138 <u>140</u> <u>141</u> <u>142</u> <u>143</u> <u>145</u> 148 <u>149</u> <u>150</u> <u>151</u> <u>152</u> <u>153</u> <u>154</u> <u>156</u> <u>157</u> <u>158</u>];

(hh) $\phi_T$=[139 137 135 134 129 128 127 123 121 120 116 115 114 111 106 104 102 101 100 98 97 92 91 88 87 86 84 83 81 80 77 73 72 68 67 63 60 58 57 54 53 48 41 40 37 33 31 30 28 27 26 24 22 20 19 15 14 13 8 7 6 5 0 <u>155</u> 136 132 130 124 122 118 110 109 99 96 95 93 82 <u>79</u> 78 76 75 62 55 52 49 43 36 35 32 25 23 21 17 10 9 3 2 1 <u>144</u> 131 112 108 105 90 89 74 65 46 45 44 42 39 38 34 18 12 <u>147</u> 126 113 103 85 66 64 50 47 4 <u>146</u> 11 16 29 51 56 <u>59</u> 61 69 70 71 94 107 117 119 125 133 138 <u>140</u> <u>141</u> <u>142</u> <u>143</u> <u>145</u> 148 <u>149</u> <u>150</u> <u>151</u> <u>152</u> <u>153</u> <u>154</u> <u>156</u> <u>157</u> <u>158</u>];

(ii) $\phi_T$=[0 5 6 7 8 13 14 15 19 20 22 24 26 27 28 30 31 33 37 40 41 48 53 54 57 58 60 63 67 68 72 73 77 80 81 83 84 86 87 88 91 92 97 98 100 101 102 104 106 111 114 115 116 120 121 123 127 128 129 134 135 137 139 <u>155</u> 1 2 3 9 10 17 21 23 25 32 35 36 43 49 52 55 62 <u>75</u> <u>76</u> 78 79 82 93 95 96 99 109 110 118 122 124 130 132 136 <u>144</u> 12 18 34 38 39 42 44 45 46 65 74 89 90 105 108 <u>112</u> 131 <u>147</u> 4 47 50 64 66 85 103 113 126 <u>146</u> 51 59 107 125 <u>145</u> 11 16 29 56 61 69 70 71 94 117 119 133 138 <u>140</u> <u>141</u> <u>142</u> <u>143</u> 148 <u>149</u> <u>150</u> <u>151</u> <u>152</u> <u>153</u> <u>154</u> <u>156</u> <u>157</u> <u>158</u>];

(jj) $\phi_T$=[139 137 135 134 129 128 127 123 121 120 116 115 114 111 106 104 102 101 100 98 97 92 91 88 87 86 84 83 81 80 77 73 72 68 67 63 60 58 57 54 53 48 41 40 37 33 31 30 28 27 26 24 22 20 19 15 14 13 8 7 6 5 0 <u>155</u> 136 132 130 124 122 118 110 109 99 96 95 93 82 <u>79</u> 78 76 75 62 55 52 49 43 36 35 32 25 23 21 17 10 9 3 2 1 <u>144</u> 131 112 108 105 90 89 74 65 46 45 44 42 39 38 34 18 12 <u>147</u> 126 113 103 85 66 64 50 47 4 <u>146</u> 125 107 59 51 <u>145</u> 11 16 29 56 61 69 70 71 94 117 119 133 138 <u>140</u> <u>141</u> <u>142</u> <u>143</u> 148 <u>149</u> <u>150</u> <u>151</u> <u>152</u> <u>153</u> <u>154</u> <u>156</u> <u>157</u> <u>158</u>].

25. The wireless receiver of claim 21, wherein $K_{max}$ is 160 and the template interleaver uses an interleaving pattern comprising any one of the following interleaving patterns, wherein indices corresponding to cyclic redundancy check (CRC) bits are underlined:

(a) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 <u>160</u> 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 <u>161</u> 3 8 14 22 36 39 42 54 60 65 75 92 95 103 106 109 117 123 128 133 147 <u>162</u> 2 53 59 64 91 102 116 122 127 146 <u>163</u> 101 121 <u>126</u> <u>164</u> 100 <u>165</u> 99 <u>166</u> 98 <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(b) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 <u>164</u> 1 4 7 10 16 19 21 24 27 32 41 46 59 65 69 72 79 81 85 90 95 100 108 116 119 123 129 132 135 138 140 142 146 151 153 158 <u>165</u> 0 6 15 18 23 26 31 40 45 58 64 71 78 84 89 94 99 <u>107</u> 115 131 134 137 145 150 157 <u>166</u> 29 30 35 38 39 50 51 52 56 62 93 98 105 106 113 <u>167</u> 44 57 63 77 83 88 114 144 149 <u>160</u> 37 43 53 55 <u>112</u> 148 <u>181</u> 34 36 103 <u>170</u> 49 <u>179</u> 87 <u>183</u> 76 <u>173</u> 92 <u>163</u> 54 <u>171</u> <u>178</u> <u>180</u> <u>182</u> <u>104</u> <u>161</u> <u>162</u> <u>168</u> <u>169</u> <u>172</u> <u>174</u> <u>175</u> <u>176</u> <u>177</u>];

(c) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 <u>160</u> 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 <u>161</u> 147 133 128 123 117 109 106 103 95 92 75 65 60 <u>54</u> 42 39 36 22 14 8 3 <u>162</u> 146 127 122 116 102 91 64 59 53 2 <u>163</u> 126 121 <u>101</u> <u>164</u> 100 <u>165</u> 99 <u>166</u> 98 <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(d) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 <u>164</u> 158 153 151 146 142 140 138 135 132 129 123 119 <u>116</u> 108 100 95 90 85 81 79 72 69 65 59 46 41 32 27 24 21 19 16 10 7 4 1 <u>165</u> 157 150 145 137 134 131 115 107 99 94 89 84 78 <u>71</u> 64 58 45 40 31 26 23 18 15 6 0 <u>166</u> 113 106 105 98 93 62 56 52 51 50 39 38 35 30 29 <u>167</u> 149 144 114 88 83 77 63 57 44 <u>160</u> 148 112 55 53 <u>43</u> 37 <u>181</u> 103 36 34 <u>170</u> 49 <u>179</u> 87 <u>183</u> 76 <u>173</u> 92 <u>163</u> 54 <u>171</u> <u>178</u> <u>180</u> <u>182</u> <u>104</u> <u>161</u> <u>162</u> <u>168</u> <u>169</u> <u>172</u> <u>174</u> <u>175</u> <u>176</u> <u>177</u>];

(e) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 <u>160</u> 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 <u>161</u> 3 8 14 22 36 39 42 54 60 65 75 92 95 103 106 109 117 123 128 133 147 <u>162</u> 2 53 59 64 91 98 99 100 101

102 116 121 122 126 127 146 163 164 165 166 167 168 169 170 171 172 173 174 175 176 177 178 179 180 181 182 183];

(f) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 164 1 4 7 10 16 19 21 24 27 32 41 46 59 65 69 72 79 81 85 90 95 100 108 116 119 123 129 132 135 138 140 142 146 151 153 158 165 0 6 15 18 23 26 31 40 45 58 64 71 78 84 89 94 99 107 115 131 134 137 145 150 157 166 29 30 34 35 36 37 38 39 43 44 49 50 51 52 53 54 55 56 57 62 63 76 77 83 87 88 92 93 98 103 104 105 106 112 113 114 144 148 149 160 161 162 163 167 168 169 170 171 172 173 174 175 176 177 178 179 180 181 182 183];

(g) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 2 53 59 64 91 98 99 100 101 102 116 121 122 126 127 146 163 164 165 166 167 168 169 170 171 172 173 174 175 176 177 178 179 180 181 182 183];

(h) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 164 158 153 151 146 142 140 138 135 132 129 123 119 116 108 100 95 90 85 81 79 72 69 65 59 46 41 32 27 24 21 19 16 10 7 4 1 165 157 150 145 137 134 131 115 107 99 94 89 84 78 71 64 58 45 40 31 26 23 18 15 6 0 166 29 30 34 35 36 37 38 39 43 44 49 50 51 52 53 54 55 56 57 62 63 76 77 83 87 88 92 93 98 103 104 105 106 112 113 114 144 148 149 160 161 162 163 167 168 169 170 171 172 173 174 175 176 177 178 179 180 181 182 183];

(i) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 53 59 64 91 102 116 122 127 146 163 98 99 100 101 121 126 164 165 166 167 168 169 170 171 172 173 174 175 176 177 178 179 180 181 182 183];

(j) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 164 1 4 7 10 16 19 21 24 27 32 41 46 59 65 69 72 79 81 85 90 95 100 108 116 119 123 129 132 135 138 140 142 146 151 153 158 165 0 6 15 18 23 26 31 40 45 58 64 71 78 84 89 94 99 107 115 131 134 137 145 150 157 166 29 30 35 38 39 50 51 52 56 62 93 98 105 106 113 167 34 36 37 43 44 49 53 54 55 57 63 76 77 83 87 88 92 103 104 112 114 144 148 149 160 161 162 163 168 169 170 171 172 173 174 175 176 177 178 179 180 181 182 183];

(k) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 122 116 102 91 64 59 53 2 163 98 99 100 101 121 126 164 165 166 167 168 169 170 171 172 173 174 175 176 177 178 179 180 181 182 183];

(l) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 164 158 153 151 146 142 140 138 135 132 129 123 119 116 108 100 95 90 85 81 79 72 69 65 59 46 41 32 27 24 21 19 16 10 7 4 1 165 157 150 145 137 134 131 115 107 99 94 89 84 78 71 64 58 45 40 31 26 23 18 15 6 0 166 113 106 105 98 93 62 56 52 51 50 39 38 35 30 29 167 34 36 37 43 44 49 53 54 55 57 63 76 77 83 87 88 92 103 104 112 114 144 148 149 160 161 162 163 168 169 170 171 172 173 174 175 176 177 178 179 180 181 182 183];

(m) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 53 59 64 91 102 116 122 127 146 163 101 121 126 164 98 99 100 165 166 167 168 169 170 171 172 173 174 175 176 177 178 179 180 181 182 183];

(n) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 164 1 4 7 10 16 19 21 24 27 32 41 46 59 65 69 72 79 81 85 90 95 100 108 116 119 123 129 132 135 138 140 142 146 151 153 158 165 0 6 15 18 23 26 31 40 45 58 64 71 78 84 89 94 99 107 115 131 134 137 145 150 157 166 29 30 35 38 39 50 51 52 56 62 93 98 105 106 113 167 44 57 63 77 83 88 114 144 149 160 34 36 37 43 49 53 54 55 76 87 92 103 104 112 148 161 162 163 168 169 170 171 172 173 174 175 176 177 178 179 180 181 182 183];

(o) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 122 116 102

91 64 59 53 2 163 126 121 101 164 98 99 100 165 166 167 168 169 170 171 172 173 174 175 176 177 178 179 180 181 182 183];

(p) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 164 158 153 151 146 142 140 138 135 132 129 123 119 116 108 100 95 90 85 81 79 72 69 65 59 46 41 32 27 24 21 19 16 10 7 4 1 165 157 150 145 137 134 131 115 107 99 94 89 84 78 71 64 58 45 40 31 26 23 18 15 6 0 166 113 106 105 98 93 62 56 52 51 50 39 38 35 30 29 167 149 144 114 88 83 77 63 57 44 160 34 36 37 43 49 53 54 55 76 87 92 103 104 112 148 161 162 163 168 169 170 171 172 173 174 175 176 177 178 179 180 181 182 183];

(q) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 53 59 64 91 102 116 122 127 146 163 101 121 126 164 100 165 98 99 166 167 168 169 170 171 172 173 174 175 176 177 178 179 180 181 182 183];

(r) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 164 1 4 7 10 16 19 21 24 27 32 41 46 59 65 69 72 79 81 85 90 95 100 108 116 119 123 129 132 135 138 140 142 146 151 153 158 165 0 6 15 18 23 26 31 40 45 58 64 71 78 84 89 94 99 107 115 131 134 137 145 150 157 166 29 30 35 38 39 50 51 52 56 62 93 98 105 106 113 167 44 57 63 77 83 88 114 144 149 160 37 43 53 55 112 148 181 34 36 49 54 76 87 92 103 104 161 162 163 168 169 170 171 172 173 174 175 176 177 178 179 180 182 183];

(s) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 122 116 102 91 64 59 53 2 163 126 121 101 164 100 165 98 99 166 167 168 169 170 171 172 173 174 175 176 177 178 179 180 181 182 183];

(t) $\phi_T$=[159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 164 158 153 151 146 142 140 138 135 132 129 123 119 116 108 100 95 90 85 81 79 72 69 65 59 46 41 32 27 24 21 19 16 10 7 4 1 165 157 150 145 137 134 131 115 107 99 94 89 84 78 71 64 58 45 40 31 26 23 18 15 6 0 166 113 106 105 98 93 62 56 52 51 50 39 38 35 30 29 167 149 144 114 88 83 77 63 57 44 160 148 112 55 53 43 37 181 34 36 49 54 76 87 92 103 104 161 162 163 168 169 170 171 172 173 174 175 176 177 178 179 180 182 183];

(u) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 59 100 101 116 121 126 127 146 165 64 99 122 166 91 169 53 102 163 164 98 167 168 170 171 172 173 174 175 176 177 178 179 180 181 182 183];

(v) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 59 100 101 116 121 126 127 146 165 64 99 122 166 91 169 53 102 163 164 98 167 168 170 171 172 173 174 175 176 177 178 179 180 181 182 183];

(w) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 146 127 122 116 101 100 59 2 165 122 99 64 166 91 169 102 53 163 164 98 167 168 170 171 172 173 174 175 176 177 178 179 180 181 182 183];

(x) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 161 3 8 14 22 36 39 42 54 60 65 75 92 95 103 106 109 117 123 128 133 147 162 2 53 59 64 91 98 99 100 101 102 116 121 122 126 127 146 163 164 165 166 167 168 169 170 171 172 173 174 175 176 177 178 179 180 181 182 183];

(y) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 160 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 161 147 133 128 123 117 109 106 103 95 92 75 65 60 54 42 39 36 22 14 8 3 162 2 53 59 64 91 98 99

100 101 102 116 121 122 126 127 146 <u>163</u> <u>164</u> <u>165</u> <u>166</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(z) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 <u>160</u> 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 <u>161</u> 3 8 14 22 36 39 42 54 60 65 75 92 95 103 106 109 117 123 128 133 147 <u>162</u> 2 59 100 101 116 121 126 127 146 <u>165</u> 53 64 91 98 99 102 122 <u>163</u> <u>164</u> <u>166</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(aa) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 <u>160</u> 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 <u>161</u> 147 133 128 123 117 109 106 103 95 92 75 65 60 <u>54</u> 42 39 36 22 14 8 3 <u>162</u> 146 127 126 121 116 101 100 59 2 <u>165</u> 53 64 91 98 99 102 122 <u>163</u> <u>164</u> <u>166</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(bb) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 <u>160</u> 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 <u>161</u> 3 8 14 22 36 39 42 54 60 65 75 92 95 103 106 109 117 123 128 133 147 <u>162</u> 2 59 100 101 116 121 126 127 146 116 111 110 109 102 101 97 96 91 86 82 80 75 74 73 70 68 67 66 61 60 48 47 42 33 28 25 22 20 17 14 13 12 11 9 8 5 3 2 <u>204</u> 195 188 186 182 177 164 99 122 <u>166</u> 53 91 98 102 <u>163</u> <u>164</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(cc) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 <u>160</u> 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 <u>161</u> 147 133 128 123 117 109 106 103 95 92 75 65 60 <u>54</u> 42 39 36 22 14 8 3 <u>162</u> 146 127 126 121 116 101 100 59 2 165 122 99 64 <u>166</u> 53 91 98 102 <u>163</u> <u>164</u> <u>167</u> <u>168</u> <u>169</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(dd) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 <u>160</u> 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 <u>161</u> 3 8 14 22 36 39 42 54 60 65 75 92 95 103 106 109 117 123 128 133 147 <u>162</u> 2 59 100 101 116 121 126 127 146 <u>165</u> 64 99 122 <u>166</u> 91 <u>169</u> 53 98 102 <u>163</u> <u>164</u> <u>167</u> <u>168</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>];

(ee) $\phi_T$=[159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 <u>160</u> 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 <u>161</u> 147 133 128 123 117 109 106 103 95 92 75 65 60 <u>54</u> 42 39 36 22 14 8 3 <u>162</u> 146 127 126 121 116 101 100 59 2 <u>165</u> 122 99 64 <u>166</u> 91 <u>169</u> 53 98 102 <u>163</u> <u>164</u> <u>167</u> <u>168</u> <u>170</u> <u>171</u> <u>172</u> <u>173</u> <u>174</u> <u>175</u> <u>176</u> <u>177</u> <u>178</u> <u>179</u> <u>180</u> <u>181</u> <u>182</u> <u>183</u>].

26. The wireless receiver of claim 21, wherein $K_{max}$ is 200 and the template interleaver uses an interleaving pattern comprising any one of the following interleaving patterns, wherein indices corresponding to cyclic redundancy check (CRC) bits are underlined:

(a) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 160 161 163 165 168 170 172 173 176 178 179 183 187 189 190 196 197 198 199 <u>204</u> 1 4 7 10 16 19 21 24 27 32 41 46 59 65 69 72 79 <u>81</u> <u>85</u> 90 95 100 108 116 119 123 129 132 135 138 140 142 146 151 153 158 162 164 167 169 171 175 177 182 186 188 195 <u>205</u> 0 6 15 18 23 26 31 40 45 58 64 71 78 84 89 94 99 <u>107</u> 115 131 134 137 145 150 157 166 174 181 185 194 <u>206</u> 29 30 35 38 39 50 51 52 56 62 93 98 105 106 113 184 191 <u>207</u> 44 57 63 77 83 88 114 144 149 180 193 <u>200</u> 34 37 49 55 92 104 112 <u>208</u> 43 148 <u>214</u> 53 192 <u>221</u> 36 <u>219</u> 103 <u>210</u> 54 <u>202</u> <u>212</u> 87 <u>211</u> <u>216</u> <u>223</u> 76 <u>201</u> <u>203</u> <u>209</u> <u>213</u> <u>215</u> <u>217</u> <u>218</u> <u>220</u> <u>222</u>];

(b) $\phi_T$=[199 198 197 196 190 189 187 183 179 178 176 173 172 170 168 165 163 161 160 159 156 155 154 152 147 143 141 139 136 133 130 128 127 126 125 124 122 121 120 118 117 110 109 102 101 97 96 91 86 82 80 75 74 73 70 68 67 66 61 60 48 47 42 33 28 25 22 20 17 14 13 12 11 9 8 5 3 2 <u>204</u> 195 188 186 182 177 175 171 169 167 164 162 158 <u>153</u> 151 146 142 140 138 135 132 129 123 119 116 108 100 95 90 85 81 79 72 69 65 59 46 41 32 27 24 21 19 16 10 7 4 1 <u>205</u> 194 185 181 174 166 157 150 145 137 134 131 11<u>5</u> <u>107</u> 99 94 89 84 78 71 64 58 45 40 31 26 23 18 15 6 0 <u>206</u> 191 184 113 106 105 98 93 62 56 52 51 50 39 38 <u>35</u> 30 29 <u>207</u> 193 180 149 144 114 88 83 77 63 57 44 <u>200</u> 112 104 92 55 49 37 34 <u>208</u> 148 43 <u>214</u> 192 53 <u>221</u> 36 <u>219</u> 103 <u>210</u> 54 <u>212</u> <u>202</u> 87 <u>211</u> <u>216</u> <u>223</u> 76 <u>215</u> <u>213</u> <u>217</u> <u>218</u> <u>201</u> <u>220</u> <u>203</u> <u>222</u> <u>209</u>];

(c) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 160 161 163 165 168 170 172 173 176 178 179 183 187 189 190 196 197 198 199 <u>204</u> 1 4 7 10 16 19 21 24 27 32 41 46 59 65 69 72 79 <u>81</u> <u>85</u> 90 95 100 108 116 119 123 129 132 135 138 140 142 146 151 153 158 162 164 167 169 171 175 177 182 186 188 195 <u>205</u> 0 6 15 18 23 26 31 40 45 58 64 71 78 84 89 94 99 <u>107</u> 115 131 134 137 145 150 157 166 174 181 185 194 <u>206</u> 29 30 34 35 36 37 38 39 43 44 49 50 51 52 53 5<u>4</u> <u>55</u> 56 57 62 63 76 77 83 87 88 92 93 98 103 104 105 106 112

113 114 144 148 149 180 184 191 192 193 200 201 202 203 207 208 209 210 211 212 213 214 215 216 217 218 219 220 221 222 223];

(d) $\phi_T$=[199 198 197 196 190 189 187 183 179 178 176 173 172 170 168 165 163 161 160 159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 204 195 188 186 182 177 175 171 169 167 164 162 158 153 151 146 142 140 138 135 132 129 123 119 116 108 100 95 90 85 81 79 72 69 65 59 46 41 32 27 24 21 19 16 10 7 4 1 205 194 185 181 174 166 157 150 145 137 134 131 115 107 99 94 89 84 78 71 64 58 45 40 31 26 23 18 15 6 0 206 29 30 34 35 36 37 38 39 43 44 49 50 51 52 53 54 55 56 57 62 63 76 77 83 87 88 92 93 98 103 104 105 106 112 113 114 144 148 149 180 184 191 192 193 200 201 202 203 207 208 209 210 211 212 213 214 215 216 217 218 219 220 221 222 223];

(e) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 160 161 163 165 168 170 172 173 176 178 179 183 187 189 190 196 197 198 199 204 1 4 7 10 16 19 21 24 27 32 41 46 59 65 69 72 79 81 85 90 95 100 108 116 119 123 129 132 135 138 140 142 146 151 153 158 162 164 167 169 171 175 177 182 186 188 195 205 0 6 15 18 23 26 31 40 45 58 64 71 78 84 89 94 99 107 115 131 134 137 145 150 157 166 174 181 185 194 206 29 30 35 38 39 50 51 52 56 62 93 98 105 106 113 184 191 207 34 36 37 43 44 49 53 54 55 57 63 76 77 83 87 88 92 103 104 112 114 144 148 149 180 192 193 200 201 202 203 208 209 210 211 212 213 214 215 216 217 218 219 220 221 222 223];

(f) $\phi_T$=[199 198 197 196 190 189 187 183 179 178 176 173 172 170 168 165 163 161 160 159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 204 195 188 186 182 177 175 171 169 167 164 162 158 153 151 146 142 140 138 135 132 129 123 119 116 108 100 95 90 85 81 79 72 69 65 59 46 41 32 27 24 21 19 16 10 7 4 1 205 194 185 181 174 166 157 150 145 137 134 131 115 107 99 94 89 84 78 71 64 58 45 40 31 26 23 18 15 6 0 206 191 184 113 106 105 98 93 62 56 52 51 50 39 38 35 30 29 207 34 36 37 43 44 49 53 54 55 57 63 76 77 83 87 88 92 103 104 112 114 144 148 149 180 192 193 200 201 202 203 208 209 210 211 212 213 214 215 216 217 218 219 220 221 222 223];

(g) $\phi_T$=[2 3 5 8 9 11 12 13 14 17 20 22 25 28 33 42 47 48 60 61 66 67 68 70 73 74 75 80 82 86 91 96 97 101 102 109 110 111 117 118 120 121 122 124 125 126 127 128 130 133 136 139 141 143 147 152 154 155 156 159 160 161 163 165 168 170 172 173 176 178 179 183 187 189 190 196 197 198 199 204 1 4 7 10 16 19 21 24 27 32 41 46 59 65 69 72 79 81 85 90 95 100 108 116 119 123 129 132 135 138 140 142 146 151 153 158 162 164 167 169 171 175 177 182 186 188 195 205 0 6 15 18 23 26 31 40 45 58 64 71 78 84 89 94 99 107 115 131 134 137 145 150 157 166 174 181 185 194 206 29 30 35 38 39 50 51 52 56 62 93 98 105 106 113 184 191 207 44 57 63 77 83 88 114 144 149 180 193 200 34 36 37 43 49 53 54 55 76 87 92 103 104 112 148 192 201 202 203 208 209 210 211 212 213 214 215 216 217 218 219 220 221 222 223];

(h) $\phi_T$=[199 198 197 196 190 189 187 183 179 178 176 173 172 170 168 165 163 161 160 159 156 155 154 152 147 143 141 139 136 133 130 128 127 126 125 124 122 121 120 118 117 111 110 109 102 101 97 96 91 86 82 80 75 74 73 70 68 67 66 61 60 48 47 42 33 28 25 22 20 17 14 13 12 11 9 8 5 3 2 204 195 188 186 182 177 175 171 169 167 164 162 158 153 151 146 142 140 138 135 132 129 123 119 116 108 100 95 90 85 81 79 72 69 65 59 46 41 32 27 24 21 19 16 10 7 4 1 205 194 185 181 174 166 157 150 145 137 134 131 115 107 99 94 89 84 78 71 64 58 45 40 31 26 23 18 15 6 0 206 191 184 113 106 105 98 93 62 56 52 51 50 39 38 35 30 29 207 193 180 149 144 114 88 83 77 63 57 44 200 34 36 37 43 49 53 54 55 76 87 92 103 104 112 148 192 201 202 203 208 209 210 211 212 213 214 215 216 217 218 219 220 221 222 223];

(i) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 161 162 164 166 167 171 175 177 179 180 183 186 187 188 191 193 194 196 197 199 200 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 163 165 170 174 176 178 182 185 190 192 195 198 201 3 8 14 22 36 39 42 54 60 65 75 92 95 103 106 109 117 123 128 133 147 169 173 181 184 189 202 2 53 59 64 91 102 116 122 127 146 168 172 203 101 121 126 204 100 205 99 206 98 207 208 209 210 211 212 213 214 215 216 217 218 219 220 221 222 223];

(j) $\phi_T$=[199 197 196 194 193 191 188 187 186 183 180 179 177 175 171 167 166 164 162 161 160 159 158 157 155 153 152 150 149 145 144 142 140 139 137 135 132 130 125 120 119 115 114 113 111 108 105 97 94 90 89 88 86 85 83 81 80 78 77 74 73 72 70 69 68 67 63 62 58 57 56 52 51 50 48 46 44 41 38 35 33 31 29 28 26 24 21 20 19 17 16 13 12 10 7 5 1 0 200 198 195 192 190 185 182 178 176 174 170 165 163 156 154 151 148 143 141 138 136 134 131 129 124 118 112 110 107 104 96 93 87 84 82 79 76 71 66 61 55 49 47 45 43 40 37 34 32 30 27 25 23 18 15 11 9 6 4 201 189 184 181 173 169 147 133 128 123 117 109 106 103 95 92 75 65 60 54 42 39 36 22 14 8 3 202 172 168 146 127 122 116 102 91 64 59 53 2 203 126 121 101 204 100 205 99 206 98 207 208 209 210 211 212 213 214 215 216 217 218 219 220 221 222 223];

(k) $\phi_T$=[0 1 5 7 10 12 13 16 17 19 20 21 24 26 28 29 31 33 35 38 41 44 46 48 50 51 52 56 57 58 62 63 67 68 69 70 72 73 74 77 78 80 81 83 85 86 88 89 90 94 97 105 108 111 113 114 115 119 120 125 130 132 135 137 139 140 142 144 145 149 150 152 153 155 157 158 159 160 161 162 164 166 167 171 175 177 179 180 183 186 187 188 191 193 194 196 197 199 200 4 6 9 11 15 18 23 25 27 30 32 34 37 40 43 45 47 49 55 61 66 71 76 79 82 84 87 93 96 104 107 110 112 118 124 129 131 134 136 138 141 143 148 151 154 156 163 165 170 174 176 178 182 185 190 192 195 198 201 3 8 14 22 36 39 42 54 60 65 75 92 95 103 106 109 117 123 128 133 147 169 173 181 184 189 202 2 53 59 64 91 98 99 100 101 102 116 121 122 126 127 146 168 172 203 204 205 206 207 208 209 210 211 212 213 214 215 216 217 218 219 220 221 222 223];

(l) $\phi_T$=[199 197 196 194 193 191 188 187 186 183 180 179 177 175 171 167 166 164 162 161 160 159 158 157 155 153 152 150 149 145 144 142 140 139 137 135 132

130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 2 53 59 64 91 98 99 100 101
102 116 121 122 126 127 146 168 172 203 204 205 206
207 208 209 210 211 212 213 214 215 216 217 218 219
220 221 222 223];

(m) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 200 4 6 9 11 15 18
23 25 27 30 32 34 37 40 43 45 47 49 55 61 66 71 76
79 82 84 87 93 96 104 107 110 112 118 124 129 131
134 136 138 141 143 148 151 154 156 163 165 170 174
176 178 182 185 190 192 195 198 201 3 8 14 22 36 39
42 54 60 65 75 92 95 103 106 109 117 123 128 133 147
169 173 181 184 189 202 2 53 59 64 91 102 116 122
127 146 168 172 203 98 99 100 101 121 126 204 205
206 207 208 209 210 211 212 213 214 215 216 217 218
219 220 221 222 223];

(n) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 172 168 146 127 122 116
102 91 64 59 53 2 203 98 99 100 101 121 126 204 205
206 207 208 209 210 211 212 213 214 215 216 217 218
219 220 221 222 223];

(o) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 200 4 6 9 11 15 18
23 25 27 30 32 34 37 40 43 45 47 49 55 61 66 71 76
79 82 84 87 93 96 104 107 110 112 118 124 129 131
134 136 138 141 143 148 151 154 156 163 165 170 174
176 178 182 185 190 192 195 198 201 3 8 14 22 36 39
42 54 60 65 75 92 95 103 106 109 117 123 128 133 147
169 173 181 184 189 202 2 53 59 64 91 102 116 122
127 146 168 172 203 101 121 126 204 98 99 100 205
206 207 208 209 210 211 212 213 214 215 216 217 218
219 220 221 222 223];

(p) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 172 168 146 127 122 116
102 91 64 59 53 2 203 126 121 101 204 98 99 100 205
206 207 208 209 210 211 212 213 214 215 216 217 218
219 220 221 222 223];

(q) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 200 4 6 9 11 15 18
23 25 27 30 32 34 37 40 43 45 47 49 55 61 66 71 76
79 82 84 87 93 96 104 107 110 112 118 124 129 131
134 136 138 141 143 148 151 154 156 163 165 170 174
176 178 182 185 190 192 195 198 201 3 8 14 22 36 39
42 54 60 65 75 92 95 103 106 109 117 123 128 133 147
169 173 181 184 189 202 2 53 59 64 91 102 116 122
127 146 168 172 203 101 121 126 204 100 205 98 99
206 207 208 209 210 211 212 213 214 215 216 217 218
219 220 221 222 223];

(r) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 172 168 146 127 122 116
102 91 64 59 53 2 203 126 121 101 204 100 205 98 99
206 207 208 209 210 211 212 213 214 215 216 217 218
219 220 221 222 223];

(s) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 200 4 6 9 11 15 18
23 25 27 30 32 34 37 40 43 45 47 49 55 61 66 71 76
79 82 84 87 93 96 104 107 110 112 118 124 129 131
134 136 138 141 143 148 151 154 156 163 165 170 174
176 178 182 185 190 192 195 198 201 3 8 14 22 36 39
42 54 60 65 75 92 95 103 106 109 117 123 128 133 147
169 173 181 184 189 202 2 59 100 101 116 121 126
127 146 172 205 64 99 122 168 206 91 209 53 102 203
204 98 207 208 209 210 211 212 213 214 215 216 217
218 219 220 221 222 223];

(t) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104

96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 172 146 127 126 121 116
101 100 59 2 205 168 122 99 64 206 91 209 102 53 203
204 98 207 208 209 210 211 212 213 214 215 216 217
218 219 220 221 222 223];

(u) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 200 4 6 9 11 15 18
23 25 27 30 32 34 37 40 43 45 47 49 55 61 66 71 76
79 82 84 87 93 96 104 107 110 112 118 124 129 131
134 136 138 141 143 148 151 154 156 163 165 170 174
176 178 182 185 190 192 195 198 201 3 8 14 22 36 39
42 54 60 65 75 92 95 103 106 109 117 123 128 133 147
169 173 181 184 189 202 2 53 59 64 91 98 99 100 101
102 116 121 122 126 127 146 168 172 203 204 205 206
207 208 209 210 211 212 213 214 215 216 217 218 219
220 221 222 223]];

(v) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 2 53 59 64 91 98 99 100 101
102 116 121 122 126 127 146 168 172 203 204 205 206
207 208 209 210 211 212 213 214 215 216 217 218 219
220 221 222 223];

(w) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 200 4 6 9 11 15 18
23 25 27 30 32 34 37 40 43 45 47 49 55 61 66 71 76
79 82 84 87 93 96 104 107 110 112 118 124 129 131
134 136 138 141 143 148 151 154 156 163 165 170 174
176 178 182 185 190 192 195 198 201 3 8 14 22 36 39
42 54 60 65 75 92 95 103 106 109 117 123 128 133 147
169 173 181 184 189 202 2 59 100 101 116 121 126
127 146 172 205 53 64 91 98 99 102 122 168 203 204
205 206 207 208 209 210 211 212 213 214 215 216 217
218 219 220 221 222 223];

(x) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 172 146 127 126 121 116
101 100 59 2 205 53 64 91 98 99 102 122 168 203 203
204 205 206 207 208 209 210 211 212 213 214 215 216
217 218 219 220 221 222 223];

(y) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 200 4 6 9 11 15 18
23 25 27 30 32 34 37 40 43 45 47 49 55 61 66 71 76
79 82 84 87 93 96 104 107 110 112 118 124 129 131
134 136 138 141 143 148 151 154 156 163 165 170 174
176 178 182 185 190 192 195 198 201 3 8 14 22 36 39
42 54 60 65 75 92 95 103 106 109 117 123 128 133 147
169 173 181 184 189 202 2 59 100 101 116 121 126
127 146 172 205 64 99 122 168 206 53 91 98 102 203
204 205 206 207 208 209 210 211 212 213 214 215 216
217 218 219 220 221 222 223];

(z) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 172 146 127 126 121 116
101 100 59 2 205 168 122 99 64 206 53 91 98 102 203
204 205 206 207 208 209 210 211 212 213 214 215 216
217 218 219 220 221 222 223];

(aa) $\phi_T$=[0 1 5 7 10 12 13 16 17 19 20 21 24 26 28 29 31
33 35 38 41 44 46 48 50 51 52 56 57 58 62 63 67 68
69 70 72 73 74 77 78 80 81 83 85 86 88 89 90 94 97
105 108 111 113 114 115 119 120 125 130 132 135 137
139 140 142 144 145 149 150 152 153 155 157 158 159
160 161 162 164 166 167 171 175 177 179 180 183 186
187 188 191 193 194 196 197 199 200 4 6 9 11 15 18
23 25 27 30 32 34 37 40 43 45 47 49 55 61 66 71 76
79 82 84 87 93 96 104 107 110 112 118 124 129 131
134 136 138 141 143 148 151 154 156 163 165 170 174
176 178 182 185 190 192 195 198 201 3 8 14 22 36 39
42 54 60 65 75 92 95 103 106 109 117 123 128 133 147
169 173 181 184 189 202 2 59 100 101 116 121 126
127 146 172 205 64 99 122 168 206 91 209 53 98 102
203 204 205 206 207 208 209 210 211 212 213 214 215
216 217 218 219 220 221 222 223];

(bb) $\phi_T$=[199 197 196 194 193 191 188 187 186 183 180
179 177 175 171 167 166 164 162 161 160 159 158 157
155 153 152 150 149 145 144 142 140 139 137 135 132
130 125 120 119 115 114 113 111 108 105 97 94 90 89
88 86 85 83 81 80 78 77 74 73 72 70 69 68 67 63 62
58 57 56 52 51 50 48 46 44 41 38 35 33 31 29 28 26
24 21 20 19 17 16 13 12 10 7 5 1 0 200 198 195 192
190 185 182 178 176 174 170 165 163 156 154 151 148
143 141 138 136 134 131 129 124 118 112 110 107 104
96 93 87 84 82 79 76 71 66 61 55 49 47 45 43 40 37
34 32 30 27 25 23 18 15 11 9 6 4 201 189 184 181 173
169 147 133 128 123 117 109 106 103 95 92 75 65 60
54 42 39 36 22 14 8 3 202 172 146 127 126 121 116
101 100 59 2 205 168 122 99 64 206 91 209 53 98 102

203 204 205 206 207 208 209 210 211 212 213 214 215 216 217 218 219 220 221 222 223];

(cc) $\phi_T$=[2 3 5 7 8 10 11 12 18 19 20 21 22 25 27 28 33 35 36 37 38 39 41 43 47 51 55 57 58 62 64 67 70 71 74 76 77 78 79 81 83 85 89 90 91 93 95 96 97 100 101 102 109 110 114 116 120 121 123 125 126 127 128 129 130 131 135 136 142 145 147 152 157 158 165 168 171 173 175 178 180 181 182 187 188 190 194 195 198 199 212 0 6 13 14 15 24 26 30 31 40 48 53 54 60 63 68 72 73 80 84 86 87 88 92 98 104 106 111 115 134 137 139 141 148 149 153 154 161 163 164 167 172 174 179 186 191 192 197 215 1 9 17 23 32 49 52 75 82 99 118 122 124 132 143 144 156 159 162 169 170 176 183 185 189 196 204 34 42 44 45 46 65 105 108 112 155 166 207 4 61 119 133 138 146 211 29 56 59 94 103 117 218 107 113 160 193 208 16 177 184 200 69 150 210 50 203 151 202 140 201 209 214 66 205 206 213 216 217];

(dd) $\phi_T$=[199 198 195 194 190 188 187 182 181 180 178 175 173 171 168 165 158 157 152 147 145 142 136 135 131 130 129 128 127 126 125 123 121 120 116 114 110 109 102 101 100 97 96 95 93 91 90 89 85 83 81 79 78 77 76 74 71 70 67 64 62 58 57 55 51 47 43 41 39 38 37 36 35 33 28 27 25 22 21 20 19 18 12 11 10 8 7 5 3 2 212 197 192 191 186 179 174 172 167 164 163 161 154 153 149 148 141 139 137 134 115 111 106 104 98 92 88 87 86 84 80 73 72 68 63 60 54 53 48 40 31 30 26 24 15 14 13 6 0 215 196 189 185 183 176 170 169 162 159 156 144 143 132 124 122 118 99 82 75 52 49 32 23 17 9 1 204 166 155 112 108 105 65 46 45 44 42 34 207 146 138 133 119 61 4 211 117 103 94 59 56 29 218 193 160 113 107 208 184 177 16 200 150 69 210 50 203 151 202 140 209 214 201 66 206 213 216 217 205];

(ee) $\phi_T$=[2 3 5 7 8 10 11 12 18 19 20 21 22 25 27 28 33 35 36 37 38 39 41 43 47 51 55 57 58 62 64 67 70 71 74 76 77 78 79 81 83 85 89 90 91 93 95 96 97 100 101 102 109 110 114 116 120 121 123 125 126 127 128 129 130 131 135 136 142 145 147 152 157 158 165 168 171 173 175 178 180 181 182 187 188 190 194 195 198 199 212 0 6 13 14 15 24 26 30 31 40 48 53 54 60 63 68 72 73 80 84 86 87 88 92 98 104 106 111 115 134 137 139 141 148 149 153 154 161 163 164 167 172 174 179 186 191 192 197 215 1 9 17 23 32 49 52 75 82 99 118 122 124 132 143 144 156 159 162 169 170 176 183 185 189 196 204 4 16 29 34 42 44 45 46 50 56 59 61 65 66 69 94 103 105 107 108 112 113 117 119 133 138 140 146 150 151 155 160 166 177 184 193 200 201 202 203 205 206 207 208 209 210 211 213 214 216 217 218];

(ff) $\phi_T$=[199 198 195 194 190 188 187 182 181 180 178 175 173 171 168 165 158 157 152 147 145 142 136 135 131 130 129 128 127 126 125 123 121 120 116 114 110 109 102 101 100 97 96 95 93 91 90 89 85 83 81 79 78 77 76 74 71 70 67 64 62 58 57 55 51 47 43 41 39 38 37 36 35 33 28 27 25 22 21 20 19 18 12 11 10 8 7 5 3 2 212 197 192 191 186 179 174 172 167 164 163 161 154 153 149 148 141 139 137 134 115 111 106 104 98 92 88 87 86 84 80 73 72 68 63 60 54 53 48 40 31 30 26 24 15 14 13 6 0 215 196 189 185 183 176 170 169 162 159 156 144 143 132 124 122 118 99 82 75 52 49 32 23 17 9 1 204 4 16 29 34 42 44 45 46 50 56 59 61 65 66 69 94 103 105 107 108 112 113 117 119 133 138 140 146 150 151 155 160 166 177 184 193 200 201 202 203 205 206 207 208 209 210 211 213 214 216 217];

(gg) $\phi_T$=[2 3 5 7 8 10 11 12 18 19 20 21 22 25 27 28 33 35 36 37 38 39 41 43 47 51 55 57 58 62 64 67 70 71 74 76 77 78 79 81 83 85 89 90 91 93 95 96 97 100 101 102 109 110 114 116 120 121 123 125 126 127 128 129 130 131 135 136 142 145 147 152 157 158 165 168 171 173 175 178 180 181 182 187 188 190 194 195 198 199 212 0 6 13 14 15 24 26 30 31 40 48 53 54 60 63 68 72 73 80 84 86 87 88 92 98 104 106 111 115 134 137 139 141 148 149 153 154 161 163 164 167 172 174 179 186 191 192 197 215 1 9 17 23 32 49 52 75 82 99 118 122 124 132 143 144 156 159 162 169 170 176 183 185 189 196 204 34 42 44 45 46 65 105 108 112 155 166 207 4 16 29 50 56 59 61 66 69 94 103 107 113 117 119 133 138 140 146 150 151 160 177 184 193 200 201 202 203 205 206 208 209 210 211 213 214 216 217 218];

(hh) $\phi_T$=[199 198 195 194 190 188 187 182 181 180 178 175 173 171 168 165 158 157 152 147 145 142 136 135 131 130 129 128 127 126 125 123 121 120 116 114 110 109 102 101 100 97 96 95 93 91 90 89 85 83 81 79 78 77 76 74 71 70 67 64 62 58 57 55 51 47 43 41 39 38 37 36 35 33 28 27 25 22 21 20 19 18 12 11 10 8 7 5 3 2 212 197 192 191 186 179 174 172 167 164 163 161 154 153 149 148 141 139 137 134 115 111 106 104 98 92 88 87 86 84 80 73 72 68 63 60 54 53 48 40 31 30 26 24 15 14 13 6 0 215 196 189 185 183 176 170 169 162 159 156 144 143 132 124 122 118 99 82 75 52 49 32 23 17 9 1 204 166 155 112 108 105 65 46 45 44 42 34 207 4 16 29 50 56 59 61 66 69 94 103 107 113 117 119 133 138 140 146 150 151 160 177 184 193 200 201 202 203 205 206 208 209 210 211 213 214 216 217 218];

(ii) $\phi_T$=[2 3 5 7 8 10 11 12 18 19 20 21 22 25 27 28 33 35 36 37 38 39 41 43 47 51 55 57 58 62 64 67 70 71 74 76 77 78 79 81 83 85 89 90 91 93 95 96 97 100 101 102 109 110 114 116 120 121 123 125 126 127 128 129 130 131 135 136 142 145 147 152 157 158 165 168 171 173 175 178 180 181 182 187 188 190 194 195 198 199 212 0 6 13 14 15 24 26 30 31 40 48 53 54 60 63 68 72 73 80 84 86 87 88 92 98 104 106 111 115 134 137 139 141 148 149 153 154 161 163 164 167 172 174 179 186 191 192 197 215 1 9 17 23 32 49 52 75 82 99 118 122 124 132 143 144 156 159 162 169 170 176 183 185 189 196 204 34 42 44 45 46 65 105 108 112 155 166 207 4 61 119 133 138 146 211 16 29 50 56 59 66 69 94 103 107 113 117 140 150 151 160 177 184 193 200 201 202 203 205 206 208 209 210 213 214 216 217 218];

(jj) $\phi_T$=[199 198 195 194 190 188 187 182 181 180 178 175 173 171 168 165 158 157 152 147 145 142 136 135 131 130 129 128 127 126 125 123 121 120 116 114 110 109 102 101 100 97 96 95 93 91 90 89 85 83 81 79 78 77 76 74 71 70 67 64 62 58 57 55 51 47 43 41 39 38 37 36 35 33 28 27 25 22 21 20 19 18 12 11 10 8 7 5 3 2 212 197 192 191 186 179 174 172 167 164 163 161 154 153 149 148 141 139 137 134 115 111 106 104 98 92 88 87 86 84 80 73 72 68 63 60 54 53 48 40 31 30 26 24 15 14 13 6 0 215 196 189 185 183 176 170 169 162 159 156 144 143 132 124 122 118 99 82 75 52 49 32 23 17 9 1 204 166 155 112 108 105 65 46 45 44 42 34 207 146 138 133 119 61 4 211 16 29 50 56 59 66 69 94 103 107 113 117 140 150 151 160 177 184 193 200 201 202 203 205 206 208 209 210 213 214 216 217];

$\phi_T$=[2, 3, 5, 7, 8, 10, 11, 12, 18, 19, 20, 21, 22, 25, 27, 28, 33, 35, 36, 37, 38, 39, 41 43, 47, 51, 55, 57, 58, 62, 64, 67, 70, 71, 74, 76, 77, 78, 79, 81, 83, 85, 89, 90, 91, 93, 95, 96 97, 100, 101, 102, 109, 110, 114, 116, 120, 121, 123, 125, 126, 127, 128, 129, 130, 131, 135 136, 142, 145, 147, 152, 157, 158, 165, 168, 171, 173, 175, 178, 180, 181, 182, 187, 188, 190 194, 195, 198, 199, 212, 0, 6, 13, 14, 15, 24, 26, 30, 31, 40, 48, 53, 54, 60, 63, 68, 72, 73, 80 84, 86, 87, 88, 92, 98, 104, 106, 111, 115, 134, 137, 139, 141, 148, 149, 153, 154, 161, 163 164, 167, 172, 174, 179, 186, 191, 192, 197, 215, 1, 9, 17, 23, 32, 49, 52, 75, 82, 99, 118, 122 124, 132, 143, 144, 156, 159, 162, 169, 170, 176, 183, 185, 189, 196, 204, 34, 42, 44, 45, 46 65, 105, 108, 112, 155, 166, 207, 4, 61, 119, 133, 138, 146, 211, 29, 56, 59, 94, 103, 117, 218 107, 113, 160, 193, 208, 16, 177, 184, 200, 140, 151, 201, 66, 205, 50, 209, 150, 206, 69, 202, 203, 210, 213, 214, 216, 217].

\* \* \* \* \*